US010620143B2

(12) United States Patent
Swager et al.

(10) Patent No.: US 10,620,143 B2
(45) Date of Patent: Apr. 14, 2020

(54) SENSOR AND METHOD OF DETECTING AN ANALYTE USING 19F NMR

(71) Applicant: Massachusetts Institute of Technology, Cambridge, MA (US)

(72) Inventors: Timothy M. Swager, Newton, MA (US); Yanchuan Zhao, Cambridge, MA (US); Lily Chen, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 414 days.

(21) Appl. No.: 14/800,636

(22) Filed: Jul. 15, 2015

(65) Prior Publication Data

US 2016/0018344 A1 Jan. 21, 2016

Related U.S. Application Data

(60) Provisional application No. 62/024,967, filed on Jul. 15, 2014.

(51) Int. Cl.
*G01N 24/08* (2006.01)
*G01R 33/46* (2006.01)

(52) U.S. Cl.
CPC .......... *G01N 24/087* (2013.01); *G01N 24/08* (2013.01); *G01R 33/46* (2013.01)

(58) Field of Classification Search
CPC ...... A61K 49/06; G01N 24/08; G01N 24/087; G01N 2500/02; G01R 33/46
See application file for complete search history.

(56) References Cited

U.S. PATENT DOCUMENTS

2016/0091443 A1* 3/2016 Bar-Shir ................ A61B 5/055 436/79

OTHER PUBLICATIONS

Doyon and Jain, "The Pattern of Fluorine Substitution Affects Binding Affinity in a Small Library of Fluoroaromatic Inhibitors for Carbonic Anhydrase", Organic Lett., 1999, v. 1, No. 2, pp. 183-185.*

International Search Report dated Oct. 26, 2015, issued in International Application No. PCT/US2015/040637.

Written Opinion of the International Searching Authority dated Oct. 26, 2015, issued in International Application No. PCT/US2015/040637.

Tobias Tengel et al: "Use of 19 F NMR spectroscopy to screen chemical libraries for ligands that bind to proteins", Organic & Biomolecular Chemistry, vol. 2, Feb. 3, 2004 (Feb. 3, 2004), pp. 725-731, XP055220673, Section "Screening for ligands with affinity for HSA".

Yanchuan Zhao et al: "Detection and Differentiation of Neutral Organic Compounds by 19 F NMR with a Tungsten Calix [4] arene Imido Complex", Journal of the American Chemical Society, vol. 135, No. 50, Dec. 3, 2013 (Dec. 3, 2013), pp. 18770-18773, XP055220670, US ISSN: 0002-7863, DOI: 10.1021/ja4106804 p. 18770-p. 18772 figures 1-3.

(Continued)

*Primary Examiner* — Xiaoyun R Xu
(74) *Attorney, Agent, or Firm* — Steptoe & Johnson LLP

(57) ABSTRACT

A sensor including a fluorinated receptor can be used to identify an analyte through shift in $^{19}$F NMR resonance of the receptor when the receptor interacts with the analyte.

30 Claims, 144 Drawing Sheets

(56) References Cited

OTHER PUBLICATIONS

Haiying Gan et al: "Fluorine NMR reporter for phosphate anions", Chemical Communications—Chemcom, vol. 49, No. 44, Apr. 22, 2013 (Apr. 22, 2013), pp. 5070-5072, XP055220538, GB ISSN: 1359-7345, DOI: 10.1039/c3cc42169d p. 5070-p. 5071 figures 1-4.
Yanchuan Zhao et al: "19 F NMR Fingerprints: Identification of Neutral Organic Compounds in a Molecular container", Journal of the American Chemical Society, vol. 136, No. 30, Jul. 30, 2014 (Jul. 30, 2014), pp. 10683-10690, XP055220801, US ISSN: 0002-7863, DOI: 10.1021/ja504110f the whole document.
Notification Concerning Transmittal of International Preliminary Report on Patentability (Chapter I of the Patent Cooperation Treaty) dated Jan. 26, 2017, issued in International Application No. PCT/US2015/040637.

* cited by examiner

1

2

3

4

5, R = CH3
5a, R = F (a)

6

7, 65% ( R = 2–OCF$_3$), 8, 50% (R = 2–CF$_3$)
9, 67% (R = 3–OCF$_3$), 10, 70% (R = 3,5–CF$_3$)

(b)

6

11

1:$CH_3CN$

2:$CH_3CN$

2:PhCN

5a:$CH_3CN$

13

6

6

7

8

9

10

6

11

1

2

3

4

5

8

$^{13}C$ NMR

8

9

9

$^{13}C$ NMR

9

10

1

$^{13}C$ NMR

2

$^{19}F$ NMR

3

4

5

5

2a ($CH_3CN$) 2b ($CH_3CN$) 2b (S-α-methylbenzylamine)

1 3a 4a

2b (S-α-methylbenzylamine) 2c ($CH_3CN$)

4c

4d

2b ($CH_3CN$)

2c ($CH_3CN$)

2d ($CH_3CN$)

14952.0485

1, R = 3-$OCF_3$,
3, R = 3,5-$CF_3$,
3, R = 4-$CF_3$,
4, R = 4-$OCF_3$

5, R = 3,5-$CF_3$ flexible sidewall

6 easily disturbed *sp*$^2$ electrons

9

10

11

12

13

13

6

1

2

3

4

5

2:$CH_3CN$

6:Caffeine

SENSOR AND METHOD OF DETECTING AN ANALYTE USING 19F NMR

CLAIM OF PRIORITY

This application claims priority to U.S. Provisional Application No. 62/024,967, filed Jul. 15, 2014, which is incorporated by reference in its entirety.

FEDERAL SPONSORSHIP

This invention was made with Government support under Grant No. R01 GM095843 awarded by the National Institutes of Health. The Government has certain rights in the invention.

FIELD OF INVENTION

This invention relates to sensors and methods of detecting an analyte.

BACKGROUND

For many sensors, there is often insufficient discrimination between responses and overlapping responses in complex mixtures lead to difficulty in unambiguously identifying analytes at unknown concentrations. Improved methods for quickly identifying compounds and differentiation of analytes with similar chemical structure are widely needed. There is an increasing awareness of the need for more selective and reliable methods to detect and rapidly identify target analytes of interest in a variety of contexts relevant to health care, process control, and environmental monitoring.

SUMMARY

In one aspect, a sensor can include a fluorinated receptor, wherein a $^{19}F$ NMR resonance of the receptor shifts when associating with an analyte, thereby identifying the analyte through the shift in the $^{19}F$ NMR resonance. In certain embodiments, the $^{19}F$ NMR resonance can be capable of being detected by a NMR spectrometer.

In certain embodiments, the shift of the $^{19}F$ NMR resonance can be induced by spatial proximity. The shift of the $^{19}F$ NMR resonance can be induced by changes in electron density. The shift of the $^{19}F$ NMR resonance can be induced by spatial proximity and changes in electron density. The shift of the $^{19}F$ NMR resonance can be induced by differences in a magnetic micro-environment.

In certain embodiments, the sensor can include a plurality of fluorinated receptors, wherein at least two of the fluorinated receptors are different. The sensor can include fluorine atoms at different positions relative to the analyte. The sensor can include at least two nonequivalent fluorine atoms.

In certain embodiments, the sensor can provide at least two $^{19}F$ NMR signals that shift when the receptor associates with the analyte. The sensor can access structure information of the analyte by interaction with spatially arranged fluorine atoms. The sensor selectivity can be optimized by the position of a fluorine atom of the receptor. The sensor can discriminate different analytes.

In certain embodiments, the analyte can include a carbohydrate. The analyte can include a protein. The analyte can include a biomolecule. The analyte can include a cell. The analyte can include a virus. The analyte can be a toxic molecule. The analyte can include caffeine or a biologically active heterocycle. The analyte can include an amine, a heterocycle, a thioether, a carbohydrate, a polyol, a nitrile, an amide, a sulfoxide or a vitamin.

In certain embodiments, the sensor can have orthogonal discriminatory property. The sensor can be capable of multi-dimensional differentiation to fingerprint the analyte. The sensor can be capable of three dimensional differentiation of the analyte. The sensor can be capable of calculating a concentration of the analyte.

In certain embodiments, the receptor can include a palladium complex. The receptor can include a boronic acid complex.

In certain embodiments, the sensor signal can be enhanced by dynamic nuclear polarization.

In certain embodiments, the structure information of the analyte can include chirality, presence of a heterocycle, peptide structure, or presence of a carbohydrate.

In certain embodiments, the receptor can include a calixarene tungsten-imido complex. The calixarene tungsten-imido complex can include a trifluoromethyl group and a trifluoromethoxy group. The receptor can include a pentafluorophenyl group. The receptor can include a $SF_5$, $SCF_3$, $OCF_3$, trifluoromethyl ketone, difluoromethylketone, pentaflurophenyl, and/or trifluoromethyl.

In certain embodiments, the receptor can include a magnetic microenvironment.

In certain embodiments, the analyte can include an amine, a heterocycle, a thioether, a carbohydrate, a polyol, a nitrile, an amide, a sulfoxide or a vitamin. For example, the analyte can be a cyanophos [O-(4-cyanophenyl) O,O-dimethyl phosphoro-thioate].

In another aspect, a method of detecting an analyte can include associating a fluorinated receptor with the analyte, wherein an $^{19}F$ resonance of the receptor shifts when associating with an analyte, thereby identifying the analyte through the shift in the $^{19}F$ resonance.

In certain embodiments, the method can include detecting the $^{19}F$ resonance by a NMR spectroscopy. The method can include providing at least two $^{19}F$ NMR signals that shift when the receptor associates with the analyte. The method can include accessing structure information of the analyte by interaction with spatially arranged fluorine atoms. The method can include optimizing the sensor selectivity by the position of a fluorine atom of the receptor.

In certain embodiments, the method can include discriminating different analytes. The method can include detecting the analyte through three dimensional differentiation. The method can include calculating a concentration of the analyte. The method can include creating a magnetic microenvironment. The method can include forming a fingerprint for the analyte based on one or more shifts in the $^{19}F$ resonance.

Other aspects, embodiments, and features will be apparent from the following description, the drawings, and the claims.

BRIEF DESCRIPTION OF THE DRAWINGS

FIG. 31 shows a preparation of calixarene tungsten-imido complexes 5a.

FIG. 82 shows $^{1}H$ NMR spectrum of complex 5a.
FIG. 83 shows $^{19}F$ NMR spectrum of complex 5a.
FIG. 84 shows $^{13}C$ NMR spectrum of complex 5a.

FIG. 88(*b*) and FIG. 88(*c*) show the superimposition of the spectra showing the benzylic $CF_3$ (b) and $OCF_3$ (c) regions of complex 2c (1.0 mM) with each of the analyte (0.7 mM) collected independently.

FIG. 110(*b*) shows $^{19}F$ NMR spectrum of complex 1 and $CH_3CN$ (15 mM); FIG. 110(*c*) shows $^{19}F$ NMR spectrum of seven analytes added to a solution of 1 in $CDCl_3$, FIG. 110(*d*) shows superimposition of the spectra of complex 1 with each of the seven analyte from (c) collected independently; FIGS. 110(*e*)-(*n*) show $^{19}F$ NMR spectra of complex 1 bound to various analytes. The $^{19}F$ NMR spectrum (64 scans each) was taken of a mixture of complex 1 (1 mM in $CDCl_3$), $CH_3CN$ (15 mM) and different analytes (0.5-2.0 mM).

FIGS. 111(*d*)-(*k*) shows $^{19}F$ NMR spectrum of complex 6 bound to various analytes. The $^{19}F$ NMR spectrum (64 scans each) was taken of a mixture of complex 6 (2 mM in $CDCl_3$), $CH_3CN$ (30 mM) and different analytes (1.0-2.0 mM).

FIG. 113(*b*) shows $^{19}F$ NMR spectrum (128 scans) of the mixture when 80 μL of decaffeinated coffee was added.

FIG. 117(*b*) shows the spectrum when 80 μL of decaffeinated coffee was added.

FIG. 140(*b*) shows the spectrum when 5 μL of the prepared analyte solution was added.

FIG. 141(*b*) shows the spectrum when the concentration of caffeine is about 0.35 mM.

FIG. 142(*b*) shows the spectrum when 80 μL of decaffeinated coffee was added.

DETAILED DESCRIPTION

Figure 1:
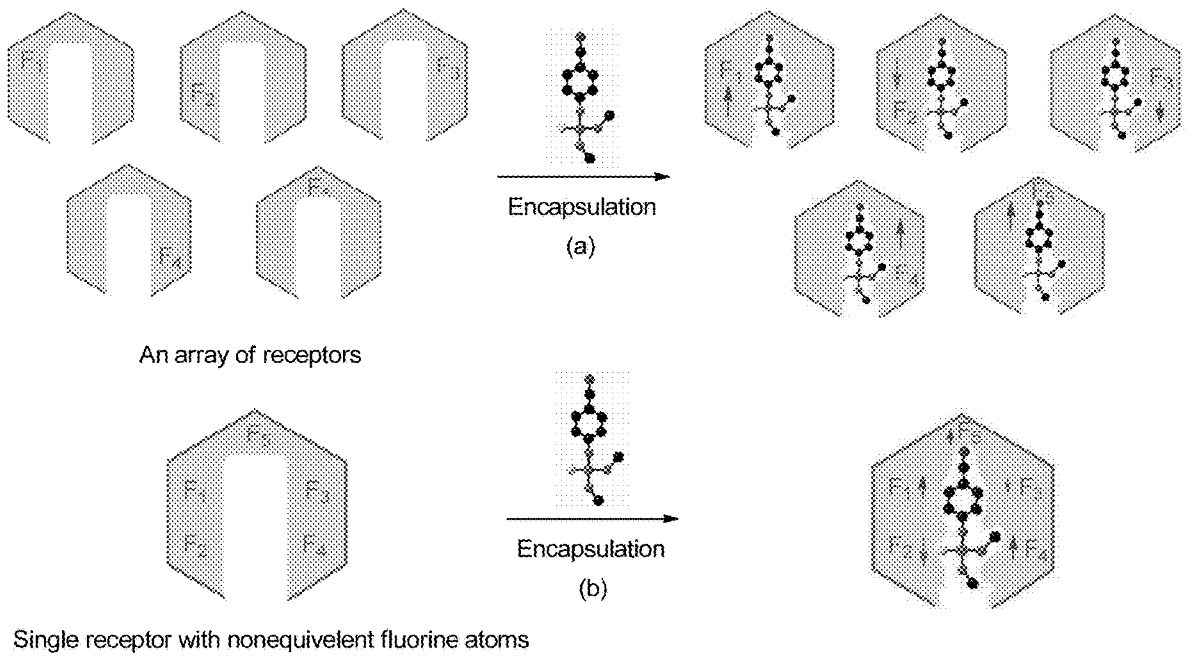
FIG. 1 is a schematic illustration of $^{19}F$ NMR spectroscopy identification of organic molecules with molecular containers.

A sensor can include a fluorinated receptor, an $^{19}F$ resonance of the receptor can shift when the sensor associates with an analyte, and the analyte can be identified through the shift in the $^{19}F$ resonance. The sensor can include a single receptor or an array of receptors. The sensor can detect a mixture of analytes. The receptor can include a three dimensional organic structure that has one or more fluorine atoms. The organic structure to be detected can be a toxin, peptide, protein, nucleotide, virus, cell, bacteria, carbohydrate, pesticide, hormone, drug, metabolite, biomarker for a disease, impurity from chemical manufacturing, or a toxic industrial chemical, provided that the organic structure binds to the receptor to give a complex that is static on the NMR timescale. The sensor is capable of discriminating different toxins, peptides, proteins, viruses, cells, bacteria, nucleotides, carbohydrates, pesticides, hormones, drugs, metabolites, biomarkers for a disease, impurities from chemical manufacturing, or toxic industrial chemicals as the analytes. The analyte can also include a nitrile, such as an alkyl nitrile, an aromatic nitrile, an acetonitrile, a propionitrile, a benzonitrile, a benzyl nitrile, a nonanenitrile, or a 3-bromopropionitrile. The receptor can be based on a molecular scaffold having a plurality of Lewis acid-Lewis base interactions, hydrogen bonding, chiral centers, moieties capable π-stacking, transition metals, hydrophobic interactions in water, ionic groups or a precise molecular shape. The sensor and method of sensing can recognize molecules or organisms that are not easily recognized by other method. It can be applied to large molecules or even organisms.

The sensor can involve a receptor that interacts with an analyte, where the interaction results in changes in how the sensor interacts with a magnetic field, e.g., changes in a $^{19}F$ resonance frequency. The sensor can use multi-dimensional parameters to fingerprint the analyte; multi-dimension includes two-dimensions, three dimensions, four-dimensions, five-dimensions, six-dimensions, seven-dimensions, eight-dimensions, and so on. A fingerprint can be formed for any analyte based on one or more shifts in the $^{19}F$ resonance. If multiple receptors are used, a unique fingerprint pattern can be obtained for an analyte.

The sensor device may be exposed to a sample suspected of containing an analyte, wherein the analyte, if present, may interact with one or more components of the device to cause a change in the signal produced by the device. Determination of the change in the signal may then determine the analyte.

A receptor can provide for selective interaction with an analyte. The receptor can interact directly with an analyte (e.g., by binding, spatial interaction, or reaction) or can interact indirectly with the analyte by interaction (e.g., by binding or reaction) with another chemical species which in turn interacts with the analyte. The specific structure of the receptor or the presence of a specific chemical species may facilitate a selective interaction with an analyte.

The receptor can be chosen to provide selective interactions with one or more analytes. In one embodiment, a particular sensing receptor can have a selective interaction with just one analyte; in other words, the selectivity is such that the sensing material can distinguish between the analyte and virtually all other chemical species.

The term "selective" indicates an interaction that can be used to distinguish the analyte in practice from other chemical species, even species which may be structurally related or similar to the analyte, in the system in which the sensor and sensing composition is to be employed. The interaction can be, for example, a reversible or irreversible non-covalent binding interaction; a reversible or irreversible covalent binding interaction (i.e., a reaction wherein a covalent bond between the receptor and the analyte is formed); or catalysis (e.g., where the receptor is an enzyme and the analyte is a substrate for the enzyme).

Improved methods for quickly identifying neutral organic compounds and differentiation of analytes with similar chemical structure are widely needed. Neutral organic molecules can be fingerprinted by using $^{19}F$ NMR and molecular receptors. The binding of analytes to the receptors induces characteristic up- or downfield shifts of $^{19}F$ resonances that can be used as multi-dimensional parameters to fingerprint each analyte. The strategy can be either achieved with an array of fluorinated receptors or by incorporating multiple nonequivalent fluorine atoms in a single receptor. Spatial proximity of the analyte to the fluorinated group is important to induce the most pronounced NMR shifts and is crucial in the differentiation of analytes with similar structures. This new scheme allows for the precise and simultaneous identification of multiple analytes in a complex mixture.

There is an increasing awareness of the need for more selective and reliable methods to detect and rapidly identify target analytes of interest in a variety of contexts relevant to health care, process control, and environmental monitoring. See, for example, Ho, C. K.; Robinson, A.; Miller, D. R.; Davis, M. J. *Sensors* 2005, 5, 4; Krantz-Rulcker, C.; Stenberg, M.; Winquist, F.; Lundstrom, I. *Anal. Chim. Acta* 2001, 426, 217; Du, J.; Hu, M.; Fan, J.; Peng, X. *Chem. Soc. Rev.* 2012, 41, 4511; Pejcic, B.; Eadington, P.; Ross, A. *Environ. Sci. Technol.* 2007, 41, 6333; Jun, Y.-W.; Lee, J.-H.; Cheon, J. *Angew. Chem., Int. Ed.* 2008, 47, 5122; Kobayashi, H.; Ogawa, M.; Alford, R.; Choyke, P. L.; Urano, Y. *Chem. Rev.* 2010, 110, 2620; Domaille, D. W.; Que, E. L.; Chang, C. J. *Nat. Chem. Bio.* 2008, 4, 168; Lavis, L. D.; Raines, R. T. *ACS Chem. Bio.* 2008, 3, 142, each of which is incorporated by reference in its entirety. Chemosensory systems designed to assist in this process are molecular constructs that respond to a stimulus and give a measurable change in electronic, optical, and/or chemical/spectroscopic properties. See, for example, Czarnik, A. W. *Fluorescent Chemosensor for Ion and Molecule Recognition*; ACS Symposium Series 538; American Chemical Society: Washington, D.C., 1993; de Silva, A. P.; Gunaratne, H. Q. N.; Gunnlaugsson, T.; Huxley, A. J. M.; McCoy, C. P.; Rademacher, J. T.; Rice, T. E. *Chem. Rev.* 1997, 97, 1515; Thomas, S. W., III; Joly, G. D.; Swager, T. M. *Chem. Rev.* 2007, 107, 1339; Leray, I.; Valeur, B. *Eur. J. Inorg. Chem.* 2009, 2009, 3525; Lange, U.; Mirsky, V. M. *Anal. Chim. Acta* 2011, 687, 105, each of which is incorporated by reference in its entirety. Transduction generally involves molecular associations that are transduced optically or electrically between the analyte and a receptor. See, for example, Binghe, W.; Eric, V. A. *Chemsosensor: Principles, Strategies, and Applications*; John Wiley & Sons: Hoboken, 2011, which is incorporated by reference in its entirety.

These interactions typically occur at a specific bonding site, and sensing methods based on this strategy are best suited to detect classes of structurally related analytes, but often fail in the precise discrimination of related species. Array sensing has emerged as an approach that increases discriminatory power by combining signals collected by a large amount of individual sensors. See, for example, Diehl, K. L.; Anslyn, E. V. *Chem. Soc. Rev.* 2013, 42, 8596; Askim, J. R.; Mahmoudi, M.; Suslick, K. S. *Chem. Soc. Rev.* 2013, 42, 8649; Miranda, O. R.; Creran, B.; Rotello, V. M. *Curr. Opin. Chem. Biol.* 2010, 14, 728; Wang, F.; Swager, T. M. *J. Am. Chem. Soc.* 2011, 133, 11181, each of which is incorporated by reference in its entirety. However, without highly orthogonal discrimination between analytes, there is insufficient discrimination between responses and overlapping responses in complex mixtures lead to difficulty in unambiguously identifying analytes at unknown concentrations. A sensing method can be based on $^{19}F$ NMR and the encapsulation of an analyte with molecular receptors, and/or by binding to another scaffold, and/or array of receptor/scaffold molecules. The method provides a unique spectroscopic signature (fingerprint) that allows for an output and enables precise and simultaneous identification of multiple guest molecules in a complex mixture.

$^{19}F$ NMR has emerged as a versatile tool in biological and pharmaceutical studies as a result of the high sensitivity and scarcity of naturally occurring background signals. See, for example, For a review discussing applications of $^{19}F$ NMR, see: Yu, J.-X.; Hallac, R. R.; Chiguru, S.; Mason, R. P. *Prog. Nucl. Magn. Reson. Spectrosc.* 2013, 70, 25, which is incorporated by reference in its entirety. Fluorinated biological molecules have utility in the determination of enzyme activity. See, for example, Tanaka, K.; Kitamura, N.; Naka, K.; Chujo, Y. *Chem. Commun.* 2008, 6176; Tanaka, K.; Kitamura, N.; Chujo, Y. *Bioconjugate Chem.* 2011, 22, 1484; Stockman, B. J. *J. Am. Chem. Soc.* 2008, 130, 5870; Albert, M.; Repetschnigg, W.; Ortner, J.; Gomes, J.; Paul, B. J.; Illaszewicz, C.; Weber, H.; Steiner, W.; Dax, K. *Carbohydr. Res.* 2000, 327, 395; Mendz, G. L.; Lim, T. N.; Hazell, S. L. *Arch. Biochem. Biophys.* 1993, 305, 252; Yu, J.; Liu, L.; Kodibagkar, V. D.; Cui, W.; Mason, R. P. *Bioorg. Med. Chem.* 2006, 14, 326; Yu, J.; Mason, R. P. *J. Med. Chem.* 2006, 49, 1991; Yu, J.-X.; Kodibagkar, V. D.; Liu, L.; Mason, R. P. *NMR Biomed.* 2008, 21, 704, each of which is incorporated by reference in its entirety. In addition to the reaction monitoring, various metal ions can be detected through reversible association with fluorinated chelates or crown ethers where characteristic shifts are generated for each metal ion. See, for example, Smith, G. A.; Hesketh, R. T.; Metcalfe, J. C.; Feeney, J.; Morris, P. G. *Proc. Natl. Acad. Sci. U.S.A.* 1983, 80, 7178; Schanne, F. A. X.; Dowd, T. L.; Gupta, R. K.; Rosen, J. F. *Proc. Natl. Acad. Sci. U.S.A.* 1989, 86, 5133; Levy, L. A.; Murphy, E.; Raju, B.; London, R. E. *Biochemistry* 1988, 27, 4041; Smith, G. A.; Kirschenlohr, H. L.; Metcalfe, J. C.; Clarke, S. D. *J. Chem. Soc., Perkin Trans.* 2 1993, 1205; Jiang, Z.-X.; Feng, Y.; Yu, Y. B. *Chem. Commun.* 2011, 47, 7233, each of which is incorporated by reference in its entirety. As the induced $^{19}F$ NMR shifts are largely dependent on the through-bond disturbance of electron density at fluorine atom upon association, charged species are typically selected as target analytes. In contrast, the detection and differentiation of the neutral organic molecules with similar structure represents a significant challenge for most sensing methods.

Achieving a goal of unique identification of an analyte can include several criteria. For example, the molecular recognition event is sufficiently defined to provide a well-structured binding complex. There can be a number of independently varying $^{19}F$ NMR signals that shift to provide a robust multi-dimensional discrimination of an analyte. The shift of $^{19}F$ resonance should be induced by spatial proximity and can be augmented by through-bond electron density differences from binding. The spatial proximity is important to provide structure information for the whole molecule by shifting the frequencies of the spatially arranged fluorine atoms. The molecular recognition can be influenced by strong covalent binding to the analyte, Lewis acid-Lewis base interactions, hydrogen bonding, chiral centers, π-stacking, metal coordination, hydrophobic interactions in water, electrostatics, binding to receptors immobilized on surfaces, or shape.

Molecular containers, such as cavitands and capsules with different levels of preorganization, have found wide-ranging applications in molecular recognition. See, for example, Rudkevich, D. M.; Rebek, J. J. *Eur J. Org. Chem.* 1999, 1999, 1991; Asfari, Z.; Bo¨hmer, V.; Harrowfield, J. M.; Vicens, J. *Calixarenes* 2001; Kluwer Academic Publishers: Dordrecht, 2001; Rudkevich, D. M. *Chem. Eur. J.* 2000, 6, 2679; Cram, D. J. *Science* 1983, 219, 1177, each of which is incorporated by reference in its entirety. By design the encapsulation of an analyte induces a change of the magnetic microenvironment inside the container thereby creating easily discernable $^{19}F$ NMR shifts. The multi-dimensional output can be achieved either with an array of receptors bearing equivalent fluorine atoms at different positions relative to the analyte (FIG. 1, *a*) or by employing a single receptor with multiple nonequivalent fluorine atoms (FIG. 1, *b*). As a result of the scarcity of organic fluorine compounds in nature, it is unlikely that there will be interfering signals and an efficient method can fingerprint a chosen analyte. See, for example, Furuya, T.; Kamlet, A. S; Ritter, T. *Nature* 2011, 473, 470; Harper, D. B.; O'Hagan, D. *Nat. Prod. Rep.* 1994, 11, 123, each of which is incorporated by reference in its entirety. A number of related receptors such as those having clefts or rigid backbones are also capable of forming unique magnetic microenvironments to give multidimensional $^{19}F$ NMR outputs.

Figure 2:
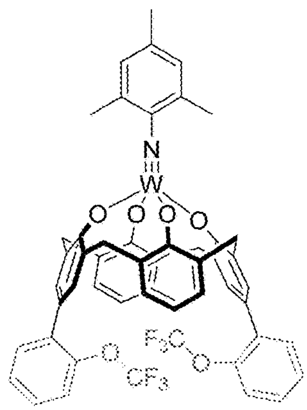
FIG. 2 shows structures of fluorinated calix[4]arene tungsten complexes.
Figure 2:
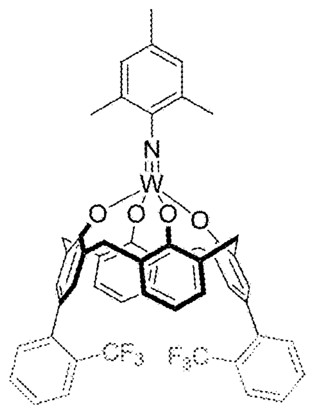
Figure 2:
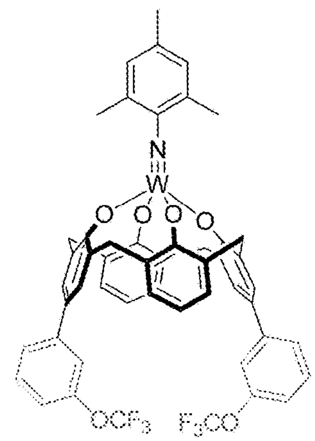
Figure 2:
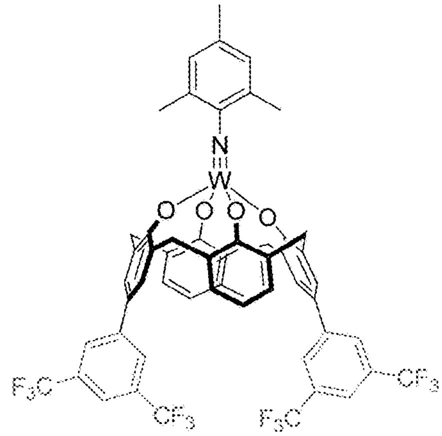
Figure 2:
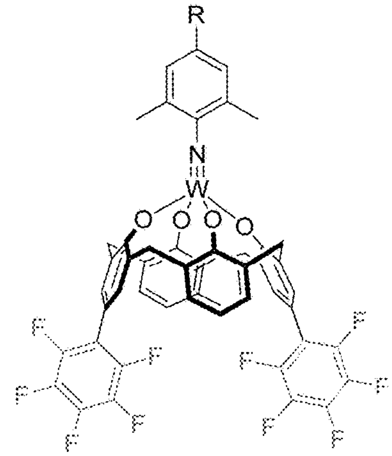

Calix[4]arene tungsten-imido complexes can be used as a scaffold from which to produce partially fluorinated molecular containers on the basis of their synthetic accessibility and the fact that the Lewis acidic nature of the metal center gives predictable binding structures with Lewis basic analytes. See, for example, Gramage-Doria, R.; Armspach, D.; Matt, D. *Coord. Chem. Rev.* 2013, 257, 776; Kotzen, N.; Vigalok, A. *Supramol. Chem.* 2008, 20, 129, each of which is incorporated by reference in its entirety. To evaluate the feasibility of the strategy based on encapsulation and chemical shift induced by spatial proximity, calixarene tungsten-imido complexes appended with spatially varying trifluoromethyl group ($CF_3$) and trifluoromethoxy group ($OCF_3$) at the upper rim (FIG. 2, complexes 1-4) can be examined. In addition to an array of complexes that can be employed together to output fingerprint, receptors 5 and 5a with multiple nonequivalent fluorine atoms are also prepared (FIG. 2).

Synthesis.

Figure 3:
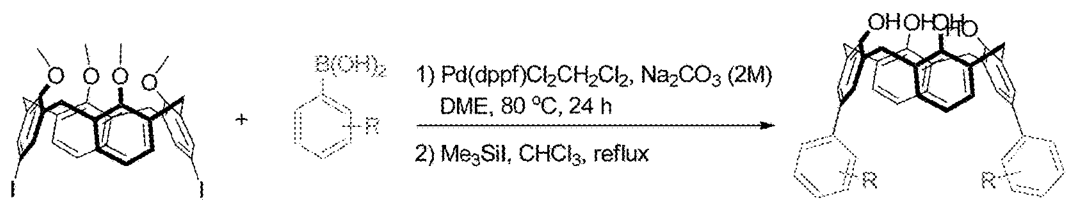
FIG. 3 shows preparation of fluorinated calix[4]arene 7-11.
Figure 3:
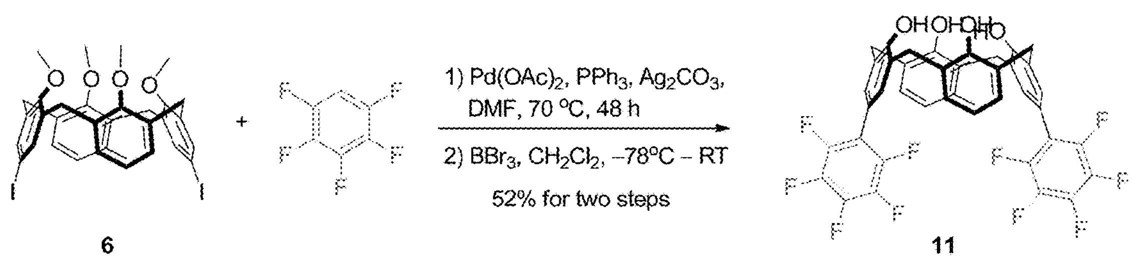

The —$CF_3$ and —$OCF_3$ substituted calix[4]arenes (7-10) were prepared through a Suzuki-Miyaura coupling of diiodocalix[4]arene (6) and various organoboronic acids followed by a demethylation with $Me_3SiI$ (FIG. 3, *a*). The target bis(pentafluorophenyl) substituted calix[4]arene (11) was prepared through a silver-mediated direct coupling of 1 and pentafluorobenzene recently reported by Zhang and coworkers, the methyl groups were subsequently removed by treating with $BBr_3$ in $CH_2Cl_2$ at low temperature (FIG. 3, b). See, for example, Chen, F.; Min, Q.-Q.; Zhang, X. *J. Org. Chem.* 2012, 77, 2992, each of which is incorporated by reference in its entirety. The corresponding tungsten-imido complexes (1-5 and 5a) were obtained using a previously reported "one pot" procedure from calixarenes (7-11) by reacting with $WOCl_4$ and iminophosphorane ($Ph_3P{=}NR$) reagent. See, for example, Zhao, Y.; Swager, T. M. *J. Am. Chem. Soc.* 2013, 135, 18770, which is incorporated by reference in its entirety.

Platforms that can Fingerprint Molecules

There are many platforms that can be used to fingerprint molecules and provide recognition of a broader range of species of health, environmental, security, and industrial relevance. To create a fingerprint one needs only to create probe-analyte complexes that are effectively static on the NMR timescale. The probe need not only bind one molecule, as long as an unambiguous fingerprint for the analyte of interest is produced. Another versatile platform is the palladium pincer complexes (FIG. 4), which display rich coordination chemistry that can be influenced by the pendant aromatic rings. See, for example, Albrecht, M. et al., *Angew. Chem. Int. Ed.* 2001, 40, 3750-3781; Wang, Q.-Q. et al., Bowman-James, K., *J. Am. Chem. Soc.* 2013, 135, 17193-17199, each of which is incorporated by reference in its entirety.

The $Pd^{+2}$ center has a strong affinity for nitrogen ligands and is a good motif for recognition of biologically relevant heterocycles or histidine residues in proteins. FIG. 5 demonstrates the robust nature of this method for the detection of caffeine. FIG. 5 shows $^{19}F$ NMR of a Pd pincer probe in water (a) with signals for both ACN and $H_2O$ coordination. Addition of pure caffeine generates a new signal at −59.48 ppm (b), which is also observed when the pincer is added to coffee (c) in the presence of creamer (d) or creamer and sugar (e). The $OCF_3$ and $SF_5$ derivatives (FIG. 4) displayed minor responses that are not easily differentiated from $H_2O$ coordination. However the pendant $C_6F_5$ analog provided a clear signature indicating that caffeine's π-system can provide a stronger perturbation to the pendant $^{19}F$ reporting groups.

Figure 4:
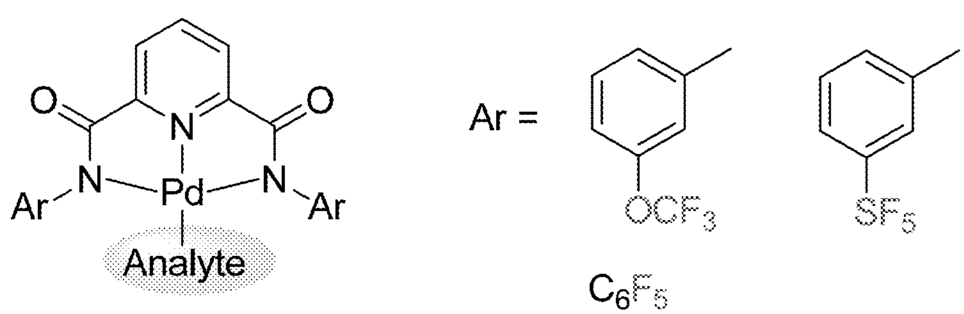
FIG. 4 shows palladium complexes.
Figure 5:
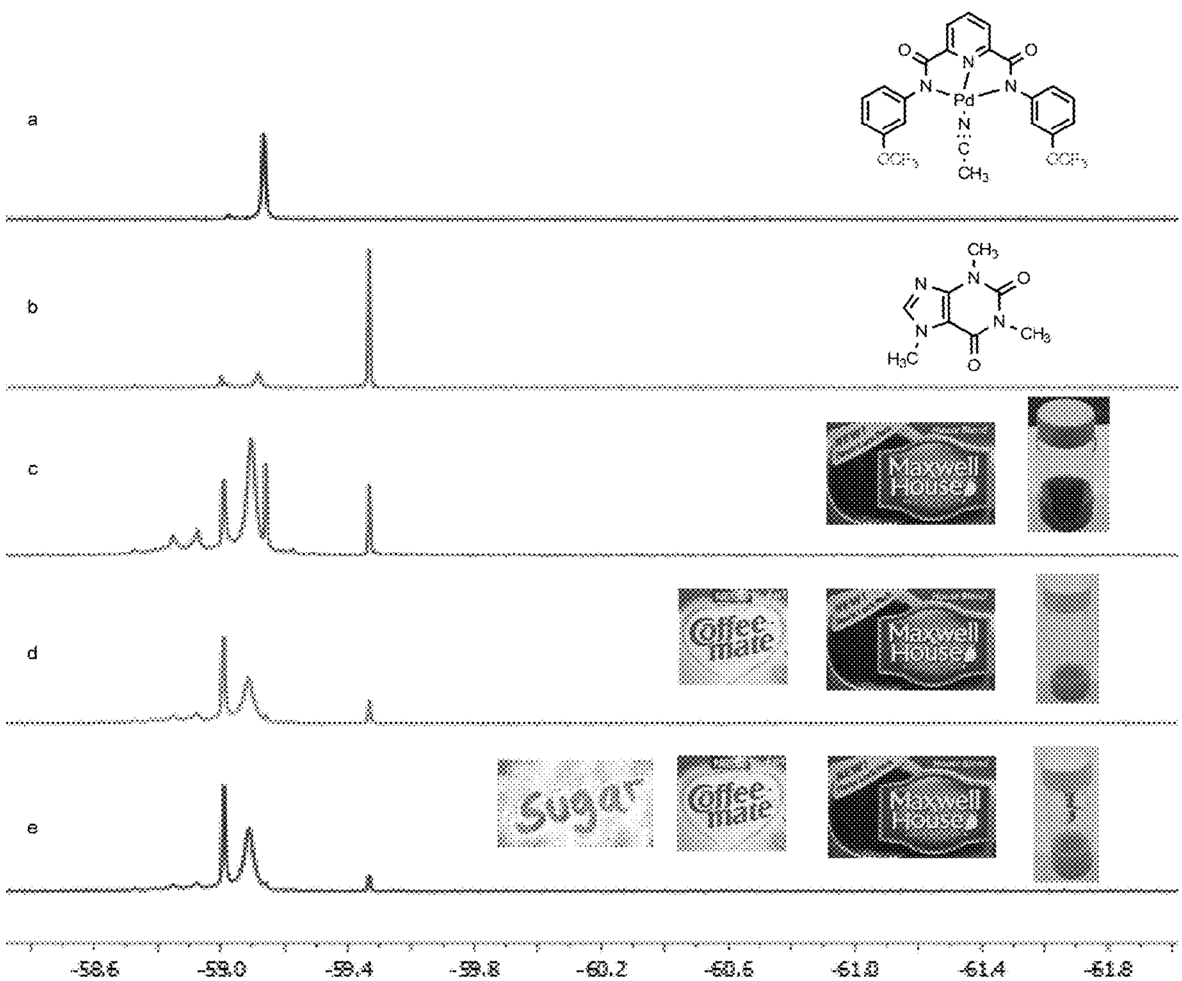
FIG. 5 shows the detection of caffeine.
Figure 6:
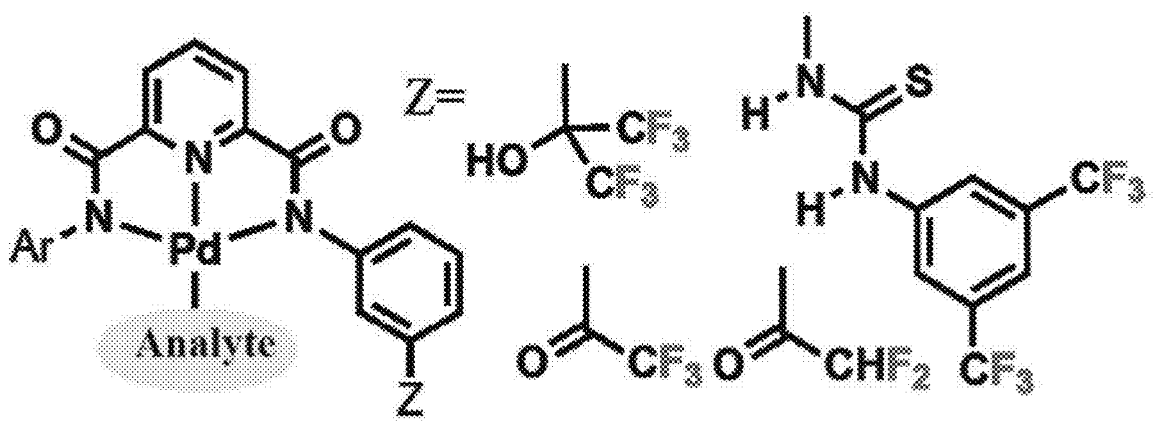
FIG. 6 shows palladium complexes.

The $Pd^{+2}$ Pincer platform can contain two different pendant aromatic groups (FIG. 6) with one arm coming from the groups detailed in FIG. 4. This series can integrate hydrogen bond donating hexafluoroisopropyl and thiourea groups, as well as the trifluoro- and difluoro-ketones that form reversible covalent complexes with amines and hydroxyls. See, for example, Nielsen, G. D. et al., *Arch. Toxicol.* 1996, 70, 319-328; Grate, J. W., *Chem. Rev.* 2008, 108, 726-745; Roccatano, D. et al., *Protein Sci.* 2005, 14, 2582-2589; Li, A.-F. et al., *Chem. Soc. Rev.* 2010, 39, 3729-3745; Kim, D. W. et al., *Bull. Korean Chem. Soc.* 2012, 33, 1159-1164; Mohr, G. J. et al., *Adv. Mater.* 1998, 10, 1353-1357; Mertz, E. et al., *J. Am. Chem. Soc.* 2003, 125, 3424-3425; Yu, S. et al., *J. Am. Chem. Soc.* 2012, 134, 20282-20285, each of which is incorporated by reference in its entirety. The $CF_3$ groups in the freely rotating hexafluoroisopropyl and thiourea groups can be equivalent and binding to a larger biomolecule is expected to freeze out specific conformations and break this symmetry. For aqueous environments, water-solubilizing groups (ionic or polyethylene glycol) can be attached to the complexes, ideally in the 4 position of the pyridine ring. However it is also possible to create complexes between a fingerprinting probe and an ionic guest.

Carbohydrates present a particular challenge in biomolecular structure determination and display extraordinary complexity with a small diversity of functional groups. In addition, to recognize base carbohydrate groups, detecting glycoproteins in complex environments by a $^{19}F$ fingerprint would be of considerable importance. For example, $^{19}F$ fingerprinting methods can enable detection of interferons such as interferon-gamma (IFN-γ) an important inflammatory cytokine. See, for example, Tuleuova, N. et al., *Anal. Chem.* 2010, 82, 1851-1857; Pan, L. et al., *Analyst* 2013, 138, 6811-6816, each of which is incorporated by reference in its entirety. To expand fingerprinting to both simple carbohydrates and carbohydrates of high complexity, $^{19}F$ NMR carbohydrate fingerprinting agents based upon boronic acids, can selectively detect carbohydrates. Although this field has seen considerable attention, orthogonal selectivity of even simple carbohydrates is still a challenge and even sophisticated arrays using other methods require pure samples at high concentrations. See, for example, Teichert, J. F. et al., *J. Am. Chem. Soc.* 2013, 135, 11314-11321, which is incorporated by reference in its entirety.

Figure 7:
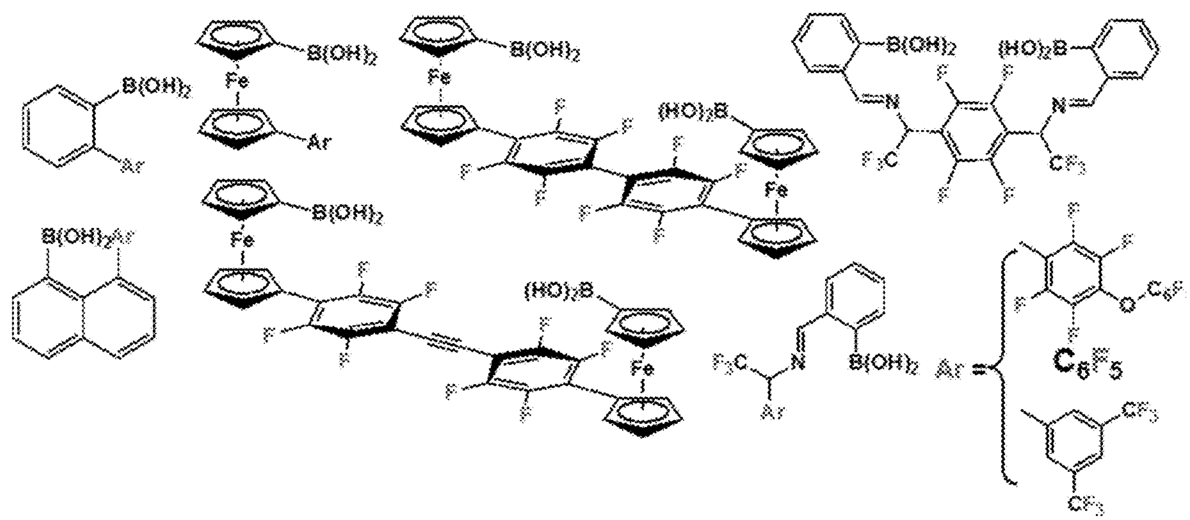
FIG. 7 shows examples of systems that can act as fingerprinting molecules for carbohydrates.
Figure 8:
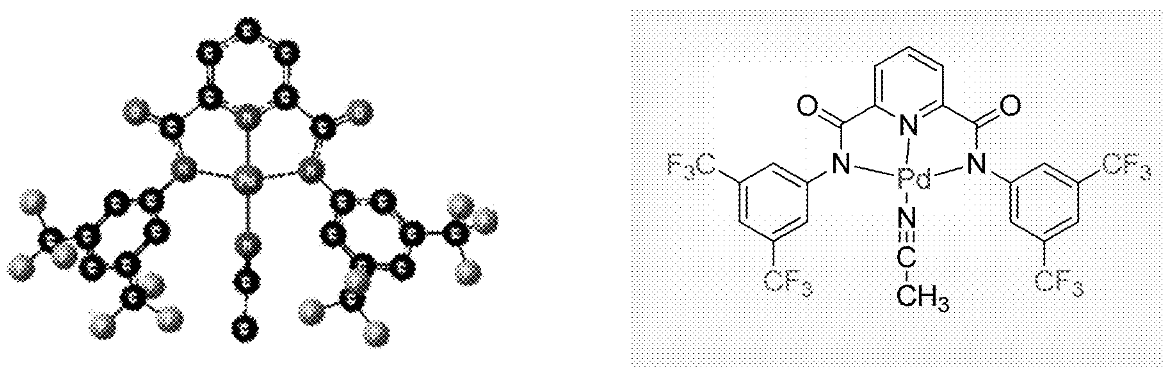
FIG. 8 shows X-ray structure of palladium complex.
Figure 9:
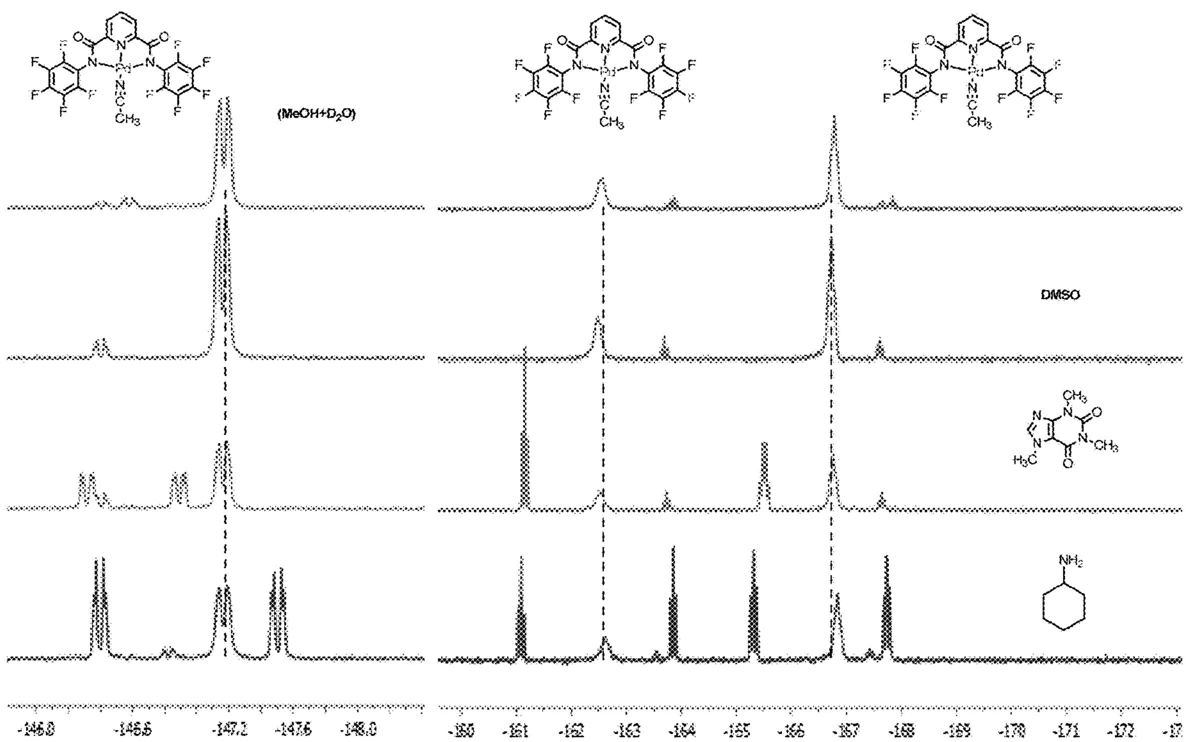
FIG. 9 shows bonding properties of palladium complex.
Figure 10:
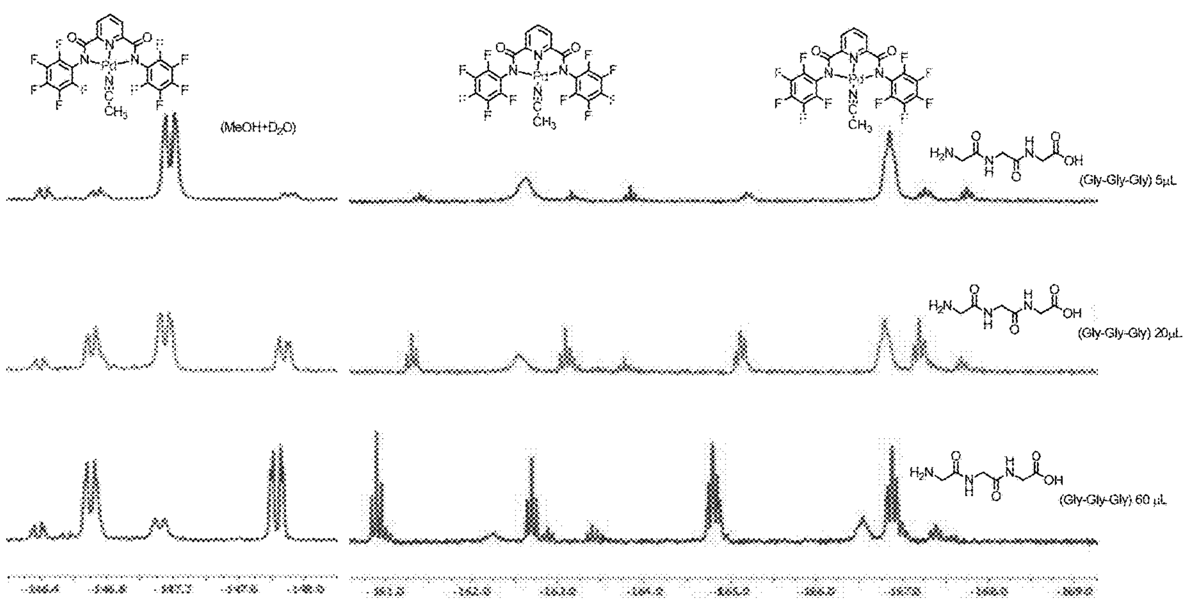
FIG. 10 shows concentration dependence of detection using palladium complex.
Figure 11:
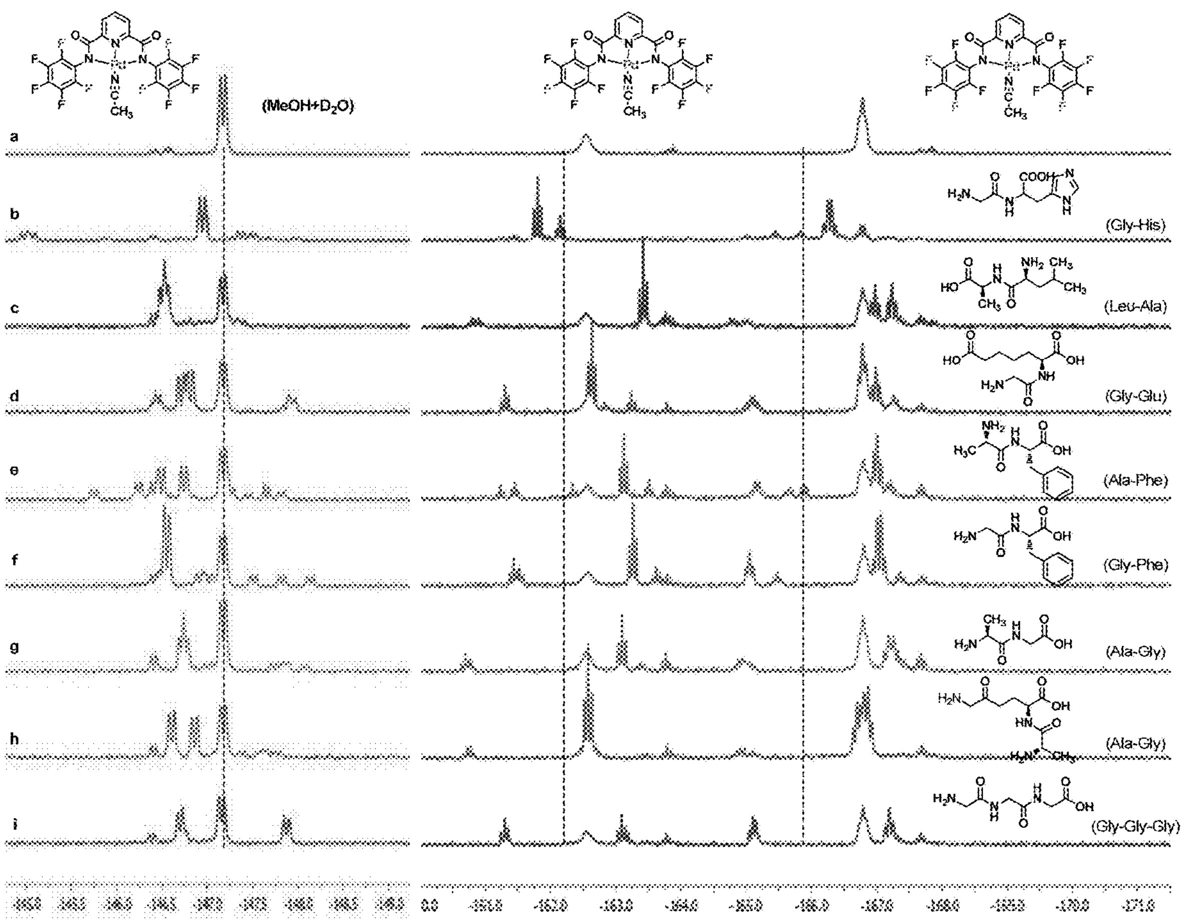
FIG. 11 shows $^{19}F$ NMR data with $C_6F_5$-substituted palladium complex.
Figure 12:
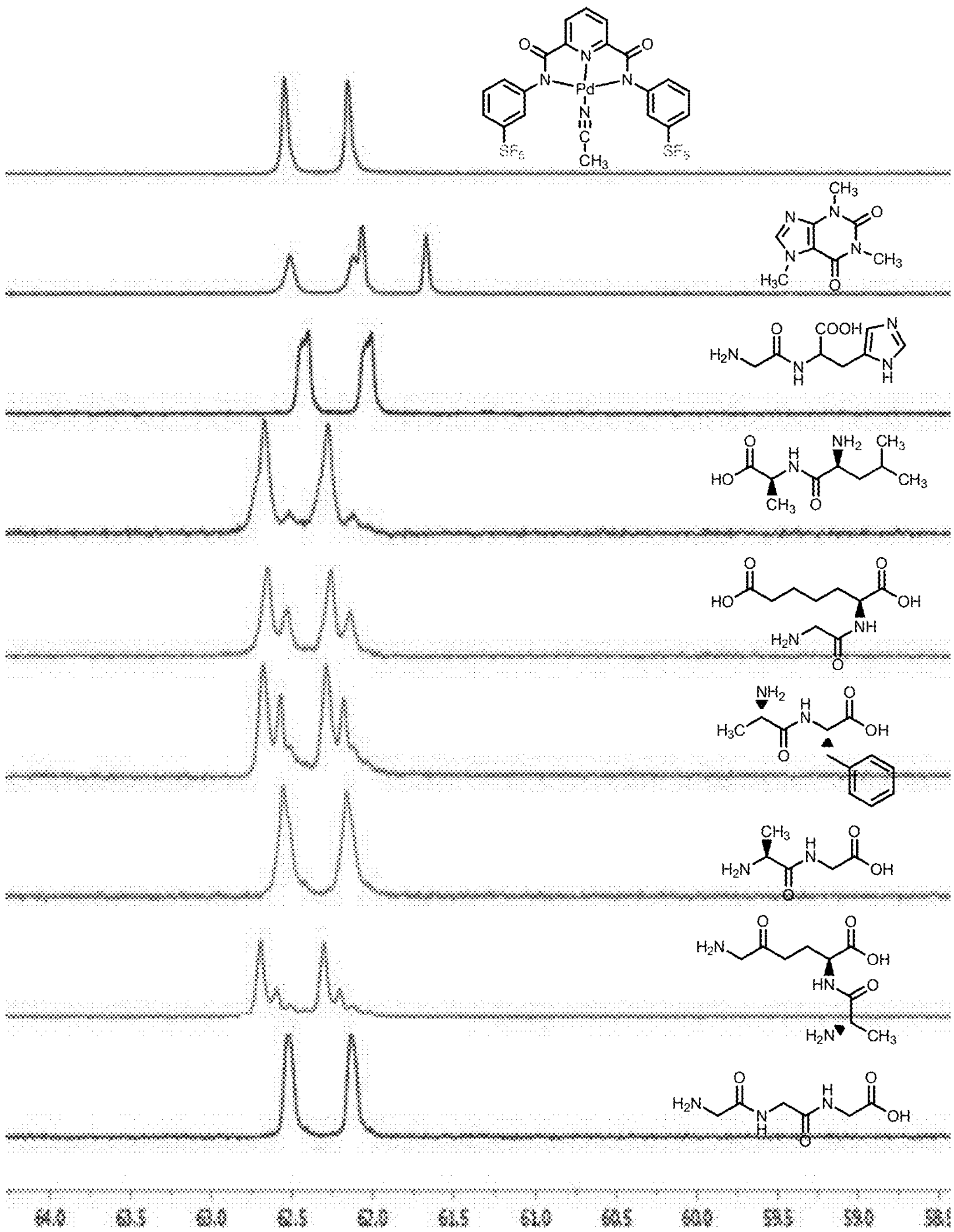
FIG. 12 shows $^{19}F$ NMR data with $SF_5$-substituted palladium complex.
Figure 13:
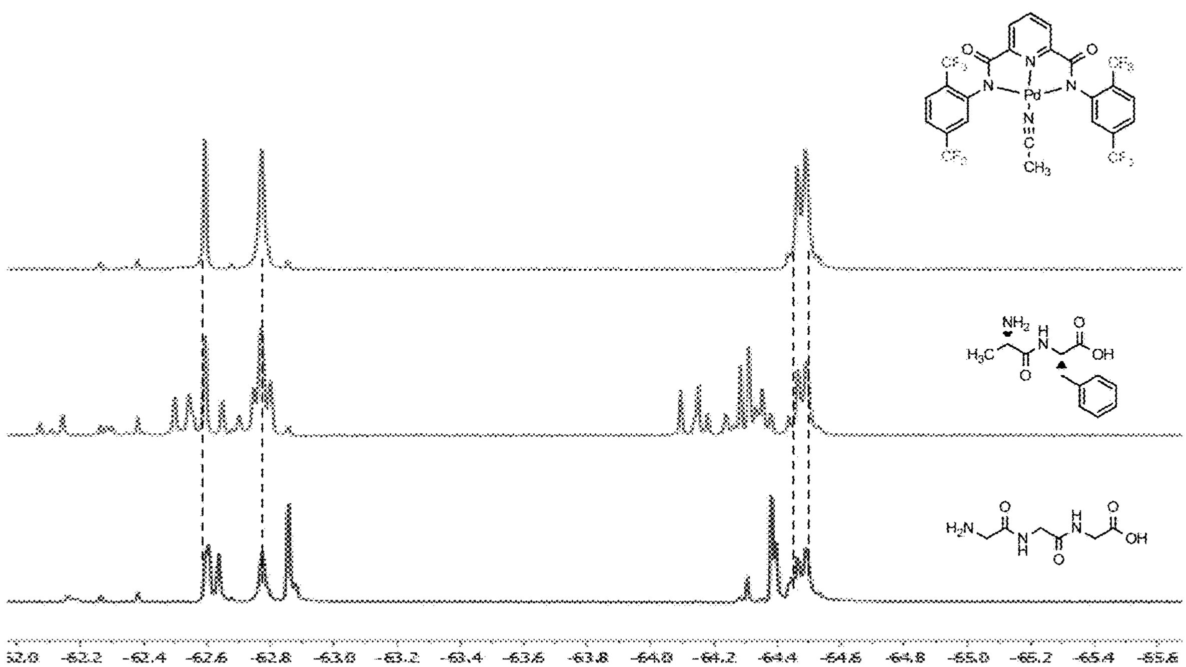
FIG. 13 shows $^{19}F$ NMR data with $CF_3$-substituted palladium complex.

Boronic acid $^{19}F$ probe molecules as shown in FIG. 7 are examples of systems that can act as fingerprinting molecules for carbohydrates.

NMR Fingerprinting with an Array of Receptors.

Figure 14:
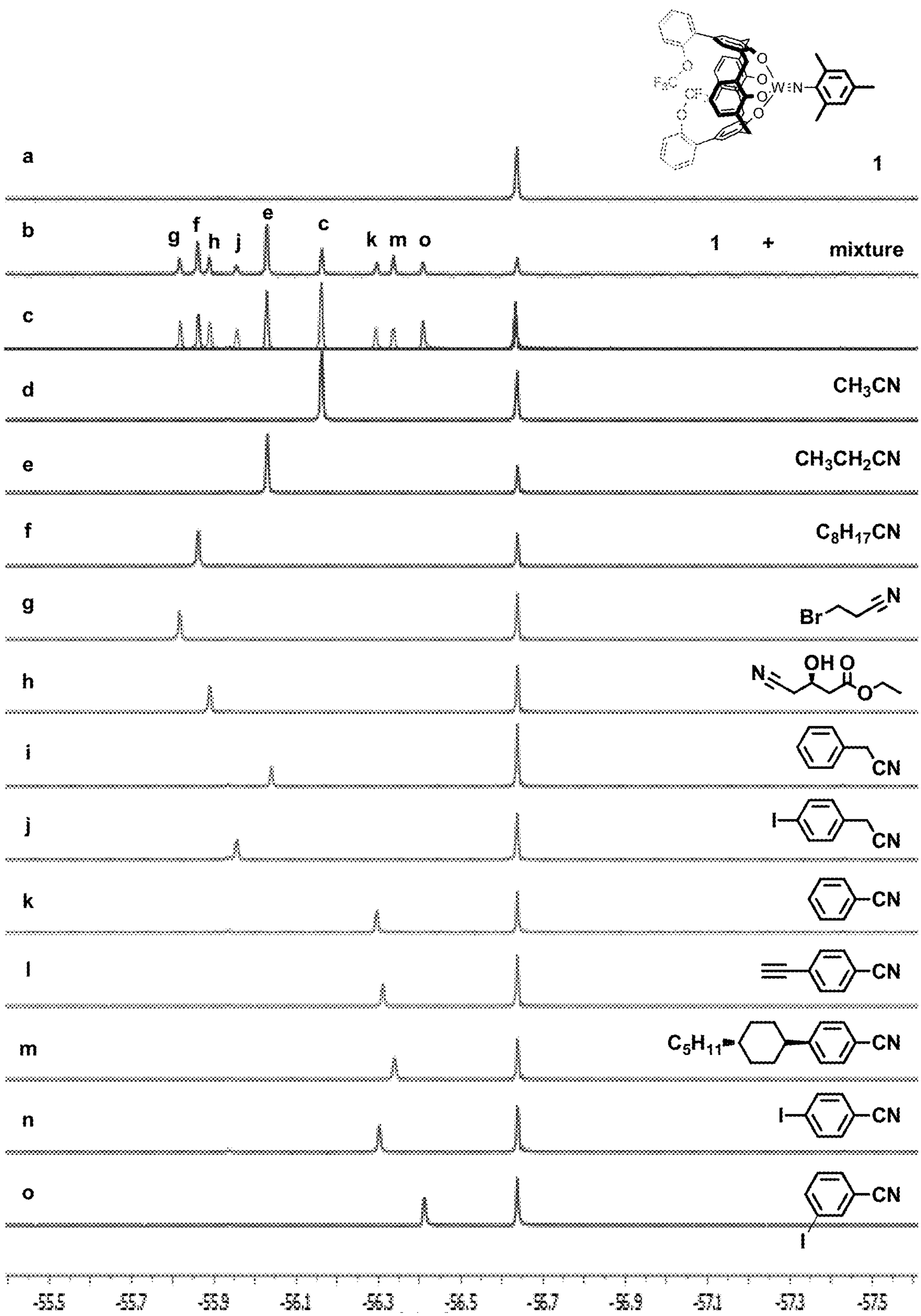
FIG. 14 shows $^{19}F$ NMR spectrum (64 scans) of a mixture of complex 1 (1.0 mM in $CDCl_3$) and different analytes (2.0 mM); in (b), nine nitriles were added to a solution of 1 in $CDCl_3$; (c) shows the superimposition of the spectrum collected independently.

To evaluate the fidelity of this strategy in the precise identification of structurally similar molecules, a series of nitriles containing compounds can be selected with an interest in differentiating pesticides and pharmaceuticals. See, for example, Fleming, F. F. *Nat. Prod. Rep.* 1999, 16, 597; Fleming, F. F.; Yao, L.; Ravikumar, P. C.; Funk, L.; Shook, B. C. *J. Med. Chem.* 2010, 53, 7902, each of which is incorporated by reference in its entirety. There can be robust recognition in arrays of fingerprinting molecules as long as the probes are not competing for the same binding motif (provide orthogonal discriminatory power); arrays can also participate in a complementary molecular recognition. Sensing experiments are performed by adding analytes to chloroform solutions of 1 at ambient temperature. The formation of a static complex with 1 is critical to create a clear shift rather than a dynamic structure that will produce shifts that are more akin to a solvent effect. In this way, the fluorine atoms provide discrete signals at precise shifts that are uniquely assignable to the encapsulated analytes. Notably, the —$OCF_3$ group in the tungsten complex 1 appears as a singlet at −56.63 ppm (FIG. 14, a) which is very close to the shift found with parent calix[4]arene 7 (−56.51 ppm) indicating the remote through-bond effects are not efficient to induce $^{19}F$ NMR shift. In contrast, the binding of nitriles to 1 produces 0.2-0.9 ppm downfield shifts in the $^{19}F$ NMR as a result of the disturbance of the magnetic microenvironment through replacing solvent molecules by the analyte. Consistent with this model, acetonitrile induces a much smaller shift than less electron-donating 3-bromopropionitrile. The results are consistent with the differences in $^{19}F$ NMR of free and bound complex 1 being caused by spatial proximity rather than through-bond electron transmission (FIG. 14*d, g*). The precision in the identification of molecules is illustrated by comparison of the differences induced by the binding of acetonitrile, propionitrile and nonanenitrile with 1. As a result of its larger size, nonanenitrile induces a more pronounced downfield shift than propionitrile and acetonitrile (FIG. 14*d-f*). The power of this method was further evaluated by the analysis of a mixture with a number of potential guest molecules. In this experiment, a mixture of nine different nitriles and 1 gave the same spectrum as obtained by superimposing the spectrum recorded with each analyte independently (FIG. 14*b, c*). It is notable that the precise identification of the multiple neutral organic analytes in a mixture represents a powerful advance in chemical sensing.

The sensing properties of 2-$CF_3$-substituted complex 2 can be explored. Interestingly, although the encapsulation of alkyl nitriles (FIG. 15*d-h*) and benzyl nitriles (FIG. 15*i,j*) produces downfield shifts, which are also observed in the experiments with 1, aromatic nitriles (FIG. 15*k-o*) induced upfield shifts upon binding thus providing a facile way to determine the identity of the analyte. Unlike the trend observed in the experiments with 1, the bonding of 3-bromopropionitrile with 2 gives a smaller downfield shift than acetonitrile and nonanenitrile (FIG. 15*d-g*). This result indicates receptors/sensors with orthogonal discriminatory power wherein the structure of the probe analyte complex produces a unique pattern wherein signals shift independently and in different relative directions can be easily produced by incorporating fluorine atoms at different positions. Similarly, complex 2 also shows the ability to identify a series of nitriles in a complex mixture (FIG. 15*b*).

Figure 15:
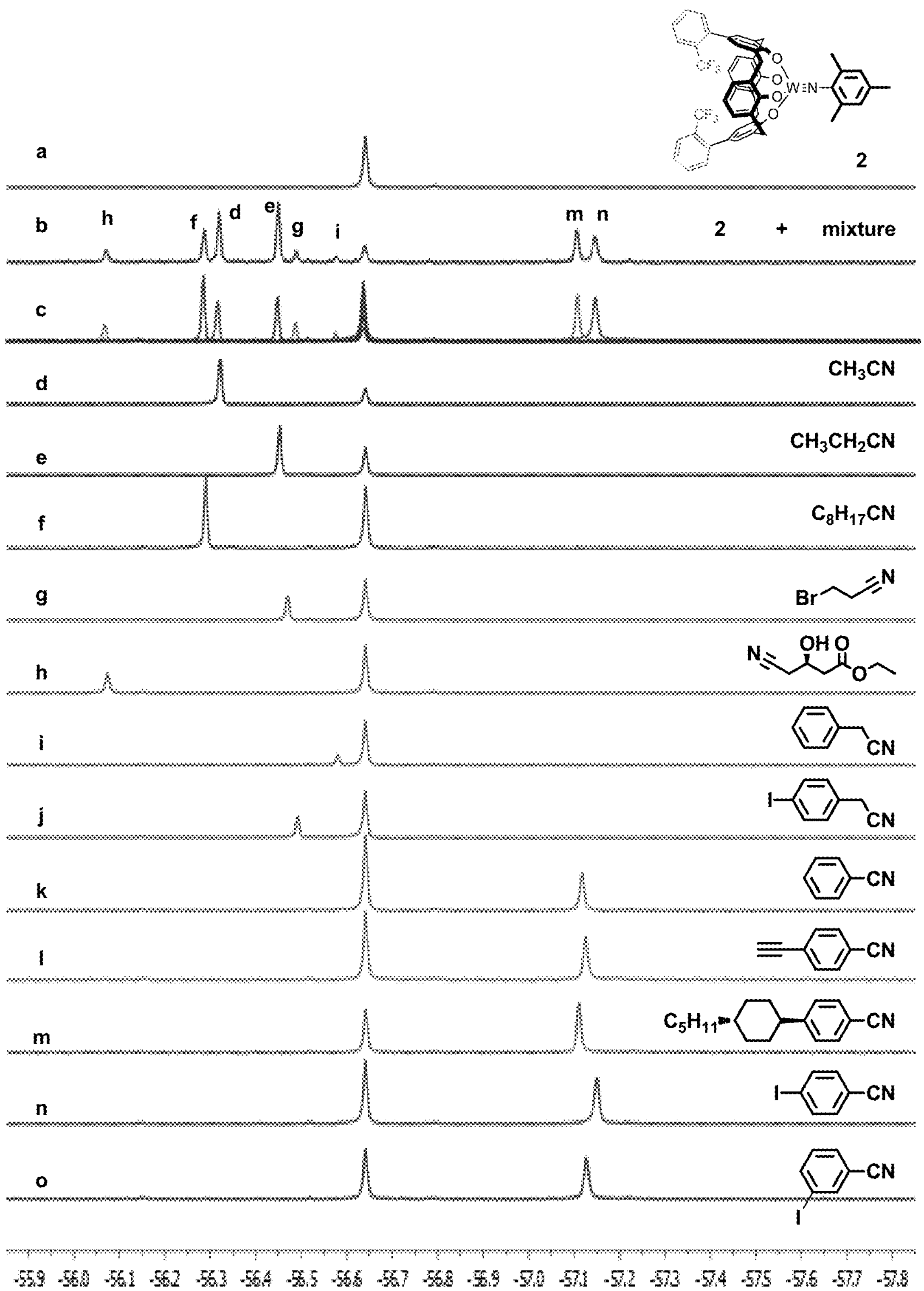
FIG. 15 shows $^{19}F$ NMR spectrum (64 scans) of a mixture of complex 2 (1.0 mM in $CDCl_3$) and different analytes (2.0 mM); in (b), eight nitriles were added to a solution of 2 in $CDCl_3$; (c) shows the superimposition of the spectrum collected independently.
Figure 16:
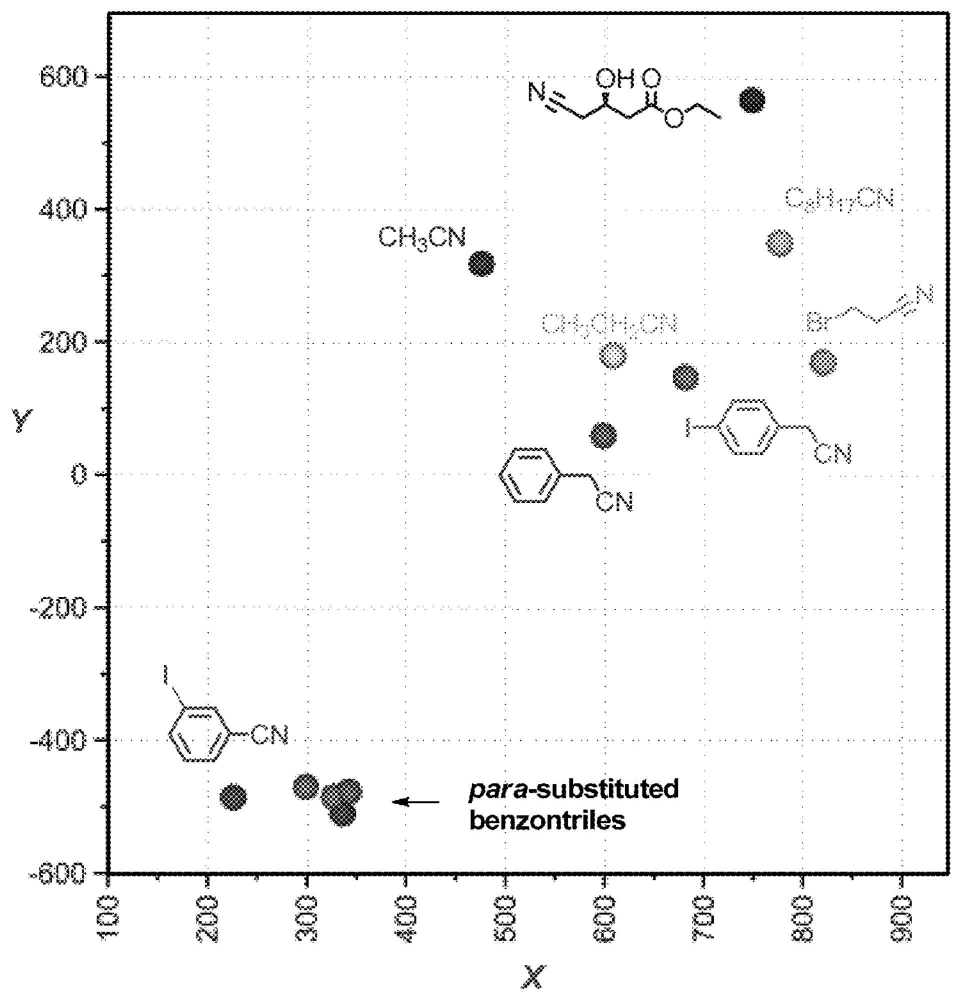
FIG. 16 shows 2D scatter of analytes based on the shifts of $^{19}F$ resonances upon bonding. Axis X: $OCF_3$-fluorine (1) ($-\Delta\delta\times1000$); axis Y: $CF_3$-fluorine (2) ($-\Delta\delta\times1000$).

The differences observed for individual analytes are shown in FIG. 14 and FIG. 15 wherein the characteristic up- and downfield shifts induced by each analyte are given in a two dimensional plot, with the $^{19}F$ resonances of 1 and 2 as the axes (FIG. 16). Simple inspection of this data reveals the ability of the sensor array to resolve all the alkyl- and benzylnitriles.

In contrast, the discrimination of benzonitriles with para-substituents investigated is still not satisfactory probably because the remote substituent only results in minimal magnetic influence on fluorine atoms in receptor 1 and 2. Consistent with this assumption, 3-iodobenzonitrile with the substituent closer to fluorine atom displays different behavior to para-substituted nitriles (FIG. 16). It should be mentioned that a difference of 0.03 ppm leads to a baseline separation of singlet peaks in the $^{19}F$ NMR spectra, which correlates to a magnitude of 30 on the axes used in FIG. 16.

Figure 17:
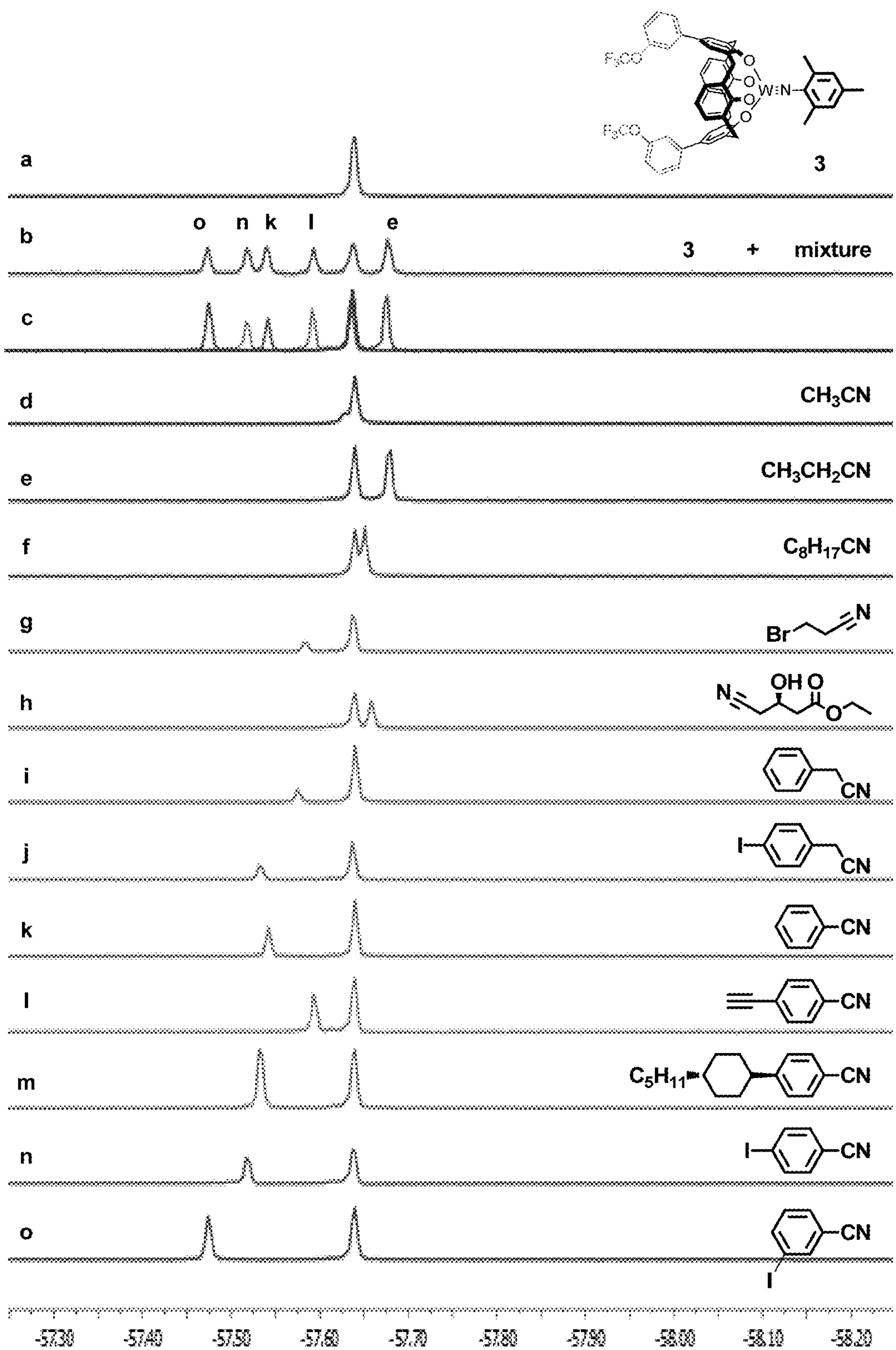
FIG. 17 shows $^{19}F$ NMR spectrum (64 scans) of a mixture of complex 3 (1 mM in $CDCl_3$) and different analytes (2.0 mM); in (b), four aromatic nitriles and propionitrile were added to a solution of 3 in $CDCl_3$; (c) shows the superimposition of the spectrum collected independently.
Figure 18:
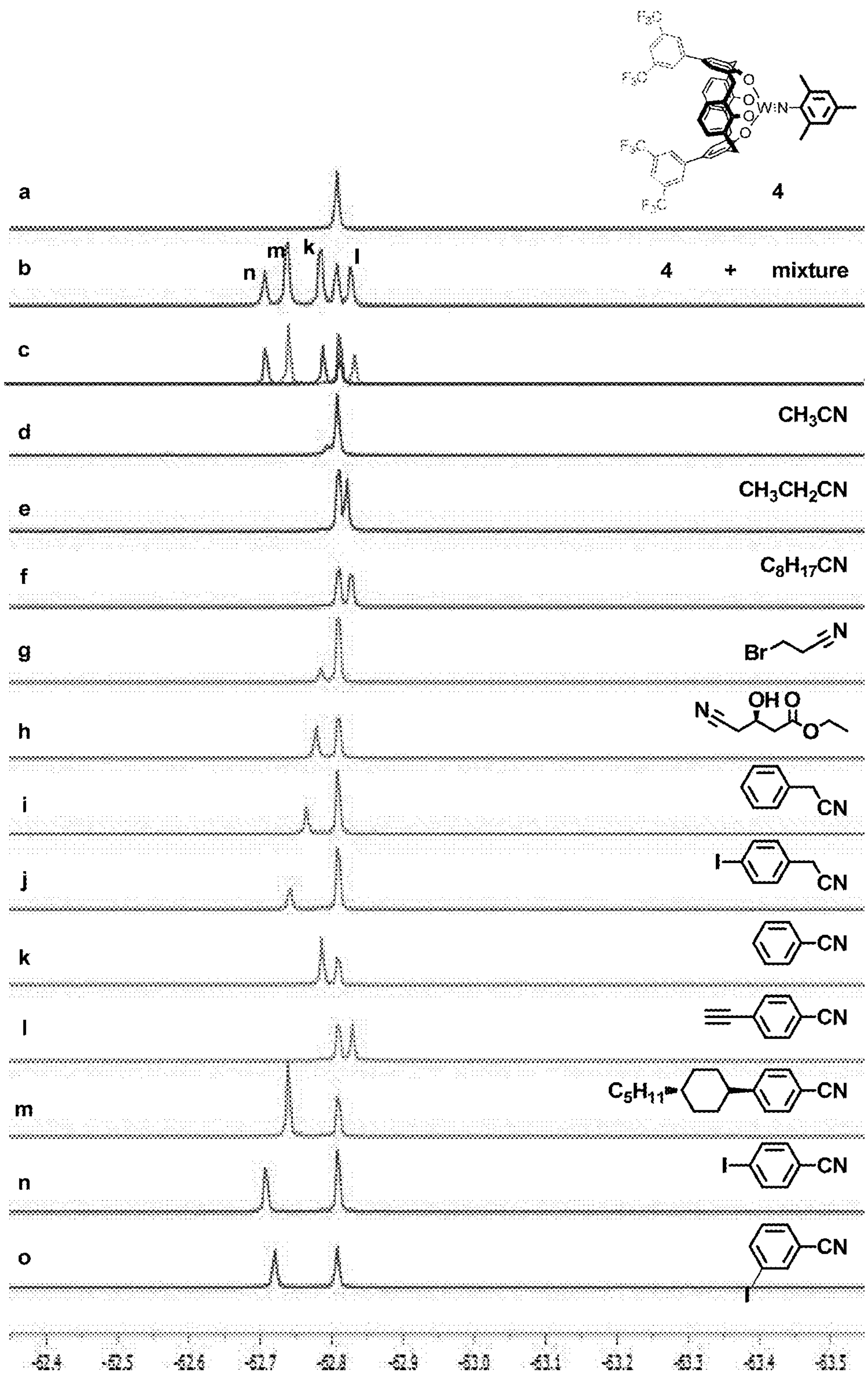
FIG. 18 shows $^{19}F$ NMR spectrum (64 scans) of a mixture of complex 4 (1 mM in $CDCl_3$) and different analytes (2.0 mM); in (b), four aromatic nitriles were added to a solution of 4 in $CDCl_3$; (c) shows the superimposition of the spectrum collected independently.

To achieve better resolution of benzonitriles, complexes 3 and 4 with —$OCF_3$ and —$CF_3$ groups at meta-position, respectively (FIG. 2), can be examined. By design, the fluorine atoms in these complexes are closer to the para-substituent of the nitrile guests, which allows discrimination of this remote structural difference that was not achieved by 1 and 2. As shown in FIGS. 17 and 18, the differences in $^{19}F$ NMR of free and bound complexes are within the range of <0.3 ppm which is smaller than those observed with 1 and 2 suggesting spatial proximity is crucial to induce shifts.

Minimum $^{19}F$ NMR shifts are observed for acetonitrile as a result of its smaller size (FIG. 17*d*, 18*d*). Interestingly, despite the smaller shifts produced, complexes 4 and 5 display improved resolution of benzonitriles relative to complexes 1 and 2 as shown in FIGS. 17*k*-*o* and 18*k*-*o*. The collective results indicate it is possible to rationally design sensors with desired selectivity by optimizing the position of fluorine atoms. Simultaneous discrimination of diverse benzonitriles in a mixture is further demonstrated in the well-separated peaks shown in FIG. 17*b* and FIG. 18*b*.

Figure 19:
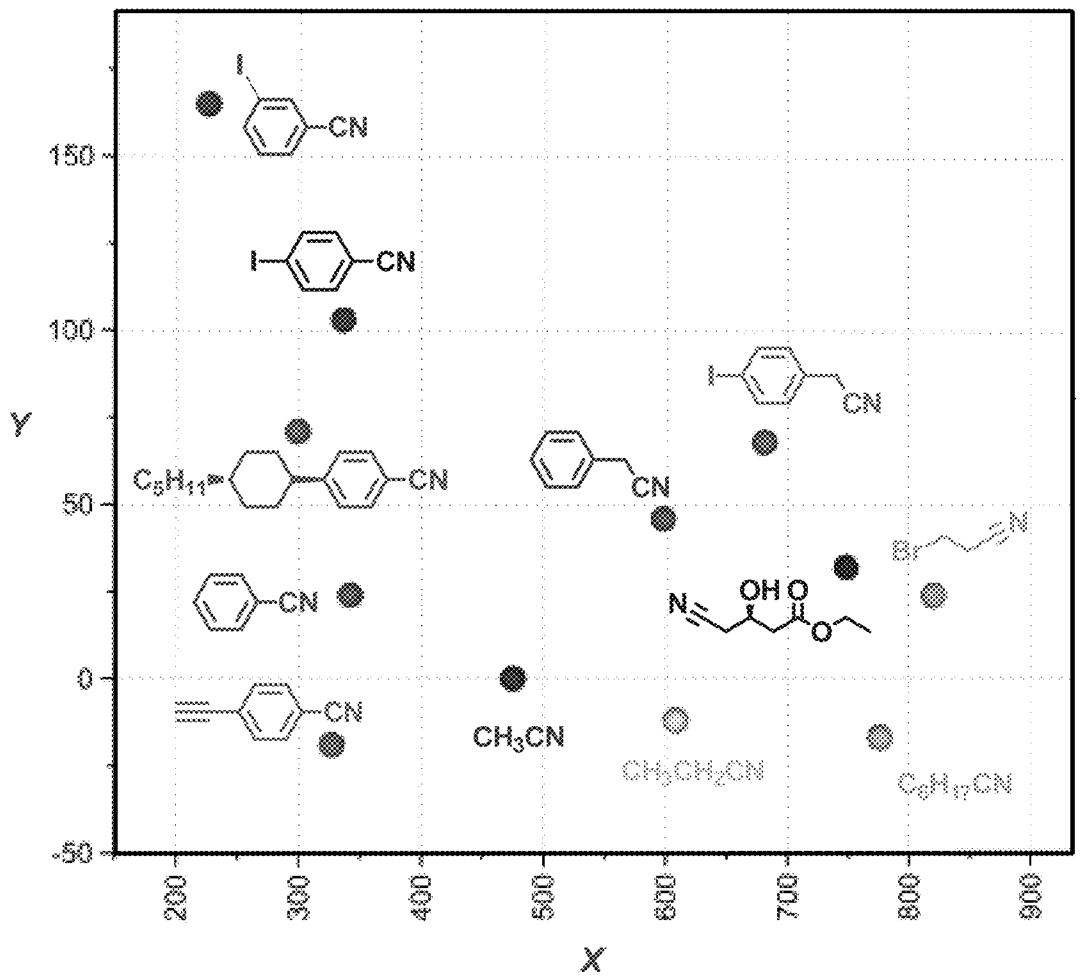
FIG. 19 shows 2D scatter of analytes based on the shifts of $^{19}F$ resonances upon bonding. Axis X: 2-$OCF_3$-fluorine (1) ($-\Delta\delta\times1000$); axis Y: 3,5-$CF_3$-fluorine (4) ($-\Delta\delta\times1000$).
Figure 20:
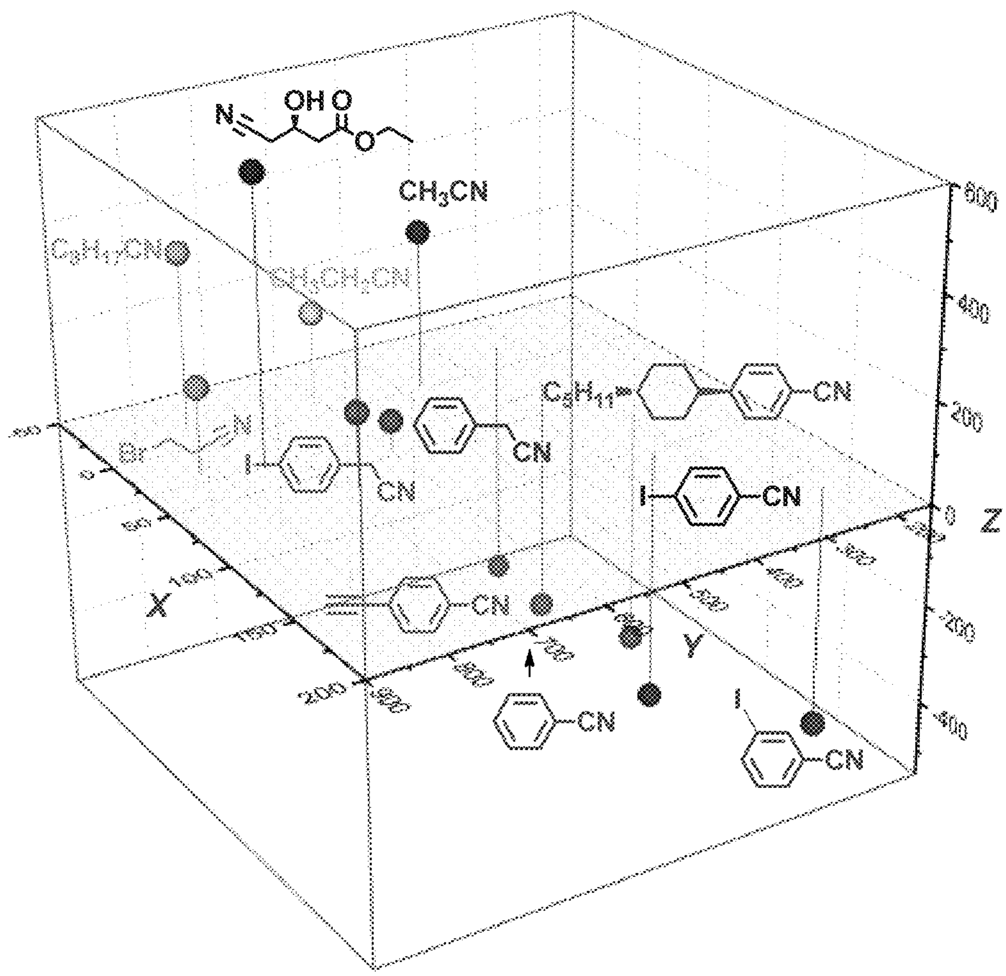
FIG. 20 shows 3D scatter of analytes based on the shifts of $^{19}F$ resonances upon bonding. Axis X: 2-$OCF_3$-fluorine (1) ($-\Delta\delta\times1000$); axis Y: 2-$CF_3$-fluorine (2) ($-\Delta\delta\times1000$); Axis Z: 3,5-$CF_3$-fluorine (4) ($-\Delta\delta\times1000$)

Multiple sensors with orthogonal discriminatory properties allow for higher analyte resolution though a combined analysis of signals from multiple receptors. By orthogonal, it is inferred that different $^{19}F$ NMR signals or the sensor shift in an uncorrelated fashion upon binding with an analyte. FIG. 19 is a plot using the $^{19}F$ NMR differences observed with 1 and 4. As a result of the orthogonal selectivity imparted by the spatial distribution variance, this combination provides better resolution than that shown in FIG. 16 wherein 1 and 2 were employed. Moreover, the resolution can be further enhanced by using signals collected by a third receptor. The use of 1, 2 and 3 enables an interpretable 3D differentiation of all the analytes. As shown in FIG. 20, all aromatic nitriles appear below the XY plane, benzylnitriles give pronounced X values whereas smaller X values were produced by alkyl nitriles. Simple inspection of these figures reveals utility for the facile classification of analytes.

NMR Fingerprinting with a Single Receptor.

Figure 21:
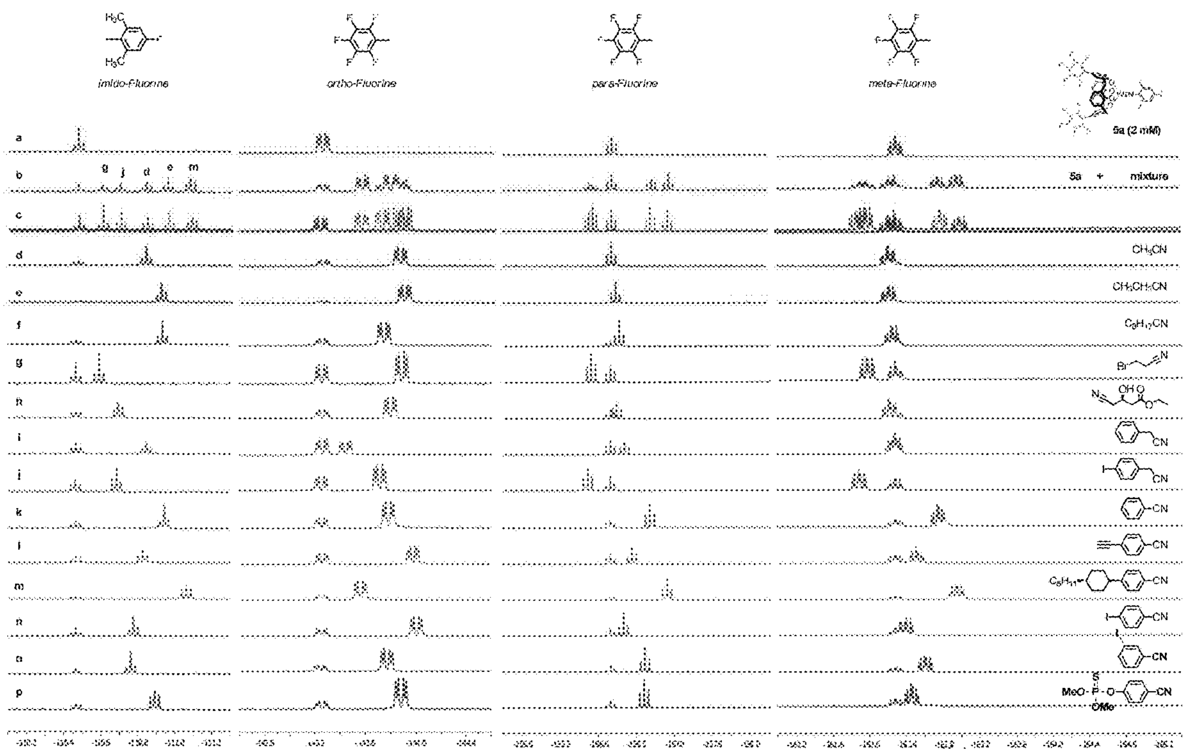
FIG. 21 shows $^{19}F$ NMR spectrum (typically 128 scans) of a mixture of complex 5a (2 mM in $CDCl_3$) and different analytes (5.0 mM); in (b), five nitriles were added to a solution of 5a in $CDCl_3$; (c) shows the superimposition of the spectrum collected independently.

The preceding studies enable the development of a receptor with multiple nonequivalent fluorine atoms that can fingerprint organic nitriles. In this regard, in addition to pentafluorophenyl groups, a fluorine atom can be incorporated on the arylimido group which has been shown to differentiate the electronic donating ability of the bound analytes by $^{19}F$ NMR shifts. By design, the pentafluorophenyl group or 5a spatially arranges fluorine groups in a polarizable π-system to create a magnetic microenvironment capable of differentiating structurally similar analytes (FIG. 21). The NMR experiments were carried out in a similar manner to that of complexes 1-4. As shown in FIG. 21, the imido-fluorine of 5a appears as a triplet at around −100 (t) ppm, and the peaks at −143 (dd), −156 (t), and −162 (m) ppm are identified as ortho, para and meta-fluorine, respectively (FIG. 21*a*). These distinctive chemical shifts provide a multi-dimensional spectroscopic signature without complexity from overlapping $^{19}F$ NMR signals. Binding of nitriles to 6 produces upfield shifts in the $^{19}F$ NMR of the pentafluorophenyl as a result of the shielding effects of the encapsulated molecules. Alkyl nitriles with varying chain length from acetonitrile to nonanenitrile display increasing upfield shifts in the imido-fluorine which correlates with the electron donating ability of these molecules to the tungsten center (FIG. 21-*d*-*g*), and the same trend is observed for substituted aromatic nitriles (FIG. 21*k*-*n*). Pronounced upfield shifts of meta-$^{19}F$ signals are observed with aromatic nitriles and provide a differentiation from the alkyl nitriles investigated (FIG. 21*k*-*o*). In contrast, benzyl nitrile did not induce a shift of meta-$^{19}F$ signals, thereby indicating the importance of the precise position of the aromatic group in the molecular container (FIG. 21*i*). It is also notable that 4-iodobenzonitrile induces less pronounced upfield shifts of meta- and para-$^{19}F$ NMR signals as compared to benzonitrile (FIG. 21, n vs. k) indicating a downfield shifting effect with halide substitution. This trend is also observed for 4-iodobenzyl cyanide and 3-bromopropionitrile, which induce downfield shifts of meta- and para-$^{19}F$ NMR signals. The downfield shifts relative to the uncomplexed receptor are not surprising because only very small upfield shifts are produced by their nonhalogenated analogues (FIG. 21, j vs. i, and g vs. d). Electron rich aromatic nitriles produce a more pronounced upfield shift of meta- and para-$^{19}F$ NMR signals as compared to electron deficient aromatic nitriles and this trend is also displayed by the shifts in the imido-$^{19}F$ NMR signals, which are solely dependent upon the electron donating ability of the nitriles (FIG. 14*k*-*n*). Owing to the polarizable π-system, 5a is more sensitive to the electronic properties of aromatic nitrile than 1-4. As a result of the multiplets of the $^{19}F$ NMR, the overlap of signals produced by each analyte is more likely in the analysis of a complex mixture (FIG. 21*b*).

Figure 37:
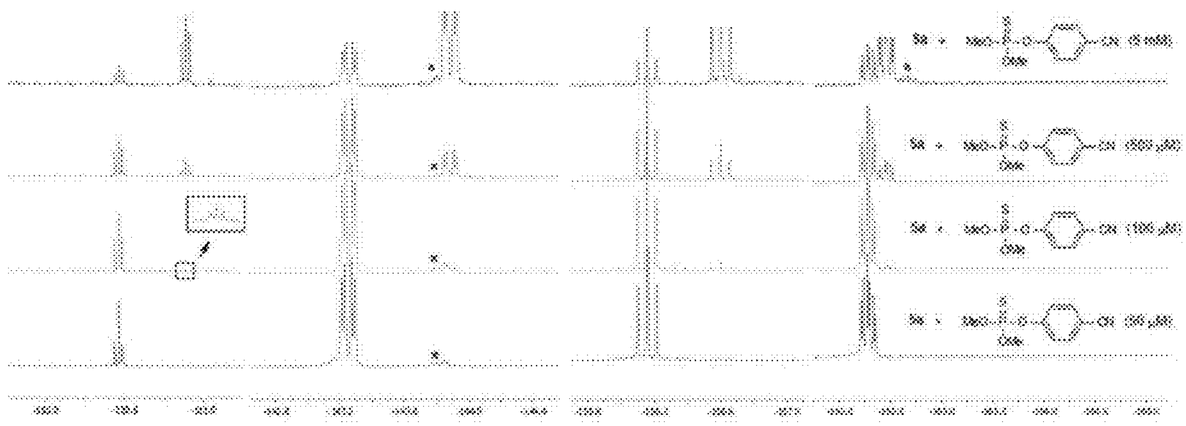
FIG. 37 shows additional $^{19}F$ NMR spectrums-to determine the detection limit and signal to noise ratio of the method for cyanophos. These peaks are identified as 5a (4-cyanophenol), 4-cyanophenol is generated by the fast hydrolysis of cyanophos in $CDCl_3$. The SNR (signal to noise ratio) is calculated using the equation $SNR=2.5\ A/N_{pp}$ (A=height of the chosen peak, $N_{pp}$=peak to peak noise). The SNR was determined to be greater than 15 in the detection of cyanophos at 100 μM.
Figure 38:
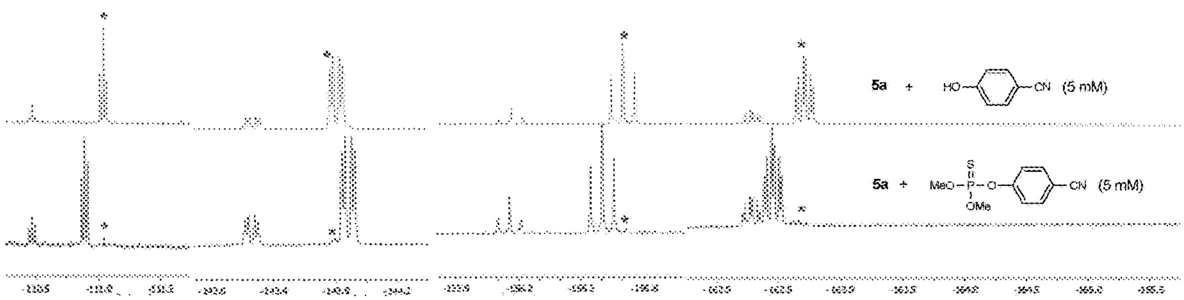
FIG. 38 shows $^{19}F$ NMR spectrum to determine the impurity in the $CDCl_3$ solution of cyanophos.
Figure 39:
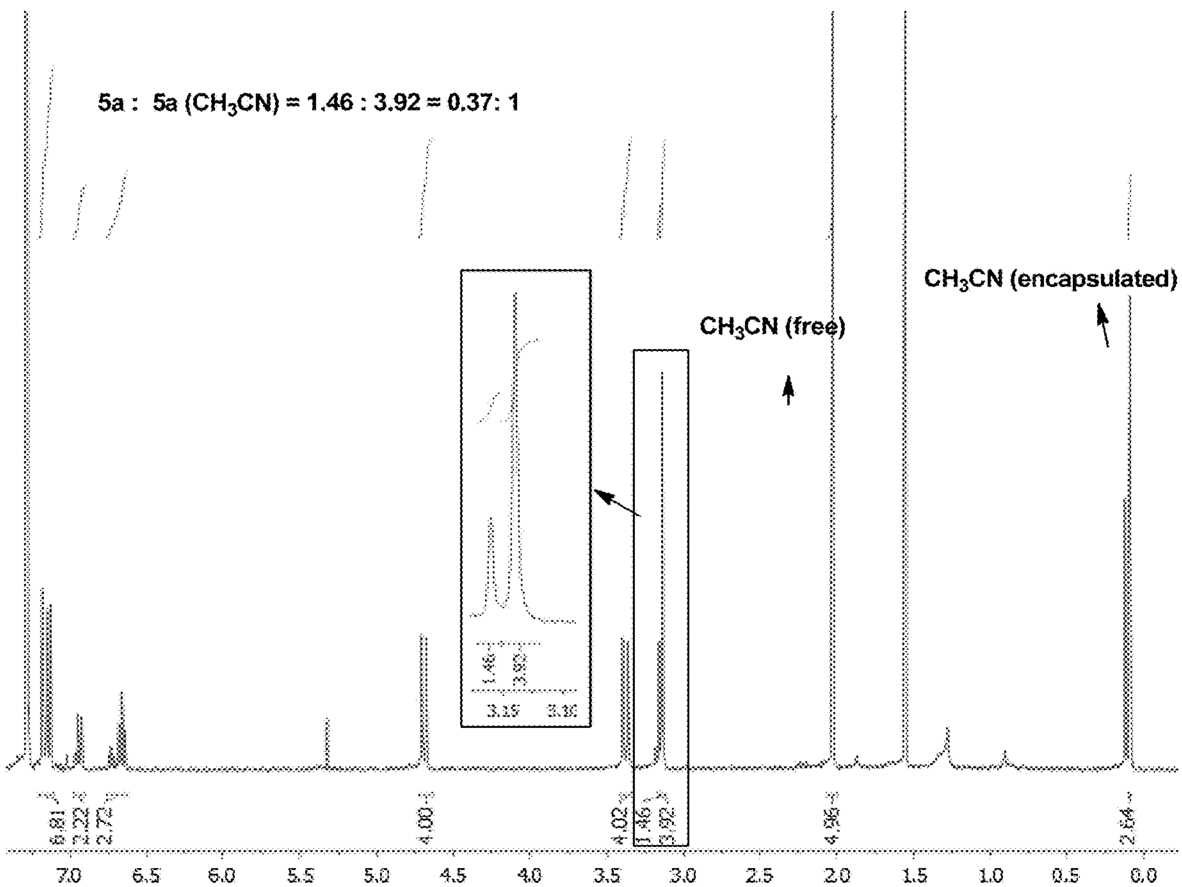
FIG. 39 shows $^{1}H$ NMR spectrum (32 scans) with complex 5a (2 M) and $CH_3CN$ (5 M).
Figure 40:
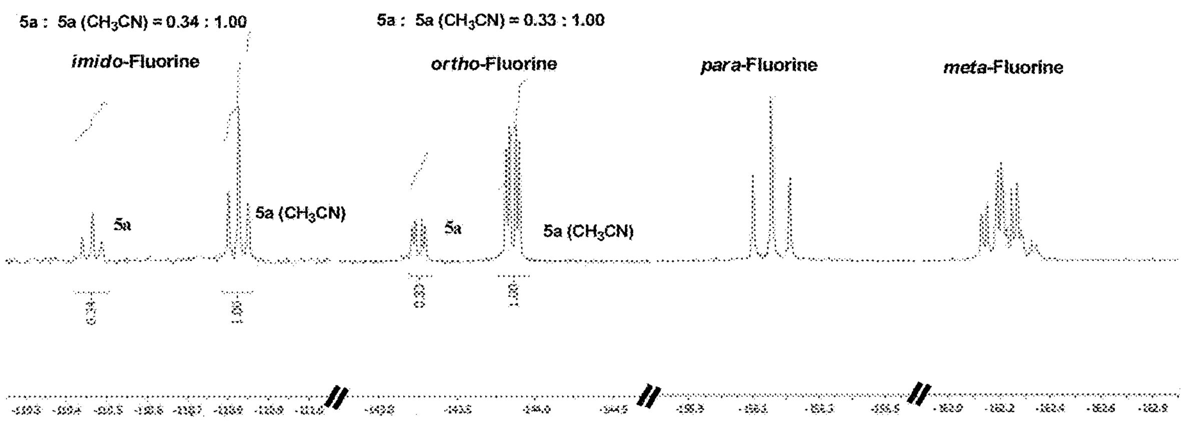
FIG. 40 shows $^{19}F$ NMR spectrum (128 scans) with complex 5a (2 M) and $CH_3CN$ (5 M).
Figure 41:
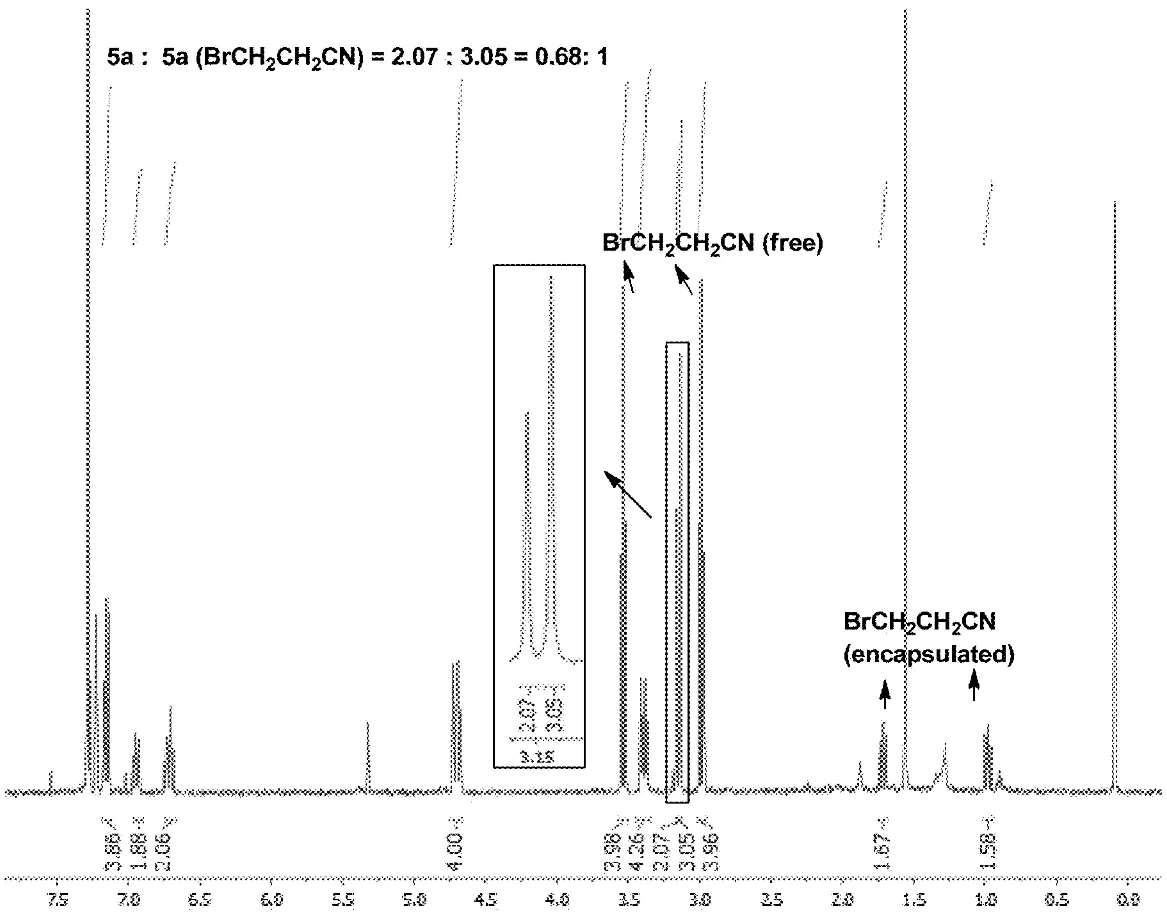
FIG. 41 shows $^{1}H$ NMR spectrum (16 scans) with complex 5a (2 M) and $BrCH_2CH_2CN$ (5 M).
Figure 42:
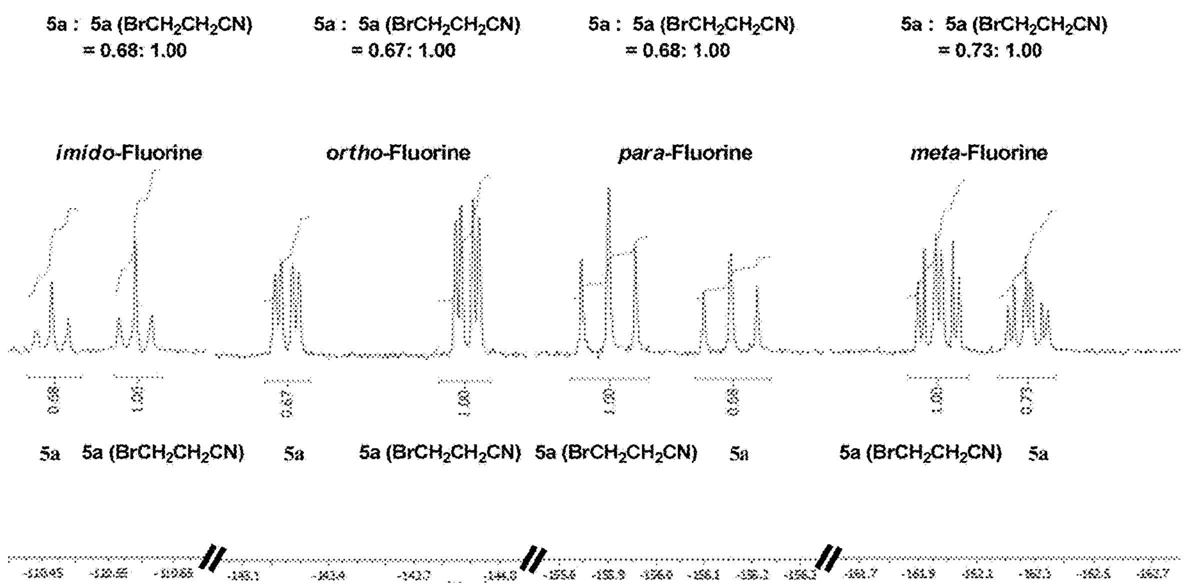
FIG. 42 shows $^{19}F$ NMR spectra (128 scans) with complex 5a (2 M) and $BrCH_2CH_2CN$ (5 M).

The selective detection/identification of insecticides is important considering the widespread usage and toxicity of these chemicals. Cyanophos [O-(4-cyanophenyl) 0,0-dimethyl phosphoro-thioate] is an organophosphorus-based insecticide that is effective against various plant pests. See, for example, Tomlin, C. D. S. *The Pesticide Manual: A World Compendium*; The British Crop Protection Council: Farnham, 1997. pp 282-283; Romeh, A. A. *J. Environ. Health Sci. Eng.* 2014, 12, 38. each of which is incorporated by reference in its entirety. It is a powerful cholinesterase inhibitor and represents a threat to human health. Traditional chemosensing methods typically rely on the bonding or reactions with the Lewis acidic phosphorous group, which is not readily distinguished from structurally related compounds. See, for example, Obare, S. O.; De, C.; Guo, W.; Haywood, T. L.; Samuels, T. A.; Adams, C. P.; Masika, N. O.; Murray, D. H.; Anderson, G. A.; Campbell, K.; Fletcher, K. *Sensors* 2010, 10, 7018; Aragay, G.; Pino, F.; Merkoci, A. *Chem. Rev.* 2012, 112, 5317, each of which is incorporated by reference in its entirety. In contrast, the method generates a fingerprint that precisely distinguishes this compound from all other analytes (FIG. 21*p*). Notably, the characteristic upshift of meta-fluorine enables a fast assignment of cyanophos as an aromatic nitrile. This method was able to provide unambiguous detection of the cyanophos signals (S/N >15) at an analyte concentration of 100 μM using a 400 MHz spectrometer and acquisition time of 24 min (800 scans) (see FIG. 37).

Figure 22:
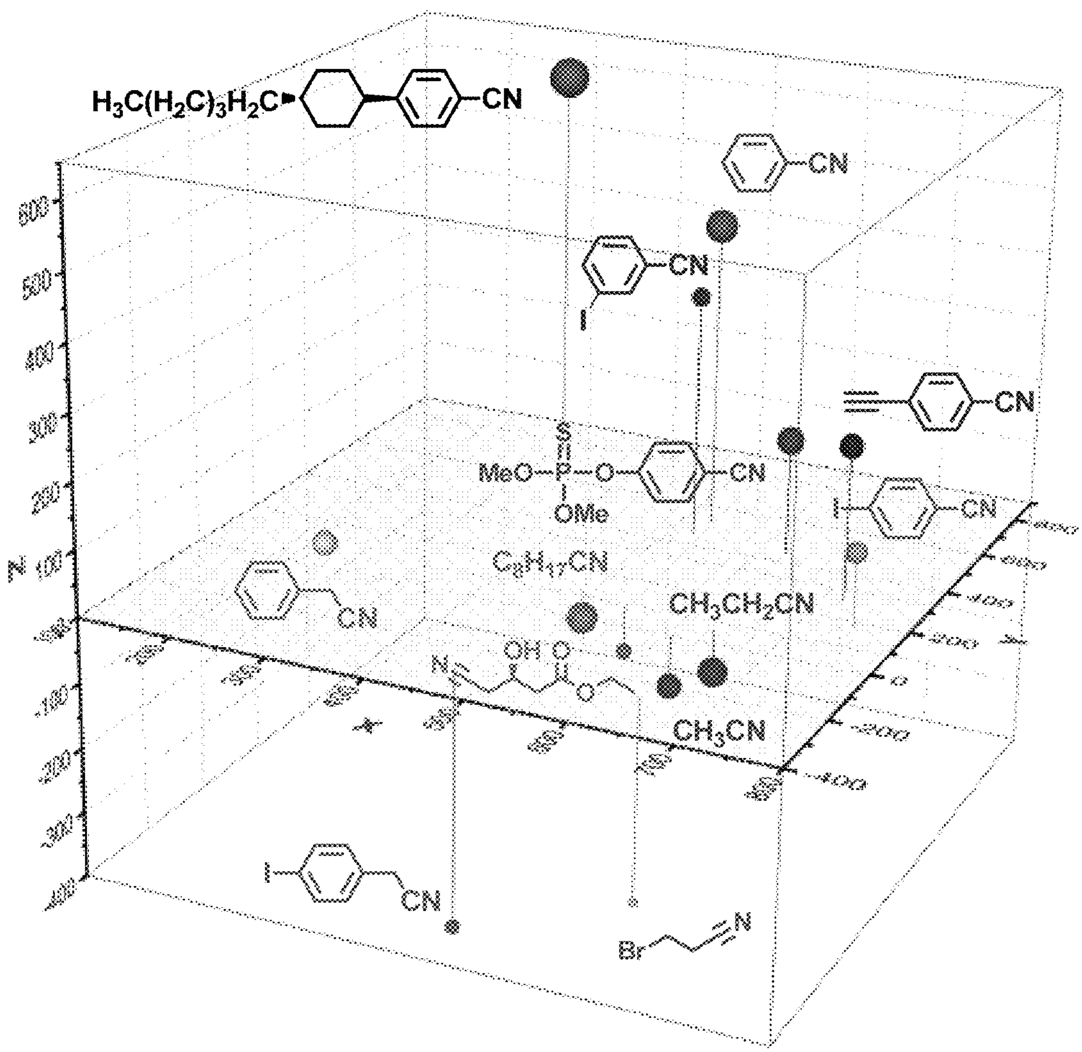
FIG. 22 shows 3D scatter of analytes based on the shifts of $^{19}F$ resonances upon bonding. Axis X: ortho-$^{19}F$ ($-\Delta\delta\times1000$); axis Y: para-$^{19}F$ ($-\Delta\delta\times1000$); axis Z: meta-$^{19}F$ ($-\Delta\delta\times1000$). Sphere size is correlated to imido-$^{19}F$ ($-\Delta\delta\times1000$) with a factor as 0.04.

A three dimensional plot is further shown in FIG. 22, with the o-, p-, and m-$^{19}F$ NMR signals as the axes and the relative shift of the imido-$^{19}F$ NNR signal represented by the size of a sphere. The highly dispensed data points demonstrated the ability of 5a to resolve all the analytes. As expected, nitriles with similar structure display $^{19}F$ NMR signals that are close to one another. For example, acetonitrile and propionitrile (FIG. 21*d,e*) induce similar but differentiated responses. It should be mentioned that the size of the spheres (ability to coordinate to the tungsten center) in FIG. 21 correlate with the shift of imido-fluorine and can further differentiate analytes that produce similar spectral differences in the other $^{19}F$ NMR signals such as ethyl (R)-4-cyano-3-hydroxybutyrate (FIG. 21*h*) and $C_8H_{17}CN$ (FIG. 21*f*).

Association Constants and Detection Limits.

The association constants were measured in chloroform, the concentrations of free and bound complexes are determined by the integration of $^{19}F$ NMR signal, and the concentration of free nitrile is calculated accordingly. In some cases a non-interacting $^{19}F$ NMR signal is added as a reference signal to provide for precise determination of the concentrations of the different species. As shown in Table 1, the magnitude of the bonding constant varies significantly toward different nitriles. For 1 and 2, the constants decrease in the sequence of acetonitrile, benzonitrile and benzyl nitrile.

Figure 43:
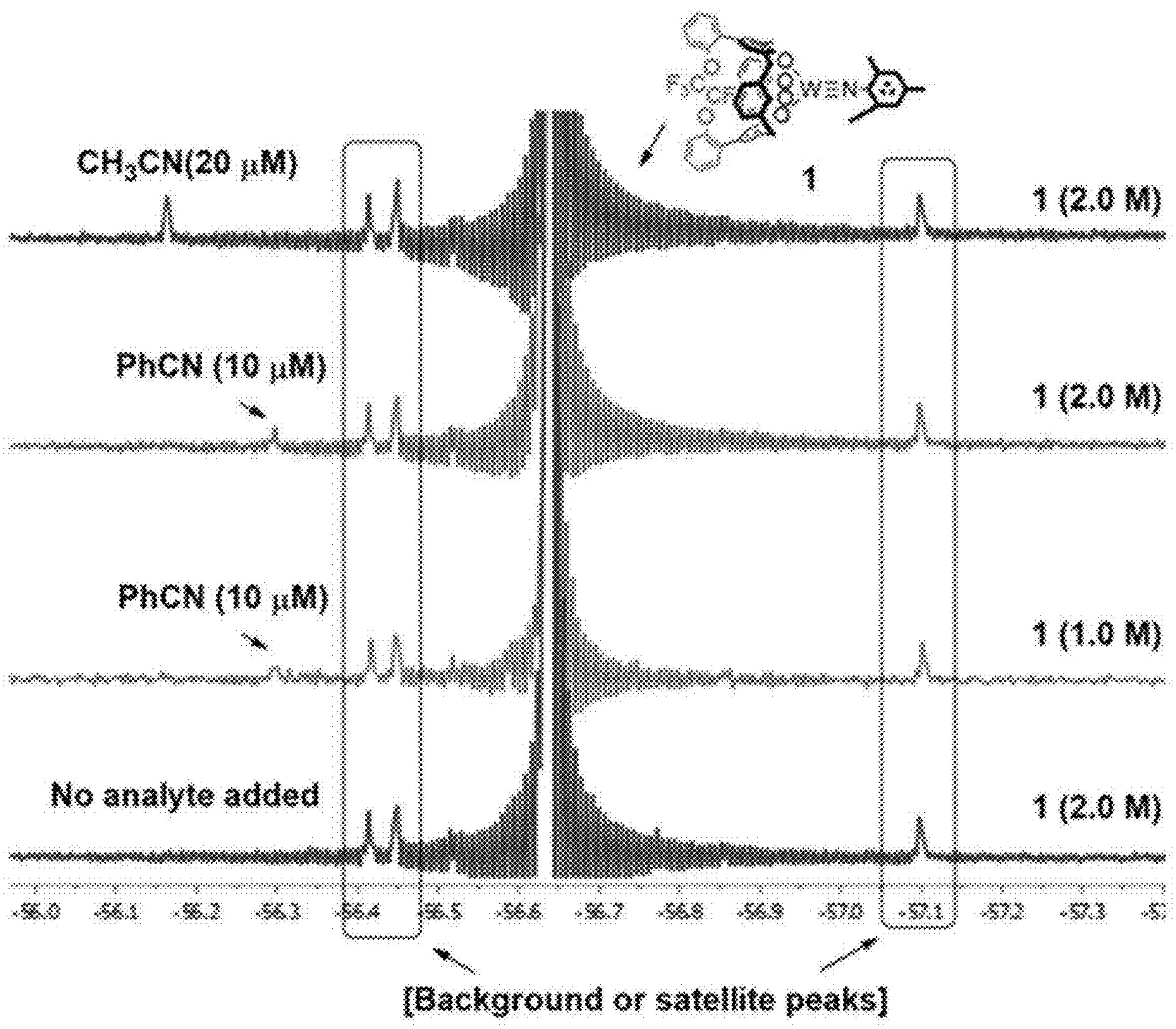
FIG. 43 shows $^{19}F$ NMR spectra to determine the detection limit of PhCN with 1.
Figure 44:
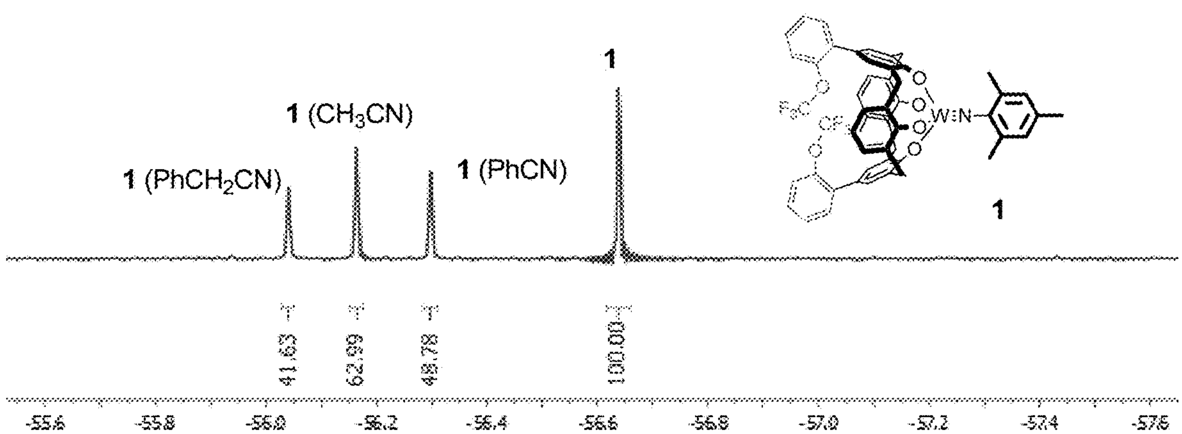
FIG. 44 shows an example of quantitative measurements of multiple analytes based on association constants. Concentrations: 1 (0.87 M), $PhCH_2CN$ (2.58 M), $CH_3CN$ (0.90 M), PhCN (1.62 M). Concentrations calculated based on association constants and concentration of 1: $PhCH_2CN$ (2.49 M), $CH_3CN$ (0.88 M), PhCN (1.58 M).
Figure 45:
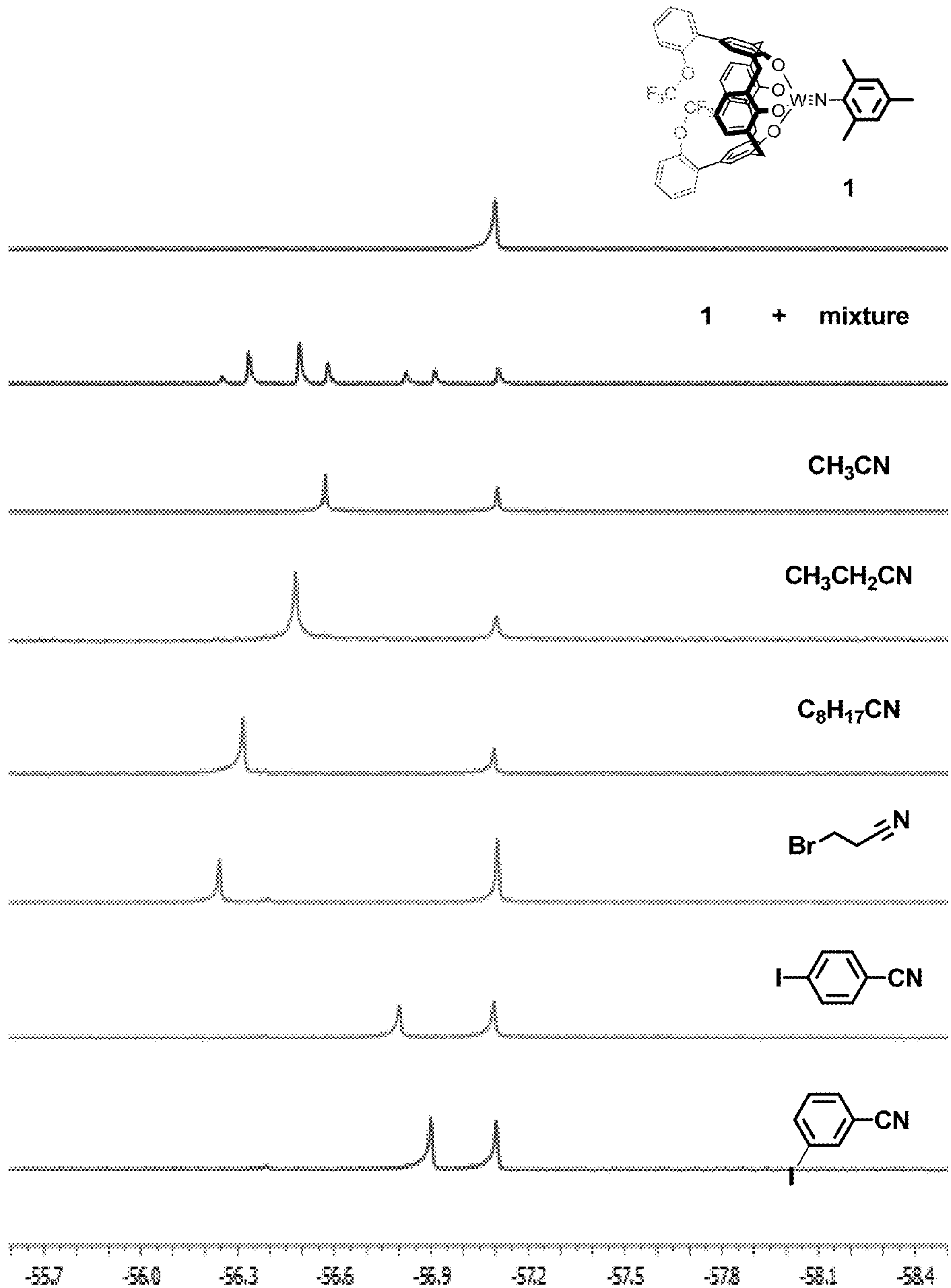
FIG. 45 shows $^{19}F$ NMR spectra (64 scans) with complex 1 and various nitrile in $CH_2Cl_2$.

Significant bonding enhancement of benzonitrile are observed with 4, 5, and 5a indicating the favorable π-π interactions between phenyl ring and electron-deficient 3,5-bis(trifluromethyl)phenyl or pentafluorophenyl groups. Changing the methyl group to fluorine on the arylimido group is beneficial to the binding as a result of the increased Lewis acidity of the tungsten center. Notably, with the association constants, the simultaneous and quantitative measurements of multiple analytes can be achieved based on signal integrations (see FIG. 44). According to the equation (1), the ratio of bound to free analyte equals to K [CalixW(NR)]. For the detection of analyte in presence of excess amount of receptor, [CalixW(NR)] equals to the total complex concentration employed in the analysis. This means, for example, about 45% of the analyte is in the complexed form when detecting trace amount of benzonitrile in presence of 2 M tungsten complex 1. Owing to the six equivalent fluorine atoms and singlet peak, the detection limit of benzonitrile in the presence of 2 M 1 is determined to be down to 10 μM using a 400 MHz spectrometer and acquisition time of 24 min (800 scans) in contrast to the 100 μM detection limit of cyanophos obtained with 5a (see FIG. 43).

$$[CalixW(NR)] + [\text{free analyte}] \underset{}{\overset{K}{\rightleftharpoons}} [CalixW(NR):\text{analyte}] \quad (1)$$

$$\frac{[\text{bound analyte}]}{[\text{free analyte}]} = K\,[CalixW(NR)]$$

TABLE 1

Association Constants ($K/M^{-1}$) of Various Nitriles with Tungsten-Imido Complex[a]

| | 1 | 2 | 3 | 4 | 5 | 5a |
|---|---|---|---|---|---|---|
| K ($CH_3CN$) | 945 | 815 | —[b] | —[b] | 618 | 786 |
| K (PhCN) | 345 | 372 | 279 | 897 | 852 | 1360 |
| K ($PhCH_2CN$) | 177 | 97 | 118 | 219 | 318 | 600 |

[a]Determined by $^{19}F$ NMR in $CDCl_3$. Three measurements at different concentrations are taken and the average is given in the table; error <15%.
[b]Not determined because the signals overlap in both $^1H$ NMR and $^{19}F$ NMR.

Concentrations can also be determined by adding excess sensor and effectively binding all of the analyte present in the sample to be analyzed. By this method, a binding constant need not be determined in advance and the concentration of the analyte can be determined by straight forward integration of the signal intensities against a reference signal generated by a non-interacting $^{19}F$ NMR signal that is added in a precisely determined concentration.

Figure 23:
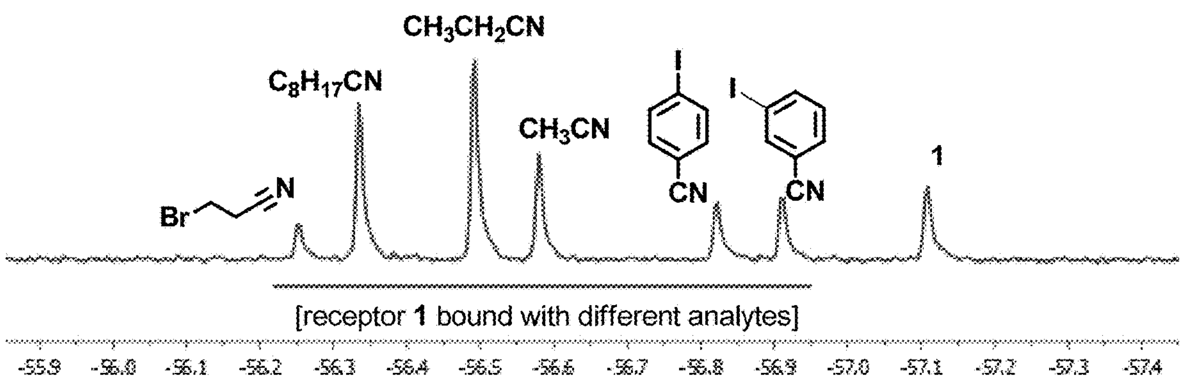
FIG. 23 shows $^{19}F$ NMR spectrum (64 scans) of a mixture of complex 1 (ca. 0.8 mM in $CH_2Cl_2$), various nitriles (each ca. 1.6 mM), hexane (54), ethyl acetate (5 μL) and acetone (5 μL).

The robust sensing power is further demonstrated by the analysis of a complex mixture of various nitriles in presence of an excess amount of hexane, ethyl acetate and acetone with 1. As shown in FIG. 23, non-coordinating analytes, such as hexane, ethyl acetate and acetone did not give signals, while various nitriles can be unambiguously identified simultaneously even in non-deuterated solvent.

Figure 46:
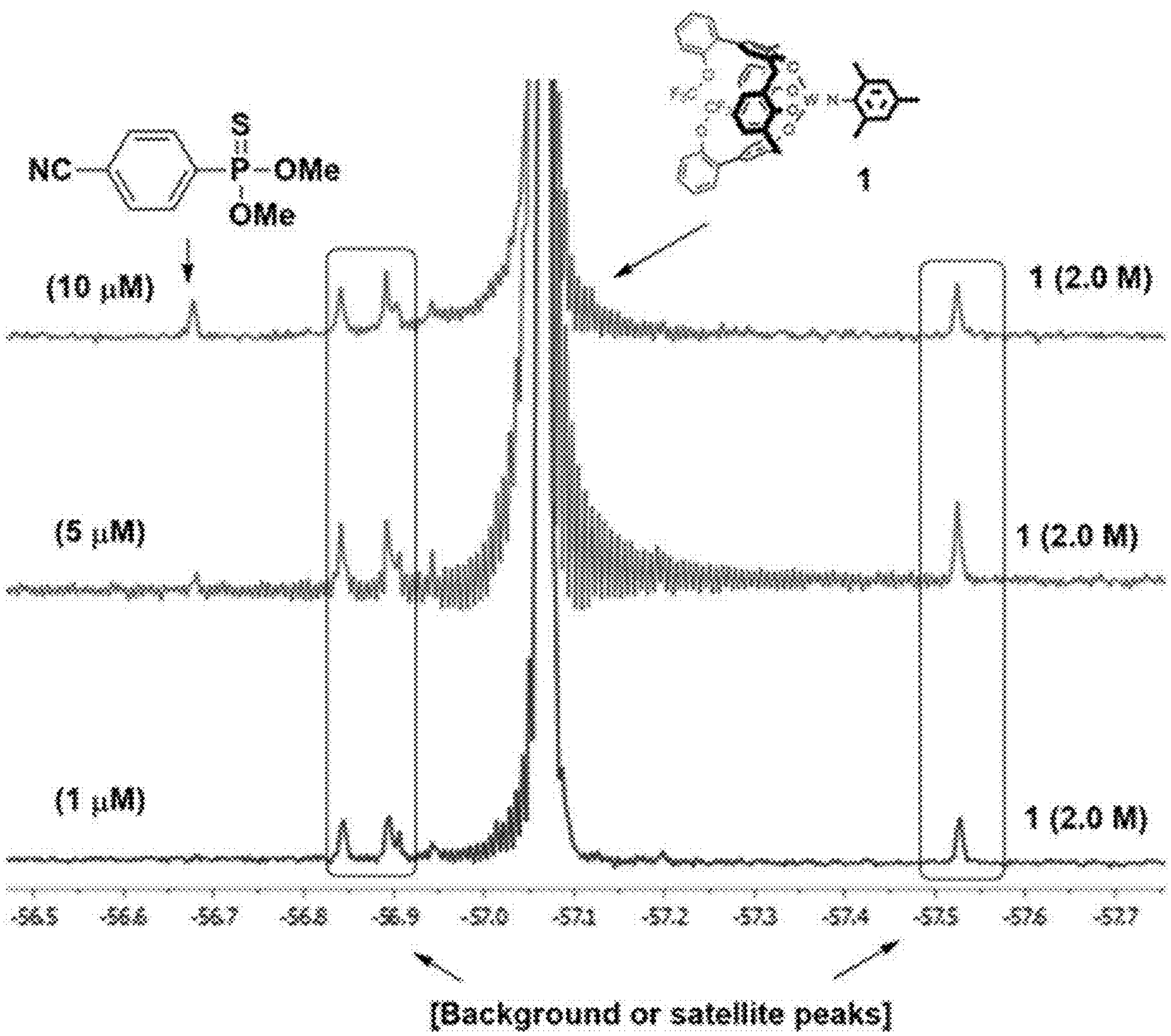
FIG. 46 shows $^{19}F$ NMR experiments to determine the detection limit of cyanophos in river water with 1. In this experiment, river water (5 mL) was extracted with a solution of receptor 1 in dichloromethane (2 M, 0.6 mL), and resulting organic phase was analyzed by $^{19}F$ NMR using a 400 MHz spectrometer and acquisition time of 24 min (800 scans).
Figure 47:
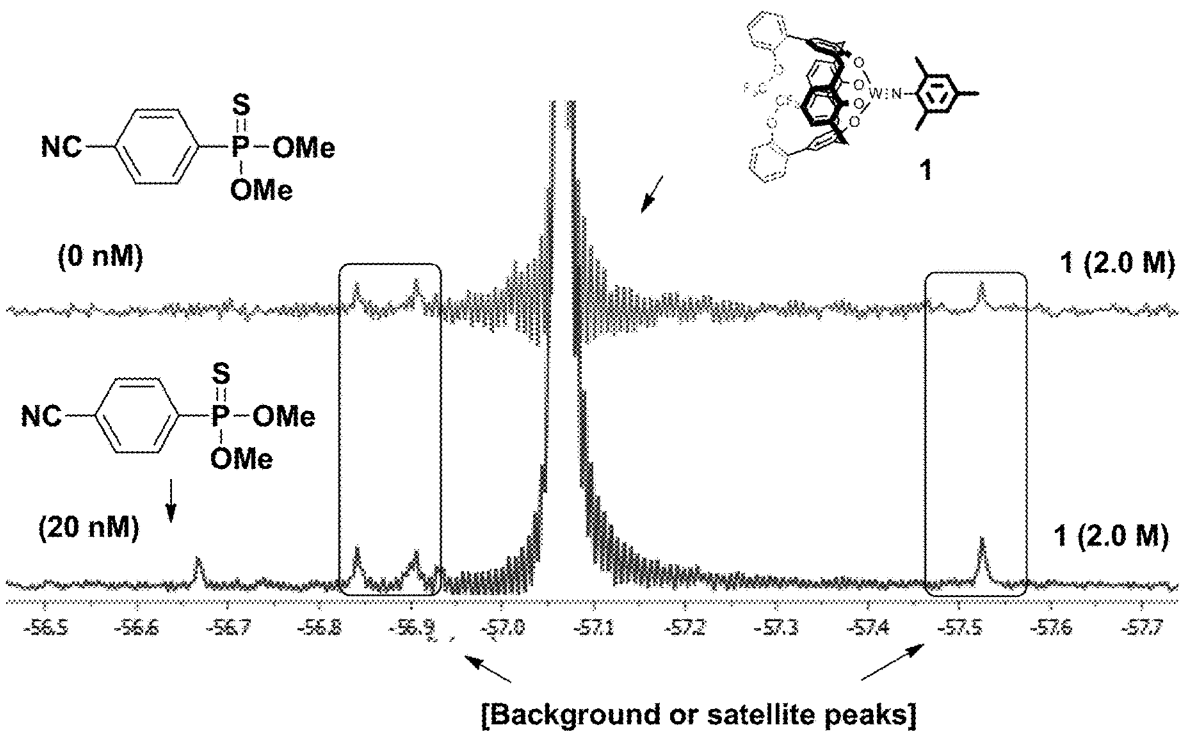
FIG. 47 shows $^{19}F$ NMR experiments to detect cyanophos in river water using extraction enrichment. In this experiment, river water (500 mL) was extracted with dichlormethane (100 mL×3) and concentrated. The extract was then redissolved in a solution of receptor 1 in dichloromethane (2 M, 0.5 mL) and analyzed by $^{19}F$ NMR.
Figure 48:
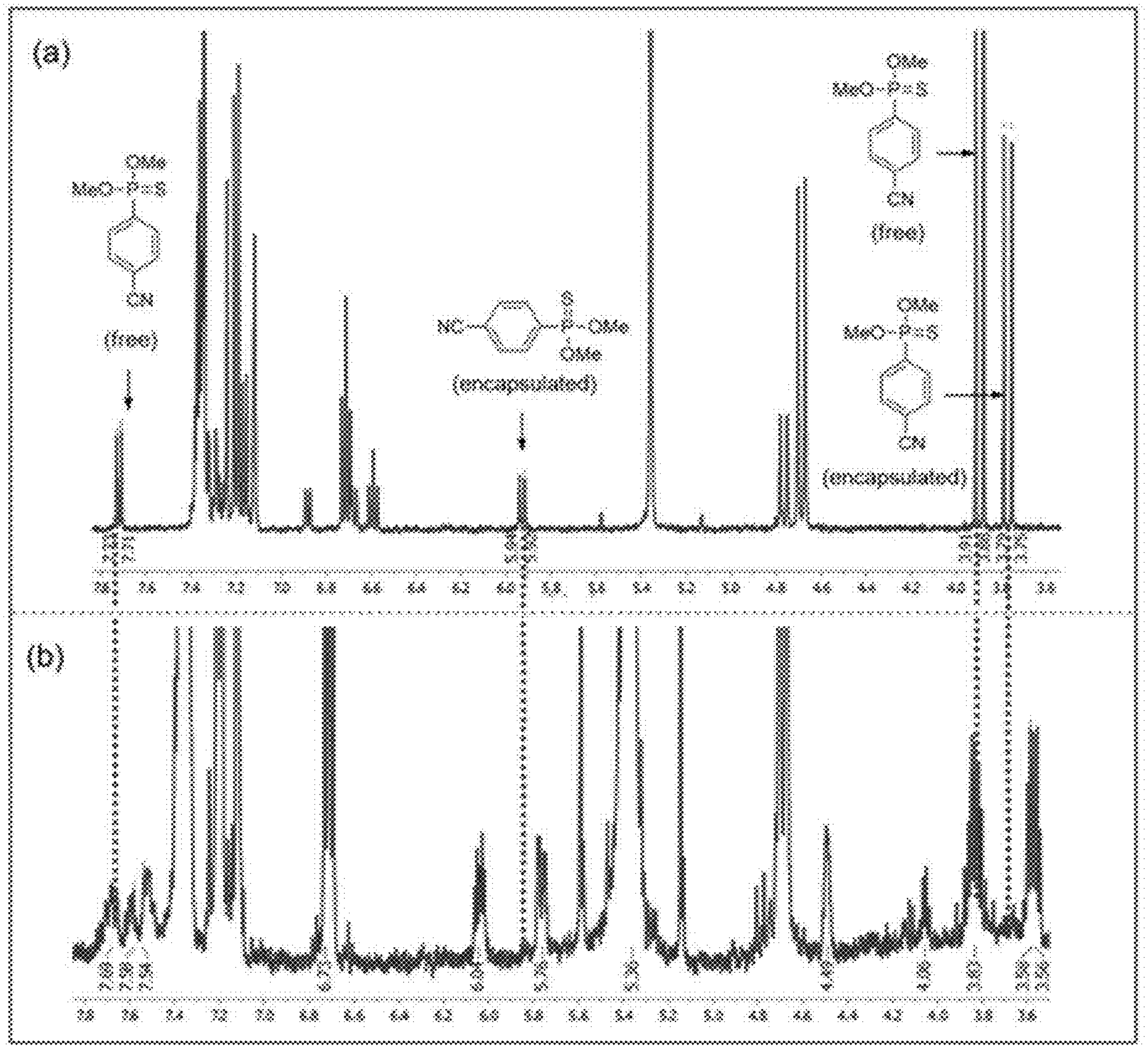
FIG. 48(*a*) shows $^{1}H$ NMR spectra of a mixture of receptor (2 M) 1 and cyanophos (2 M); (b) shows $^{1}H$ NMR spectra of a mixture of receptor (2 M) 1 and extract obtained from extraction of 500 mL water (with cyanophos at 20 nM). Due to the presence of a number of unidentified species at much higher concentrations than cyanophos, the identification of cyanophos in this spectra is unsuccessful.
Figure 49:
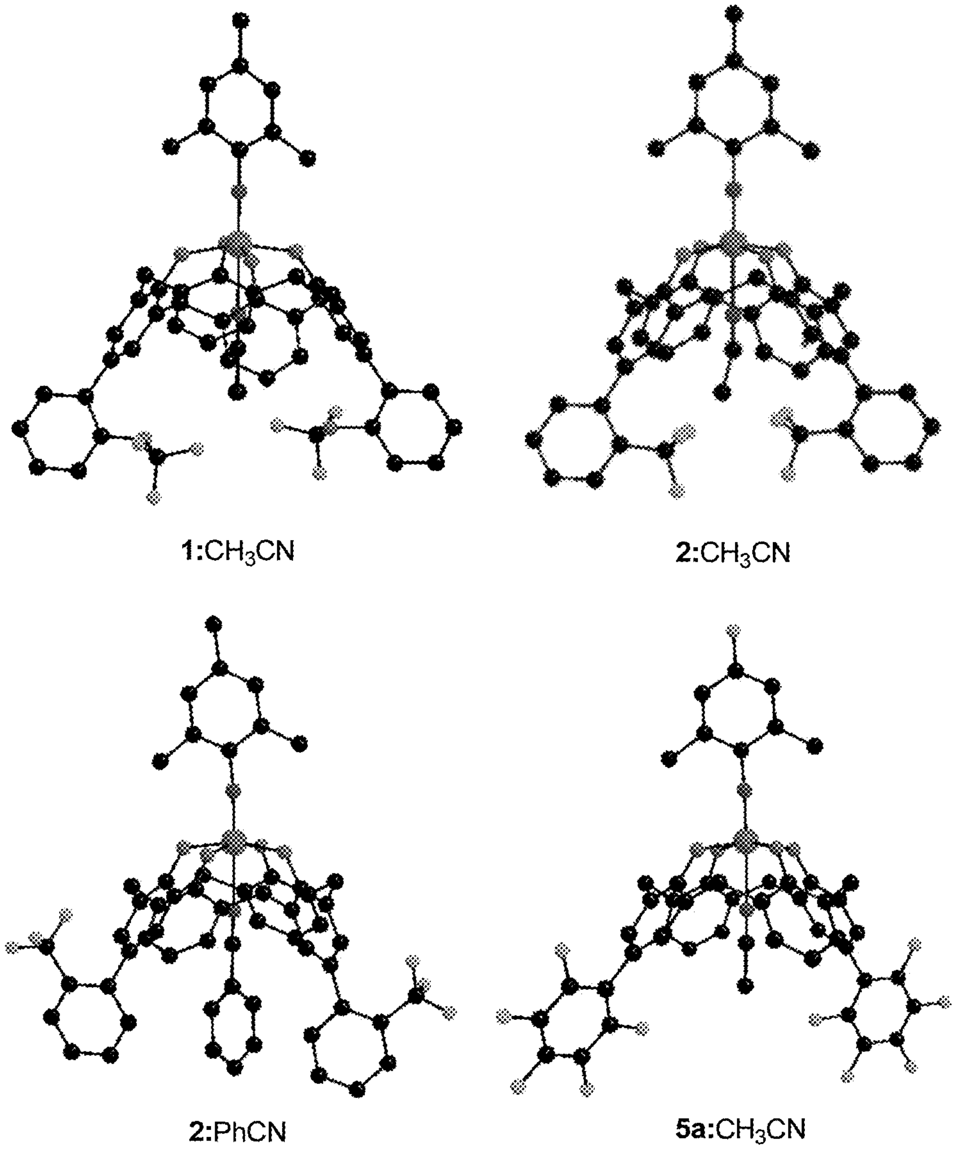
FIG. 49 shows X-ray Structures of 1, 2, and 5a (1:1 Cocrystal with $CH_3CN$ or PhCN). Black=carbon, green=fluorine, blue=nitrogen, red=oxygen, purple=tungsten. The methyl groups of the acetonitriles in 1: $CH_3CN$ and 2: $CH_3CN$ are disordered about the crystallographic twofold axis. 1: $CH_3CN$, 2: $CH_3CN$, 2: PhCN and 5a: $CH_3CN$.
Figure 50:
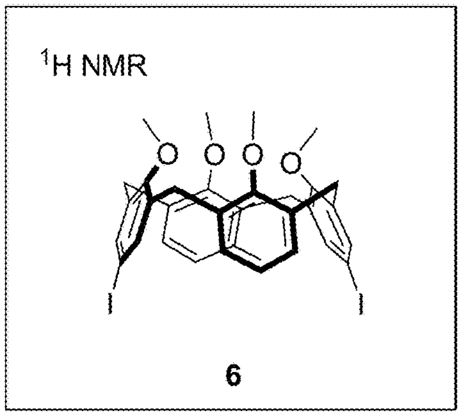
FIG. 50 shows $^{1}H$ NMR spectrum of complex 6.
Figure 50:
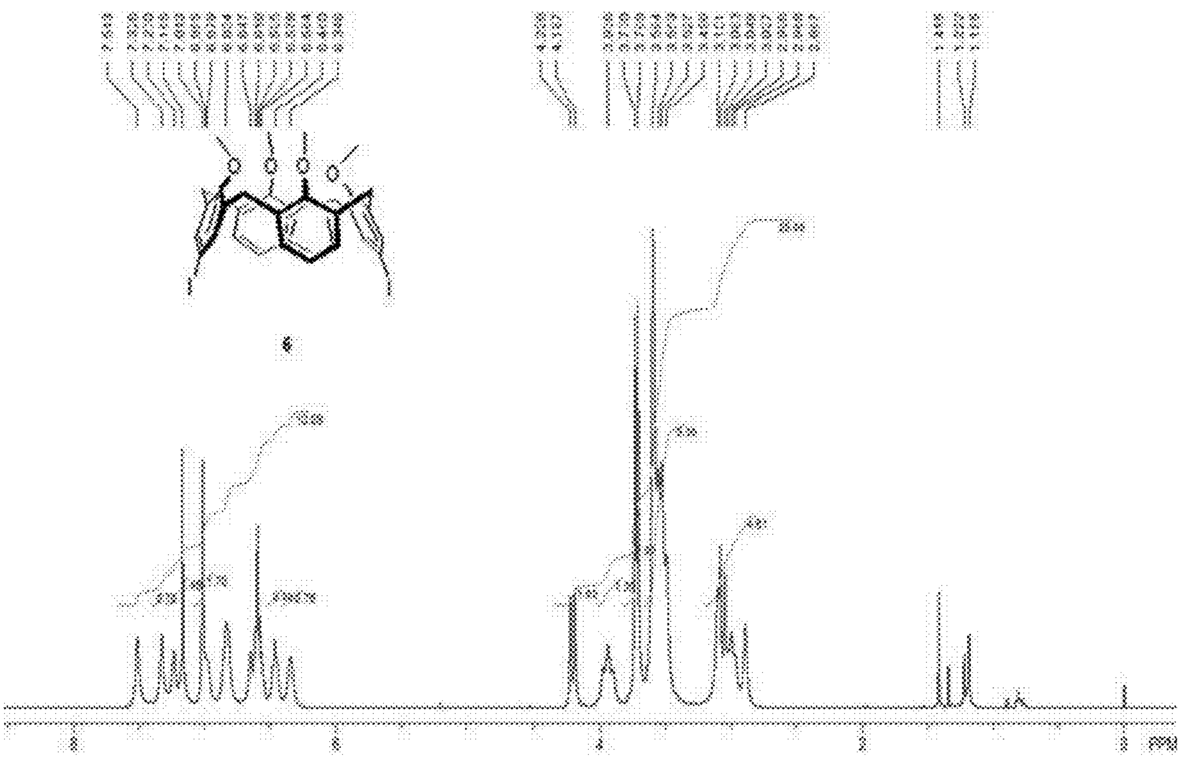
Figure 51:
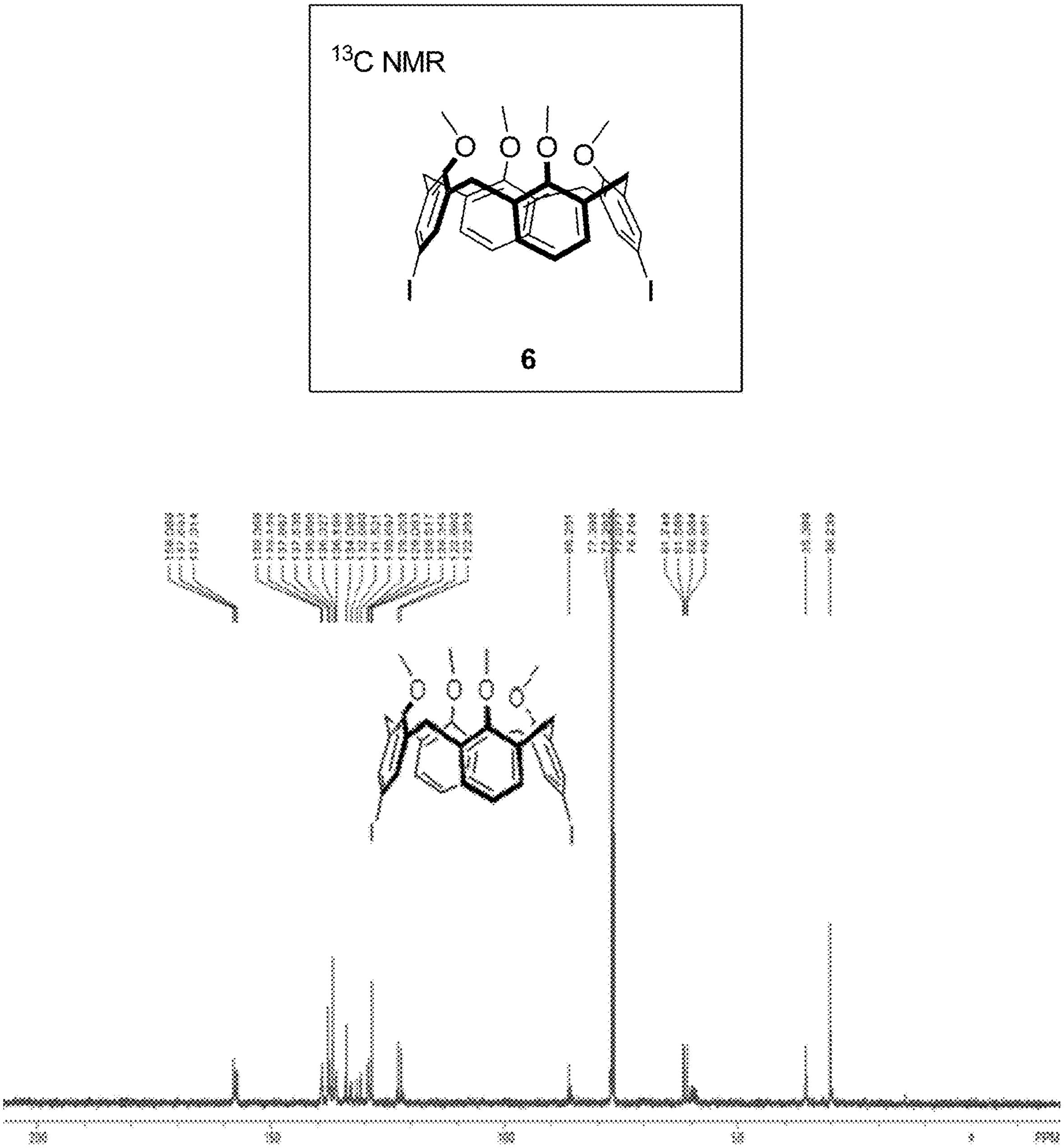
FIG. 51 shows $^{13}C$ NMR spectrum of complex 6.
Figure 52:
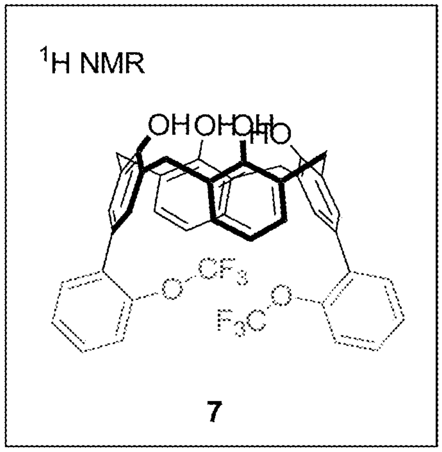
FIG. 52 shows $^{1}H$ NMR spectrum of complex 7.
Figure 52:
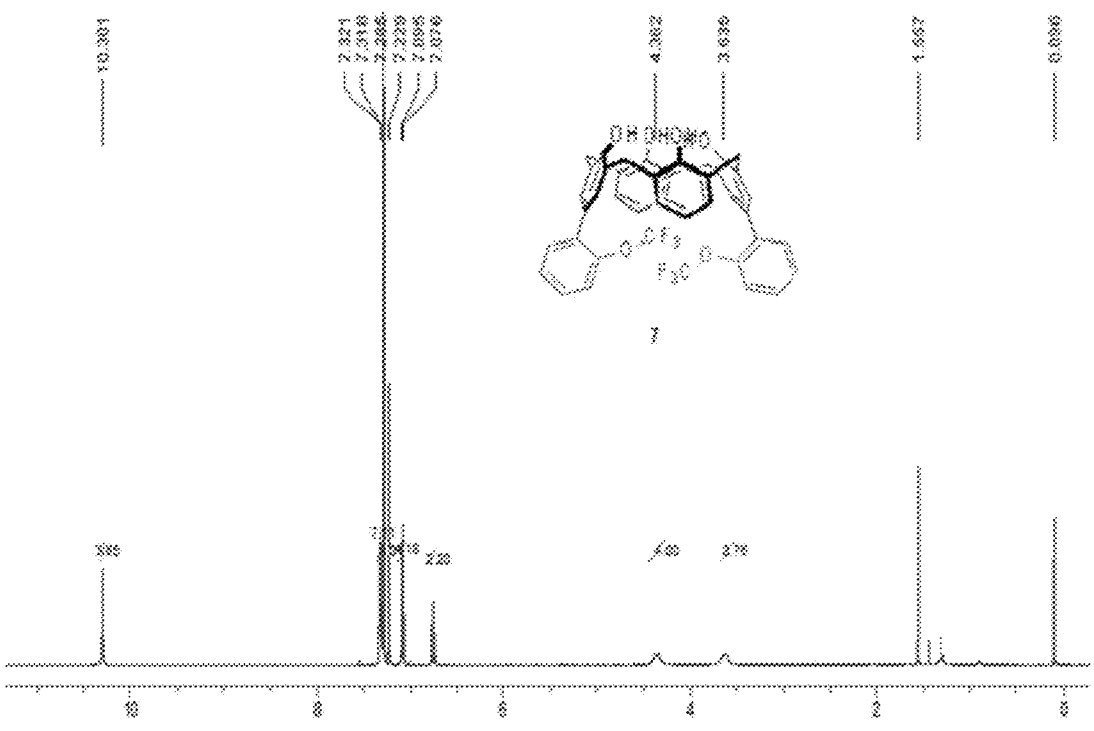
Figure 53:
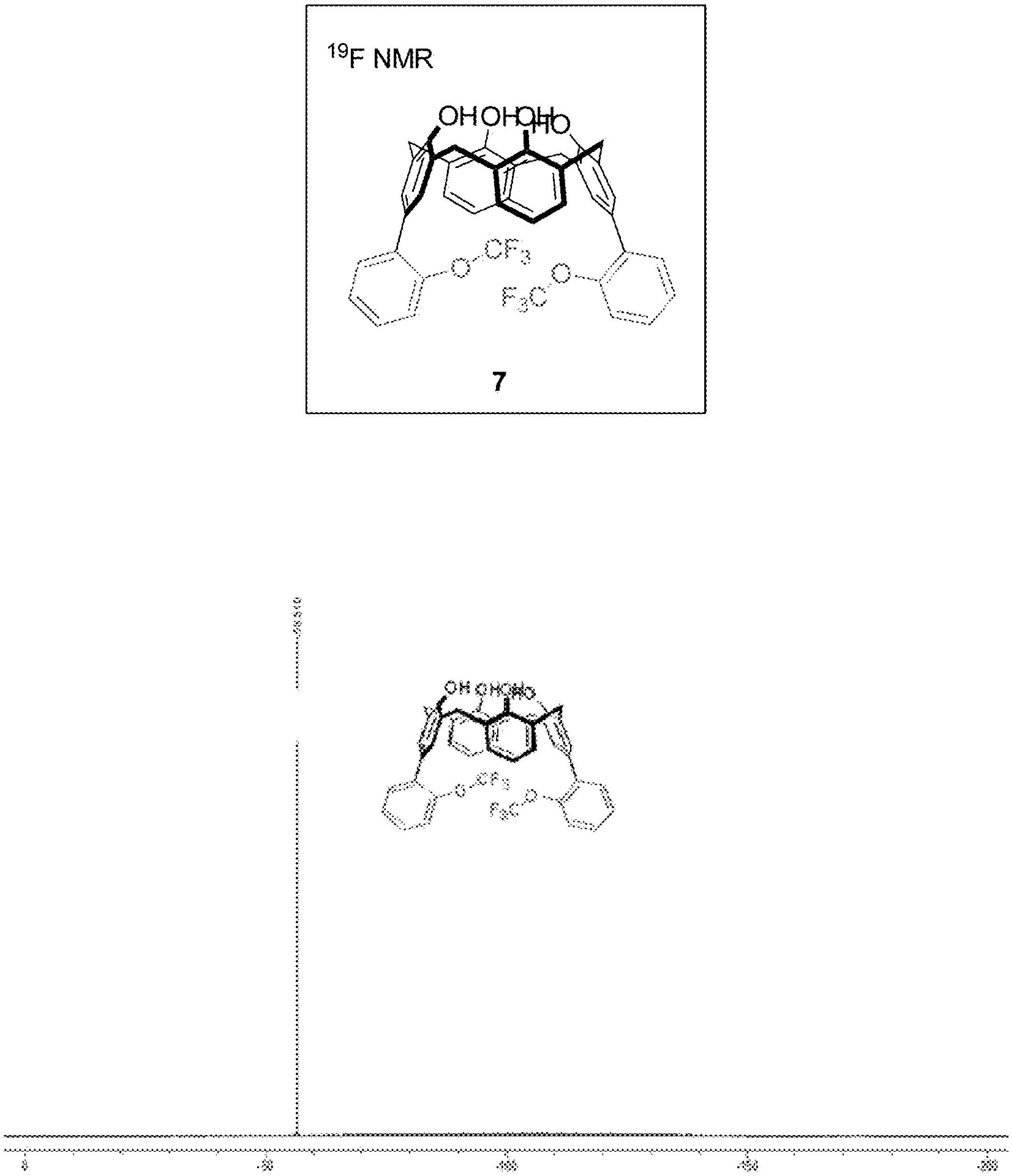
FIG. 53 shows $^{19}F$ NMR spectrum of complex 7.
Figure 54:
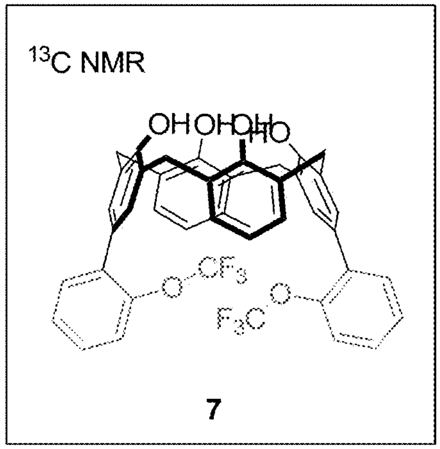
FIG. 54 shows $^{13}C$ NMR spectrum of complex 7.
Figure 54:
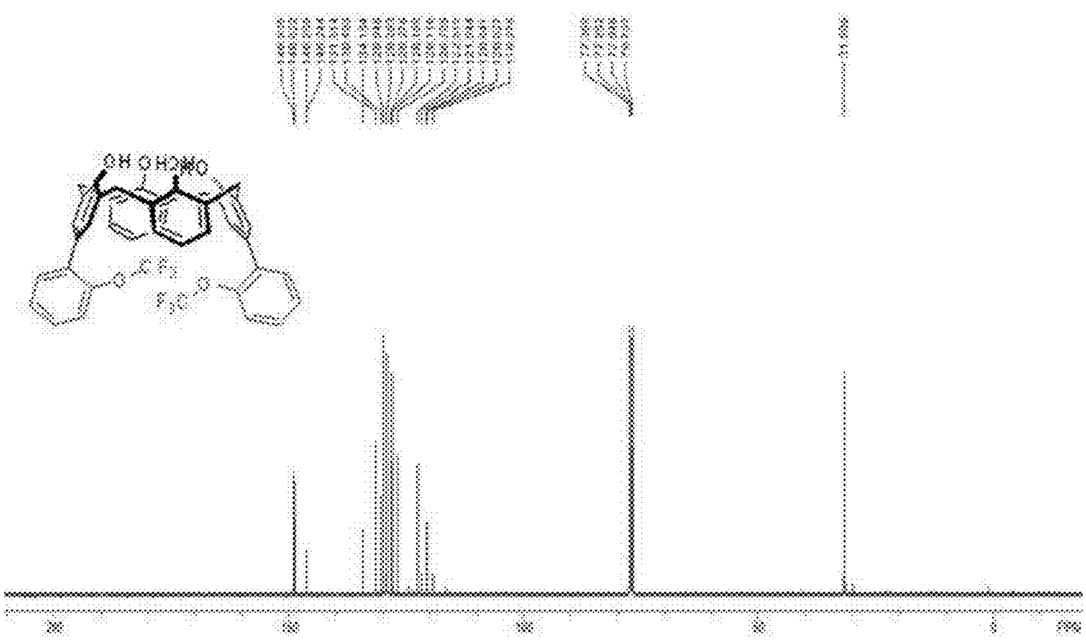
Figure 55:
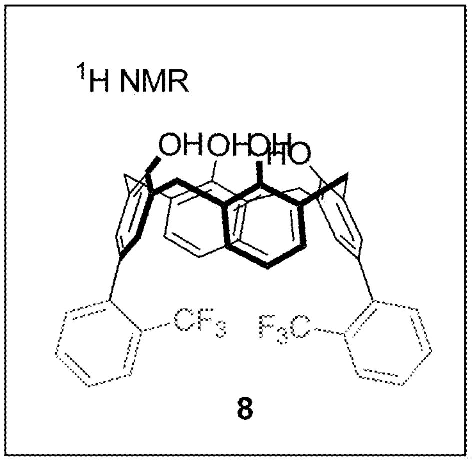
FIG. 55 shows $^{1}H$ NMR spectrum of complex 8.
Figure 55:
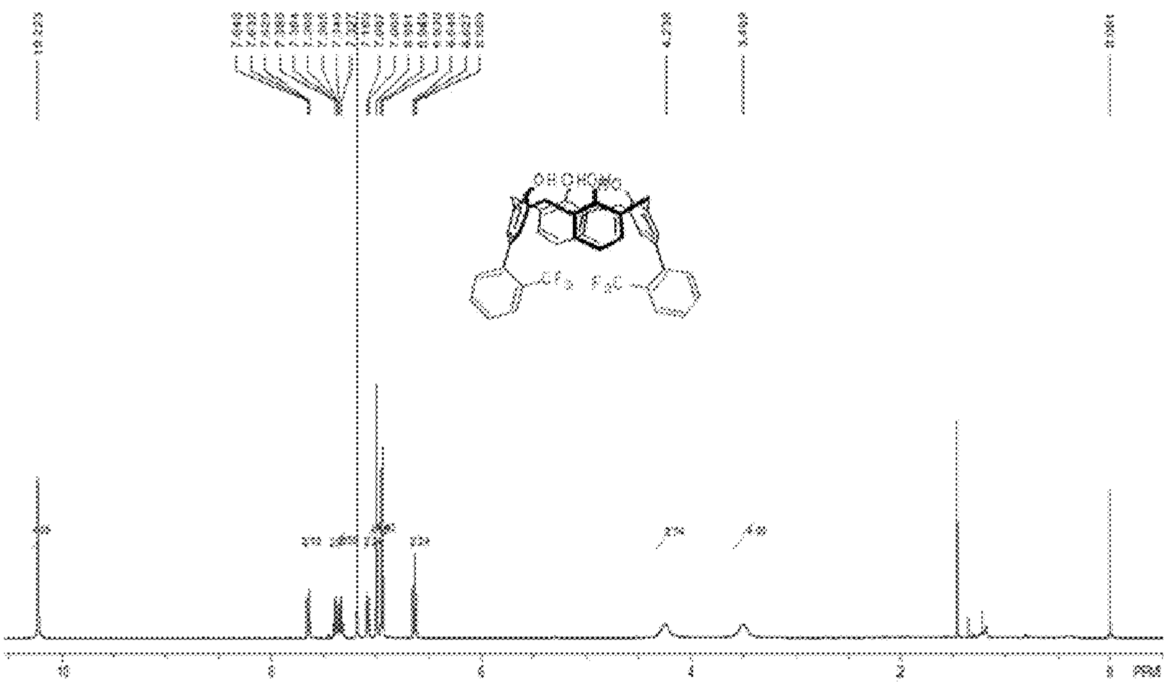
Figure 56:
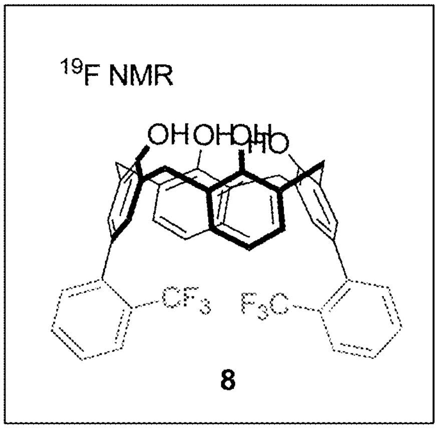
FIG. 56 shows $^{19}F$ NMR spectrum of complex 8.
Figure 56:
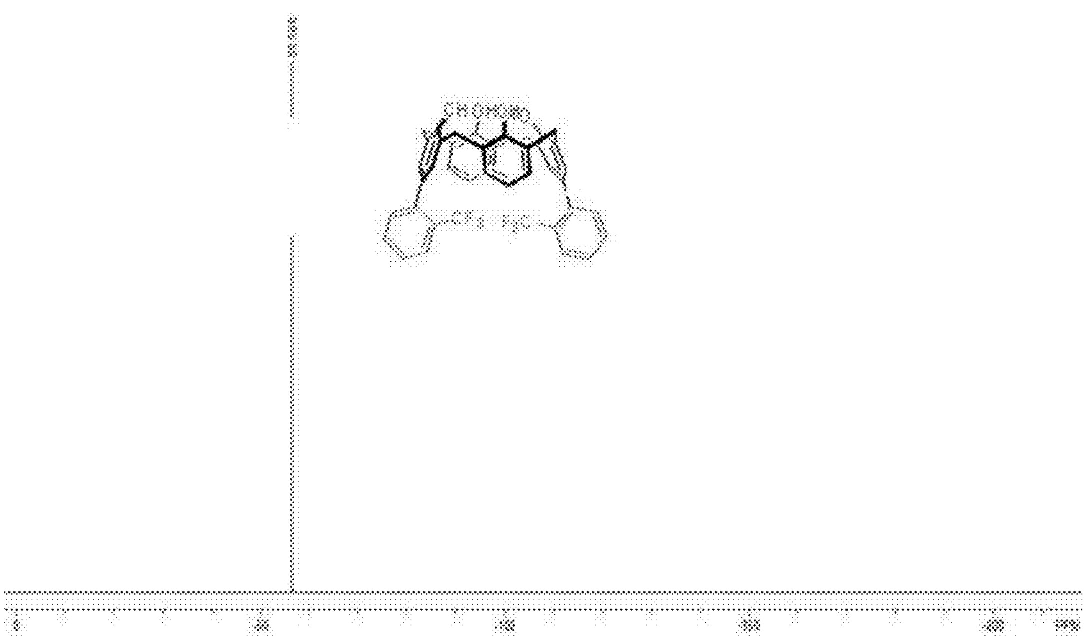
Figure 57:
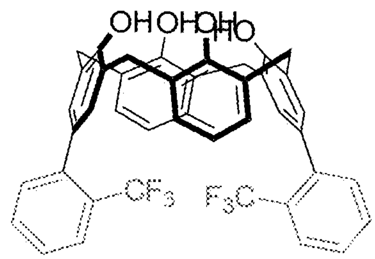
FIG. 57 shows $^{13}C$ NMR spectrum of complex 8.
Figure 57:
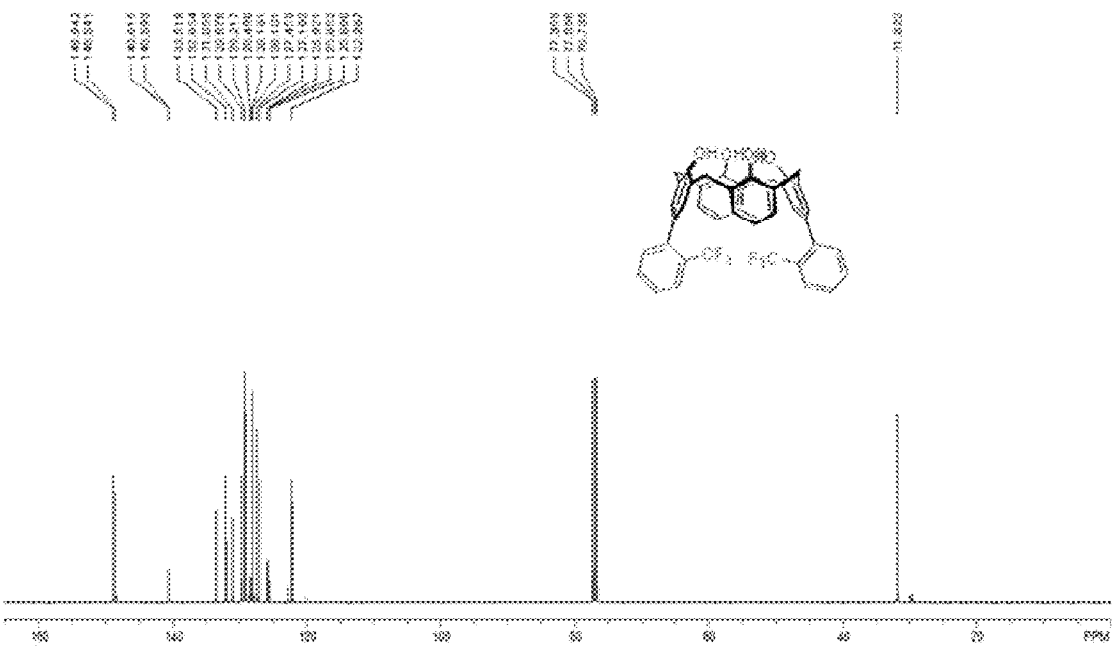
Figure 58:
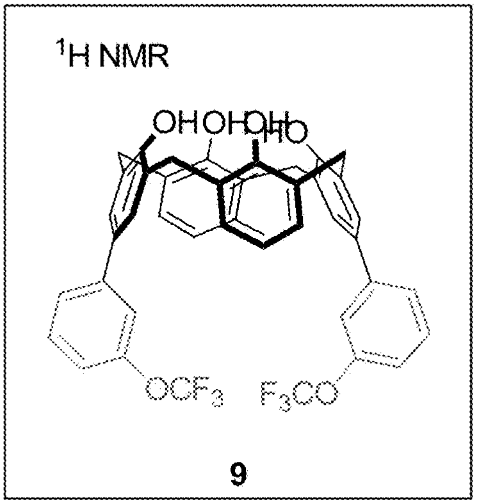
FIG. 58 shows $^{1}H$ NMR spectrum of complex 9.
Figure 58:
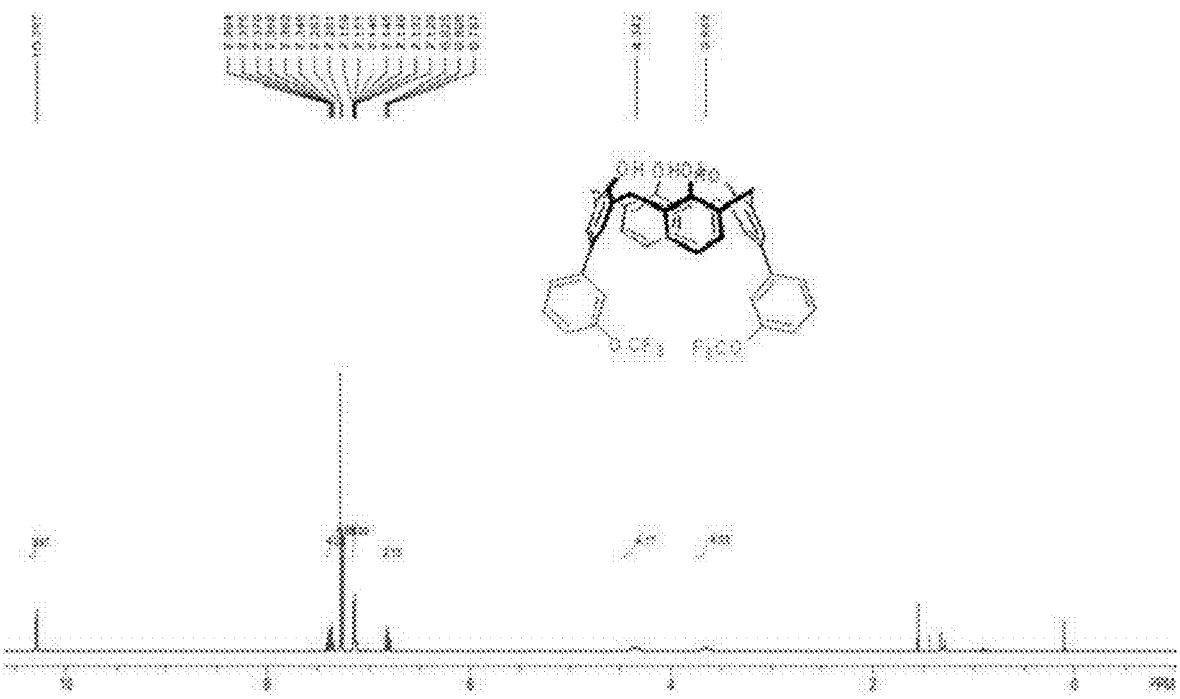
Figure 59:
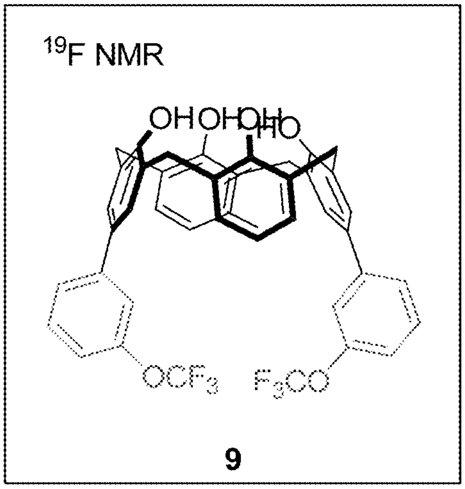
FIG. 59 shows $^{19}F$ NMR spectrum of complex 9.
Figure 59:
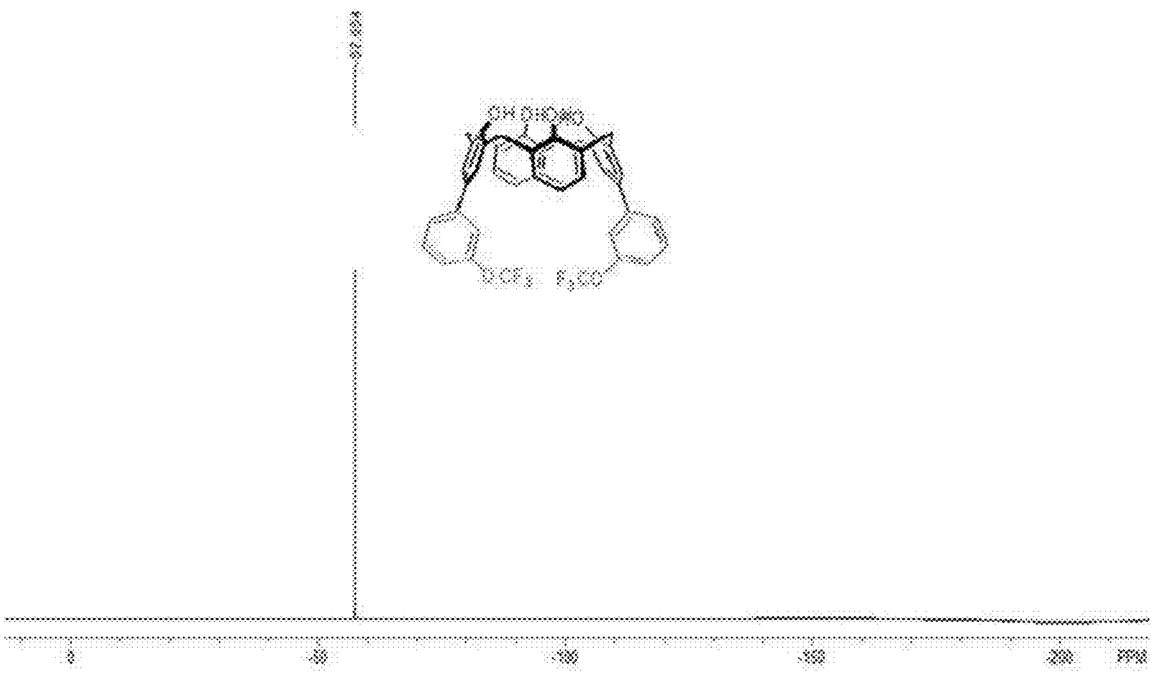
Figure 60:
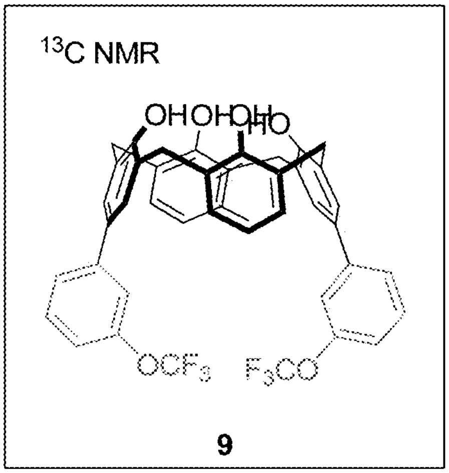
FIG. 60 shows $^{13}C$ NMR spectrum of complex 9.
Figure 60:
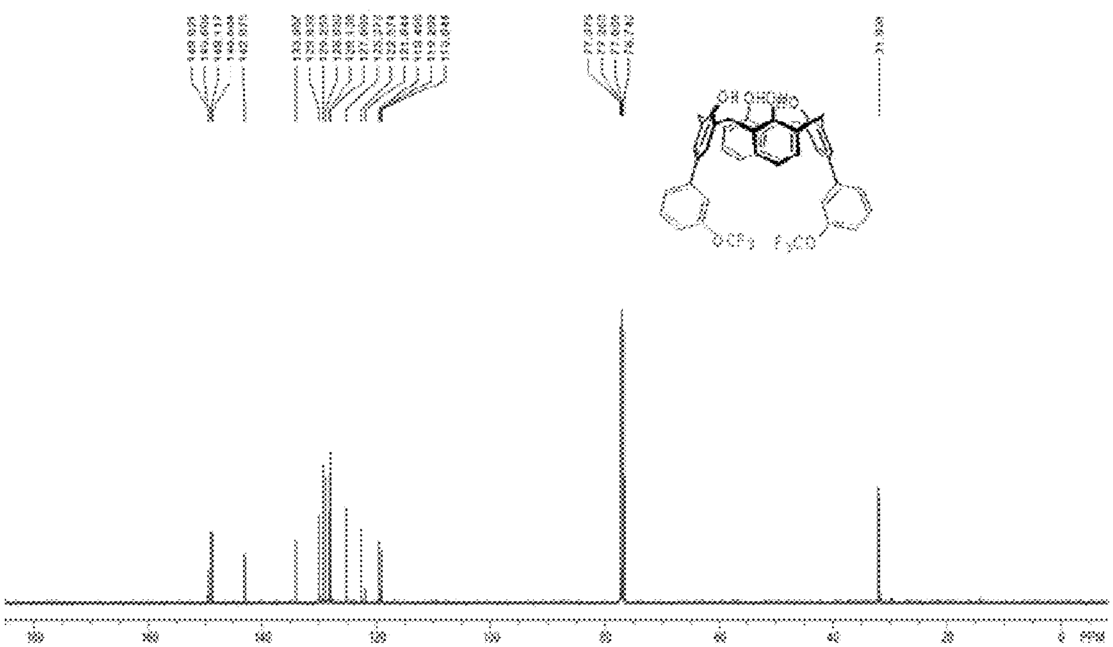
Figure 61:
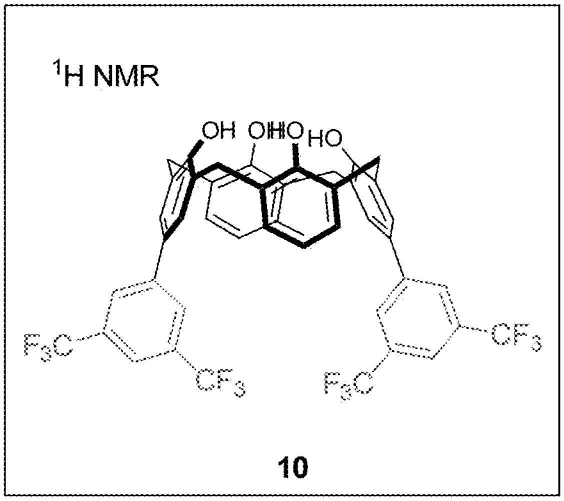
FIG. 61 shows $^{1}H$ NMR spectrum of complex 10.
Figure 61:
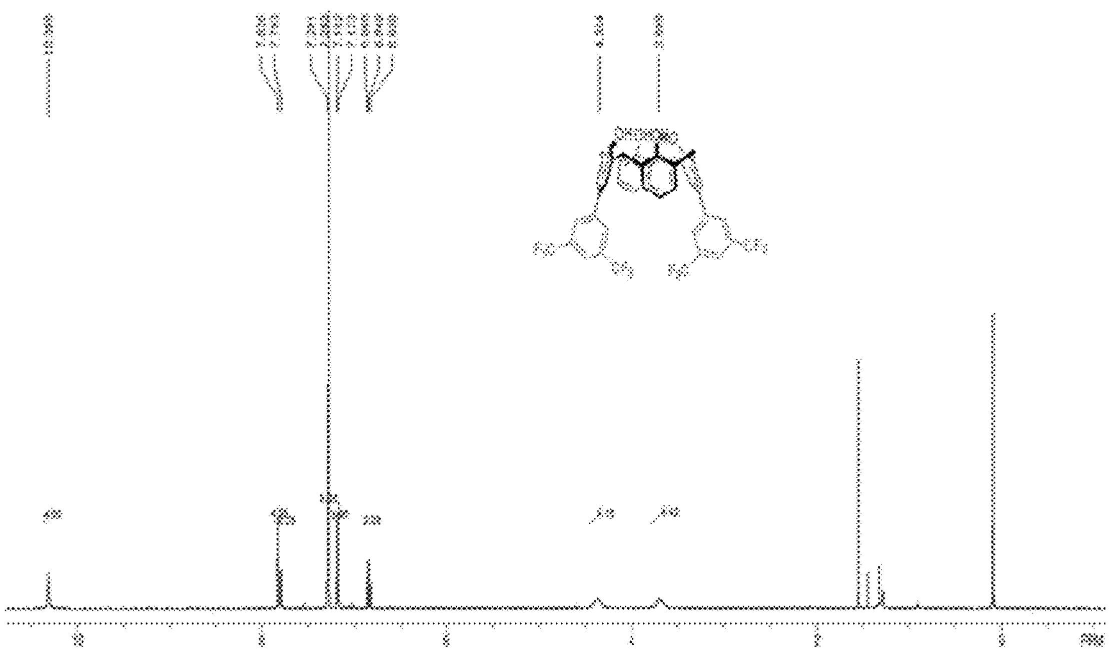
Figure 62:
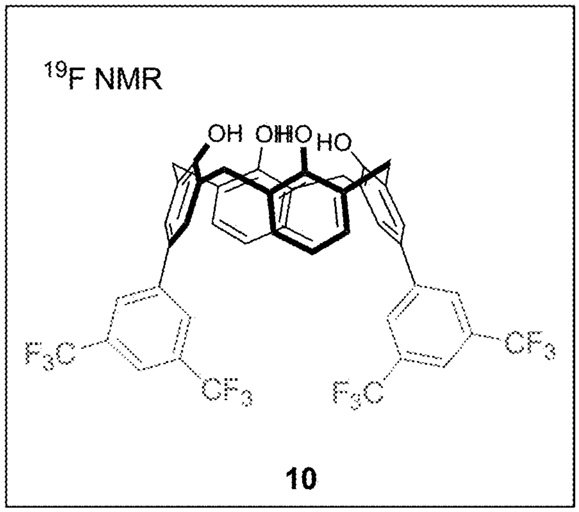
FIG. 62 shows $^{19}F$ NMR spectrum of complex 10.
Figure 62:
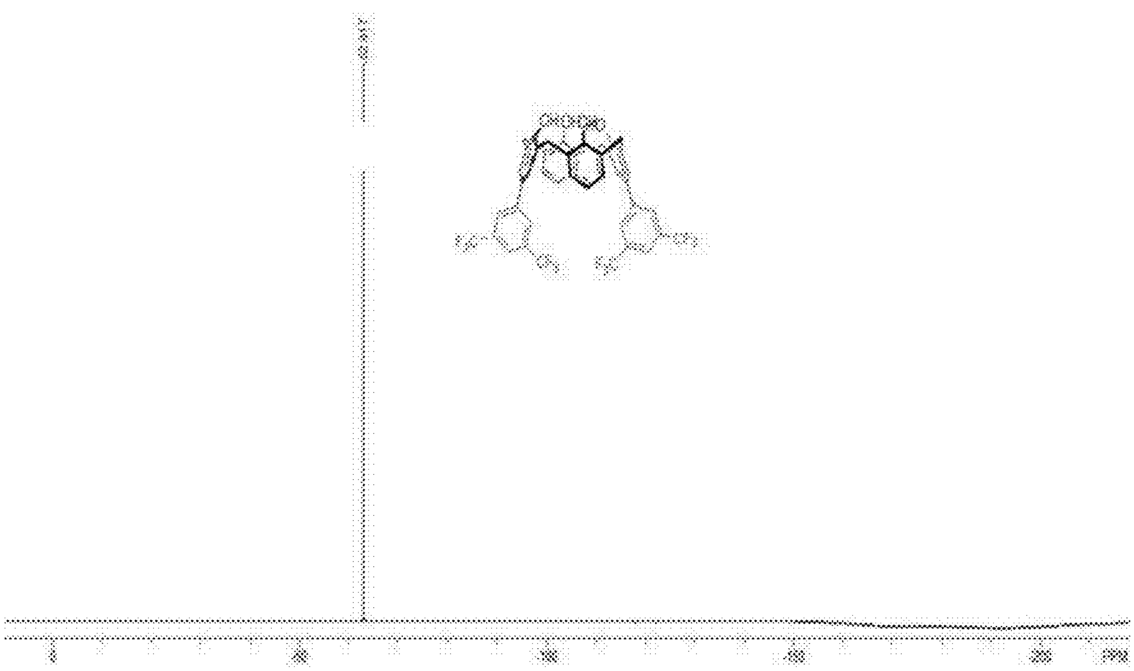
Figure 63:
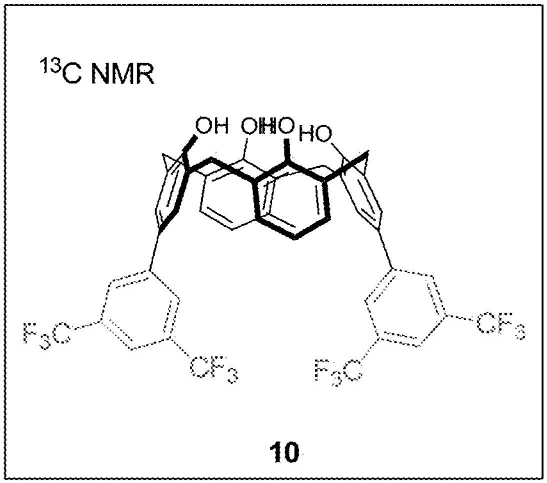
FIG. 63 shows $^{13}C$ NMR spectrum of complex 10.
Figure 63:
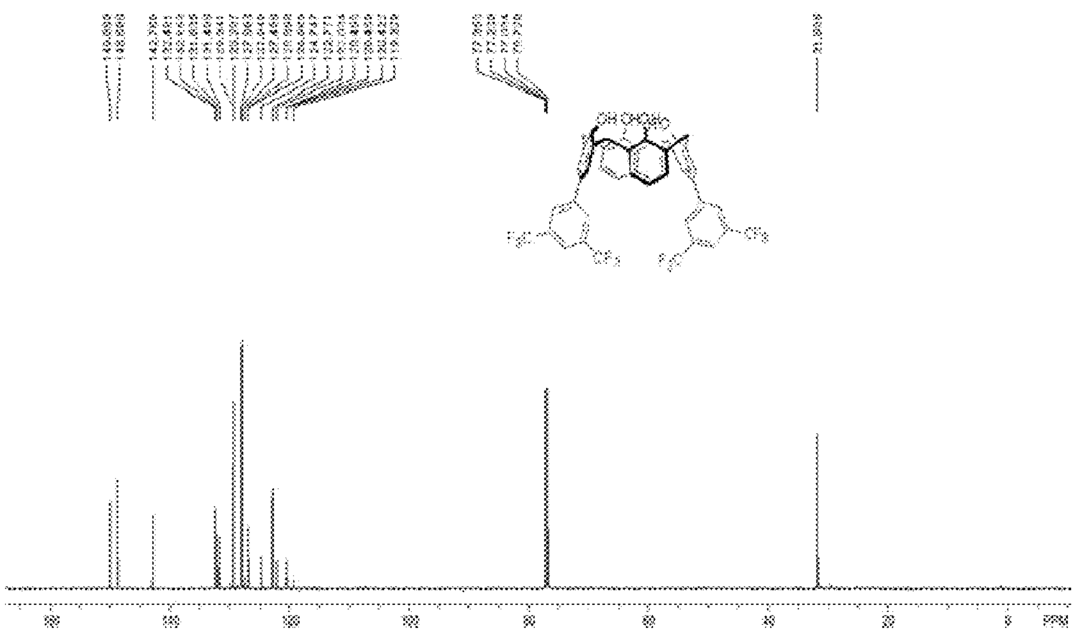
Figure 64:
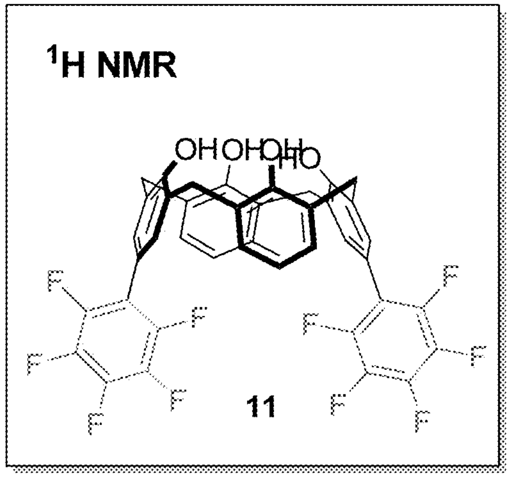
FIG. 64 shows $^{1}H$ NMR spectrum of complex 11.
Figure 64:
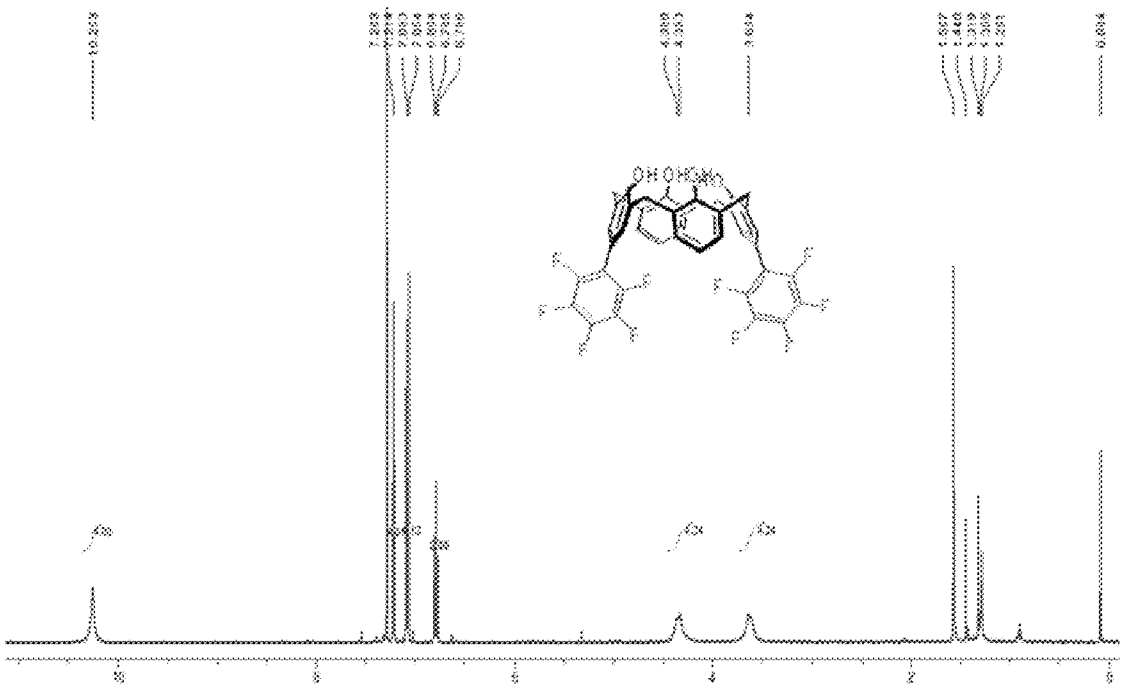
Figure 65:
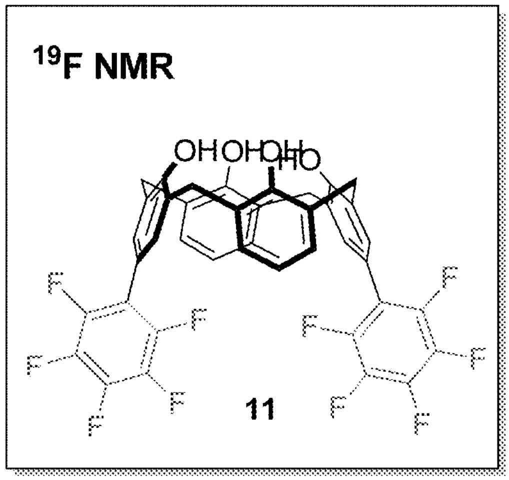
FIG. 65 shows $^{19}F$ NMR spectrum of complex 11.
Figure 65:
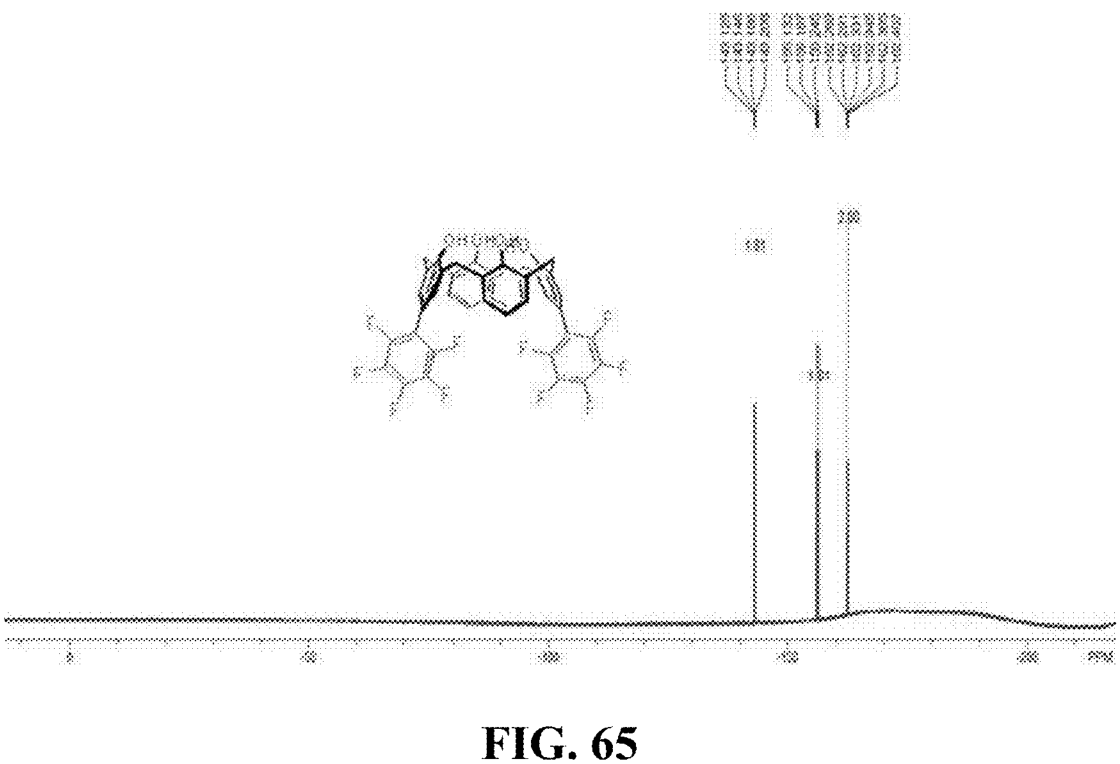
Figure 66:
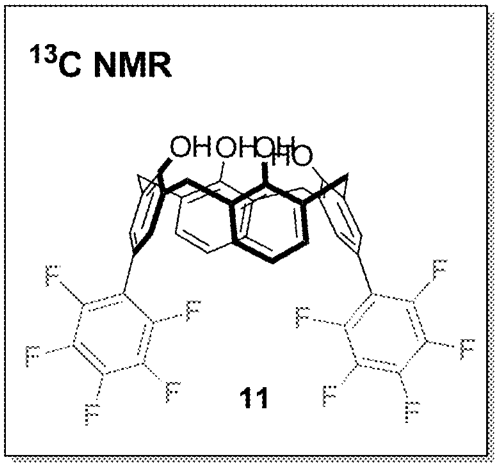
FIG. 66 shows $^{13}C$ NMR spectrum of complex 11.
Figure 66:
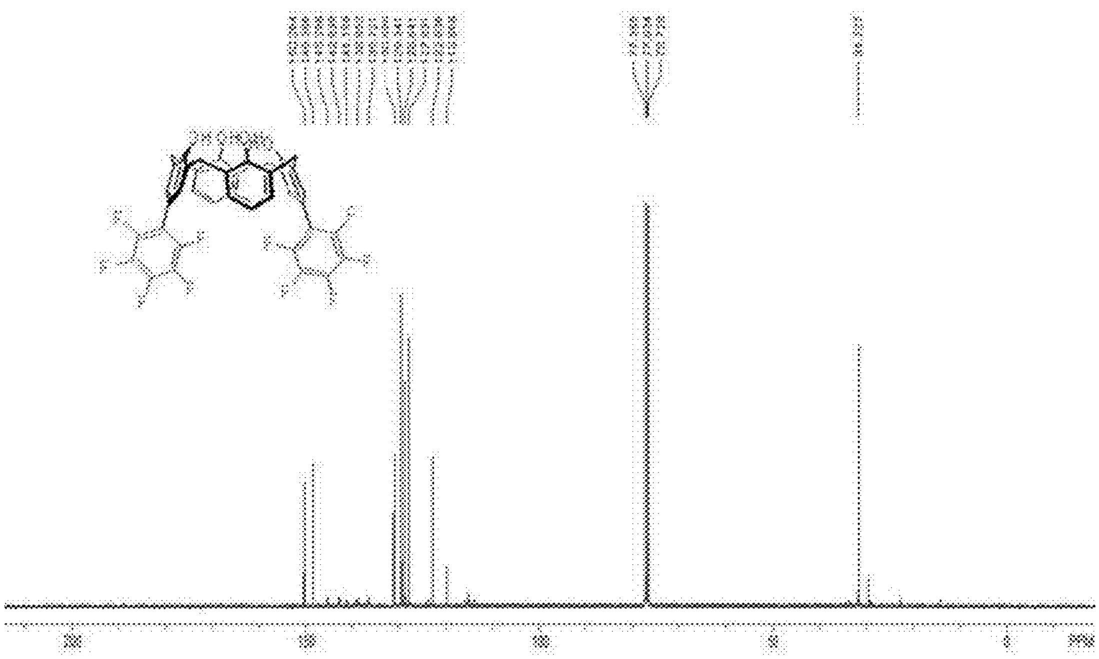
Figure 67:
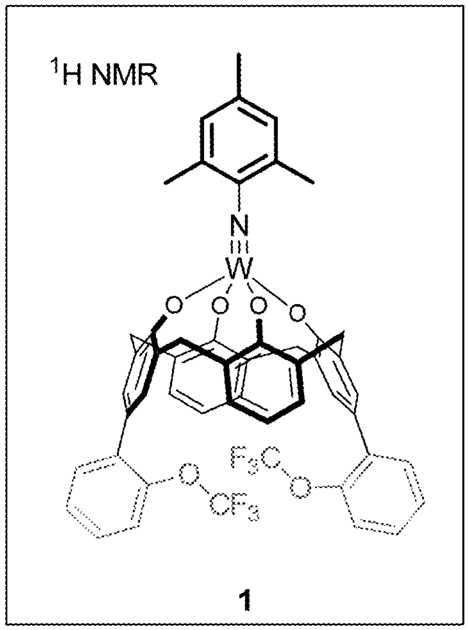
FIG. 67 shows $^{1}H$ NMR spectrum of complex 1.
Figure 67:
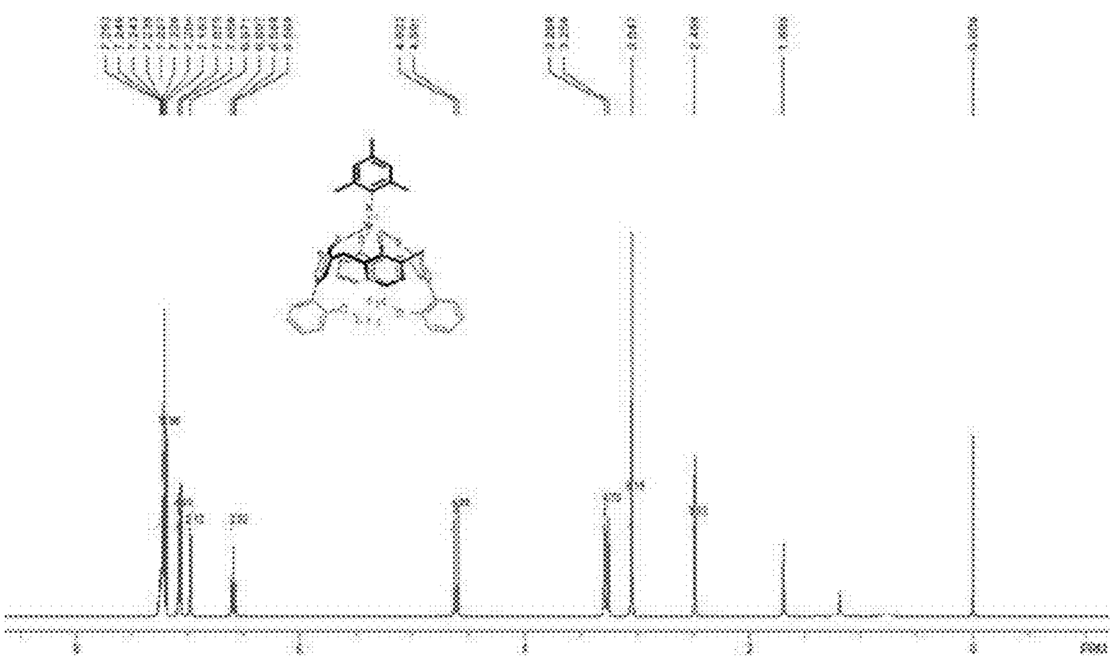
Figure 68:
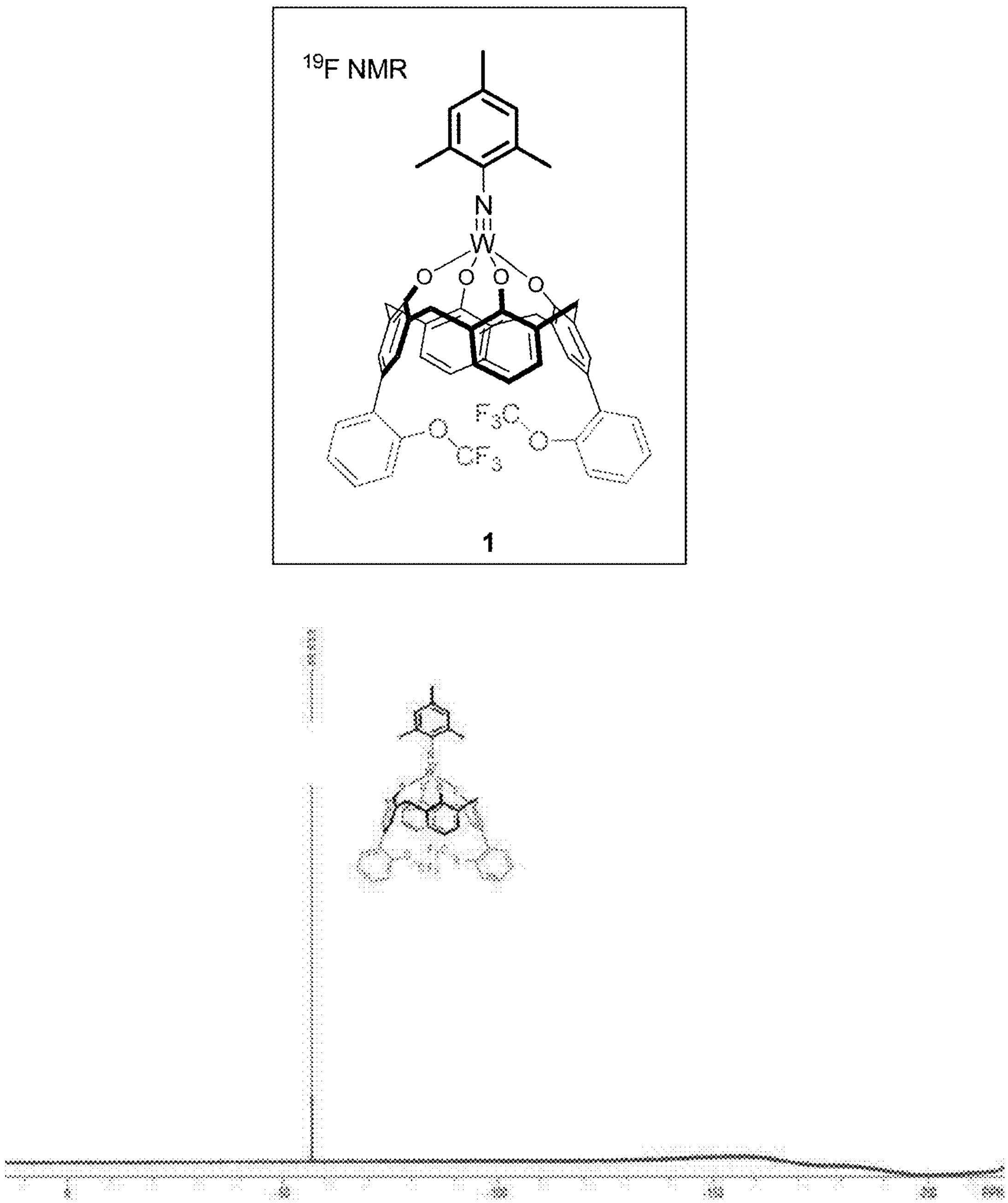
FIG. 68 shows $^{19}F$ NMR spectrum of complex 1.
Figure 69:
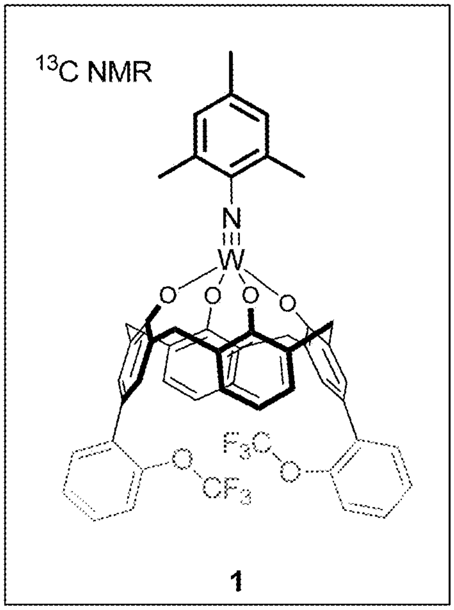
FIG. 69 shows $^{13}C$ NMR spectrum of complex 1.
Figure 69:
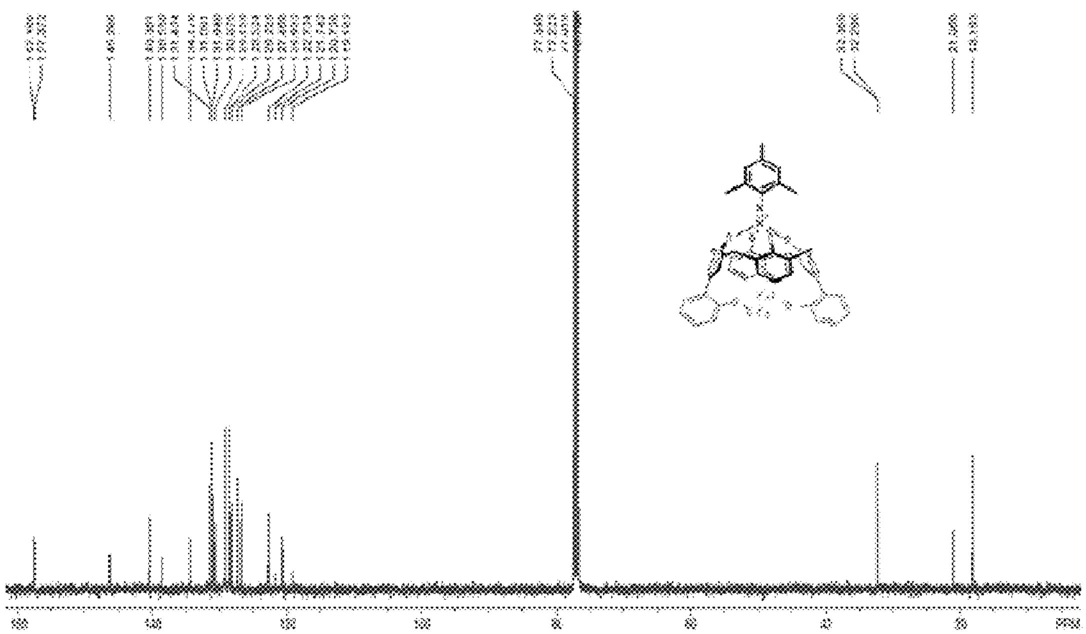
Figure 70:
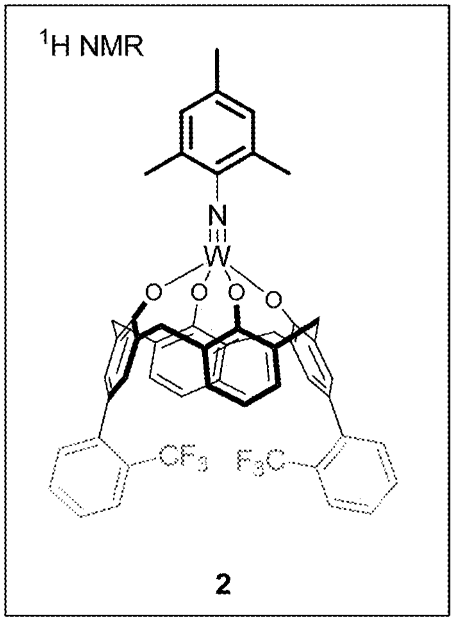
FIG. 70 shows $^{1}H$ NMR spectrum of complex 2.
Figure 70:
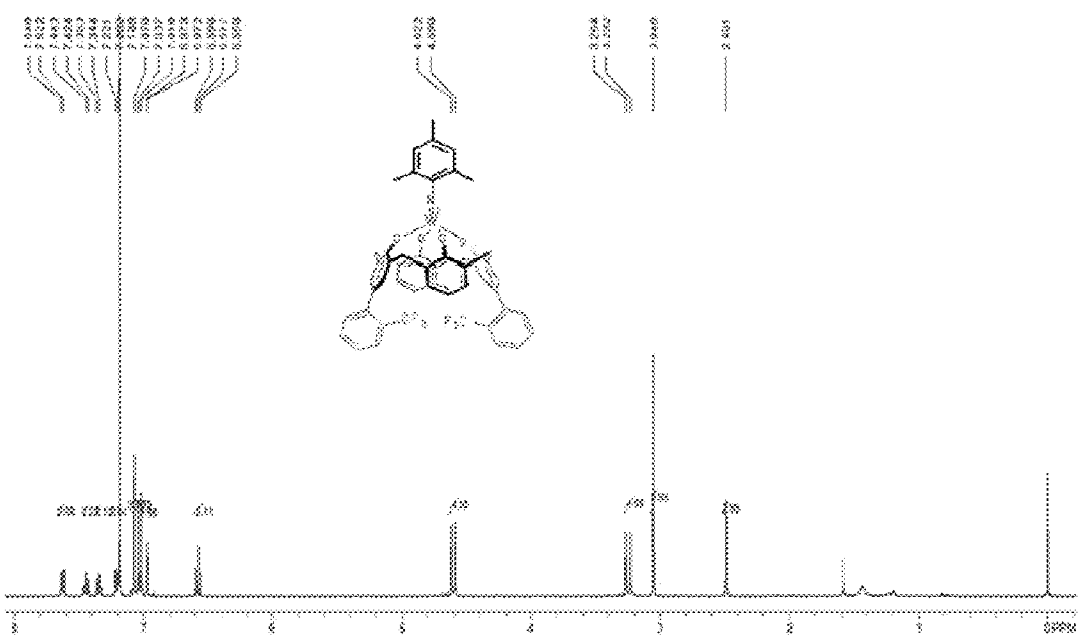
Figure 71:
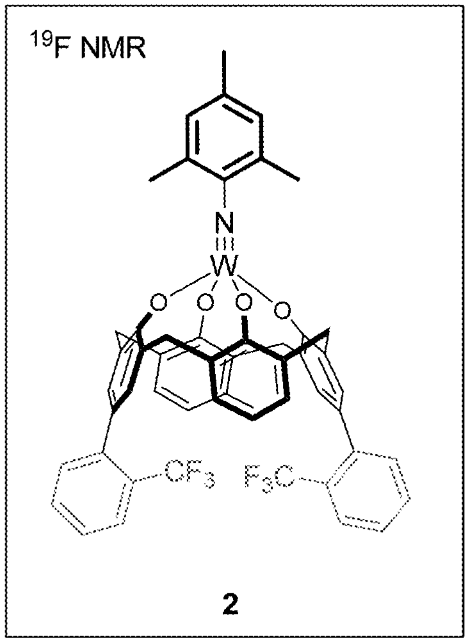
FIG. 71 shows $^{19}F$ NMR spectrum of complex 2.
Figure 71:
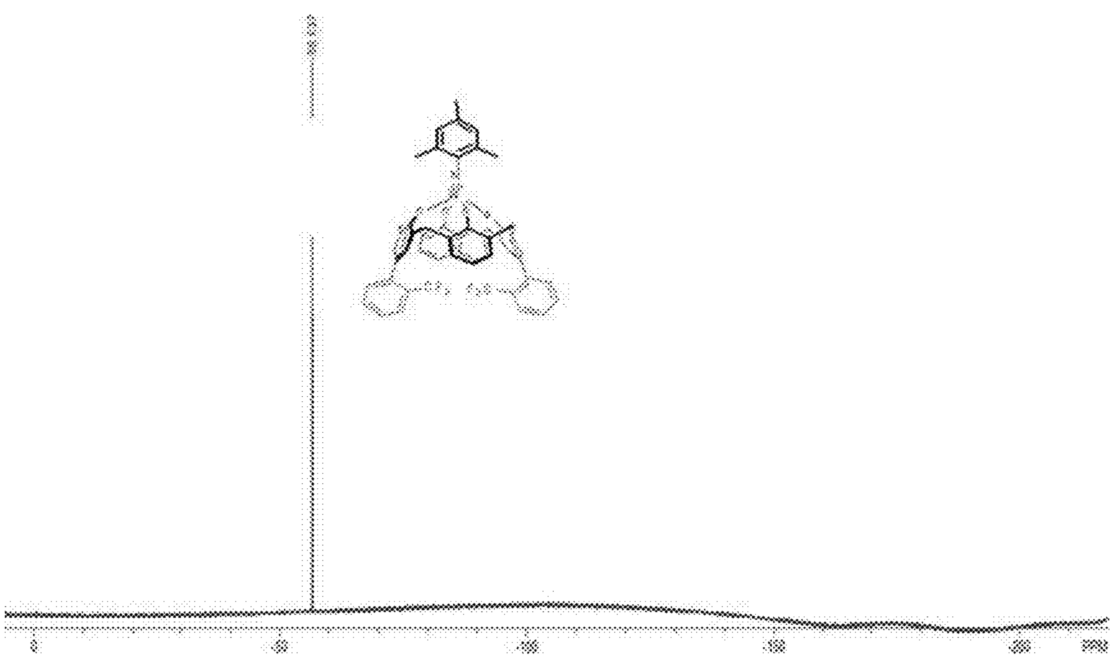
Figure 72:
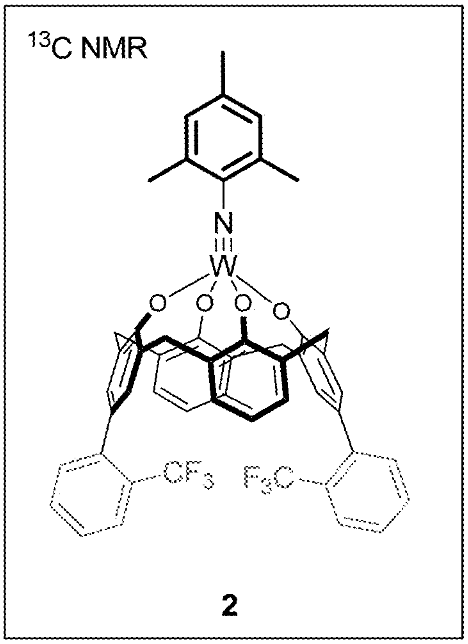
FIG. 72 shows $^{13}C$ NMR spectrum of complex 2.
Figure 72:
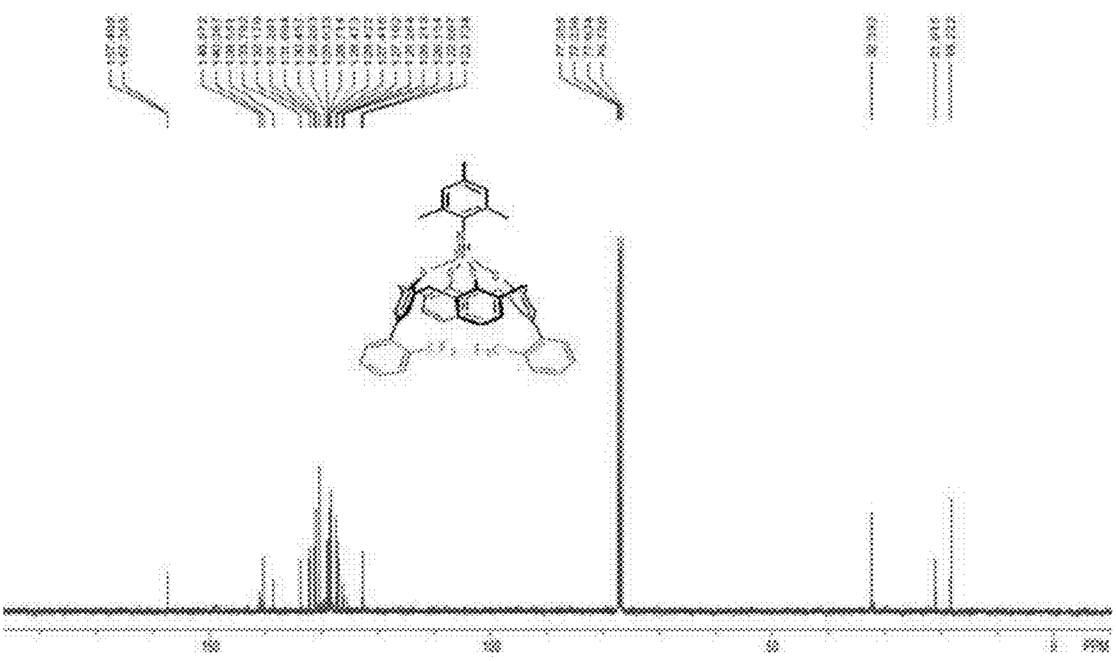
Figure 73:
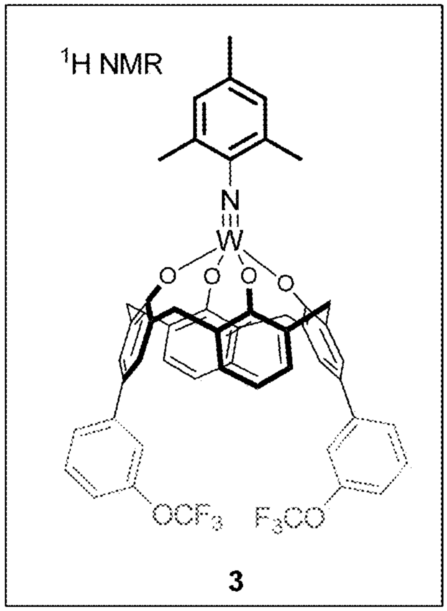
FIG. 73 shows $^{1}H$ NMR spectrum of complex 3.
Figure 73:
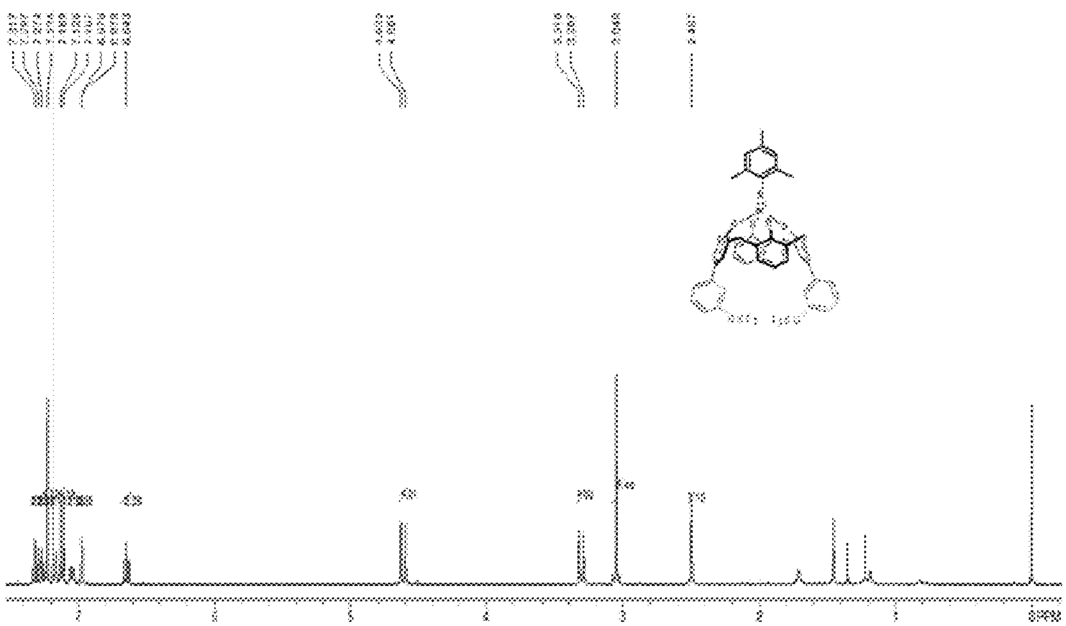
Figure 74:
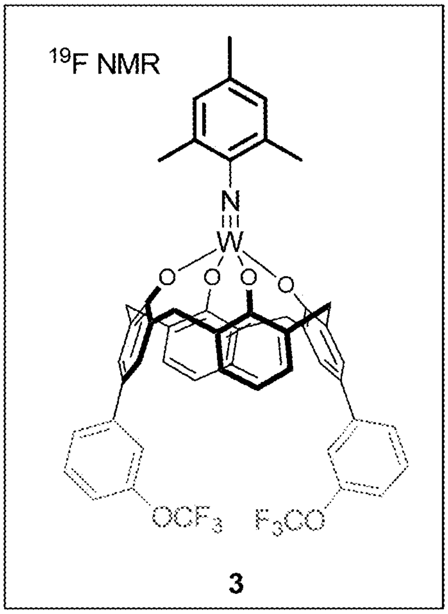
FIG. 74 shows $^{19}F$ NMR spectrum of complex 3.
Figure 74:
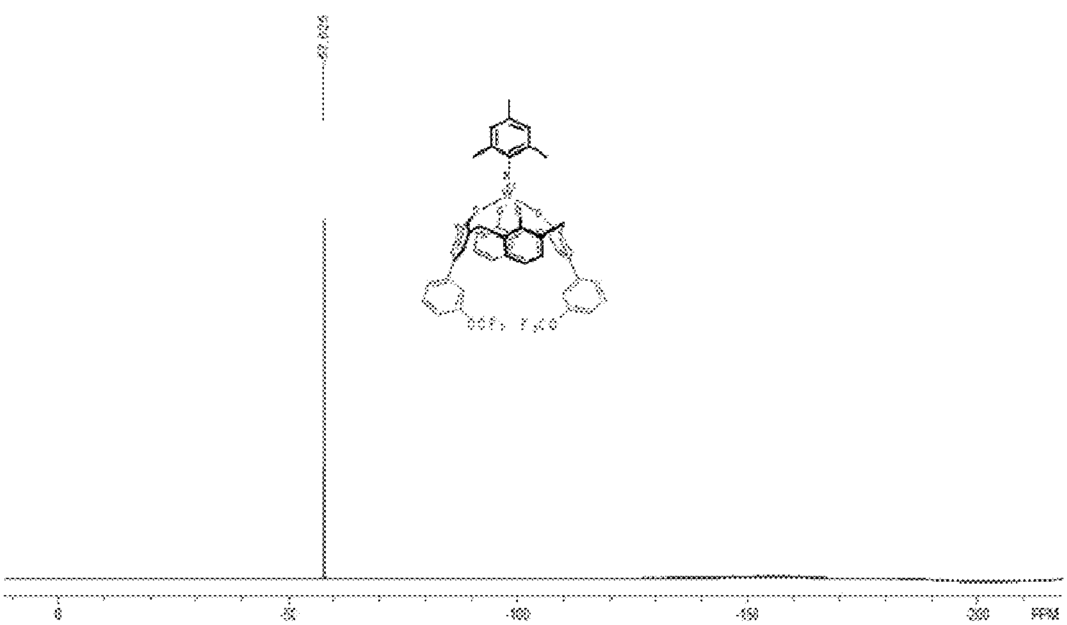
Figure 75:
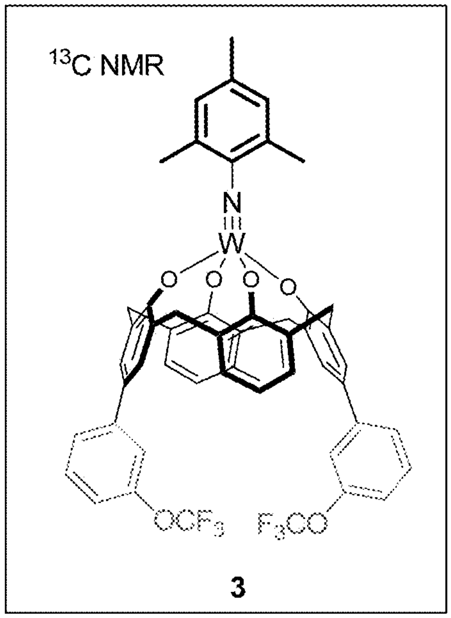
FIG. 75 shows $^{13}C$ NMR spectrum of complex 3.
Figure 75:
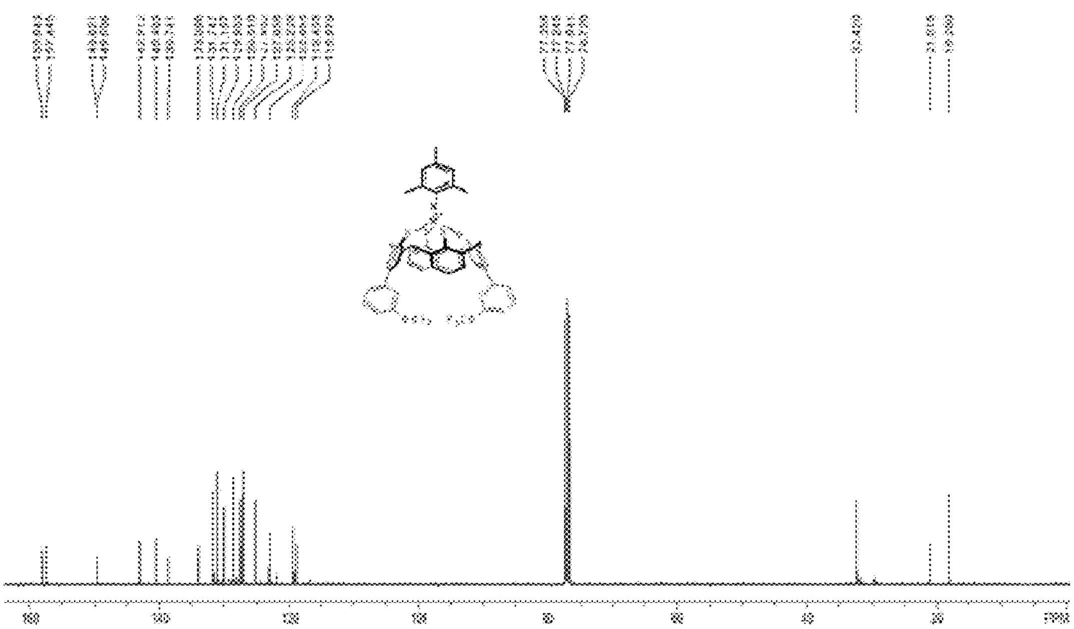
Figure 76:
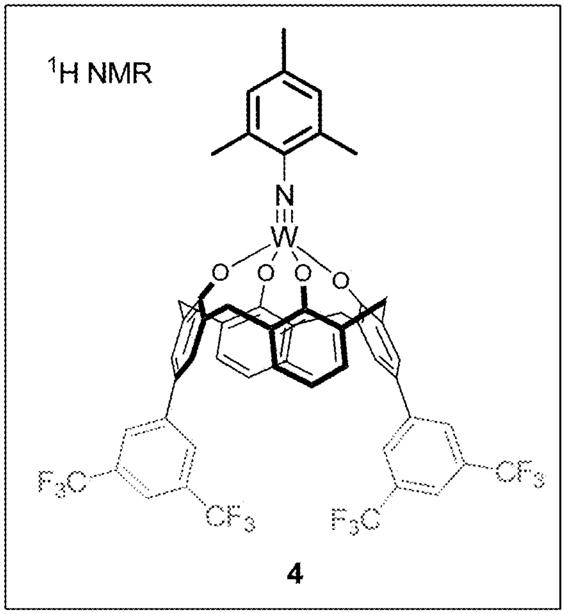
FIG. 76 shows $^{1}H$ NMR spectrum of complex 4.
Figure 76:
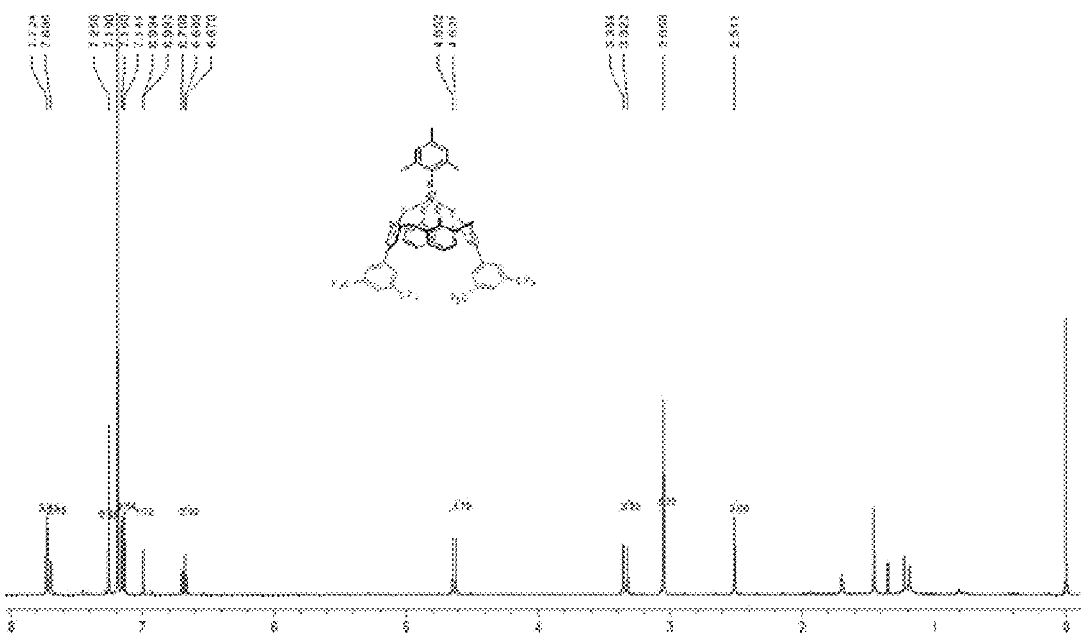
Figure 77:
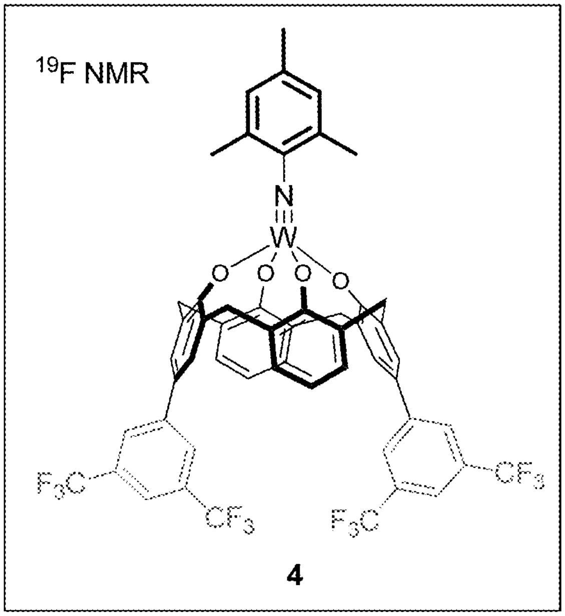
FIG. 77 shows $^{19}F$ NMR spectrum of complex 4.
Figure 77:
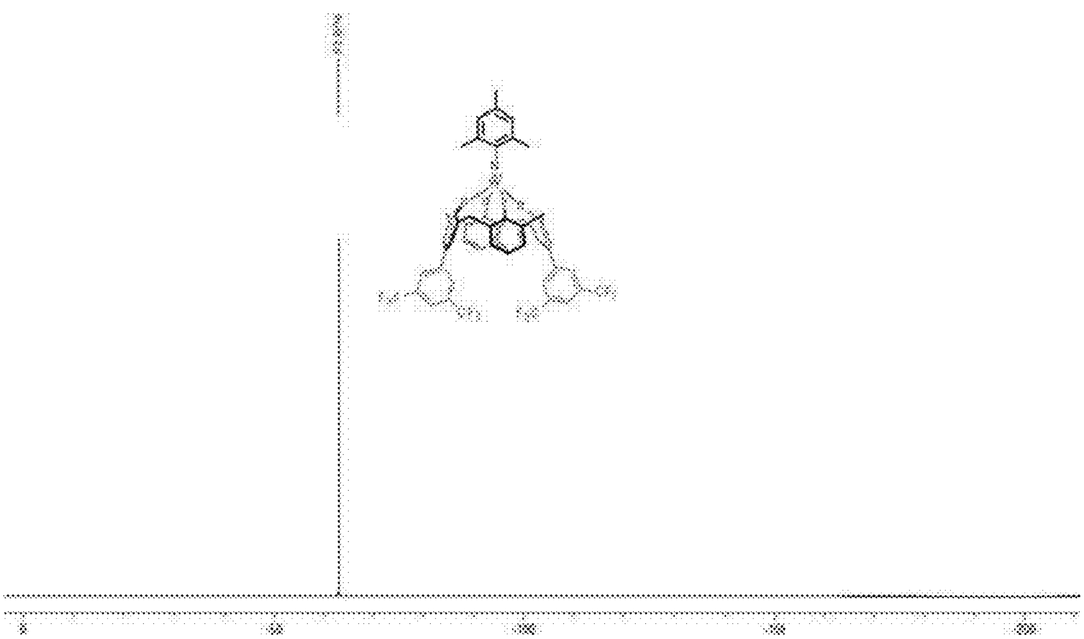
Figure 78:
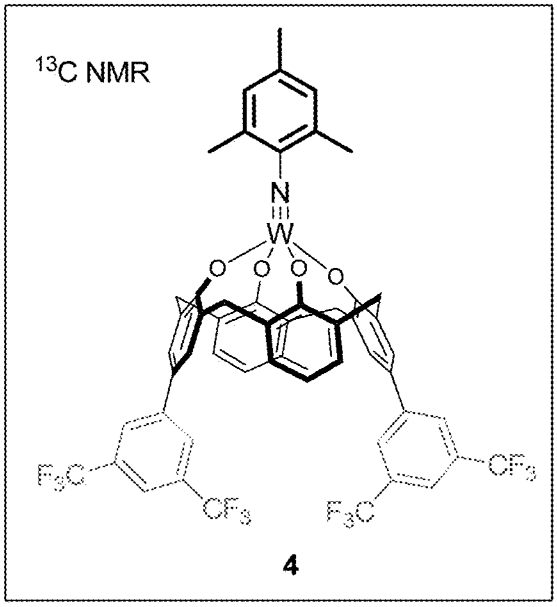
FIG. 78 shows $^{13}C$ NMR spectrum of complex 4.
Figure 78:
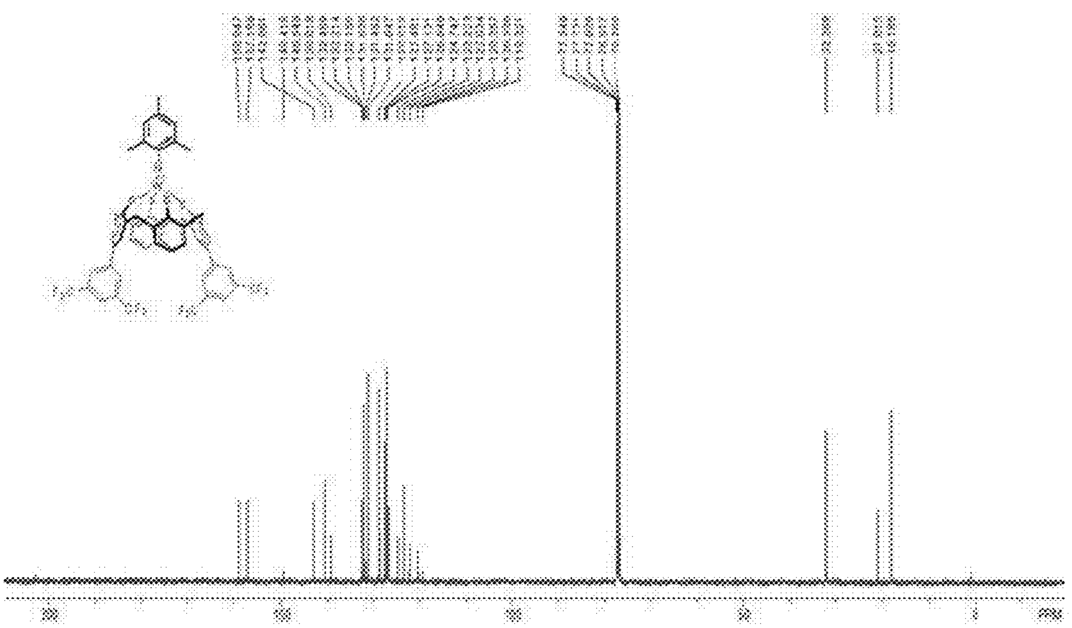
Figure 79:
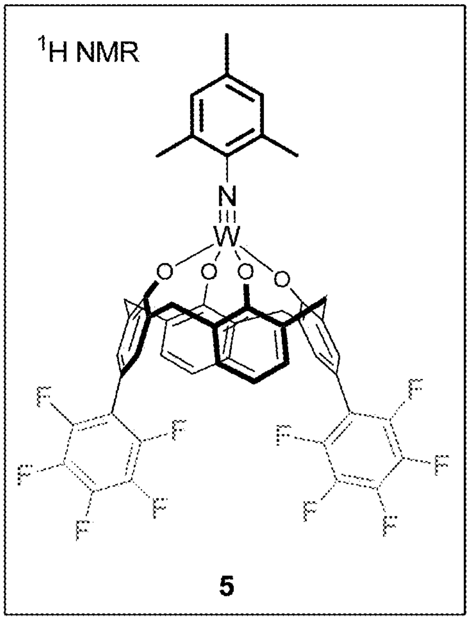
FIG. 79 shows $^{1}H$ NMR spectrum of complex 5.
Figure 79:
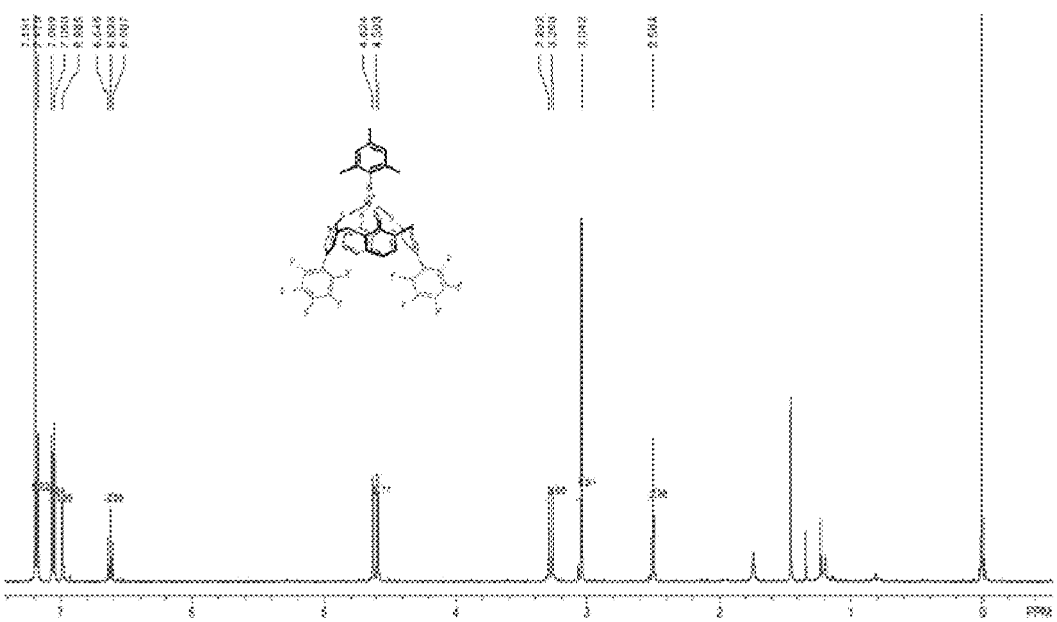
Figure 80:
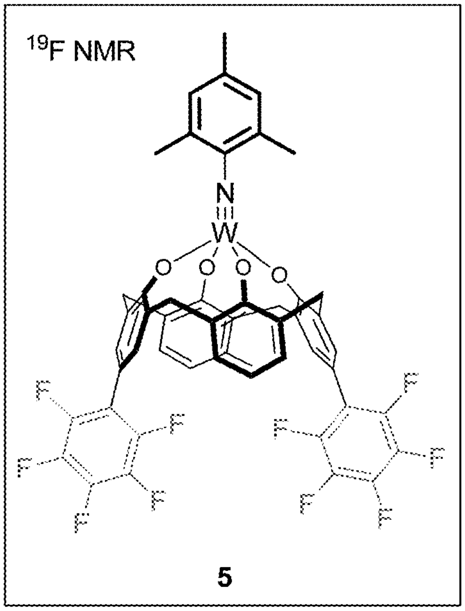
FIG. 80 shows $^{19}F$ NMR spectrum of complex 5.
Figure 80:
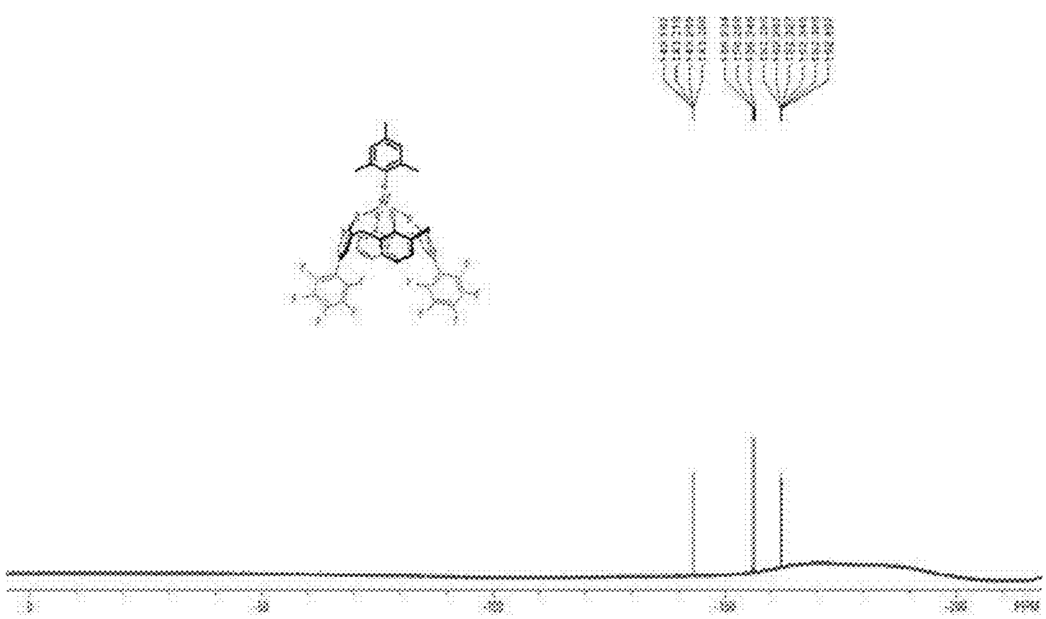
Figure 81:
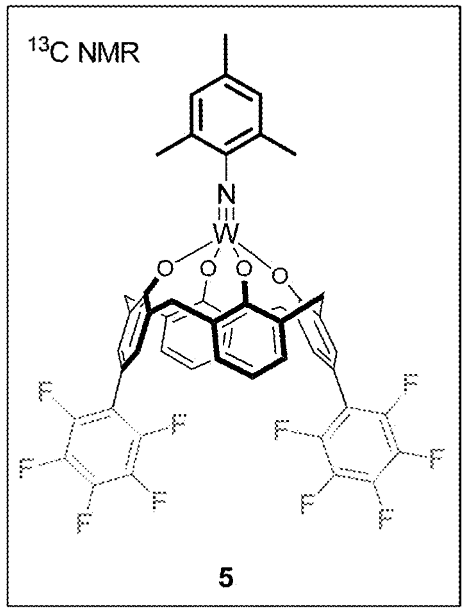
FIG. 81 shows $^{13}C$ NMR spectrum of complex 5.
Figure 81:
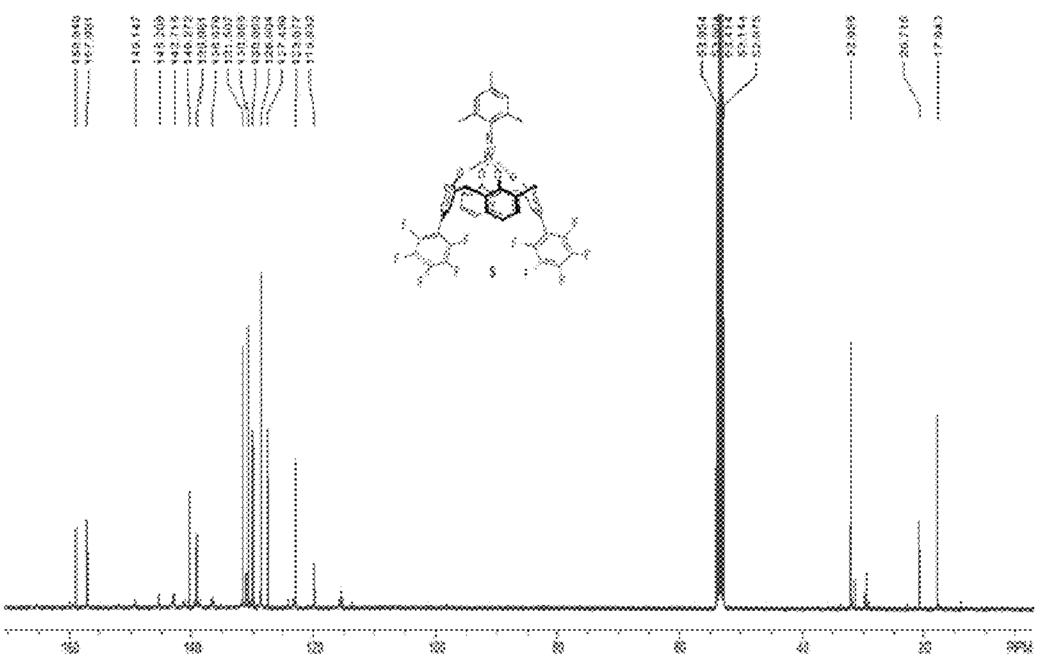
Figure 82:
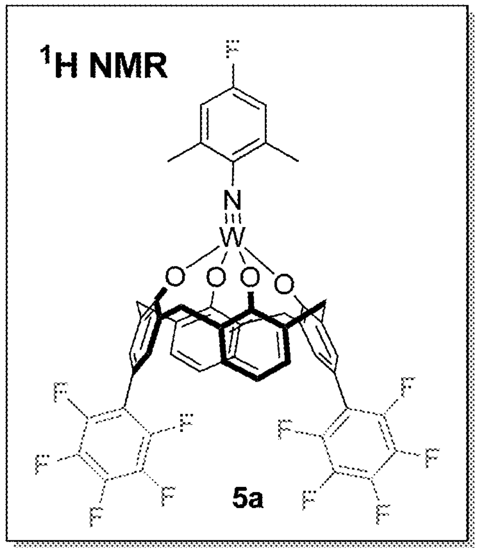
Figure 82:
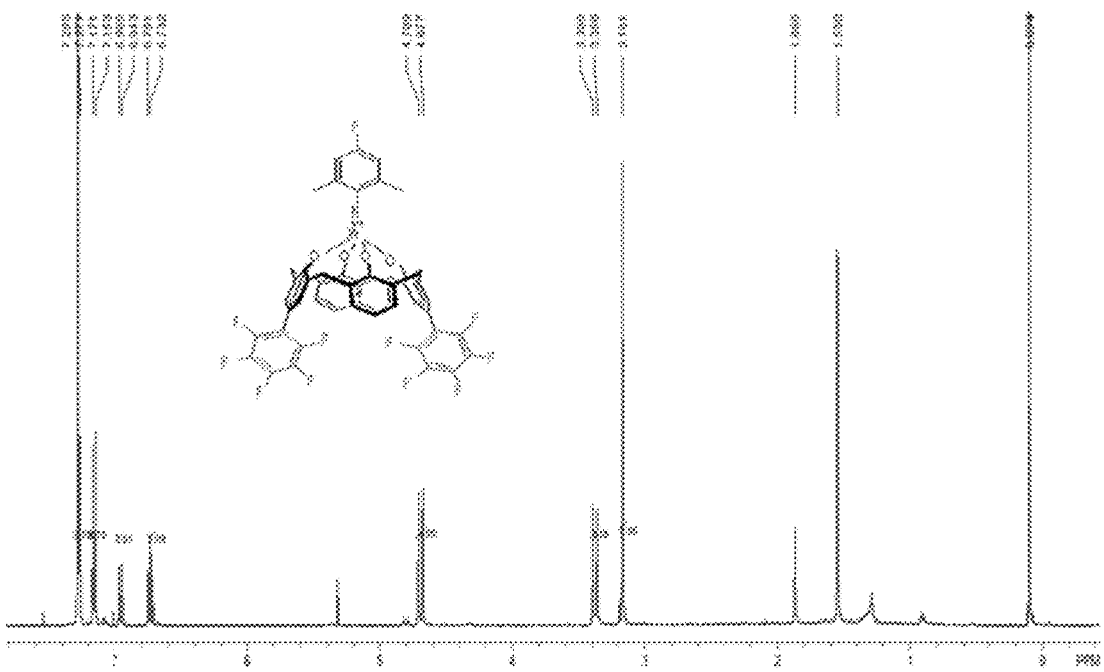
Figure 83:
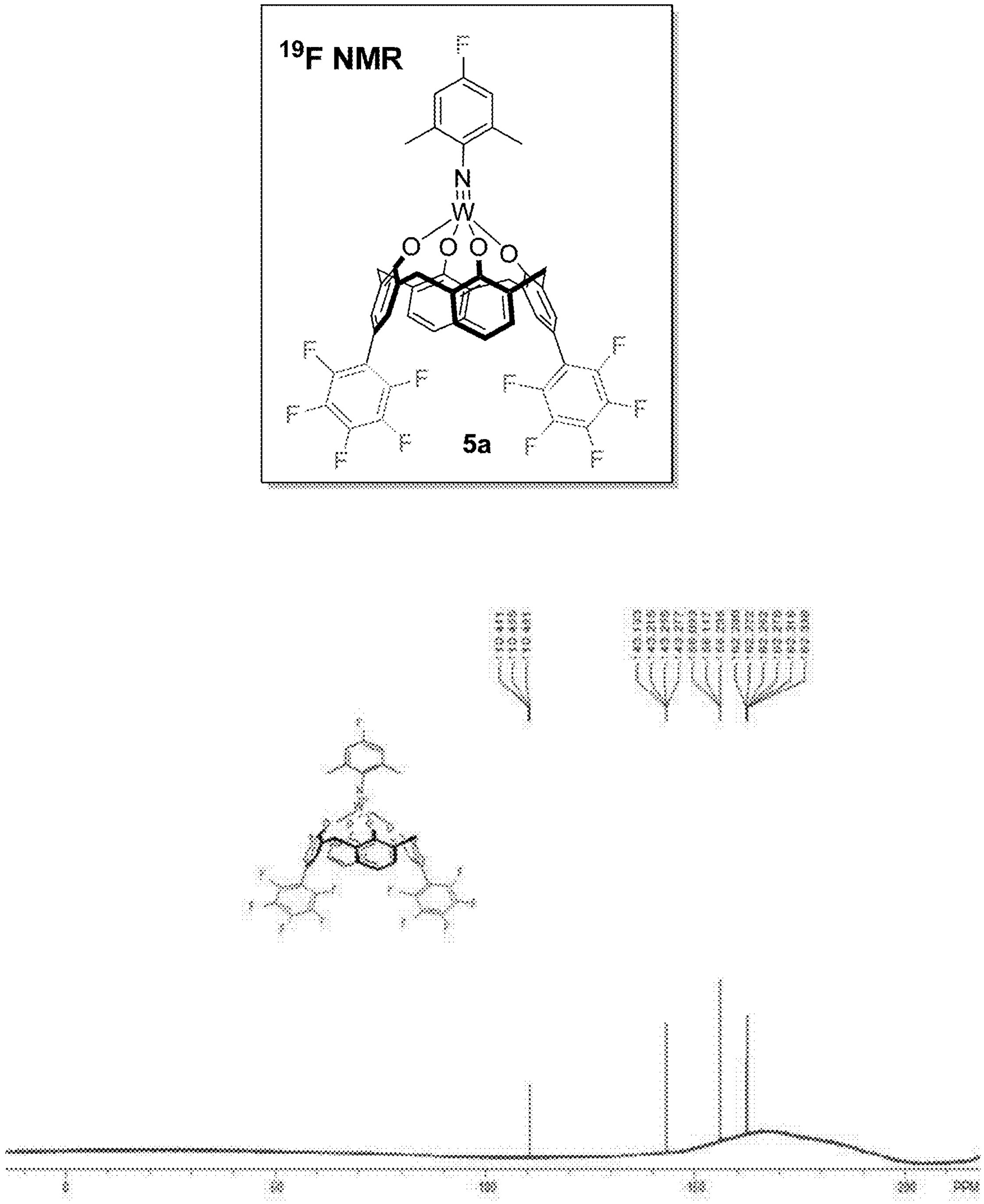
Figure 84:
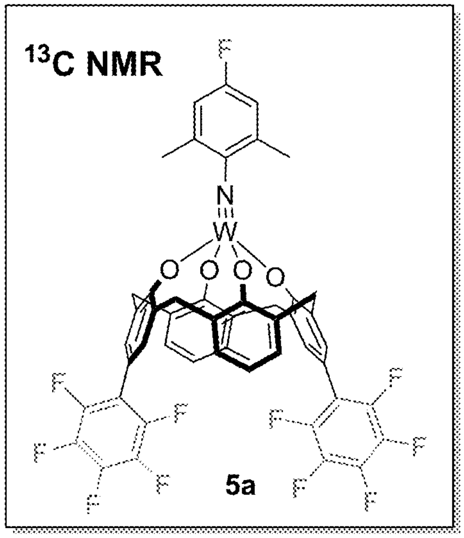
Figure 84:
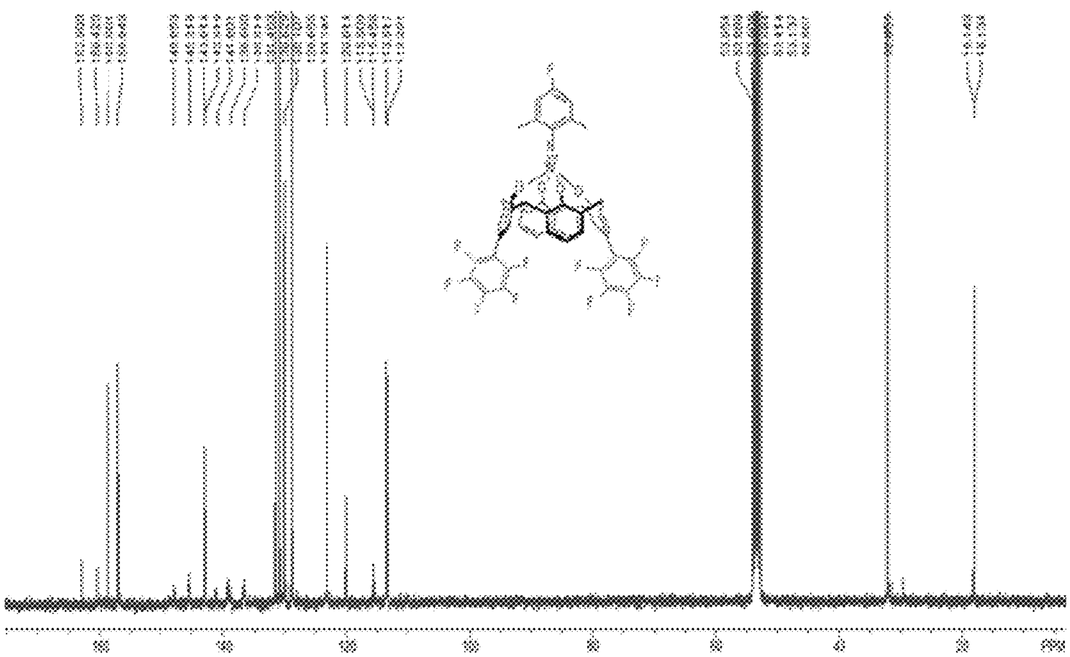

The detection of pollution in water is crucial to environmental monitoring. Although many sensing methods are capable of detecting specific target in domestic water, the analysis of more complex matrix, such as river water is still challenging. To mimic a sample in the environment, water taken from the Charles River between Boston and Cambridge Mass. was contaminated with cyanophos at various concentrations. In order to use a minimum amount of organic solvent, river water (5 mL) was extracted with a solution of receptor 1 in dichloromethane (2 M, 0.6 mL), and resulting dichloromethane phase was analyzed by $^{19}F$ NMR. A detection limit of cyanophos is determined to be 5 μM by using this method (see FIG. 46). Enrichment by extraction is often employed when detecting nanomolar range neutral organic molecules in water. As the process is not selective, a complex mixture with a number of components at much higher concentrations than the target analyte is often obtained. To test the method in the analysis of mixture obtained from enrichment, river water (500 mL) was extracted with dichloromethane (100 mL×3) and concentrated. The extract was then redissolved in a solution of receptor 1 in dichloromethane (2M, 0.5 mL) and analyzed by $^{19}F$ NMR. A detection of cyanophos at 20 nM in river water was achieved by this method. (see FIG. 47). It is worth noting that a number of unidentified species at much higher concentrations than cyanophos were observed in $^1H$ NMR which makes the identification of cyanophos unsuccessful in $^1H$ NMR (see FIG. 48). The preceding studies are intended to illustrate that the method is sufficiently robust for demanding applications. A more efficient extraction process could be achieved by immobilization 1 or analogs in a concentrator/filter assembly. Higher sensitivity in this sensing scheme or others can be achieved by hyperpolarizing the $^{19}F$ NMR signals by dynamic nuclear polarization. See, for example, Loening, N. M.; Rosay, M.; Weis, V.; Griffin, R. G. "Solution-State Dynamic Nuclear Polarization at High Magnetic Field" *J. Am. Chem. Soc.* 2002, 124, 8808-8809, which is incorporated by reference in its entirety.

Figure 24:
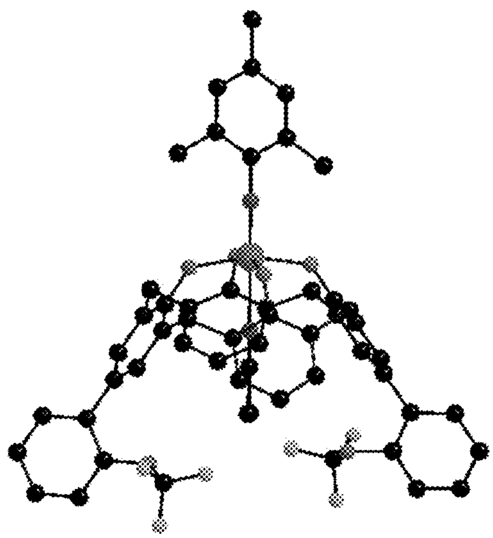
FIG. 24 shows X-ray structures of 1, 2, and 5a (1:1 cocrystal with $CH_3CN$ or PhCN). Black=carbon, green=fluorine, blue=nitrogen, red=oxygen, purple=tungsten. The methyl groups of the acetonitriles in 1: $CH_3CN$ and 2: $CH_3CN$ are disordered about the crystallographic twofold axis.
Figure 24:
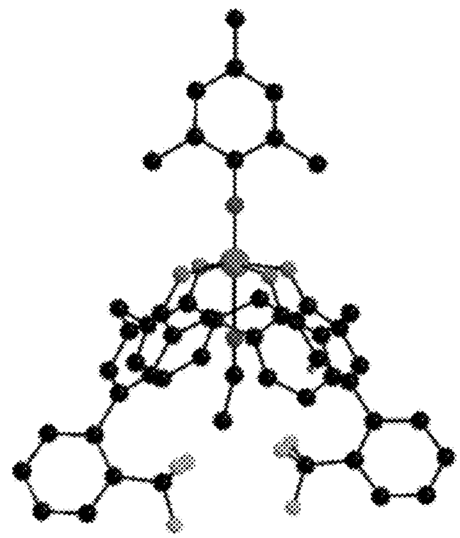
Figure 24:
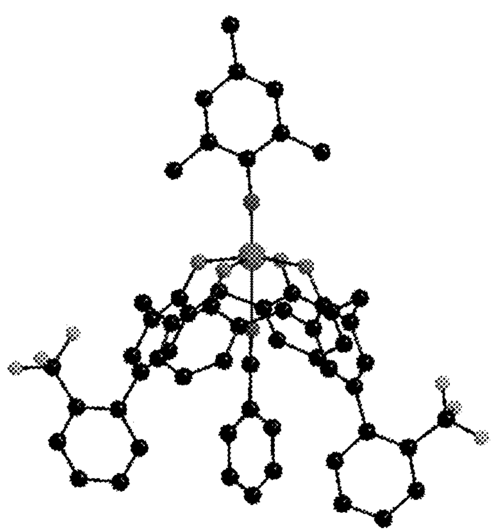
Figure 24:
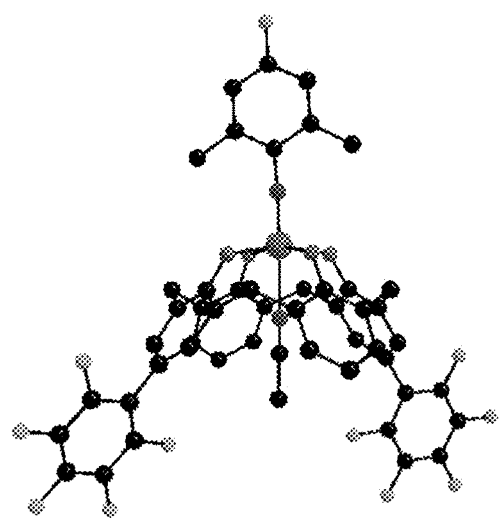
Figure 25:
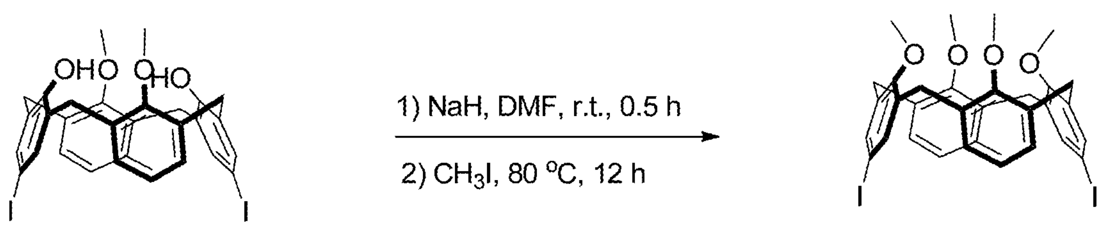
FIG. 25 shows a preparation of diiodocalix[4]arene 6.
Figure 26:
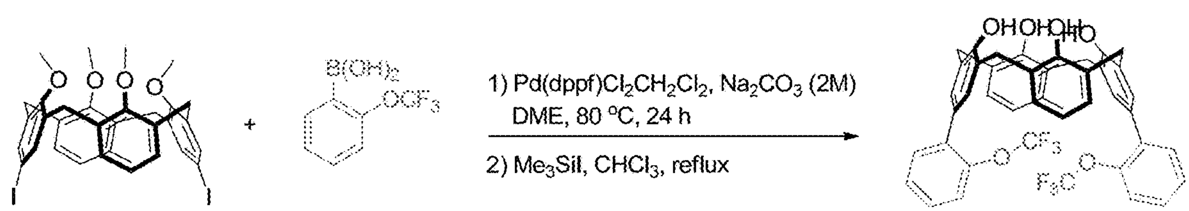
FIG. 26 shows a preparation of substituented-calix[4]arene 7.
Figure 27:
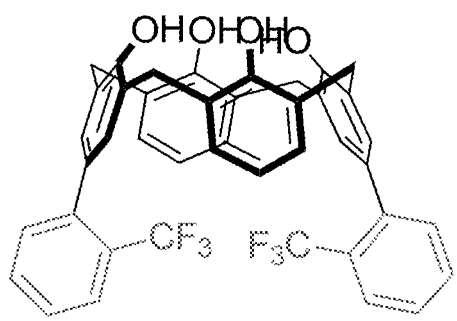
FIG. 27 shows structure of complex 8.
Figure 28:
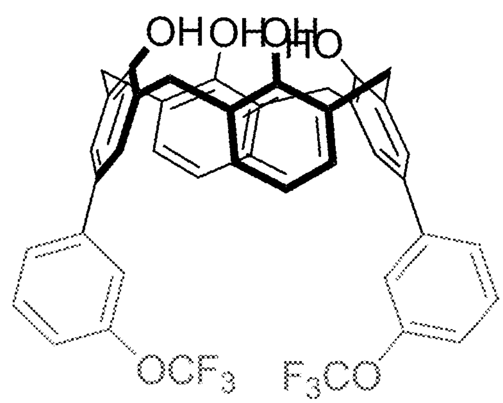
FIG. 28 shows structure of complex 9.
Figure 29:
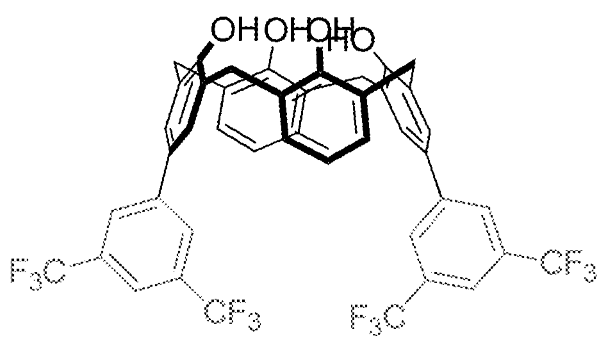
FIG. 29 shows structure of complex 10.
Figure 30:
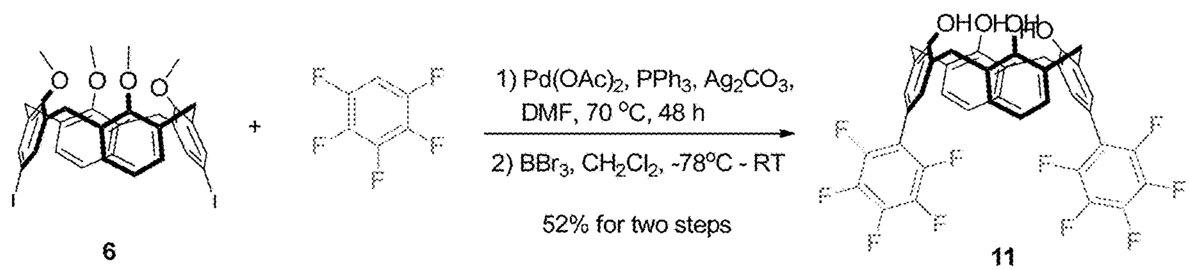
FIG. 30 shows a preparation of pentafluorophenyl substituted-calix[4]arene 11.

To gain more insight of the transduction of the current method, the X-ray single crystal structures of 1, 2, and 5a were obtained. Interestingly, 2: $CH_3CN$ is found to be perfectly isostructural to 1: $CH_3CN$, and the only difference is the $OCF_3$ group is replaced by $CF_3$ group (FIG. 24). This result suggests that it is valid to estimate the structures of related complexes. Although the nonlinear geometry of acetonitrile in 2: $CH_3CN$ is unusual, it is not unprecedented and has been observed in a variety of metal complexes. See, for example, Feng, S. G.; Gamble, A. S.; Philipp, C. C.; White, P. S.; Templeton, J. L. *Organometallics* 1991, 10, 3504; Hutchinson, D. J.; Cameron, S. A.; Hanton, L. R.; Moratti, S. C. *Inorg. Chem.* 2012, 51, 5070; Li, C.-P.; Chen, J.; Du, M. *CrystEngComm* 2010, 12, 4392; Fox, S.; Stibrany, R. T.; Potenza, J. A.; Knapp, S.; Schugar, H. J. *Inorg. Chem.* 2000, 39, 4950; Fernandez, E. J.; Laguna, A.; Lopez-de-Luzuriaga, J. M.; Monge, M.; Montiel, M.; Olmos, M. E.; Rodriguez-Castillo, M. *Dalton Trans.* 2009, 7509, each of which is incorporated by reference in its entirety. Another observation is that fluorinated groups face inward for the cavity in 2: $CH_3CN$ whereas the opposite is true for 2: PhCN. Probably as a result of the larger size of benzonitrile, the cavity of calixarene expands to fit the analyte. The discrete behaviors found in 2: $CH_3CN$ and 2: PhCN in crystal structure also shed light on the chemical shift induced with 2 wherein alkyl nitrile produces a downfield shift whereas aromatic nitrile induces an upfield shift (FIG. 15). The distance of tungsten to the nitrogen of the nitrile in 2: PhCN is significantly longer than that of 2: $CH_3CN$ (2.310 Å vs. 2.287 Å), suggesting a weaker bonding of PhCN. This observation is consistent with the trend of association constants found in Table 1. It should be mentioned that the NMR signals are collected in solution; therefore, the shifts are largely dependent on the average distance between the fluorine atom and the analyte in all of the conformational isomers.

A sensing scheme can be based on $^{19}$F NMR and the encapsulation of analytes with molecular containers, binding of analytes to receptors, or binding of analytes to scaffolds. Unlike other conventional approaches, the method collects extensive interactions between the analyte and receptor/scaffold/container to provide measurable signals with sufficient dimensionality (information) to uniquely identify or "fingerprint" analytes that have only small structural differences. The strategy can be achieved either with an array of receptors or by incorporating multiple nonequivalent fluorine atoms in a single receptor. This new scheme allows for an informative and interpretable output and enables a precise and simultaneous identification of multiple potential guest molecules in a complex mixture. The structures reported herein are only representative examples and can be extended to many other structural scaffolds, including those targeting to complex and/or larger biomolecular species that cannot be readily identified by conventional analytical methods (e.g. mass spectrometry). Critical to this latter prospect is the development of receptors/probes that incorporate $^{19}$F groups that are sensitive to their environment, and produce relatively static complexes. More complex recognition elements can produce powerful detection schemes relevant to environmental and biomedical sensing.

Example 1

Material:

All reactions were carried out under argon using standard Schlenk techniques unless otherwise noted. All solvents were of ACS reagent grade or better unless otherwise noted. Anhydrous toluene ($PhCH_3$) was obtained from Sigma-Aldrich. Silica gel (40 μm) was purchased from SiliCycle Inc. All reagent grade materials were purchased from Alfa Aesar or Sigma-Aldrich and used without further purification. Iminophosphorane ($Ph_3P{=}NR$) reagent was prepared. See, for example, Gibson, V. C.; Kee, T. P.; Shaw, A. *Polyhedron* 1988, 7, 579, which is incorporated by reference in its entirety.

NMR Spectroscopy:

$^{1}$H, $^{19}$F, and $^{13}$C NMR spectra for all compounds were acquired in $CDCl_3$ on a Bruker Avance Spectrometer operating at (400 MHz 376 MHz, and 100 MHz, respectively). Chemical shifts (6) are reported in parts per million (ppm) and referenced with TMS for $^{1}$H NMR and $CFCl_3$ for $^{19}$F NMR.

General Procedure for NMR Experiment:

For FIGS. 14, 15, 17, and 18, at ambient temperature, complexes 1-4 (1.04 M in 488 μL of $CDCl_3$) was mixed with different analytes (50 M in 20 μL $CDCl_3$).

For FIG. 21, at ambient temperature, complex 5a (2.07 M in 530 μL of $CDCl_3$) was mixed with different analytes (variable concentrations in 20 μL $CDCl_3$). The NMR spectra was recorded on a Bruker Avance Spectrometer with TOPSPIN using autolocking and autoshimming (typically 128 scans).

The obtained NMR data were processed using MestReNova. After phase correction, the spectra were stacked (stacked angle=0). For FIG. 21, the signals between −109.9 ppm to −111.1 ppm (imido-Fluorine), −142.8 ppm to −144.4 ppm (ortho-Fluorine), −155.4 ppm −157.4 ppm (para-Fluorine), and −161.0 to 166.0 (meta-Fluorine) were shown in FIG. 21.

Mass Spectrometry:

High-resolution mass spectra (HRMS) were obtained at the MIT Department of Chemistry Instrumentation Facility employing electrospray (ESI) as the ionization technique.

Preparation of Diiodocalix[4]Arene 6

Under Ar atmosphere, NaH (60% dispersion in mineral oil, 284 mg, 7.10 mmol, 5.0 equiv) was added to a solution of 5,17-Diiodo-25,27-dimethoxy-26,28-dihydroxycalix[4]arene (13) in DMF (20 mL). After the reaction mixture was stirred at room temperature for 0.5 h, MeI (1.01 g, 7.10 mmol, 5.0 equiv) was added. The resulting mixture was heated at 80° C. for 12 h. The reaction was then cooled to room temperature, water (50 mL) was added. The mixture was filtered and the solid was washed with water (20 mL) and methanol (20 mL) to get the crude product which was purified by silica gel chromatography using hexane/DCM as the eluent to give a white solid (780 mg, Yield: 75%). MP: 202-205° C. IR: 2975, 2919, 2816, 1464, 1423, 1255, 1211, 1080, 865, 837, 767 $cm^{-1}$. A mixture of conformers. $^{1}$H NMR (400 MHz, $CDCl_3$) δ 7.51 (bs), 7.33 (bs), 7.23 (bs), 7.17 (bs), 7.00 (bs), 6.87 (bs), 6.72-6.51 (bm), 6.47 (bt), 6.35 (bs), 4.20 (bd, J=13.2 Hz), 3.93 (bt, J=14.9 Hz), 3.72 (bd, J=8.5 Hz), 3.64-3.38 (bm), 3.17-2.82 (bm). $^{13}$C NMR (101 MHz, $CDCl_3$) δ 158.07, 157.68, 157.40, 157.30, 139.36, 139.12, 137.88, 137.52, 136.89, 136.18, 134.28, 134.05, 133.29, 133.97, 131.51, 130.69, 129.24, 129.08, 128.51, 128.34, 122.87, 122.24, 86.25, 85.89, 61.75, 61.59, 60.98, 60.88, 60.07, 59.69, 59.38, 58.52, 35.39, 30.24. HRMS (ESI): calc for $C_{32}H_{34}I_2NO_4^+$ $[M+NH_4]^+$ 750.0572. found 750.0561.

13 was prepared according to a procedure described in the literature. See, for example Klenke, B.; Friedrichsen, W. *J. Chem. Soc.; Perkin Trans.* 1 1998, 3377, which is incorporated by reference by its entirety.

General Procedure for the Preparation of Fluorinated Calix[4]Arenes 7-10

To a 25 mL Schlenk tube was added $Pd(dppf)Cl_2.CH_2Cl_2$ (28 mg, 0.034 mmol, 0.10 equiv), 6 (250 mg, 0.34 mmol) and (2-(trifluoromethoxy)phenyl)boronic acid (281 mg, 1.37 mmol, 4.0 equiv) under Ar, followed by DME (8 mL) and $Na_2CO_3$ (2 mL, 2M). The reaction was heated to 80° C. and stirred for 18 h. After the reaction was cooled to room temperature, $CHCl_3$ (80 mL) and water (40 mL) were added. The organic layer was washed with brine (40 mL×2) and concentrated. The crude product was purified by silica gel chromatography using hexane/DCM as the eluent to give a white solid (231 mg). The solid was dissolved in $CHCl_3$ and $Me_3SiI$ (1.365 g, 20 equiv) was added dropwise. The reaction mixture was refluxed for 6 h and then allowed to warm to room temperature. 3N HCl (10 mL) was added, and the mixture was stirred for another 1 h. After extreated with $CHCl_3$ (50 mL), the organic layer was concentrated, and the crude product was purified by silica gel chromatography using hexane/DCM as the eluent to give product 7 as a white solid (163 mg, Yield: 65% for two steps). M.P. 123-125° C. IR: 3189, 1473, 1454, 1248, 1216, 1168, 1111, 1082, 926, 890, 783, 751, 673, 631 $cm^{-1}$. $^{1}$H NMR (400 MHz, $CDCl_3$) δ 10.30 (s, 4H), 7.35-7.29 (m, 8H), 7.28 (s, 4H), 7.09 (d, J=7.6 Hz, 4H), 6.75 (t, J=7.6 Hz, 2H), 4.34 (s, 4H), 3.63 (s, 4H). $^{19}$F NMR (376 MHz, $CDCl_3$) δ −56.51 (s). $^{13}$C NMR (101 MHz, $CDCl_3$) δ 148.92, 148.61, 146.25, 134.14, 131.50, 130.48, 129.94, 129.27, 128.27, 128.18, 128.10, 126.78, 122.50, 120.62, 120.55 (q, J=257.6 Hz), 31.91. HRMS (ESI): calc for $C_{42}H_{30}F_6NaO_6$ $[M+Na]^+$ 767.1839. found 767.1852.

Product 8 was a white solid. Yield: 50% for two steps. M.P. 270-271° C. IR: 3181, 1604, 1469, 1448, 1314, 1261, 1170, 1125, 1107, 1081, 1051, 1034, 959, 918, 876, 829, 785, 768, 755, 735, 686, 652, 638 $cm^{-1}$. $^{1}H$ NMR (400 MHz, $CDCl_3$) δ 10.28 (s, 4H), 7.71 (d, J=7.1 Hz, 2H), 7.33-7.27 (m, 2H), 7.24 (t, J=7.3 Hz, 2H), 6.97 (s, 4H), 6.92 (d, J=7.6 Hz, 4H), 6.64-6.55 (m, 4H), 4.33 (s, 4H), 3.58 (s, 4H). $^{19}F$ NMR (376 MHz, $CDCl_3$) δ −56.59 (s). $^{13}C$ NMR (101 MHz, $CDCl_3$) δ 148.93, 148.53, 140.59, 133.51, 132.04, 131.05, 129.67, 129.21, 128.32 (q, J=29.5 Hz), 128.09, 127.45, 127.09, 125.93, 124.23 (q, J=274.0 Hz), 122.26 (s), 31.82 (s). HRMS (ESI): calc for $C_{42}H_{34}F_6NO_4$ $[M+NH_4]^+$ 730.2387. found 730.2368.

Product 9 was a white solid. Yield: 67% for two steps. M.P. 238-240° C. IR: 3204, 1609, 1582, 1469, 1453, 1252, 1217, 1160, 1088, 870, 782, 766, 735, 697, 634 $cm^{-1}$. $^{1}H$ NMR (400 MHz, $CDCl_3$) δ 10.30 (s, 4H), 7.43-7.33 (m, 4H), 7.26 (s, 6H), 7.18-7.12 (m, 6H), 6.81 (t, J=7.6 Hz, 2H), 4.35 (s, 4H), 3.66 (s, 4H). $^{19}F$ NMR (376 MHz, $CDCl_3$) δ −57.65 (s). $^{13}C$ NMR (101 MHz, $CDCl_3$) δ 149.60, 149.11, 148.79, 142.86, 133.95, 129.92, 129.24, 128.82, 128.13, 127.88, 125.26, 122.57, 120.56 (q, J=257.3 Hz), 119.49, 119.03, 31.93. HRMS (ESI): calc for $C_{42}H_{30}F_6NaO_6$ $[M+Na]^+$ 767.1839. found 767.1824.

Product 10 was a white solid. M.P. 270-272° C. IR: 376, 1604, 1455, 1382, 1277, 1137, 1130, 898, 874, 845, 806, 753, 706, 663, 651, 638 $cm^{-1}$. $^{1}H$ NMR (400 MHz, $CDCl_3$) δ 10.31 (s, 4H), 7.83 (s, 4H), 7.79 (s, 2H), 7.29 (s, 4H), 7.18 (d, J=7.6 Hz, 4H), 6.85 (t, J=7.6 Hz, 2H), 4.37 (s, 4H), 3.70 (s, 4H). $^{19}F$ NMR (376 MHz, $CDCl_3$) δ −62.82 (s). $^{13}C$ NMR (101 MHz, $CDCl_3$) δ 149.87, 148.66, 142.75, 132.47, 132.14, 131.81, 131.48, 129.32, 129.27, 127.95, 127.89, 126.88, 123.37 (q, J=272.8 Hz), 122.75, 120.44, 31.85. HRMS (ESI): calc for $C_{44}H_{32}F_{12}NO_4$ $[M+NH_4]^+$ 866.2134. found 866.2150.

Preparation of Pentafluorophenyl Substituted-Calix[4]Arene 11:

The palladium catalyzed cross-coupling with pentaflorobenze was using an analogue procedure described in literature. See, for example, Chen, F.; Min, Q.-Q.; Zhang, X. *J. Org. Chem.* 2012, 77, 2992, which is incorporated by reference by its entirety.

To a 25 mL Schlenk tube was added $Pd(OAc)_2$ (27 mg, 0.21 mmol, 0.15 equiv), $PPh_3$ (46 mg, 0.17 mmol, 0.21 equiv), $Ag_2CO_3$ (340 mg, 1.23 mmol, 1.5 equiv) and 6 (600 mg, 0.82 mmol) under Ar, followed by pentafluorobenzene (688 mg, 4.09 mmol, 5.0 equiv) and DMF (15 mL). The reaction was heated to 70° C. and stirred for 48 h. After the reaction was cooled to room temperature, EtOAc (80 mL) and water (40 mL) were added. The organic layer was washed with brine (40 mL×2) and concentrated. The crude product was purified by silica gel chromatography using hexane/DCM as the eluent to give white solid (465 mg). The Demethylation was using an analogue procedure described in literature. See, for example, Scully, P. A.; Hamilton, T. M.; Bennett, J. L. *Org. Lett.* 2001, 3, 2741, which is incorporated by reference in its entirety.

A solution of $BBr_3$ (3.7 mL, 6.5 equiv, 1.0 M in $CH_2CH_2$) was added dropwise to a solution of the product obtained in the last step (465 mg, 0.57 mmol) in $CH_2Cl_2$ (25 mL) at −78° C. under Ar. The reaction mixture was held at −78° C. for 3 h and then allowed to warm to room temperature and stirred overnight (12 h). The reaction mixture was treated with saturated $Na_2CO_3$ (30 mL) and extreated with $CH_2Cl_2$ (50 mL). The organic layer was concentrated, and the crude product was purified by silica gel chromatography using hexane/DCM as the eluent to give product 11 as a white solid (322 mg, Yield: 52% for two steps). M.P. 325° C. (decomposed). IR: 3453, 3253, 2952, 1526, 1494, 1452, 1083, 990, 817, 767, 752 $cm^{-1}$. $^{1}H$ NMR (400 MHz, $CDCl_3$) δ 10.25 (s, 4H), 7.21 (s, 4H), 7.07 (d, J=7.6 Hz, 4H), 6.78 (t, J=7.6 Hz, 2H), 4.33 (s, 4H), 3.63 (s, 4H). $^{19}F$ NMR (376 MHz, $CDCl_3$) δ −143.18 (dd, J=23.1, 8.1 Hz, 4F), −156.20 (t, J=21.1 Hz, 2F), −162.26-−162.45 (m, 4F). $^{13}C$ NMR (101 MHz, $CDCl_3$) δ 150.19 (s), 148.35, 144.04 (dm, J=251.1 Hz), 140.04 (dm, J=257.7 Hz), 137.86 (d, J=250.9 Hz), 130.87, 129.33, 128.63, 127.82, 122.82, 119.86, 115.25 (t, J=16.6 Hz), 31.73. HRMS (ESI): calc for $C_{40}H_{23}F_{10}O_4$ $[M+H]^+$ 774.1431. found 774.1448.

General Procedure for the Preparation of Calixarene Tungsten-Imido Complex 1-5 and 5a.

Figure 31:
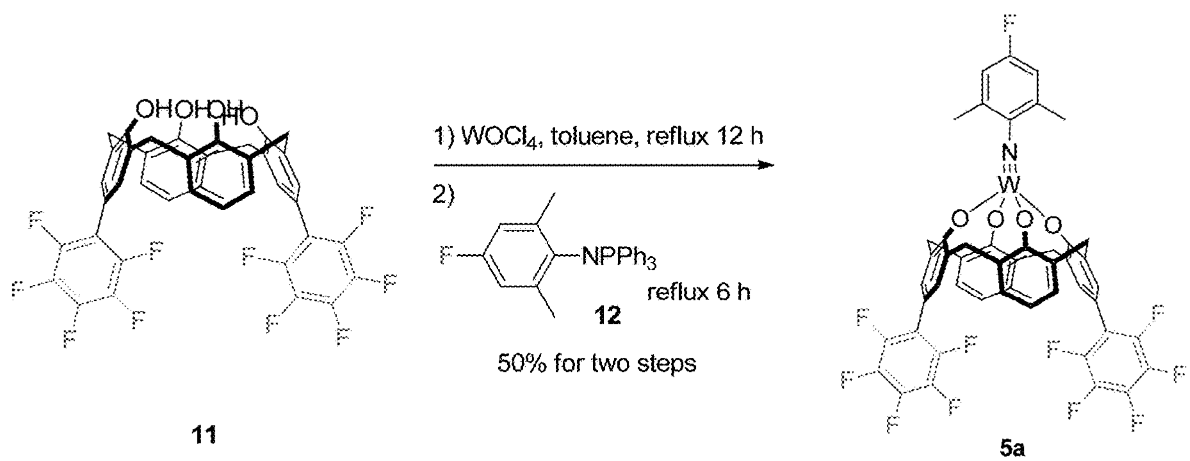
Figure 32:
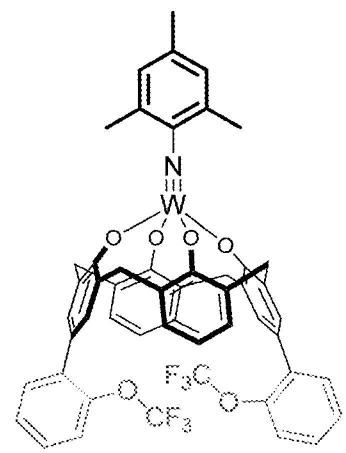
FIG. 32 shows structure of complex 1.
Figure 33:
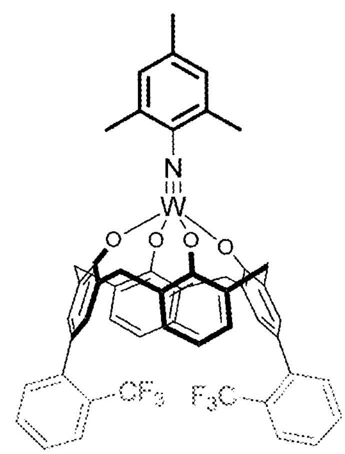
FIG. 33 shows structure of complex 2.
Figure 34:
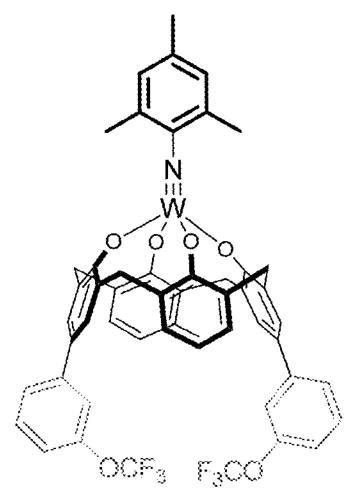
FIG. 34 shows structure of complex 3.
Figure 35:
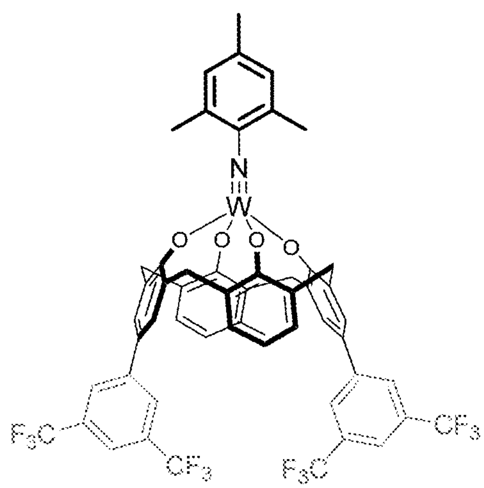
FIG. 35 shows structure of complex 4.
Figure 36:
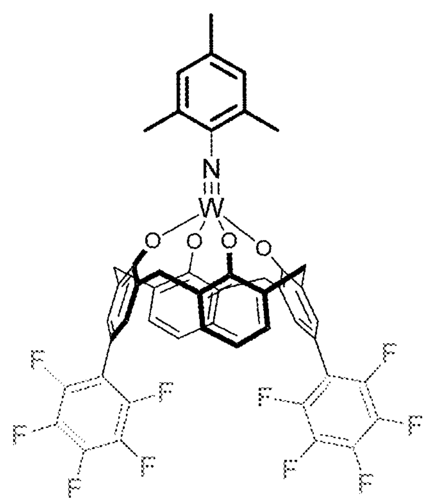
FIG. 36 shows structure of complex 5.

A general procedure can be used for the preparation of calixarene tungsten imido complex 1-5 and 5a. FIG. 31 describes a procedure. See, for example, Zhao, Y.; Swager, T. M. *J. Am. Chem. Soc.* 2013, 135, 18770, which is incorporated by reference in its entirety. To a suspension of $WOCl_4$ (147 mg, 0.43 mmol, 1.20 equiv) and Calixarene 11 (272 mg, 0.36 mmol) were dissolved in 10 mL dry toluene and refluxed for 12 h under an inert atmosphere?. Iminophoshorane reagent 12 (215 mg, 0.54 mmol, 1.50 equiv) was added and the mixture was refluxed for additional 6 h. Evaporation of the solvent and the crude product was purified by silica gel chromatography using hexane/dichloromethane (1:1) as the eluent to give product 6 as a yellow solid (193 mg, Yield: 50%).

IR: 3541, 3474, 2948, 1523, 1497, 1468, 1447, 1281, 1265, 1075, 992, 858, 800, 769, 717 $cm^{-1}$. $^{1}H$ NMR (400 MHz, $CDCl_3$) δ 7.27 (s, 4H), 7.16 (d, J=7.6 Hz, 4H), 6.95 (d, J=9.0 Hz, 2H), 6.73 (t, J=7.6 Hz, 2H), 4.69 (d, J=12.6 Hz, 1H), 3.38 (d, J=12.6 Hz, 1H), 3.16 (s, 6H). $^{19}F$ NMR (376 MHz, $CDCl_3$) δ −110.47 (t, J=9.0 Hz, 1F), −143.25 (dd, J=23.4, 7.9 Hz, 4F), −156.16 (t, J=21.1 Hz, 2F), −162.19-−162.38 (m, 4F). $^{13}C$ NMR (101 MHz, $CD_2Cl_2$) δ 161.65 (d, J=249.0 Hz), 158.79 (s), 156.93 (s), 147.95 (s), 144.20 (dm, J=259.3 Hz), 142.96 (d, J=9.2 Hz), 140.00 (dm, J=256.3 Hz), 137.85 (dm, J=248.3 Hz), 131.45 (s), 130.82 (s), 130.10 (s), 128.64 (s), 123.24 (s), 120.00 (s), 115.48 (t, J=17.3 Hz), 113.39 (d, J=22.8 Hz), 32.06 (s), 18.15 (d, J=1.3 Hz). HRMS (ESI): calc for $C_{48}H_{27}F_{11}NO_4W$ $[M+H]^+$ 1074.1280. found 1074.1268.

Yield: 75%. Product 1 was a yellow solid. IR: 1458, 1430, 1322, 1247, 1212, 1201, 1180, 1155, 1111, 920, 905, 858, 815, 804, 761, 752, 712, 652 $cm^{-1}$. $^{1}H$ NMR (400 MHz, $CDCl_3$) δ 7.37-7.31 (m, 8H), 7.30 (s, 4H), 7.16 (d, J=7.6 Hz, 4H), 7.07 (s, 2H), 6.68 (t, J=7.5 Hz, 2H), 4.70 (d, J=12.5 Hz, 4H), 3.37 (d, J=12.6 Hz, 4H), 3.14 (s, 6H), 2.58 (s, 3H). $^{19}F$ NMR (376 MHz, $CDCl_3$) δ −56.63 (s). $^{13}C$ NMR (101 MHz, $CDCl_3$) δ 157.52, 157.40, 149.50, 146.26, 140.38, 138.54, 134.17, 131.43, 131.08, 131.04, 130.64, 129.14, 128.51, 128.21, 127.40, 126.82, 122.70, 120.70, 120.46 (q, J=258.0 Hz), 32.38, 21.01, 18.20. HRMS (ESI): calc for $C_{51}H_{38}F_6NO_6W$ $[M+H]^+$ 1058.2107. found 1058.2119.

Yield: 77%. Product 2 was a yellow solid. IR: 1463, 1447, 1313, 1271, 1240, 1161, 1117, 1103, 1089, 1036, 858, 810, 761 $cm^{-1}$. $^{1}H$ NMR (400 MHz, $CDCl_3$) δ 7.72 (d, J=7.3 Hz, 2H), 7.54 (t, J=7.5 Hz, 2H), 7.44 (t, J=7.6 Hz, 2H), 7.33-7.29 (m, 2H), 7.28 (s, 4H), 7.12 (d, J=7.6 Hz, 4H), 7.07 (s, 2H), 6.67 (t, J=7.5 Hz, 2H), 4.71 (t, J=10.2 Hz, 4H), 3.34 (d, J=12.6 Hz, 4H), 3.14 (s, 6H), 2.59 (s, 3H). $^{19}F$ NMR (376 MHz, $CDCl_3$) δ −56.64 (s). $^{13}C$ NMR (101 MHz, $CDCl_3$) δ 157.45, 157.41, 149.50, 140.98, 140.36, 138.52, 133.75, 132.17, 131.27, 131.09, 130.44, 128.91, 128.69, 128.45, 127.40, 127.08, 126.22 (q, J=5.2 Hz), 124.16 (q, J=273.9 Hz), 122.68, 32.34, 21.01, 18.22. HRMS (ESI): calc for $C_{51}H_{38}F_6NO_4W$ $[M+H]^+$ 1026.2209. found 1026.2221.

Yield: 67%. Product 3 was a yellow solid. IR: 1607, 1461, 1432, 1355, 1325, 1249, 1218, 1168, 1086, 921, 903, 859, 803, 762, 712, 640 $cm^{-1}$. $^1H$ NMR (400 MHz, $CDCl_3$) δ 7.41 (t, J=7.8 Hz, 2H), 7.38-7.34 (m, 2H), 7.28 (s, 4H), 7.25 (s, 2H), 7.23-7.19 (m, 4H), 7.17-7.11 (m, 2H), 7.07 (s, 2H), 6.74 (t, J=7.6 Hz, 2H), 4.71 (d, J=12.5 Hz, 4H), 3.41 (t, J=12.5 Hz, 4H), 3.13 (s, 6H), 2.60 (s, 3H). $^{19}F$ NMR (376 MHz, $CDCl_3$) δ −57.63 (s). $^{13}C$ NMR (101 MHz, $CDCl_3$) δ 158.03, 157.43, 149.60, 149.40, 142.90, 140.47, 138.73, 133.97, 131.73, 131.15, 129.95, 128.50, 127.44, 127.05, 125.22, 122.89, 120.54 (q, J=257.3 Hz), 119.44, 118.97, 32.42, 21.02, 18.20. HRMS (ESI): calc for $C_{51}H_{38}F_6NO_6W$ $[M+H]^+$ 1058.2107. found 1058.2119.

Yield: 52%. Product 4 was a yellow solid. IR: 1457, 1381, 1276, 1252, 1175, 1131, 1087, 1077, 762, 683 $cm^{-1}$. $^1H$ NMR (400 MHz, $CDCl_3$) δ 7.82 (s, 4H), 7.79 (s, 2H), 7.35 (s, 4H), 7.25 (d, J=7.6 Hz, 4H), 7.09 (s, 2H), 6.78 (t, J=7.6 Hz, 2H), 4.73 (d, J=12.5 Hz, 4H), 3.43 (d, J=12.6 Hz, 4H), 3.15 (s, 6H), 2.61 (d, J=7.1 Hz, 3H). $^{19}F$ NMR (376 MHz, $CDCl_3$) δ −62.81 (s). $^{13}C$ NMR (101 MHz, $CDCl_3$) δ 158.95, 157.17, 149.41, 142.86, 140.55, 139.01, 132.46, 132.20, 132.15, 131.82, 131.49, 131.05, 128.62, 127.48, 127.13, 126.84, 123.39 (q, J=272.8 Hz), 123.21, 120.35, 32.38, 21.02, 18.20. HRMS (ESI): calc for $C_{53}H_{36}F_{12}NO_4W$ $[M+H]^+$ 1162.1957. found 1162.1969.

Yield: 70%. Product 5 was a yellow solid. IR: 1521, 1495, 1469, 1450, 1286, 1266, 1251, 1227, 1203, 1085, 1077, 990, 966, 943, 921, 884, 858, 835, 799, 762, 717, 667, 650 $cm^{-1}$. $^1H$ NMR (400 MHz, $CDCl_3$) δ 7.26 (s, 4H), 7.15 (d, J=7.6 Hz, 4H), 7.08 (s, 2H), 6.72 (t, J=7.6 Hz, 2H), 4.70 (d, J=12.6 Hz, 4H), 3.37 (d, J=12.6 Hz, 4H), 3.13 (s, 6H), 2.60 (s, 3H). $^{19}F$ NMR (376 MHz, $CDCl_3$) δ −143.25 (dd, J=23.4, 7.9 Hz, 4F), −156.30 (t, J=21.0 Hz, 2F), −162.35 (td, J=22.8, 8.0 Hz, 4F). $^{13}C$ NMR (101 MHz, $CD_2Cl_2$) δ 158.92 (s), 157.06 (s), 149.21 (s), 144.17 (dm, J=248.0 Hz), 140.26 (s), 139.93 (dm, J=250.9 Hz), 139.05 (s), 137.92 (dm, J=251.0 Hz), 131.50 (s), 130.86 (s), 130.05 (s), 128.59 (s), 127.42 (s), 123.07 (s), 119.83 (s), 115.54 (t, J=15.2 Hz), 32.06 (s), 20.72 (s), 17.85 (s). HRMS (ESI): calc for $C_{49}H_{30}F_{10}NO_4W$ $[M+H]^+$ 1162.1957. found 1162.1969.

Method to Plot FIG. 22:

FIG. 22 was plotted with the following coordinates (X, Y, Z) using software Origin.

The size of the particle is correlated with parameter (Size shown below) using a scaling factor of 0.4

Example of Generation of Coordinate for 3D Scatter:

For $CH_3CN$:

| | Complex 5a | Complex 5a: $CH_3CN$ | |
|---|---|---|---|
| δ(ortho-Fluorine) | −143.211 | −143.826 | X = −Δδ × 1000 = 605 |
| δ(para-Fluorine) | −156.154 | −156.154 | Y = −Δδ × 1000 = 0 |
| δ(meta-Fluorine) | −162.346 | −162.269 | Z = −Δδ × 1000 = −77 |
| δ(imido-Fluorine) | −110.44 | −110.826 | Size = −Δδ × 1000 = 362 |

The following table shows coordinates for the analytes:

| Analytes | X | Y | Z | Size |
|---|---|---|---|---|
| $CH_3CN$ | 605 | 0 | −77 | 362 |
| $CH_3CH_2CN$ | 636 | 55 | −64 | 442 |
| $C_8H_{17}CN$ | 487 | 116 | −44 | 463 |
| 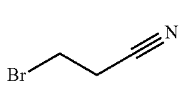 | 633 | −253 | −307 | 127 |

-continued

| Analytes | X | Y | Z | Size |
|---|---|---|---|---|
| 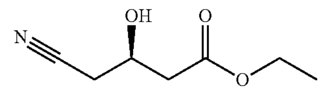 | 539 | 87 | −70 | 226 |
| 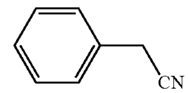 | 185 | 188 | −33 | 379 |
| 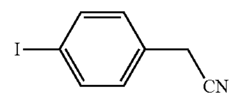 | 462 | −295 | −391 | 224 |
| 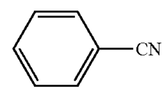 | 529 | 521 | 463 | 479 |
| 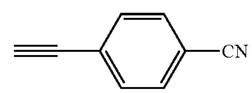 | 718 | 285 | 232 | 359 |
| 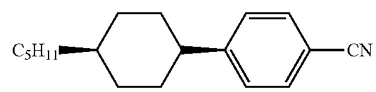 | 307 | 748 | 666 | 600 |
| 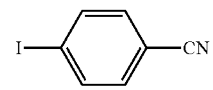 | 749 | 174 | 109 | 312 |
| 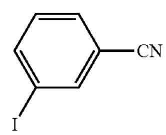 | 525 | 452 | 370 | 297 |
| 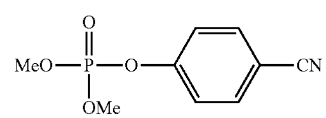 [SMILES: COP(=O)(OC)Oc1ccc(C#N)cc1] | 525 | 452 | 370 | 297 |

Example 2: Simultaneous Chirality Sensing of Multiple Amines by 19F NMR

The rapid detection and differentiation of chiral compounds is important to synthetic, medicinal, and biological chemistry. Palladium complexes with chiral pincer ligands are demonstrated to have utility in determining the chirality of various amines. See, for example, Simultaneous Chirality Sensing of Multiple Amines by $^{19}F$ NMR, Yanchuan Zhao, Timothy Swager, *J. Am. Chem. Soc.* 2015, 137, 3221-3224, which is incorporated by reference in its entirety. The binding of enantiomeric amines induced distinct $^{19}F$ NMR shifts of the fluorine atoms appended on the ligand that defines a chiral environment around palladium. It is further demonstrated that this method has the ability to evaluate the enantiomeric composition and discriminate between enantiomers with chiral centers several carbons away from the binding site. The wide detection window provided by optimized chiral chemosensors allows the simultaneous identification of as many as 12 chiral amines. The extraordinary discriminating ability of this method is demonstrated by the resolution of chiral aliphatic amines that are difficult to separate using chiral chromatography.

Rapid and facile methods to detect and discriminate chiral compounds are highly desirable to accelerate advances in synthetic and biological chemistry. See, for example, *Differentiation of Enantiomers I*; Schurig, V., Ed.; Springer: Heidelberg, 2013; *Differentiation of Enantiomers II*; Schurig, V., Ed.; Springer: Heidelberg, 2013, each of which is incorporated by reference in its entirety. The challenges in analysis stem from the obvious fact that enantiomeric molecules have the same physical properties. Chemosensory systems designed for chirality determination have attracted increasing attention as a result of the low cost and simplicity as alternatives to traditionally employed X-ray crystallography and chiral chromatography. See, for example, Hembury, G. A.; Borovkov, V. V.; Inoue, Y. *Chem. Rev.* 2007, 108, 1; Tsukube, H.; Shinoda, S. *Chem. Rev.* 2002, 102, 2389; Bentley, K. W.; Nam, Y. G.; Murphy, J. M.; Wolf, C. *J. Am. Chem. Soc.* 2013, 135, 18052; You, L.; Pescitelli, G.; Anslyn, E. V.; Di Bari, L. *J. Am. Chem. Soc.* 2012, 134, 7117; Sofikitis, D.; Bougas, L.; Katsoprinakis, G. E.; Spiliotis, A. K.; Loppinet, B.; Rakitzis, T. P. *Nature* 2014, 514, 76, each of which is incorporated by reference in its entirety. For instance, on the basis of an intensity change of a fluorescence or circular dichroism (CD) signal, the enantiomeric excess (ee) value of a sample can be quickly evaluated. See, for example, Pu, L. *Chem. Rev.* 2004, 104, 1687; Pu, L. *Acc. Chem. Res.* 2011, 45, 150; Leung, D.; Kang, S. O.; Anslyn, E. V. *Chem. Soc. Rev.* 2012, 41, 448; Wolf, C.; Bentley, K. W. *Chem. Soc. Rev.* 2013, 42, 5408; Jo, H. H.; Lin, C.-Y.; Anslyn, E. V. *Acc. Chem. Res.* 2014, 47, 2212, each of which is incorporated by reference in its entirety. In addition to the speed of detection, other desirable attributes of a chirality sensing system include simplicity in the measurement, broad substrate applicability, and the ability to analyze complex mixtures. A limitation of optical methods for routine applications is that they usually require pure sample with known enantiomeric excess to construct a calibration curve. Herein, a $^{19}$F NMR chemosensing system doesn't suffer from these limitations in the differentiation of enantiomers. Specifically this method does not require enantiopure samples to determine the ee and is capable of predicting the absolute configuration. Multiple chiral amines can be simultaneously identified in a single NMR experiment.

Figure 85:
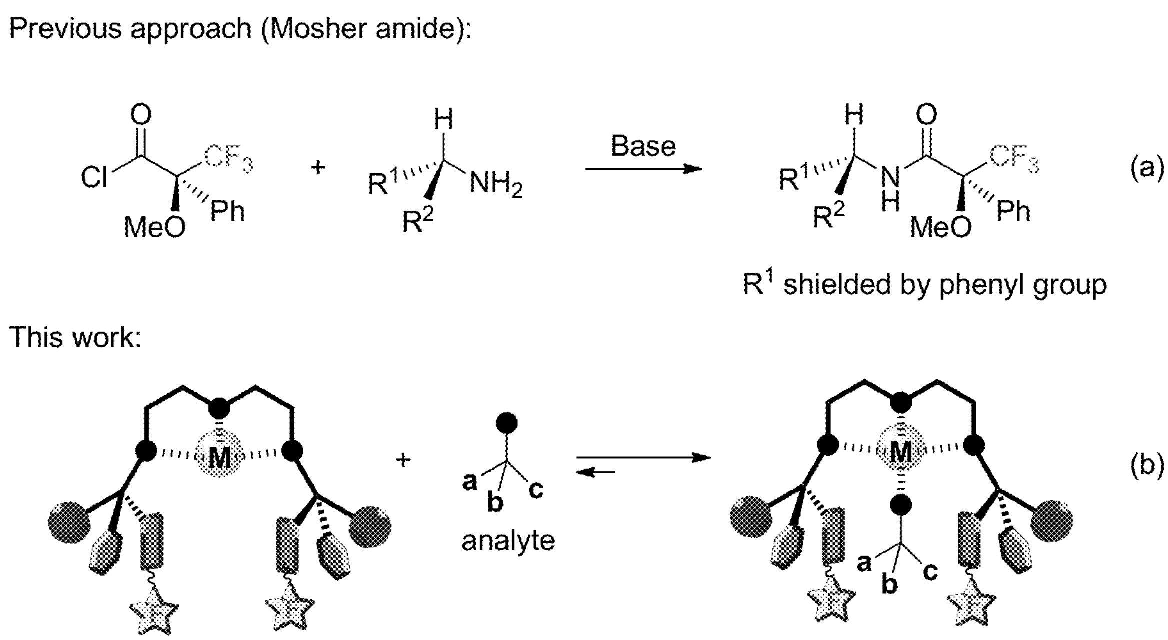
FIG. 85 shows comparison of Mosher amide based approach and the sensing scheme here for the discrimination of chiral amines.

NMR is a useful tool to access chiral information by using chiral derivatizing or solvating agents to produce diastereomeric complexes that can be used to discriminate between enantiomers. See, for example, Wenzel, T. J.; Wilcox, J. D. *Chirality* 2003, 15, 256; Seco, J. M.; Quiñoá, E.; Riguera, R. *Chem. Rev.* 2004, 104, 17; Parker, D. *Chem. Rev.* 1991, 91, 1441; Wenzel, T. J.; Chisholm, C. D. *Prog. Nucl. Magn. Reson. Spectrosc.* 2011, 59, 1; Pérez-Trujillo, M.; Monteagudo, E.; Parella, T. *Anal. Chem.* 2013, 85, 10887; Chaudhari, S. R.; Suryaprakash, N. *J. Org. Chem.* 2011, 77, 648; Moon, L. S.; Pal, M.; Kasetti, Y.; Bharatam, P. V.; Jolly, R. S. *J. Org. Chem.* 2010, 75, 5487; Ema, T.; Tanida, D.; Sakai, T. *J.* Am. Chem. Soc. 2007, 129, 10591; Quinn, T. P.; Atwood, P. D.; Tanski, J. M.; Moore, T. F.; Folmer-Andersen, J. F. *J. Org. Chem.* 2011, 76, 10020, each of which is incorporated by reference in its entirety. As these methods typically rely on the NMR signals of the substrate, the analysis often requires pure samples and is complicated if the NMR signals overlap. One approach to address these limitations in NMR methods is to use a $^{19}$F chiral derivatizing agent as a probe to simplify the NMR signal. See, for example, Allen, D. A.; Tomaso, A. E.; Priest, O. P.; Hindson, D. F.; Hurlburt, J. L. *J. Chem. Educ.* 2008, 85, 698; Hoye, T. R.; Jeffrey, C. S.; Shao, F. *Nat. Protocols* 2007, 2, 2451; Dale, J. A.; Mosher, H. S. *J. Am. Chem. Soc.* 1973, 95, 512; Hoye, T. R.; Renner, M. K. *J. Org. Chem.* 1996, 61, 2056; Dale, J. A.; Dull, D. L.; Mosher, H. S. *J. Org. Chem.* 1969, 34, 2543, each of which is incorporated by reference in its entirety. However, the discriminating ability of this approach is limited for aliphatic compounds. This is because aromatic rings are required to induce a pronounced shielding effect that facilitates the NMR signal splitting in a chiral environment (FIG. 85*a*). Furthermore, analytes with chirality centers remote to the derivatizing site are difficult to resolve through this approach. To achieve a chirality sensing method that addresses these limitations and eliminates the use of covalent derivatization, a $^{19}$F NMR chemosensory system that utilizes a chiral ligand-metal complex that reversibly binds to the analytes (FIG. 85*b*) can be used. See, for example, Yu, J.-X.; Hallac, R. R.; Chiguru, S.; Mason, R. P. *Prog. Nucl. Magn. Reson. Spectrosc.* 2013, 70, 25; Zhao, Y.; Swager, T. M. *J. Am. Chem. Soc.* 2013, 135, 18770; Teichert, J. F.; Mazunin, D.; Bode, J. W. *J. Am. Chem. Soc.* 2013, 135, 11314; Zhao, Y.; Markopoulos, G.; Swager, T. M. *J. Am. Chem. Soc.* 2014, 136, 10683; Gan, H.; Oliver, A. G.; Smith, B. D. *Chem. Commun.* 2013, 49, 5070; Perrone, B.; Springhetti, S.; Ramadori, F.; Rastrelli, F.; Mancin, F. *J. Am. Chem. Soc.* 2013, 135, 11768, each of which is incorporated by reference in its entirety. The key elements that have led to the success of this chirality chemosensing platform are: (1) The dissociation of the chiral analyte and the metal is slow on the NMR time frame to generate "static complexes" with precise and characteristic $^{19}$F NMR shifts. (2) The ligand is capable of creating a chiral environment to host the analyte wherein the subtle interactions between the ligand and the chiral analyte are transduced by the nearby appended $^{19}$F probes (FIG. 85*b*).

To examine the feasibility of the chemosensing scheme, the amide-based palladium pincer complex 2 (FIG. 86) was selected as a scaffold as a result of its easy preparation and well known coordination chemistry. See, for example, Reed, J. E.; White, A. J. P.; Neidle, S.; Vilar, R. *Dalton Trans.* 2009, 2558; Yamnitz, C. R.; Negin, S.; Carasel, I. A.; Winter, R. K.; Gokel, G. W. *Chem. Commun.* 2010, 46, 2838, each of which is incorporated by reference in its entirety. The coordination site that undergoes facile ligand exchange is flanked by pendant groups that are sensitive to through-bond and through-space interactions with analyte enantiomers. The chiral ligands were constructed by reacting 2,6-pyridinedicarbonyl dichloride (1) with various chiral amines. The corresponding palladium complexes 2 were prepared with a weakly bound acetonitrile that is rapidly replaced by Lewis basic analytes. In addition to the $C_2$-symmetric complex (2a), a nonsymmetric complex (2b) that is derived from (S)-α-methylbenzylamine and 3,5-bis(trifluoromethyl)aniline was prepared with the aim to evaluate the influence of a remote chirality on the $^{19}$F NMR shifts in the sensing system. The nonsymmetric ligand of 2b was readily prepared by a sequential addition of the corresponding aniline and amine to a solution of 1 in toluene.

Figure 87:
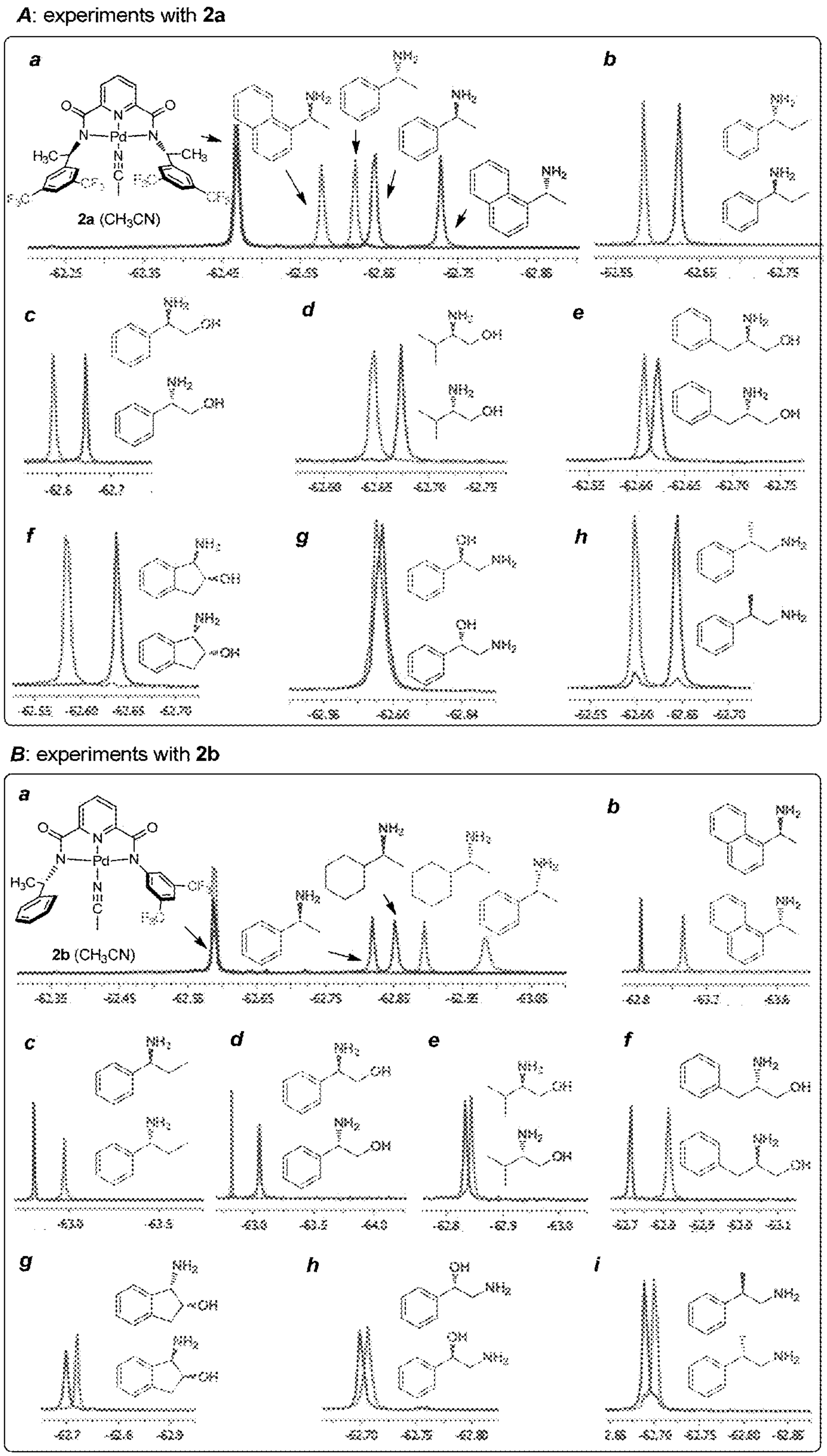
FIG. 87(*a-i*) show $^{19}F$ NMR spectrum (64 scans each) of a mixture of complex 2a or 2b (1 mM in $CDCl_3$), $CH_3CN$ (15 mM) and different chiral amines (1.0-2.0 mM). (a-i) superimposition of the spectra of complex 2a or 2b with each of the analyte collected independently.
Figure 93:
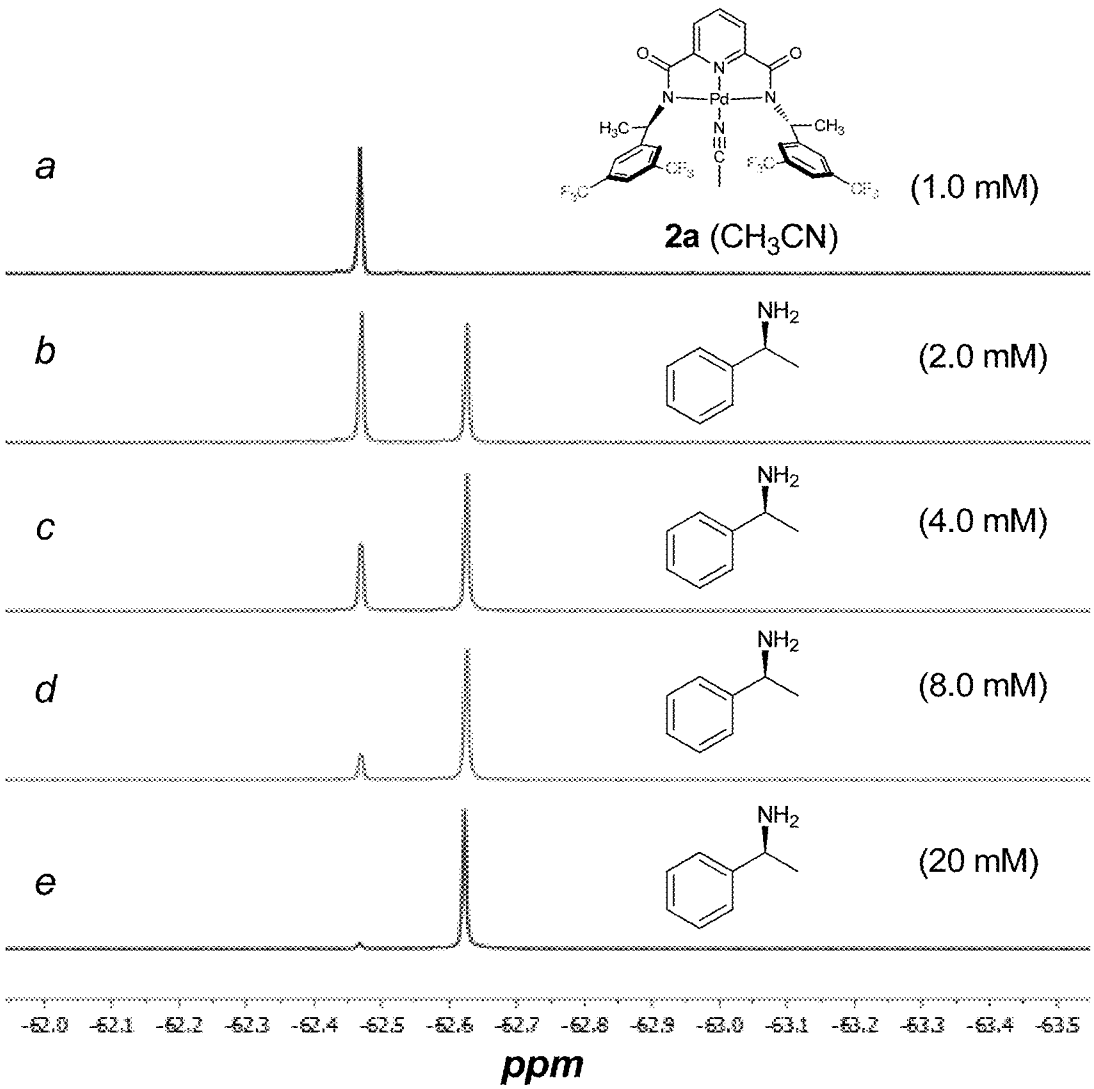
FIG. 93 shows $^{19}F$ NMR titration experiment (64 scans each) with complex 2a ($CH_3CN$) (1.0 mM), $CH_3CN$ (15.0 mM) and (S)-α-methylbenzylamine at various concentrations (2.0-20 mM).
Figure 94:
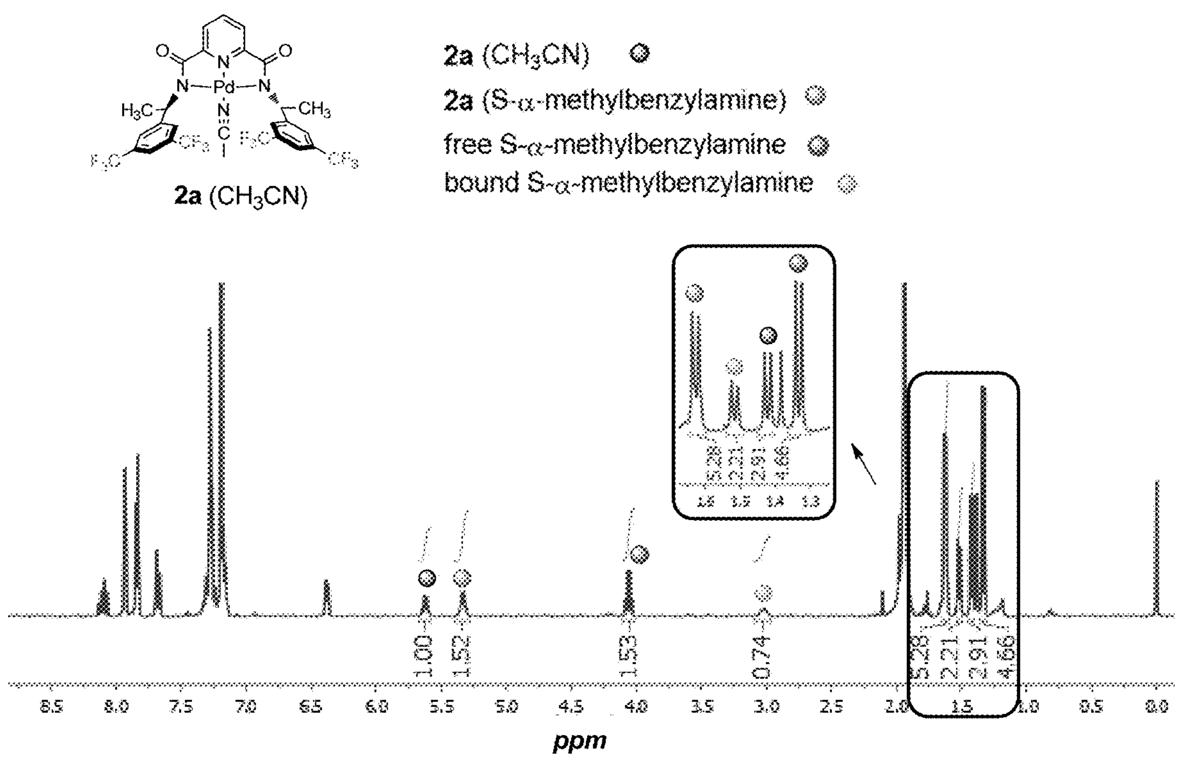
FIG. 94 shows $^{1}H$ NMR (64 scans) of a mixture of complex 2a ($CH_3CN$) (5.0 mM), $CH_3CN$ (ca. 50.0 mM) and (S)-α-methylbenzylamine (ca. 10 mM).
Figure 95:
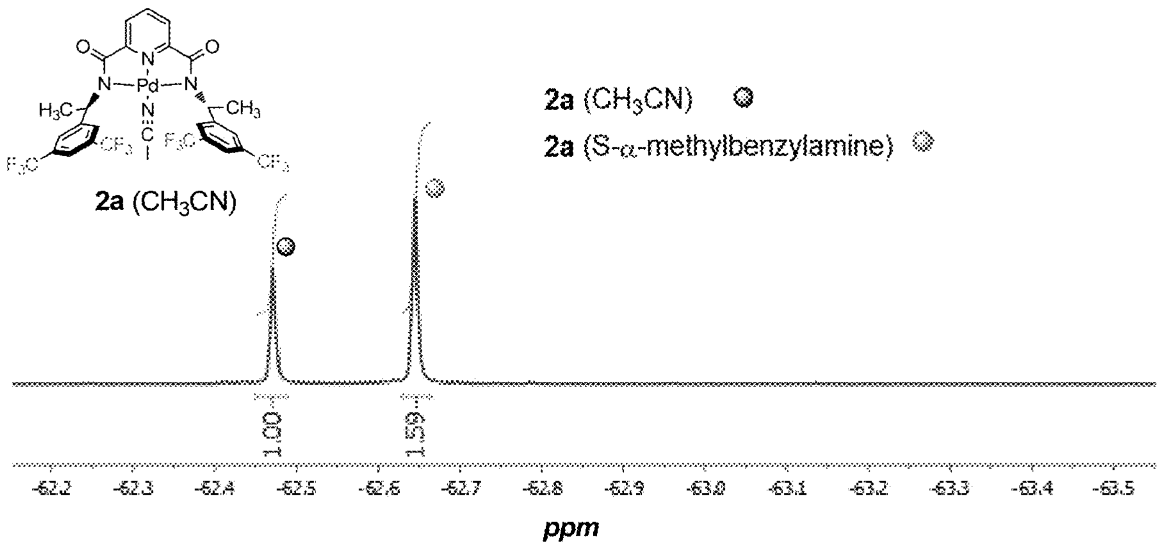
FIG. 95 shows $^{19}F$ NMR (64 scans) of a mixture of complex 2a ($CH_3CN$) (5.0 mM), $CH_3CN$ (ca. 50.0 mM) and (S)-α-methylbenzylamine (ca. 10 mM).

The $^{19}$F NMR chirality sensing potential of complex 2a can be explored. Initial studies revealed that the Lewis basic oxygens of amide groups act as ligands to produce insoluble oligomeric species. See, for example, Moriuchi, T.; Bandoh, S.; Kamikawa, M.; Hirao, T. *Chem. Lett.* 2000, 148; Moriuchi, T.; Bandoh, S.; Miyaji, Y.; Hirao, T. *J. Organomet. Chem.* 2000, 599, 135; Wang, Q.-Q.; Begum, R. A.; Day, V. W.; Bowman-James, K. *J. Am. Chem. Soc.* 2013, 135, 17193, each of which is incorporated by reference in its entirety. This oligomerization is prevented by the addition of 15 equivalent of $CH_3CN$ to produce clear stable monomeric solutions of 2a. A series of readily available chiral amines and amino alcohols was then selected as the analytes to test the differentiation of enantiomers. The observation of discrete signals at precise chemical shifts that are not concentration dependent indicated the formation of "static" complexes on the NMR time scale (FIG. 93). As a result, for a given solvent, each enantiomer can be correlated to a NMR signal with precise chemical shift. With amine binding, a new high field signal was observed that is indicative of an increased shielding effect caused by the analyte relative to the displaced acetonitrile ligand (FIG. 87*a*). The shielding effect imposed by a pair of enantiomers to the chiral ligand is different and generates discrete NMR signals for identification. It is noteworthy that the association of 2a and amines is fast and the equilibrium is reached before the NMR analysis. FIG. 87A illustrates the ability of 2a to resolve most of the enantiomers. One noteworthy feature of sensor 2a is the high sensitivity provided by 12 equivalent fluorine atoms, which allowed analysis to be performed at low concentrations (50 μg of analyte was adequate for the experiments in FIG. 87 using a 400 MHz NMR spectrometer).

Figure 86:
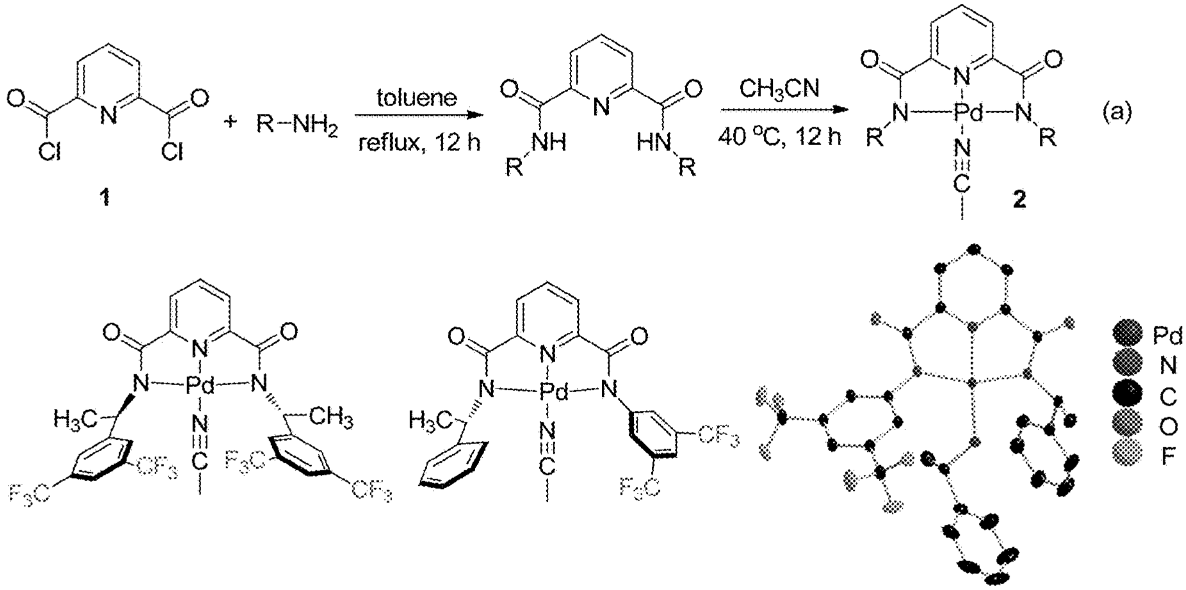
FIG. 86 shows the preparation and structures of Palladium complexes with chiral pincer ligands.

Nonsymmetric complex 2b positions the $^{19}F$ probes closer to the analyte to create more pronounced changes in chemical shifts. The topology of 2b is interesting because the chiral moiety effecting the chirality discrimination is separated from the $^{19}F$ probe by the analyte. This transduction mechanism could provide an orthogonal discriminatory ability relative to that of 2a. The data in FIG. 87B confirms the designs and the chemical shift range induced by the bound analyte is larger for 2b in comparison to 2a. Specifically, in the case of (R)-α-methylbenzylamine, NMR shifts of 0.39 and 0.15 ppm relative to the signals of 2b ($CH_3CN$) and 2a ($CH_3CN$), respectively. Furthermore, 2b produced a satisfactory resolution of (R)- and (S)-2-amino-3-phenyl-1-propanol in contrast to the overlapped signals observed in the experiment with 2a (FIG. 87*e* and FIG. 880. Despite of the larger chemical shift range, the resolution of certain enantiomers is still not satisfactory (FIG. 87B, e, and g-i). This observation revealed that in addition to the spatial proximity of the fluorine probe to the analyte, the chiral environment has a crucial role in the chirality chemosensing. This is illustrated by the crystal structure of 2b bound to (S)-α-methylbenzylamine, wherein both of the methyl and phenyl group on pincer ligand point toward the bound analyte to define a chiral cavity with the planar $CF_3$-substituted phenyl group on the other side (FIG. 86). The methyl and phenyl groups are relatively small, and as a result, the conformational changes of 2b induced by certain analytes are not sufficient to provide a desired resolution (FIG. 87B, h and i). See, for example, Prakash, G. K. S.; Wang, F.; Ni, C.; Shen, J.; Haiges, R.; Yudin, A. K.; Mathew, T.; Olah, G. A. *J. Am. Chem. Soc.* 2011, 133, 9992; Prakash, G. K. S.; Wang, F.; Rahm, M.; Zhang, Z.; Ni, C.; Shen, J.; Olah, G. A. *J. Am. Chem. Soc.* 2014, 136, 10418, each of which is incorporated by reference in its entirety.

TABLE 1

| Quantitative Sensing Results[a] | | | | | |
|---|---|---|---|---|---|
| (S)-α-methylbenzylamine | | | (R)-2-phenylglycinol | | |
| actual ee (%) | calculated ee (%) | absolute error (%) | actual ee (%) | calculated ee (%) | absolute error (%) |
| 85.0 | 84.7 | 0.3 | 73.3 | 74.5 | 1.2 |
| 54.7 | 55.7 | 1.0 | 38.7 | 39.3 | 0.6 |
| 0 | 0.1 | 0 | 0 | −0.8 | 0.8 |
| −41.4 | −42.2 | 0.8 | −46.8 | −45.7 | 1.1 |
| −84.2 | −84.2 | 0 | −89.8 | −88.0 | 1.8 |

[a]NMR measurements were performed in $CDCl_3$/pentane (2:3) using 2b (5 mM) and analyte (ca. 2 mM)

Figure 100:
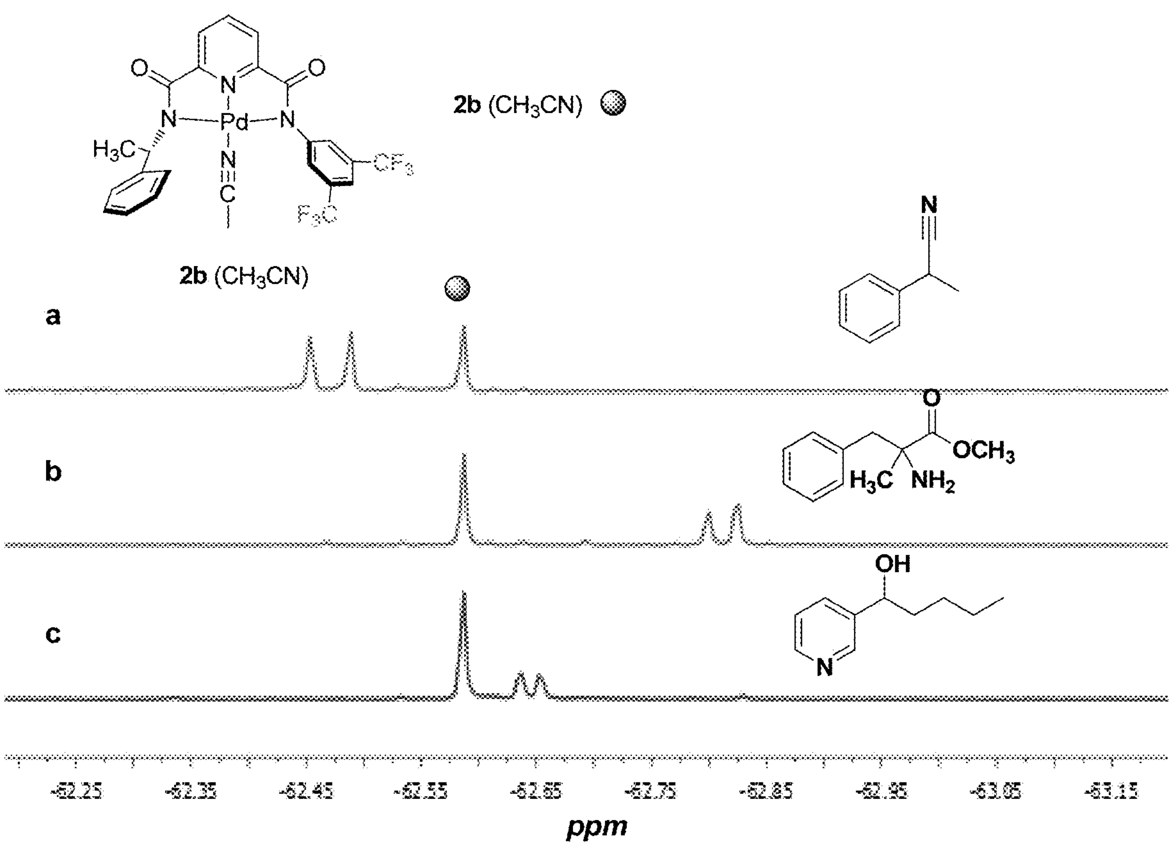
FIG. 100 shows $^{19}F$ NMR spectra (64 scans each) of a mixture of complex 2b ($CH_3CN$) (1.0 mM in $CDCl_3$) with each of the analyte (0.5-1.5 mM).

The potential of 2b can be evaluated to determine the enantiomeric excess values. Initial experiments showed that complexing 2b with racemic α-methylbenzylamines produced two new diasteriomeric palladium species with the same $^{19}F$ NMR resonance intensity. The enantiomeric excess from $^{19}F$ NMR integration can be determined under the experimental conditions. This method can be applied for the analysis of a series of nonracemic samples and Table 1 shows the calculated values are in excellent agreement with the actual enantiopurity (Table 1, left). In a similar way, the ee of nonracemic 2-phenylglycinol can be also accurately determined (Table 1, right). No calibration curve or derivatization is required, and this method has the potential to be adapted in routine asymmetric synthesis. Notably, nitriles and N-heterocycles are also potential analytes for this method (FIG. 100), while secondary and tertiary amines generally do not coordinate to the palladium as a result of their steric hindrance.

Figure 88:
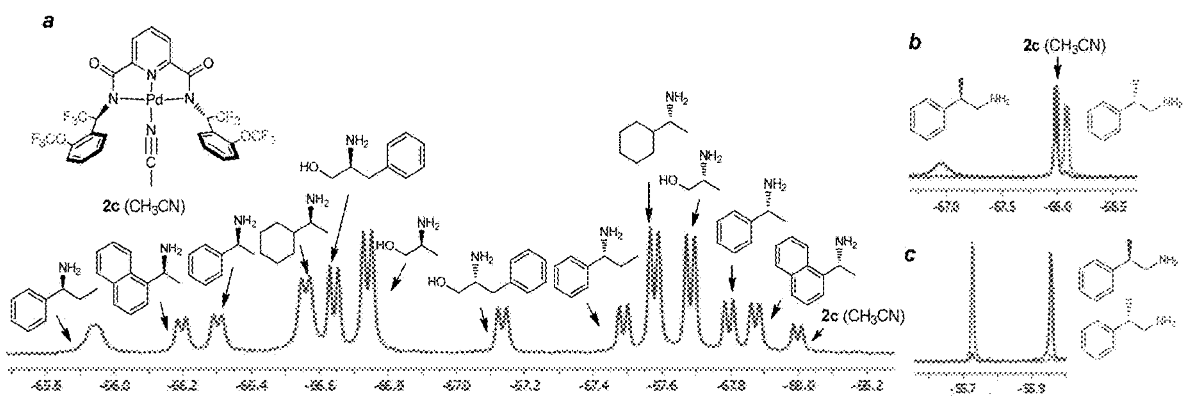
FIG. 88(*a*) shows $^{19}F$ NMR spectrum of the benzylic $CF_3$ region (128 scans) of a mixture of complex 2c (5 mM in $CDCl_3$), and 12 different chiral amines (each 0.7-1.2 mM)
Figure 89:
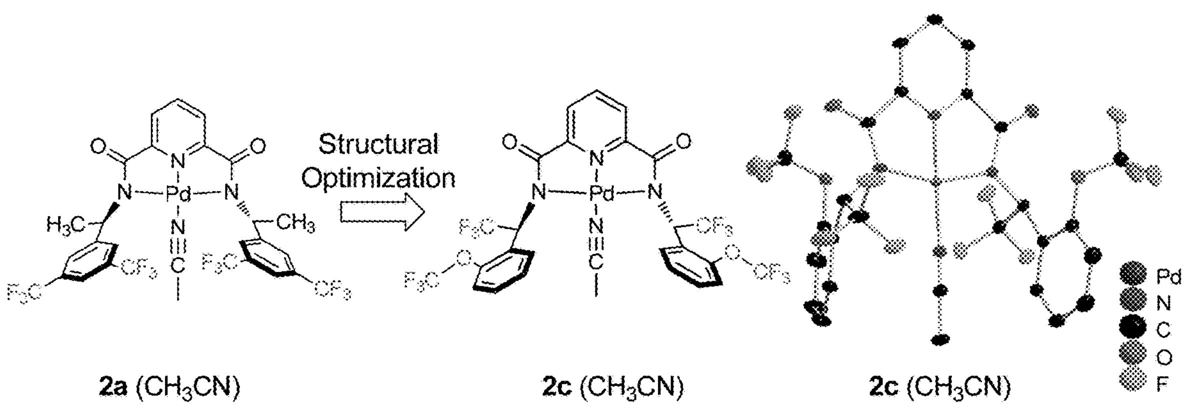
FIG. 89 shows structural optimization for enhanced chirality sensing.
Figure 90:
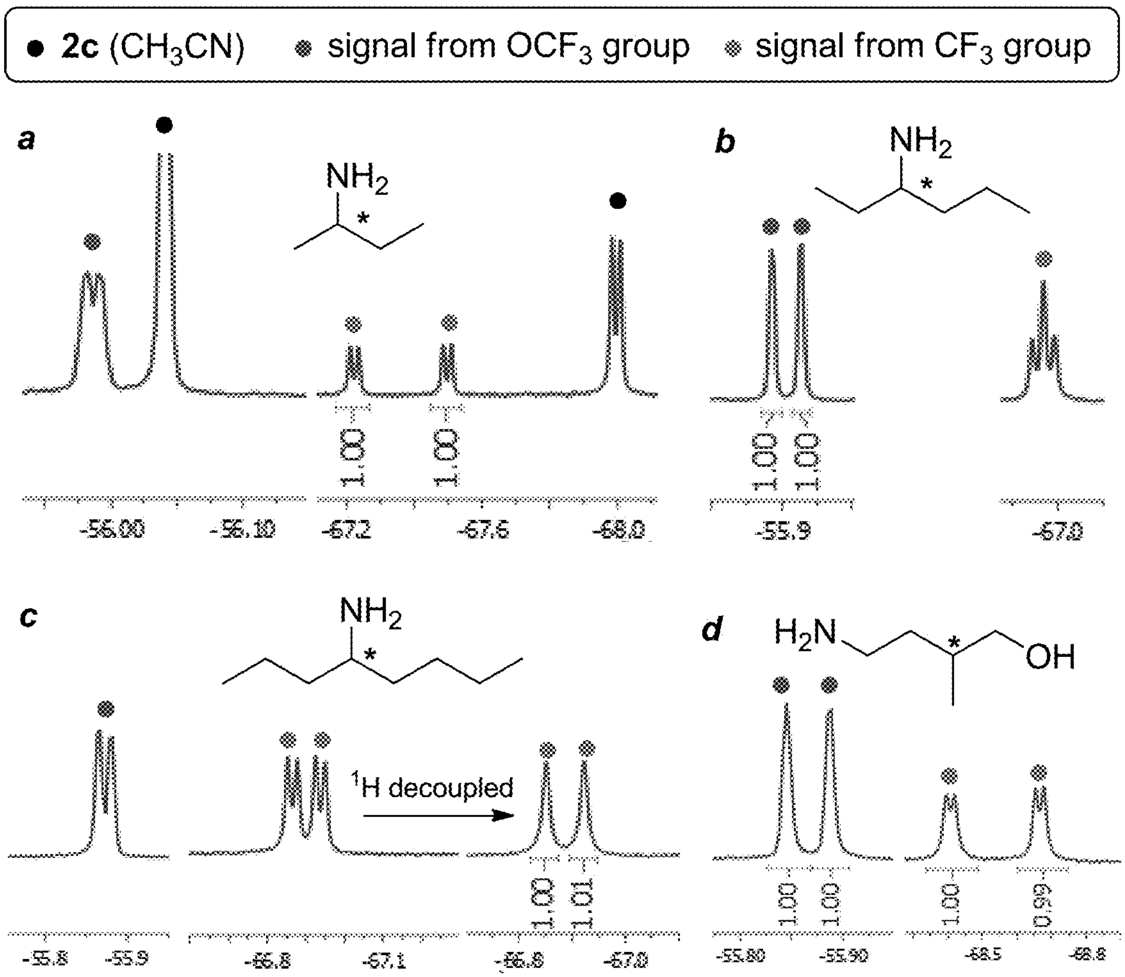
FIG. 90 shows $^{19}F$ NMR spectrum (64 scans each) of a mixture of complex 2c (1 mM in $CDCl_3$) and different chiral amines.
Figure 91:
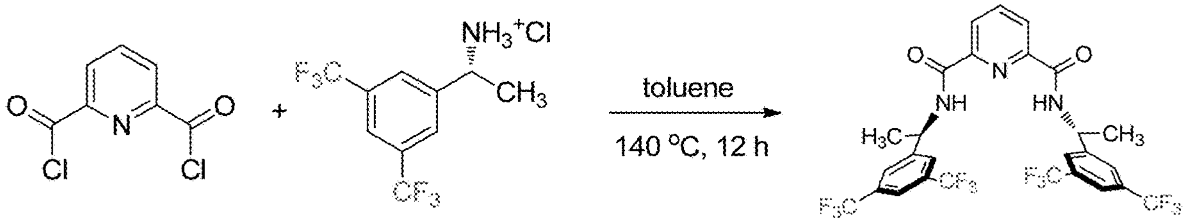
FIG. 91 shows preparation of various chiral pincer ligands (4).
Figure 92:
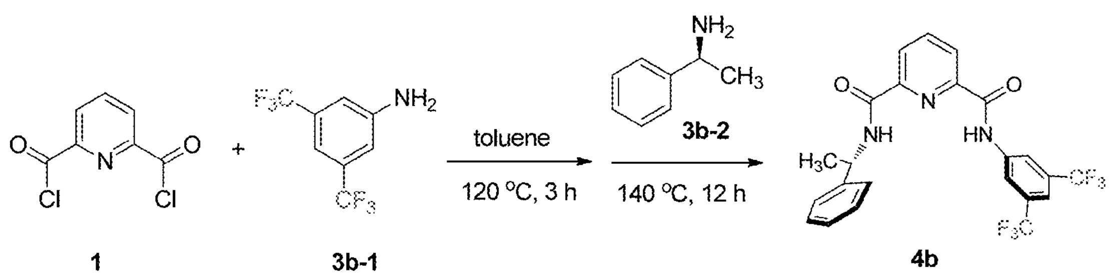
FIG. 92 shows preparation of ligands (4b).
Figure 99:
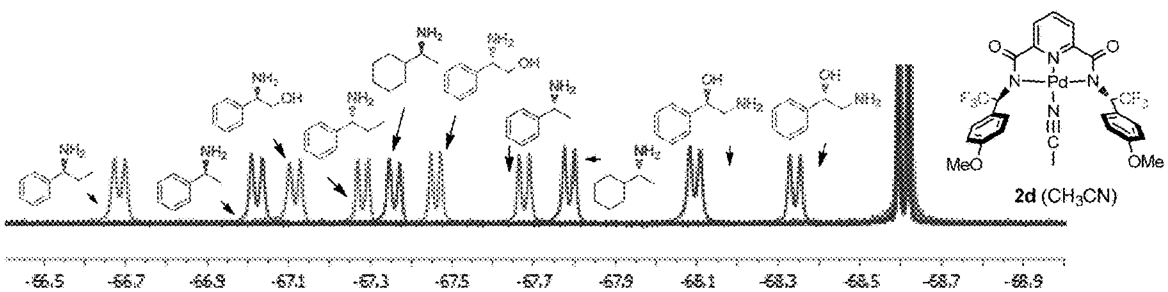
FIG. 99 shows superimposition of the $^{19}F$ NMR spectra (64 scans each) of a mixture of complex 2d (1.0 mM in $CDCl_3$) with each of the analyte (1.0-2.0 mM) collected independently.
Figure 99:
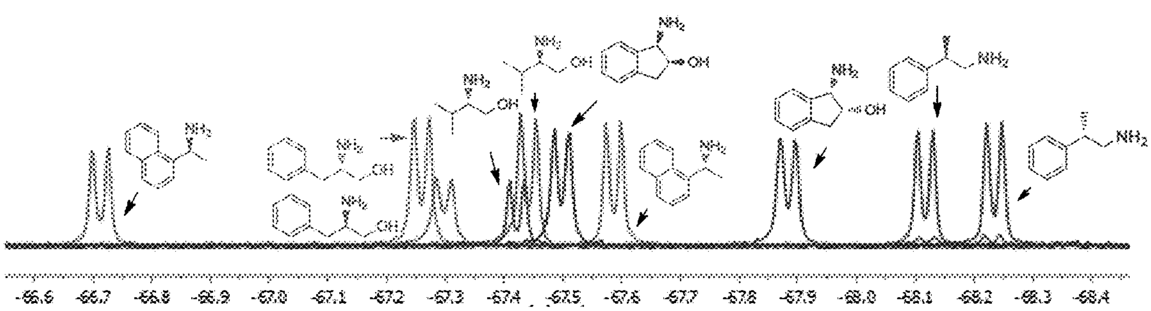

To achieve a simultaneous resolution of multiple chiral analytes, complex 2c (FIG. 89) can be prepared. The replacement of the methyl group of 2a by a trifluoromethyl ($CF_3$) group brings the fluorine probe closer to the analyte and extends the $^{19}F$ NMR detection window. See, for example, Prakash, G. K. S.; Mandal, M.; Olah, G. A. *Angew. Chem., Int. Ed.* 2001, 40, 589; Prakash, G. K. S.; Mandal, M. *J. Am. Chem. Soc.* 2002, 124, 6538, each of which is incorporated by reference in its entirety. As a $CF_3$ group is significantly bigger than a methyl group, the internal cleft flanked by this ligand becomes more confined than that of 2a and 2b, to promote intimate interactions between the ligand and analytes. See, for example, For the steric parameters of the $CH_3$ and $CF_3$ group, see: Charton, M. *J. Am. Chem. Soc.* 1975, 97, 1552, which is incorporated by reference in its entirety. A trifluoromethoxyl ($OCF_3$) group was further introduced to increase the bulkiness of the phenyl group and to add an additional fluorine probe to 2c. Another benefit of this design is the self-aggregation that was observed previously is inhibited by 2c's bulky ligand. FIG. 88*a* illustrates that the wide detection window of 2c allows the simultaneous identification of as many as 12 chiral analytes (for the performance of a structurally similar sensor without $OCF_3$ group, see FIG. 99). Interestingly, a broader peak was observed in the experiment of the β-methylphenethylamine using the $CF_3$ probe, while the $OCF_3$ probe produced sharp signals and a good resolution (FIG. 88*b,c*). Similar to the chirality sensing methods based on circular dichroism, empirical predictions of the absolute configuration can be made. For instance, α-chiral amines of S configuration always appear at a lower field as compared to those of R configuration (FIG. 88*a*). The extraordinary discriminating ability provided by 2c is further demonstrated by the resolution of aliphatic amines. Racemic samples were mixed with the chloroform solution of 2c and the $^{19}F$ NMR spectrum was recorded. The discrimination of these amines is difficult because the alkyl groups connected to the chiral center differ solely in a single methylene unit (FIG. 90*a-c*). One appealing feature of 2c is its orthogonal resolving ability provided by the $CF_3$ and $OCF_3$ probes which increases its success in resolving challenging analytes. This is revealed by inspection of the results illustrated in FIG. 90, where one fluorine probe produced a better resolution than the other. In this way, all the aliphatic amines in FIG. 90 can be differentiated. Proton-decoupled NMR experiments collapsed the doublet signal of the $CF_3$ group to a singlet, for further improved resolution (FIG. 90*c*). See, for example, Berkowitz, B. A.; Ackerman, J. J. H. *Biophys. J.* 1987, 51, 681, which is incorporated by reference in its entirety. In contrast to conventional chiral derivatizing methods, the current method is also capable of resolving the amines with chiral center several carbons away from the amino group (FIG. 90*d*).

A new chirality chemosensory platform can be developed based on $^{19}F$ NMR and chiral palladium pincer complexes. The bonding of enantiomers produced diastereomeric complexes with distinct and precise $^{19}F$ NMR shifts. This approach provided a simple and robust differentiation of chiral amines that are not easily resolved with chiral HPLC. The key to the success of this approach is to bind enantiomers with an environment that is flanked by chiral ligands with fluorine probes optimally positioned. The combination of the current strategy and diversified supramolecular scaffolds can produce a powerful sensing platform that addresses chirality differentiations relevant to chiral synthesis and biological chemistry.

Material:

All reactions were carried out under argon using standard Schlenk techniques unless otherwise noted. All solvents were of ACS reagent grade or better unless otherwise noted. Anhydrous acetonitrile ($CH_3CN$) was obtained from Alfa Aesar. Silica gel (40 μm) was purchased from SiliCycle Inc. All reagent grade materials were purchased from Alfa Aesar, Sigma-Aldrich, Matrix Scientific, or Strem chemicals and used without further purification.

NMR Spectroscopy:

$^{1}H$, $^{19}F$, and $^{13}C$ NMR spectra for all compounds were acquired in $CDCl_3$ on a Bruker Avance Spectrometer operating at (400 MHz, 376 MHz, and 101 MHz for $^{1}H$, $^{19}F$, and $^{13}C$ NMR, respectively). Chemical shifts (6) are reported in parts per million (ppm) and referenced with TMS for $^{1}H$ NMR and $CFCl_3$ for $^{19}F$ NMR.

General Procedure for NMR Experiment:

For FIG. 87, at ambient temperature, complexes 2a or 2b (1.01 M in 495 μL of $CDCl_3$) was mixed with different analytes different analytes (variable concentrations in 5 μL $CDCl_3$). For FIG. 88, at ambient temperature, complex 2c (6.25 M in 400 μL of $CDCl_3$) was mixed with a mixture of 12 different analytes (variable concentrations in 100 μL $CDCl_3$). The NMR spectra were recorded on a Bruker Avance Spectrometer with TOPSPIN using autolocking and auto shimming (64 scans each). The obtained NMR data were processed using MestReNova. After phase correction, the spectra were superimposed.

Mass Spectrometry:

High-resolution mass spectra (HRMS) were obtained at the MIT Department of Chemistry Instrumentation Facility employing electrospray (ESI) as the ionization technique.

General Procedure for the Preparation of Various Fluorinated Pincer Ligands (4).

Under Ar atmosphere, a solution of 2,6-pyridinedicarbonyl dichloride 1 (200 mg, 0.98 mmol, 1.0 equiv) and (R)-1-[3,5-bis(trifluoromethyl)phenyl]ethylamine hydrochloride 3a (576 mg, 1.96 mmol, 2.0 equiv) in toluene (30 mL) was heated at 140° C. for 12 h before the reaction was cooled to room temperature. The solution was concentrated and the crude product was purified by silica gel chromatography using hexane/ethyl acetate as the eluent to give a white solid 4a (540 mg, 0.837 mmol, yield: 85%). M.P.: 205-207° C. IR: 1721, 1640, 1593, 1540, 1493, 1449, 1426, 1374, 1247, 1219, 1166, 1102, 1037, 925, 758, 700, 674, 648 $cm^{-1}$. $^{1}H$ NMR (400 MHz, $CDCl_3$) δ 8.39 (d, J=7.8 Hz, 2H), 8.10 (dd, J=9.6, 6.0 Hz, 1H), 7.87 (s, 4H), 7.83 (m, 4H), 5.44 (m, J=7.1 Hz, 2H), 1.71 (d, J=7.0 Hz, 6H). $^{19}F$ NMR (376 MHz, $CDCl_3$) δ −62.80 (s, 12F). $^{13}C$ NMR (101 MHz, $CDCl_3$) δ 163.01, 148.52, 145.77, 139.44, 132.11 (q, J=33.3 Hz), 126.30, 125.83, 123.18 (q, J=272.7 Hz), 121.59, 48.62, 21.74. HRMS (ESI): calc for $C_{27}H_{20}F_{12}N_3O_2$ $[M+H]^+$ 646.1358. found 646.1363.

Procedure for the Preparation of Ligands (4b).

Under Ar atmosphere, a solution of 2,6-pyridinedicarbonyl dichloride 1 (400 mg, 1.96 mmol, 1.0 equiv) and 3,5-bis(trifluoromethyl)aniline 3b-1 (449 mg, 1.96 mmol, 1.0 equiv) in toluene (30 mL) was heated at 120° C. for 3 h before the addition of (S)-α-methylbenzylamine 3b-2 (237 mg, 1.96 mmol, 1.0 equiv). The reaction was heated at 140° C. for 12 h and cooled to room temperature. The solution was concentrated and the crude product was purified by silica gel chromatography using hexane/ethyl acetate as the eluent to give a white solid 4b (778 mg, 1.61 mmol, yield: 82%). M.P.: 190-192° C. IR: 3308, 1702, 1646, 1554, 1477, 1438, 1388, 1281, 1229, 1181, 1163, 1141, 1121, 1109, 1072, 907, 879, 842, 739, 731, 698, 682, 650 $cm^{-1}$. $^{1}H$ NMR (400 MHz, $CDCl_3$) δ 9.73 (s, 1H), 8.48 (ddd, J=7.6, 6.3, 1.1 Hz, 2H), 8.17 (dd, J=9.6, 6.0 Hz, 3H), 7.88 (d, J=7.7 Hz, 1H), 7.69 (s, 1H), 7.50-7.32 (m, 5H), 5.37 (p, J=7.0 Hz, 1H), 1.72 (d, J=6.9 Hz, 3H). $^{19}F$ NMR (376 MHz, $CDCl_3$) δ −62.97 (s, 6F). $^{13}C$ NMR (101 MHz, $CDCl_3$) δ 162.64, 161.75, 149.13, 147.86, 142.58, 139.67, 138.66, 132.41 (q, J=33.6 Hz), 128.81, 127.75, 126.18, 125.98, 125.58, 122.99 (q, J=272.8 Hz), 119.89, 117.96, 49.26, 21.43. HRMS (ESI): calc for $C_{23}H_{18}F_6N_3O_2$ $[M+H]^+$ 482.1298. found 482.1284.

Figure 105:
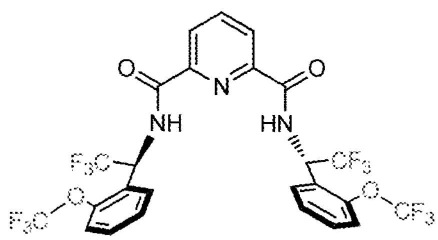
FIG. 105 shows structures of complexes.
Figure 105:
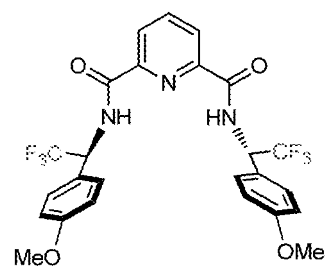
Figure 105:
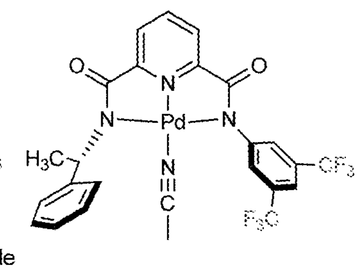
Figure 105:
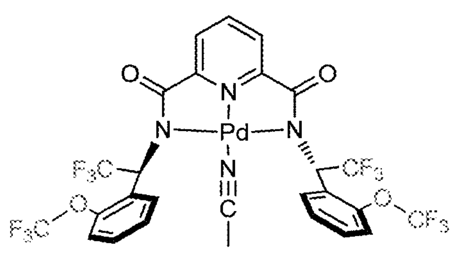
Figure 105:
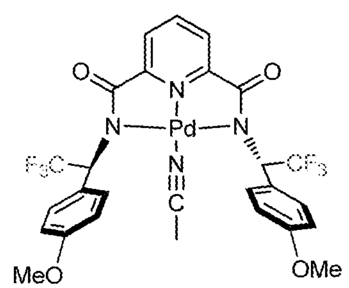

Yield of 4c in FIG. 105: 93%. M.P.: 110-113° C. IR: 3360, 1706, 1672, 1524, 1245, 1214, 1173, 1135, 1082, 1001, 959, 881, 754, 651, 638 $cm^{-1}$. $^{1}H$ NMR (400 MHz, $CDCl_3$) δ 8.36-8.28 (m, 4H), 8.15-8.08 (m, 1H), 7.59 (d, J=7.6 Hz, 2H), 7.56-7.49 (m, 2H), 7.46-7.38 (m, 4H), 6.29 (dq, J=15.5, 7.8 Hz, 2H). $^{19}F$ NMR (376 MHz, $CDCl_3$) δ −56.48 (s, 6F), −73.56 (d, J=7.1 Hz, 6F). $^{13}C$ NMR (101 MHz, $CDCl_3$) δ 162.54, 147.89, 139.60, 131.24, 129.57, 127.10, 126.42, 124.62, 124.21 (q, J=279.0 Hz), 120.49 (q, J=259.7 Hz), 120.04, 50.36 (q, J=32.9 Hz). HRMS (ESI): calc for $C_{25}H_{16}F_{12}N_3O_4$ $[M+H]^+$ 650.0944. found 650.0932.

Yield of 4d in FIG. 105: 94%. White solid. M.P.: 60-62° C. IR: 1612, 1516, 1375, 1251, 1186, 1155, 1116, 1072, 1032, 888, 840, 824, 790, 763, 716, 696, 648 $cm^{-1}$. $^{1}H$ NMR (400 MHz, $CDCl_3$) δ 8.41 (d, J=7.8 Hz, 2H), 8.32 (d, J=9.5 Hz, 2H), 8.16-8.08 (m, 1H), 7.44 (d, J=8.7 Hz, 4H), 7.04-6.96 (m, 4H), 5.80 (dq, J=15.5, 7.7 Hz, 2H), 3.86 (s, 6H). $^{19}F$ NMR (376 MHz, $CDCl_3$) δ −74.25 (d, J=7.8 Hz, 6F). $^{13}C$ NMR (101 MHz, $CDCl_3$) δ 162.51, 160.52, 147.90, 139.69, 128.90, 125.99, 124.61 (q, J=280.0 Hz), 124.45, 55.37, 54.26 (q, J=31.6 Hz). HRMS (ESI): calc for $C_{25}H_{21}F_6N_3NaO_4$ $[M+Na]^+$ 564.1328. found 564.1315.

Figure 106:
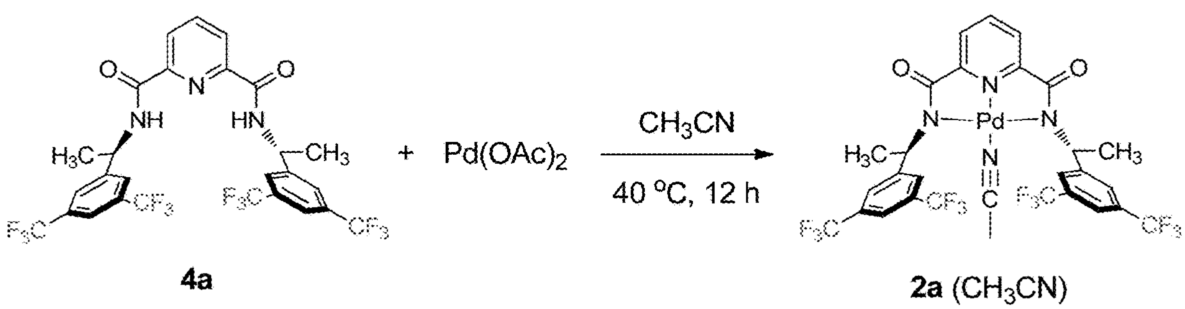
FIG. 106 shows procedure for preparing a complex.

General Procedure for the Preparation of Various Palladium Pincer Complexes (2), See FIG. 106.

Ligand 4a (300 mg, 0.46 mmol, 1.0 equiv) was added to a solution of $Pd(OAc)_2$ (114 mg, 0.51 mmol, 1.10 equiv) in acetonitrile (10 mL). The resulting mixture was stirred at 40° C. for 12 h, and filtered through a 0.02 μm syringe filter. The filtrate was concentrated to give the crude product which was transferred to a filter funnel and washed extensively with water and hexane. The yellow powder was then dried under vacuum to give product 2a ($CH_3CN$) as a yellow solid (338 mg, 0.427 mmol, Yield: 92%). IR: 1596, 1446, 1377, 1277, 1170, 1126, 896, 844, 761, 706, 682 $cm^{-1}$. $^1H$ NMR (400 MHz, $CD_3CN$) δ 8.24 (t, J=7.8 Hz, 1H), 8.06 (s, 4H), 7.88 (s, 2H), 7.77 (d, J=7.8 Hz, 2H), 5.50 (q, J=6.8 Hz, 2H), 1.53 (d, J=6.8 Hz, 6H). $^{19}F$ NMR (376 MHz, $CD_3CN$) δ −63.06 (s, 12F). $^{13}C$ NMR (101 MHz, $CD_3CN$) δ 170.27, 152.93, 149.11, 142.00, 130.57 (q, J=32.8 Hz), 127.16, 125.11, 123.79 (q, J=271.9 Hz), 120.41-119.89 (m), 50.32, 19.54. HRMS (ESI): calc for $C_{29}H_{21}F_{12}N_4O_2Pd$ $[M+H]^+$ 791.0518. found 791.0533. The signals of $CH_3CN$ for $^1H$ NMR and $^{13}C$ NMR were omitted because the bound $CH_3CN$ was replaced by $CD_3CN$.

2b of FIG. 105: Yellow solid. Yield: 92%. IR: 1597, 1547, 1495, 1466, 1427, 1379, 1277, 1172, 1124, 983, 949, 843, 759, 724, 701, 683, 634 $cm^{-1}$. $^1H$ NMR (400 MHz, $CD_3CN$) δ 8.28 (t, J=7.8 Hz, 1H), 7.83 (ddd, J=9.0, 7.9, 1.3 Hz, 2H), 7.74 (s, 2H), 7.68 (s, 1H), 7.51 (dd, J=8.4, 1.1 Hz, 2H), 7.37 (t, J=7.8 Hz, 2H), 7.24 (t, J=7.7 Hz, 1H), 5.57-5.48 (m, 1H), 1.60 (d, J=6.8 Hz, 3H). $^{19}F$ NMR (376 MHz, $CD_3CN$) δ −63.18 (s, 6F). $^{13}C$ NMR (101 MHz, $CD_3CN$) δ 169.78, 169.18, 153.53, 151.41, 148.30, 145.52, 142.17, 130.78 (t, J=32.9 Hz), 128.04, 126.96, 126.94, 126.65, 126.07, 125.84, 125.50, 123.61 (q, J=271.9 Hz), 50.40, 19.48. HRMS (ESI): calc for $C_{25}H_{19}F_6N_4O_2Pd$ $[M+H]^+$ 627.0442. found 627.0460. The signals of $CH_3CN$ for $^1H$ NMR and $^{13}C$ NMR were omitted because the bound $CH_3CN$ was replaced by $CD_3CN$.

2c of FIG. 105: Yellow solid. Yield: 90%. IR: 1641, 1624, 1611, 1499, 1457, 1428, 1367, 1253, 1227, 1201, 1189, 1148, 1126, 1098, 1075, 928, 890, 836, 768, 760, 724, 709 $cm^{-1}$. $^1H$ NMR (400 MHz, $CD_3CN$) δ 8.24 (dd, J=9.8, 5.9 Hz, 1H), 7.80 (d, J=7.8 Hz, 2H), 7.67 (d, J=7.9 Hz, 2H), 7.54-7.46 (m, 2H), 7.46-7.41 (m, 2H), 7.41-7.34 (m, 2H), 6.12 (q, J=9.2 Hz, 2H). $^{19}F$ NMR (376 MHz, $CD_3CN$) δ −56.71 (s, 6F), −69.17 (d, J=9.1 Hz, 6F). $^{13}C$ NMR (101 MHz, $CD_3CN$) δ 171.37, 150.83, 148.19, 142.53, 129.94, 129.56, 127.77, 126.06, 125.99, 125.70 (q, J=282.5 Hz), 120.48 (q, J=257.2 Hz), 120.18, 54.53 (q, J=29.9 Hz). HRMS (ESI): calc for $C_{27}H_{17}F_{12}N_4O_4Pd$ $[M+H]^+$ 795.0102. found 795.0109. The signals of $CH_3CN$ for $^1H$ NMR and $^{13}C$ NMR were omitted because the bound $CH_3CN$ was replaced by $CD_3CN$.

2d of FIG. 105: Yellow solid. Yield: 92%. IR: 1612, 1516, 1428, 1375, 1293, 1251, 1186, 1155, 1116, 1072, 1032, 888, 824, 804, 790, 763, 716, 696, 674, 648 $cm^{-1}$. $^1H$ NMR (400 MHz, $CD_3CN$) δ 8.29 (t, J=7.8 Hz, 1H), 7.92-7.84 (m, 2H), 7.39 (d, J=8.9 Hz, 4H), 6.98-6.91 (m, 4H), 6.14 (q, J=9.2 Hz, 2H), 3.81 (s, 6H). $^{19}F$ NMR (376 MHz, $CD_3CN$) δ −69.24 (t, J=7.9 Hz, 6F). $^{13}C$ NMR (101 MHz, $CD_3CN$) δ 172.05, 158.91, 151.57, 142.30, 128.39, 127.90, 126.12, 125.94 (q, J=282.2 Hz), 113.65, 55.94 (q, J=29.0 Hz), 54.97. HRMS (ESI): calc for $C_{27}H_{23}F_6N_4O_4Pd$ $[M+H]^+$ 687.0668. found 687.0656. The signals of $CH_3CN$ for $^1H$ NMR and $^{13}C$ NMR were omitted because the bound $CH_3CN$ was replaced by $CD_3CN$.

Figure 107:
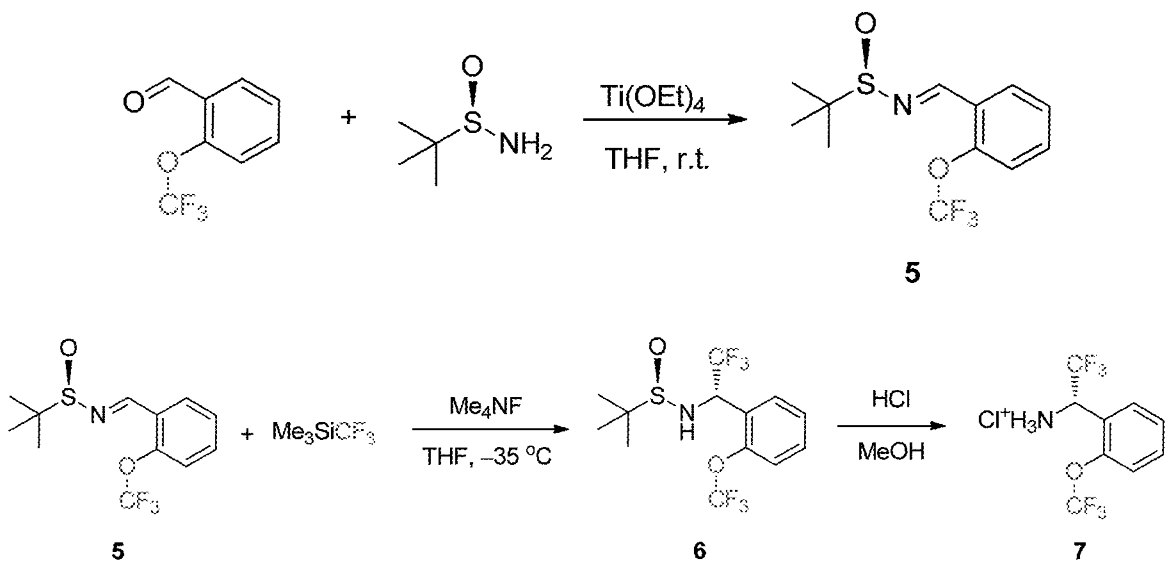
FIG. 107 shows procedure for preparing complexes.

Procedure for the Preparation of Chiral $CF_3$—Substituted Benzylamine, See FIG. 107.

Under Ar atmosphere, to a solution of 2-(trifluoromethoxy)benzaldehyde (2.0 g, 10.52 mmol, 1.0 equiv) and (R)-2-methyl-2-propanesulfinamide (1.91 g, 15.78 mmol, 1.5 equiv) in anhydrous THF (30 mL) was added $Ti(OEt)_4$ (4.8 g, 21.0 mmol, 2.0 equiv). The reaction mixture was stirred at room temperature for 6 h before the addition of a solution of brine. The resulting mixture was filtered through a plug of celite. The celite was washed with ethyl acetate and the combined organic phase was washed with brine. The $MgSO_4$ dried solution was concentrated to give the crude product which was purified by silica gel chromatography using hexane/ethyl acetate as the eluent to give a white solid 5 (2.66 g, 9.06 mmol, yield: 86%). M.P.: 63-65° C. IR: 1604, 1572, 1475, 1453, 1394, 1364, 1283, 1257, 1250, 1212, 1183, 1169, 1158, 1098, 1082, 984, 923, 774, 745, 722 $cm^{-1}$. $^1H$ NMR (400 MHz, $CDCl_3$) δ 8.93 (s, 1H), 8.11 (dd, J=7.8, 1.7 Hz, 1H), 7.58 (ddd, J=8.3, 7.4, 1.8 Hz, 1H), 7.48-7.33 (m, 2H), 1.29 (s, 9H). $^{19}F$ NMR (376 MHz, $CDCl_3$) δ −57.42 (s, 3F). $^{13}C$ NMR (101 MHz, $CDCl_3$) δ 157.27, 148.90, 133.50, 129.21, 127.17, 126.96, 121.39, 120.41 (q, J=259.1 Hz), 58.04, 22.62. HRMS (ESI): calc for $C_{12}H_{15}F_3NO_2S$ $[M+H]^+$ 294.0770. found 294.0770.

Under Ar atmosphere, to a mixture of 5 (900 mg, 3.07 mmol, 1.0 equiv) and $Me_4NF$ (343 mg, 3.68 mmol, 1.2 equiv) in anhydrous THF (30 mL) at −35° C. was added $Me_3SiCF_3$ (654 mg, 4.60 mmol, 1.5 equiv) in THF (5 mL) dropwise. This reaction mixture was stirred at −35° C. for 3 h before it was warmed to −10° C. and quenched with 2 mL saturated $NH_4Cl$. The mixture was extracted with ethyl acetate, washed with brine, and dried over $Na_2SO_4$. The solution was concentrated to give the crude product which was purified by silica gel chromatography using hexane/ethyl acetate as the eluent to give a white solid. The solid was recrystallized using ether/hexane to give 6 (722 mg, 1.98 mg, yield: 65%). M.P.: 86-88° C. IR: 3204, 2970, 1738, 1496, 1364, 1339, 1273, 1246, 1231, 1215, 1184, 1162, 1133, 1122, 1074, 1056, 877, 870, 807, 760, 695 $cm^{-1}$. $^1H$ NMR (400 MHz, $CDCl_3$) δ 7.53-7.44 (m, 2H), 7.38-7.33 (m, 2H), 5.25 (p, J=7.5 Hz, 1H), 3.88 (d, J=8.0 Hz, 1H), 1.27 (s, 9H). $^{19}F$ NMR (376 MHz, $CDCl_3$) δ −56.74 (s, 6F), −74.23 (d, J=7.3 Hz, 6F). $^{13}C$ NMR (101 MHz, $CDCl_3$) δ 147.27, 131.02, 128.84, 127.09, 125.98, 124.31 (q, J=281.4 Hz), 120.41 (q, J=258.0 Hz), 119.87 (d, J=1.6 Hz), 57.16, 55.84 (q, J=31.9 Hz), 22.24. HRMS (ESI): calc for $C_{13}H_{16}F_6NO_2S$ $[M+H]^+$ 364.0800. found 364.0802.

Under Ar atmosphere, to a solution of 6 (600 mg, 1.65 mmol, 1.0 equiv) in anhydrous MeOH (10 mL) was added HCl (4.1 mL, 10 equiv, 4 N in dioxane). The reaction mixture was stirred at room temperature for 6 h and evaporated to dryness. The amine salt was washed with cold ether to give 7 as a white solid (480 mg, 1.62 mmol, yield: 98%). M.P.: 172-175° C. IR: 2784, 2589, 1611, 1586, 1539, 1504, 1456, 1374, 1351, 1268, 1245, 1221, 1183, 1168, 1130, 1081, 1025, 934, 775, 685 $cm^{-1}$. $^1H$ NMR (400 MHz, MeOD) δ 7.74 (ddd, J=9.3, 5.7, 1.7 Hz, 2), 7.60 (dd, J=11.9, 4.5 Hz, 2H), 5.68 (q, J=7.2 Hz, 1H). $^{19}F$ NMR (376 MHz, MeOD) δ −58.53 (s, 6F), −74.71 (d, J=7.0 Hz, 6F). $^{13}C$ NMR (101 MHz, MeOD) δ 147.60, 132.79, 128.88, 127.61, 123.10 (q, J=280.8 Hz), 120.39 (q, J=257.0 Hz), 20.13, 119.94, 49.06 (q, J=33.8). HRMS (ESI): calc for $C_9H_8F_6NO$ $[M+H]^+$ 260.0505. found 260.0507.

Figure 102:
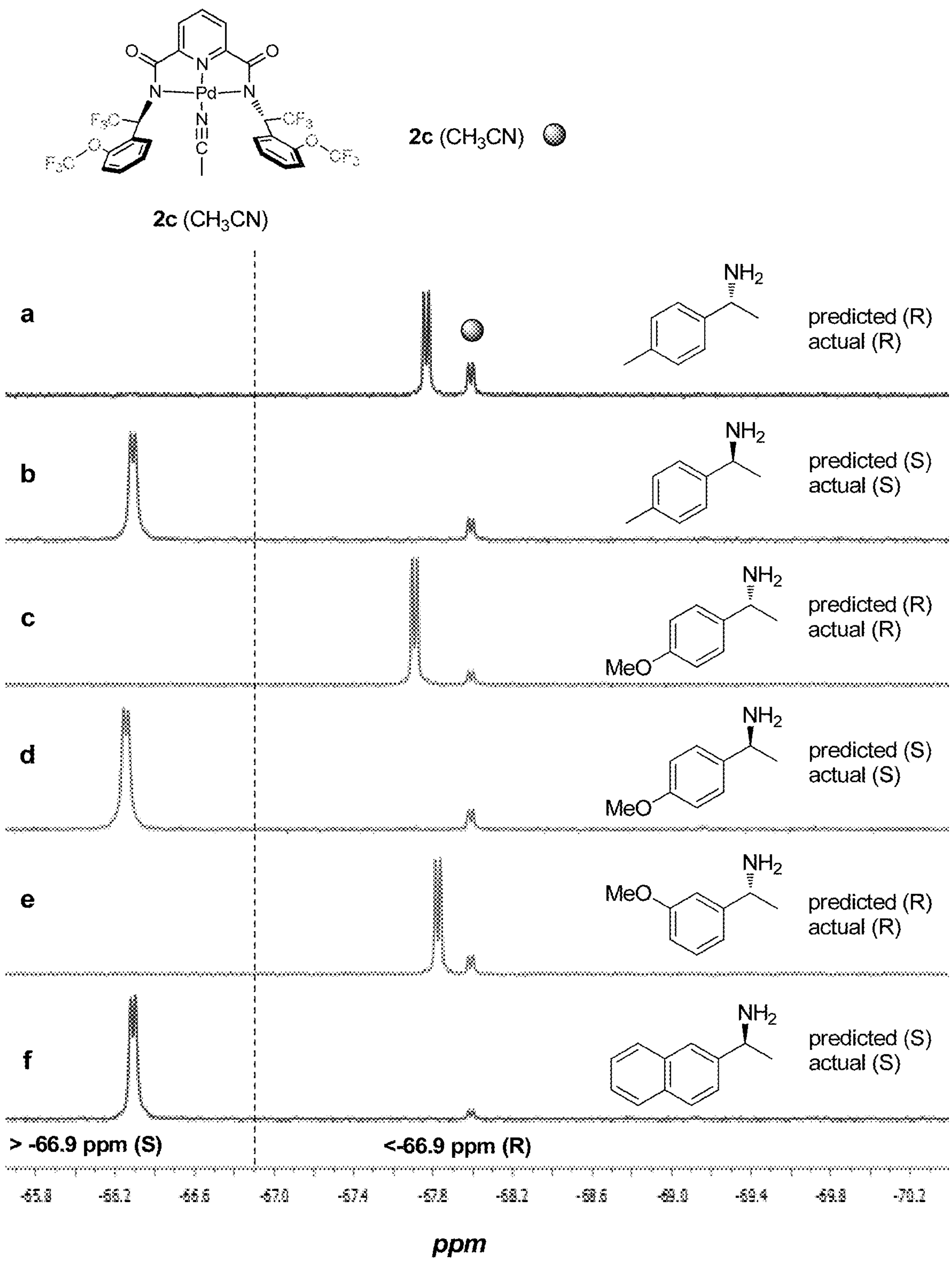
FIG. 102 shows $^{19}F$ NMR spectra (64 scans each) of a mixture of complex 2c ($CH_3CN$) (1.0 mM) in $CDCl_3$ with chiral amine (ca. 1.5 mM).
Figure 103:
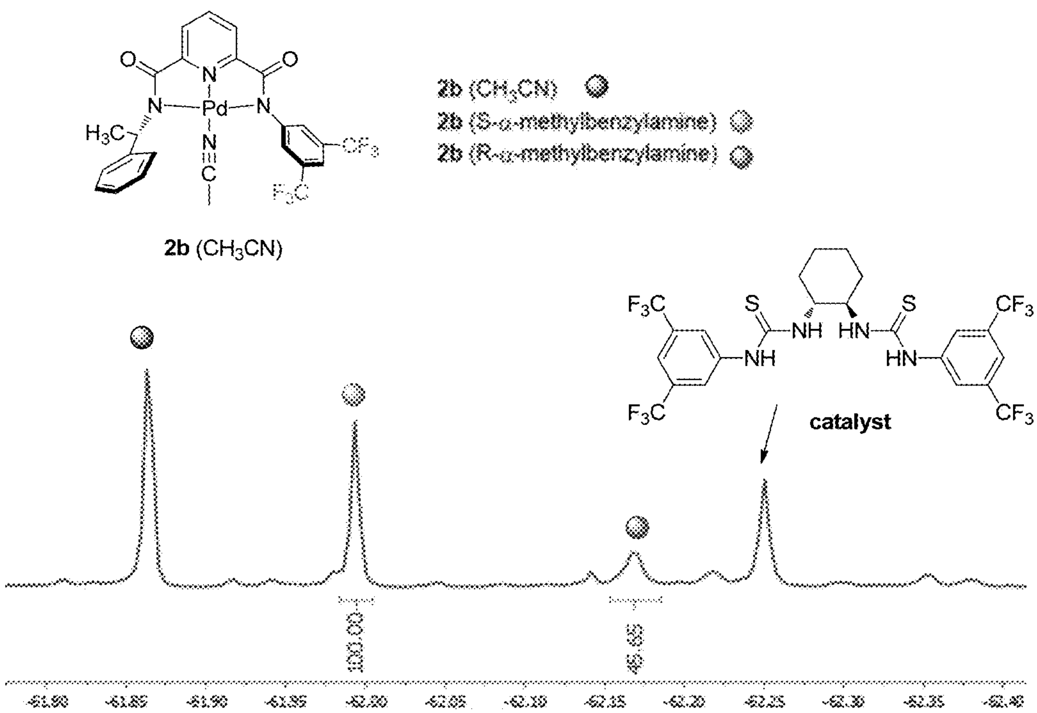
FIG. 103 shows $^{19}F$ NMR spectra (128 scans) of a mixture of complex 2b ($CH_3CN$) (ca. 1.5 mg), reaction mixture (0.3 mL), and $CDCl_3$ (0.2 mL).
Figure 104:
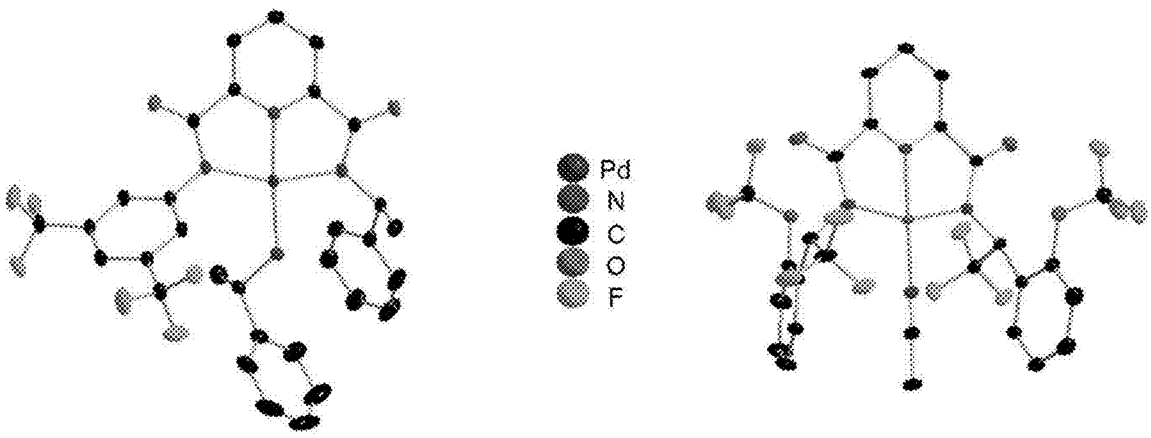
FIG. 104 shows X-ray structure of 2b (S-α-methylbenzylamine), and 2c ($CH_3CN$).

The prediction of absolute configuration of chiral amine is based on empirical trend found in the experiments of structurally similar analyte with known configuration. For instance, α-chiral amines of S configuration always appear at a lower field as compared to those of R configuration. Based on this trend, the configuration of amines FIG. 102,

*a-d*) can be made. Alternatively, α-chiral amines of S configuration generally appear at >−66.9 ppm, while R α-chiral amines has a chemical shift of <−66.9 ppm. The configuration of amines (FIG. 102, *e* and *f*) were assigned based on the trend found in chemical shift.

Direct Analysis of Crude Reaction Mixture without Workup.

The work of Siedel on catalytic kinetic resolution of chiral amines can be as an example to demonstrate the ability to analyze crude reaction mixture with the method here.

The reaction was carried out following the procedure reported in the literature. See, for example, C. K. De, E. G. Klauber and D. Seidel, J. Am. Chem. Soc., 2009, 131, 17060-17061, which is incorporated by reference in its entirety.

A mixture of DMAP (6.1 mg, 0.05 mmol), benzoic anhydride (23 mg, 0.125 mg) and 4 Å MS (100 mg) in toluene was stirred at room temperature for 15 min. The reaction mixture was cooled to −78° C. and a solution of catalyst (33 mg, 0.05 mmol) in 2 mL of toluene was added. After 15 min, racemic α-methylbenzylamine (30.3 mg, 0.25 mmol) was added. The reaction mixture was stirred at −78° C. for 1 h and was allowed to warm to room temperature over 2 h.

0.3 mL of this reaction mixture was mixed with 1.5 mg (ca.) of complex 2b ($CH_3CN$) in 2 mL of $CDCl_3$ and the $^{19}F$ NMR spectra was recorded. The enantiomeric excess determined by the method here is 37.3% which is in good agreement with the result determined by chiral HPLC (38.5%).

Example 3: Identification of Amines and N-Heterocycles Using Fluorinated Molecular Sidewalls The measurement of amines and N-heterocycles are pervasive in health care, biomedical research, and quality control of food. A chemosensory system is reported that operates without need of separation techniques and is capable of simultaneously identifying multiple structurally similar analytes. This method employs fluorinated palladium pincer complexes as receptors/sensors to bind and uniquely identify amines and N-heterocycles. The binding of analytes induces distinct NMR shifts of the fluorine atoms appended on the molecular sidewalls that define a pocket around the palladium center. This method allows for the simultaneous identification of multiple structurally similar biogenic amines.

Amine and N-heterocycle moieties are ubiquitously bioactive molecules with a wide variety of physiological functions. See, for example, (a) ten Brink, B.; Damink, C.; Joosten, H. M. L. J.; Huis in 't Veld, J. H. J. *Int. J. Food Microbiol.* 1990, 11, 73; (b) Ancin-Azpilicueta, C.; Gonzalez-Marco, A.; Jimenez-Moreno, N. *Crit. Rev. Food Sci. Nutr.* 2008, 48, 257; (c) Ruiz-Capillas, C.; Jimenez-Colmenero, F. *Crit. Rev. Food Sci. Nutr.* 2004, 44, 489; (d) *Bioactive Heterocyclic Compound Classes: Pharmaceuticals and Agrochemicals*; Clemens, L., Jurgen, D. Ed.; John Wiley & Sons: Weinheim, Germany, 2012, each of which is incorporated by reference in its entirety. Biogenic amines are key biomarkers for the determination of food freshness and human disease. See, for example, (a) Santos, M. H. S. *Int. J. Food Microbiol.* 1996, 29, 213. (b) Khuhawar, M. Y.; Qureshi, G. A. J. *Chromatogr. B* 2001, 764, 385, each of which is incorporated by reference in its entirety. For instance, a higher-than-normal level of serotonin in serum may indicate carcinoid syndrome. See, for example, Feldman, J. M. *Semin. Oncol.,* 14, 237, which is incorporated by reference in its entirety. On the other hand, N-heterocycles are commonly used in drugs and vitamins, and represent a major class of natural products. Many well-known alkaloids, such as caffeine, nicotine, and morphine also contain N-heterocyclic units. Presently, routine analysis of complex samples often requires high performance liquid chromatography (HPLC) and/or mass spectrometric methods to precisely determine their identities. See, for example, Park, J. S.; Lee, C. H.; Kwon, E. Y.; Lee, H. J.; Kim, J. Y.; Kim, S. H. *Food Control* 2010, 21, 1219. Li, W.; Pan, Y.; Liu, Y.; Zhang, X.; Ye, J.; Chu, Q. *Chromatographia* 2014, 77, 287. Önal, A.; Tekkeli, S. E. K.; Önal, C. *Food Chem.* 2013, 138, 509, each of which is incorporated by reference in its entirety. Herein, a $^{19}F$ NMR chemosensing method can be applied to untreated complex samples and simultaneously identify a number of amines and N-heterocycles.

Figure 108:
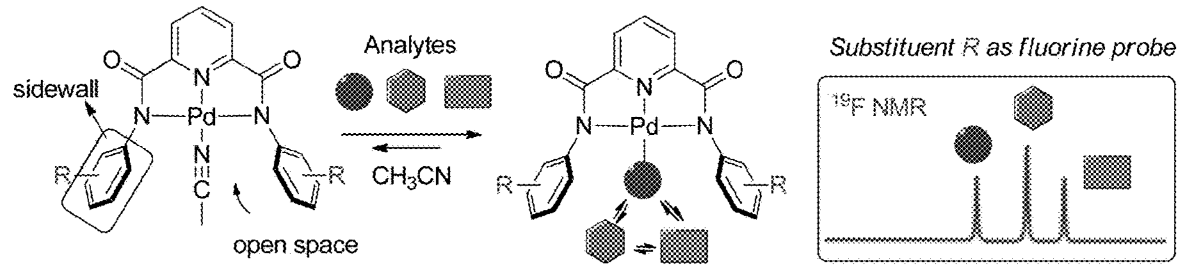
FIG. 108 illustrates sensing with fluorinated sidewalls.

Chemosensory methods, wherein molecules are designed as transducers to analytes, have attracted attention of the last couple decades as a result of their efficiency and simplicity. See, for example, Binghe, W.; Eric, V. A. *Chemsosensors: Principles, Strategies, and Applications*; John Wiley & Sons: Hoboken, 2011, which is incorporated by reference in its entirety. However, the vast majority of synthetic recognition elements suffer from cross reactivity between related molecules, albeit often with different association constants. Put simply, perfect receptors that do not suffer from interferences are rare. As a result, a single chemosensory is typically not able to simultaneously identify a multiplicity of organic compounds in a complex mixture. To address this limitation a new sensing scheme was introduced for the identification of organic compounds using molecular containers coating fluorine atoms as NMR probes. See, for example, Zhao, Y.; Swager, T. M. *J. Am. Chem. Soc.* 2013, 135, 18770. Zhao, Y.; Markopoulos, G.; Swager, T. M. *J. Am. Chem. Soc.* 2014, 136, 10683, each of which is incorporated by reference in its entirety. The rigid and constrained environment of the molecular container promoted a static structure on the NMR time frame and promoted intimate through-space and through-bond interactions between fluorine probes and the encapsulated analyte. Analyte induced changes in multiple $^{19}F$ signals provided for a unique signature or fingerprint for each analyte. The scarcity of organofluorine compounds in nature is also an advantage and allows for the direct analysis of complex mixtures without concern of interfering signals. See, for example, (a) Furuya, T.; Kamlet, A. S; Ritter, T. *Nature* 2011, 473, 470; (b) Harper, D. B.; O'Hagan, D. *Nat. Prod. Rep.* 1994, 11, 123, each of which is incorporated by reference in its entirety. Although molecular containers can provide precise size selectivity, the synthetic challenges in the preparation of a large molecular containers limit applications of this method to be adapted to detect a diverse array of bioactive molecules. To address this limitation, a new strategy using an open binding cleft with adjacent fluorinated aromatic rings (molecular sidewalls) as a versatile platform for the identification of amine and N-heterocycles. The bound analytes restrict the free rotation of the molecular sidewalls and these subtle interactions lead to characteristic $^{19}F$ NMR shifts (FIG. 108). This reductionist progression wherein a rigid molecular container was transformed to clefts flanked by sidewalls provides for a more compliant host that can bind larger and more diverse analytes. An additional benefit is simplified synthetic access to chemosensory molecules expanding the prospects of $^{19}F$ NMR for chemical sensing (FIG. 108). See, for example, Yu, J.-X.; Hallac, R. R.;

Chiguru, S.; Mason, R. P. *Prog. Nucl. Magn. Reson. Spectrosc.* 2013, 70, 25, which is incorporated by reference in its entirety.

Figure 109:
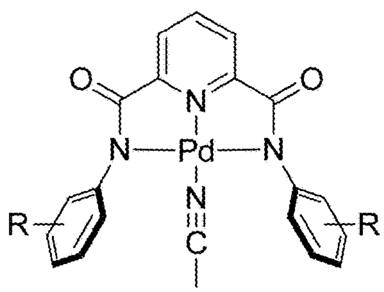
FIG. 109 shows palladium complexes with various fluorinated molecular sidewalls.
Figure 109:
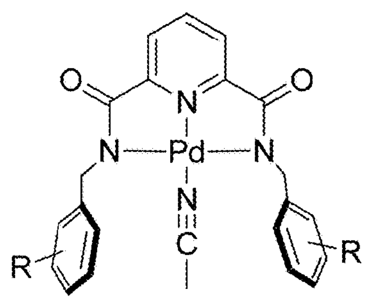
Figure 109:
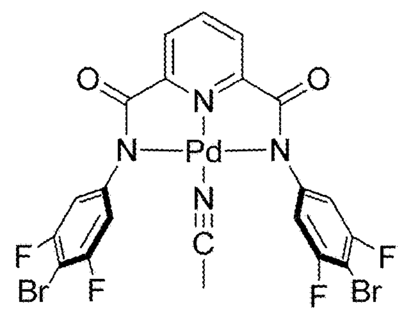

The amide-based tridentate chelated NNN palladium pincer complexes are an ideal scaffold because the molecular sidewalls are easily constructed by reacting 2,6-pyridinedicarbonyl dichloride with various anilines or benzylamines. See, for example, Reed, J. E.; White, A. J. P.; Neidle, S.; Vilar, R. *Dalton Trans.* 2009, 2558. Yamnitz, C. R.; Negin, S.; Carasel, I. A.; Winter, R. K.; Gokel, G. W. *Chemical Commun.* 2010, 46, 2838, each of which is incorporated by reference in its entirety. Another appealing feature of these complexes is the ability to undergo facile ligand exchange at only one coordination site. The complexes can be synthesized with a weakly bound acetonitrile that is rapidly replaced by stronger ligands such as pyridine and 2,2'-dichlorodiethyl sulfide (FIG. 108). See, for example, (a) Moriuchi, T.; Bandoh, S.; Kamikawa, M.; Hirao, T. *Chem. Lett.* 2000, 148; (b) Moriuchi, T.; Bandoh, S.; Miyaji, Y.; Hirao, T. *J. Organomet. Chem.* 2000, 599, 135; (c) Wang, Q.-Q.; Begum, R. A.; Day, V. W.; Bowman-James, K. *J. Am. Chem. Soc.* 2013, 135, 17193, each of which is incorporated by reference in its entirety. The wide analyte scope provided by this motif is important to an expanded sensing scheme for the simultaneous detection of multiple species. Palladium complexes can be prepared with molecular sidewalls composed of aryl-groups containing $CF_3$ and $OCF_3$ groups with the aim to differentiate structurally related analytes (FIG. 109, 1-4). To examine the impact of conformational flexibility, benzylamine derived sidewalls (FIG. 109, 5) was further prepared. Fluoroaryl sidewalls were introduced with an interest to create larger $^{19}$F NMR shifts in response to proximate interactions with analytes containing polarizable π-electrons (FIG. 109, 6). The spatial location of the $^{19}$F groups is also critical to supply uncorrelated shifts that uniquely identify analytes. The discriminatory power of these chemosensory constructions (FIG. 109, 1-6) for amines and N-heterocycles was examined.

Figure 110:
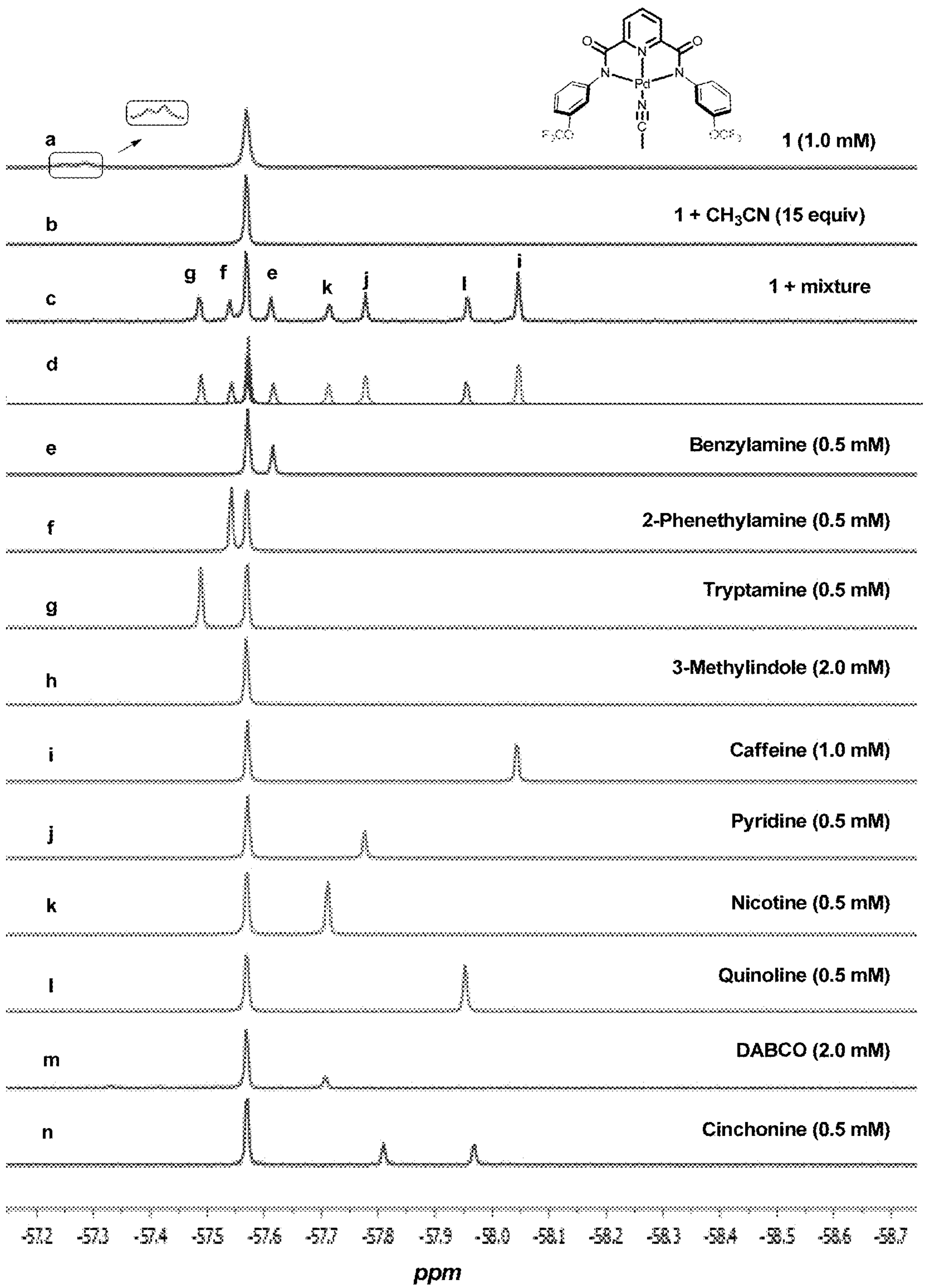
FIG. 110(*a*) shows $^{19}F$ NMR spectrum of complex 1 alone.

The $^{19}$F NMR sensing potential of complex 1 can be explored. Initial studies revealed that the Lewis basic amide group of the ligand can replace the bound acetonitrile to generate oligomeric species in non-coordinating solvent (FIG. 110*a*). This behavior has been previously investigated, and a cyclic hexamer of a palladium pincer complex has been recently reported and characterized by X-ray crystallography. See, for example, Belli Dell'Amico, D.; Calderazzo, F.; Di Colo, F.; Guglielmetti, G.; Labella, L.; Marchetti, F. *Inorg. Chim. Acta* 2006, 359, 127. Wang, Q.-Q.; Day, V. W.; Bowman-James, K. *Chem. Commun.* 2013, 49, 8042, each of which is incorporated by reference in its entirety. To prevent the formation of oligomeric species, an additional 15 equivalent of $CH_3CN$ was added to chloroform solution of 1. The monomeric species is stable under this condition with a well-resolved singlet peak observed in $^{19}$F NMR (FIG. 110*b*). A series of amines and N-heterocycles were selected as the analytes with an interest in the detection of biologically active compounds (see FIG. 101, for the analyte structures). The observation of the discrete signals at precise concentration independent chemical shifts indicates the formation of "static" complexes on the NMR time scale for the identification of each analyte. FIG. 110 illustrates the ability to discriminate between similar analytes. A noteworthy feature is to contrast the new upfield shifted signal observed in for benzylamine binding as opposed to the downfield shift for 2-phenethylamine binding, which is caused by the addition of an additional methylene (FIG. 110*e*,*f*). Ethylamines with aromatic rings at the β positions are readily resolved with 2-phenethylamine and tryptamine binding producing easily distinguishable signals (FIG. 110*f*, *g*). It is worth noting that the $NH_2$ group on tryptamine is responsible for the sensing result as no new peak was observed with exposure to 3-methylindole (FIG. 110*h*). Despite the fact that N-heterocycles, such as pyridine, nicotine and quinoline all coordinate to 1 through a pyridine subunit, distinct shifts were produced (FIG. 110*j*-*l*). Tertiary amines have a much lower coordinating ability with 1 in comparison with primary amines and the Lewis basic sites on planar N-heterocycles. This deduction is based on the fact that the intensity of the generated signal is very low even with analyte at high concentrations (FIG. 110*m*). Interestingly, two new peaks of the same intensity were produced upon exposure to cinchonine (FIG. 110*n*). This observation is attributed to the asymmetricity of cinchonine, which induces the non-equivalence of the two $OCF_3$ groups. Notably, the fact that multiple signals are produced by a single sensor mitigates the use of arrays of chemosensors and increases the fidelity in targeting specific analyte. The ability to simultaneously identify multiple species is a desired property for chemosensing methods, especially when the inference is present or more than one analytes are of interest in the system. As a demonstration, a mixture of seven compounds (three amines and four N-heterocycles) provides seven new signals with which are uniquely assignable to the corresponding analytes (FIG. 110*c*).

To explore the properties of receptors with spatially varying fluorine atoms and the influence of the flexible molecular sidewalls, the sensing experiment can be performed with palladium pincer complexes 2-5. The analyte induced shifts for each complex are defined as the difference of the $^{19}$F NMR shifts relative to the acetonitrile complexes of 2-5. As shown in Table 1, the receptors all displayed different responses for each individual analyte. The discriminatory ability of chemosensors is highly dependent on the position of fluorine atoms. For instance, although benzylamine and 2-phenethylamine induced similar responses (−0.091 v.s. −0.073 ppm) in chemosensor 2 with meta-$CF_3$ group on the sidewall, placing the $CF_3$ group at para-position as in 3 produces a higher resolution response (−0.197 v.s. −0.047 ppm). Interestingly, N-heterocycles tend to induce larger shifts than amines in chemosensors 2-4, whereas 5 with flexible sidewalls displays similar magnitude responses for all of the analytes. This result suggests that the rigid structures increase the interactions with analytes having π-systems, which generates larger chemical shifts.

TABLE 1

Chemical Shifts Induced (Δδ, ppm) by Various Amines and N-heterocycles.

| | 2 | 3 | 4 | 5 |
|---|---|---|---|---|
| Benzylamine | −0.091 | −0.197 | −0.061 | −0.141 |
| 2-Phenethylamine | −0.073 | −0.047 | 0.075 | −0.043 |
| Nicotine | −0.288 | −0.175 | −0.100 | −0.043 |
| Quinoline | −0.627 | −0.352 | −0.268 | −0.101 |

Figure 111:
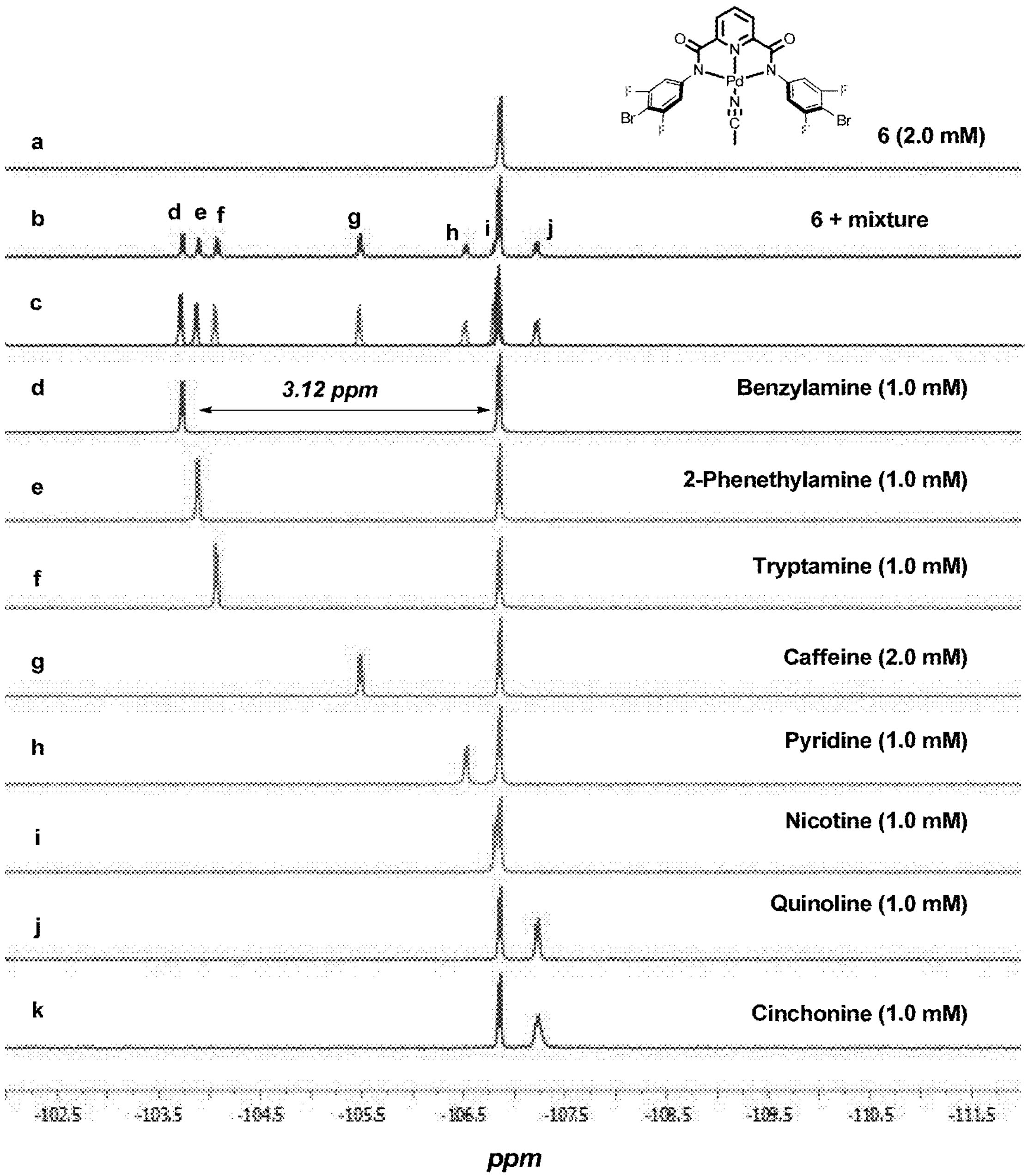
FIG. 111(*a*) shows $^{19}F$ NMR spectrum of complex 6 and 15 equiv of $CH_3CN$, FIG. 111(*b*) shows $^{19}F$ NMR spectrum of seven analytes added to a solution of 6 in $CDCl_3$, FIG. 111(*c*) shows superimposition of the spectra of complex 6 with each of the seven analyte from (b) collected independently.

Sensor 6 with fluoroaryl sidewalls can display larger $^{19}$F NMR shifts as a result of the direct connection of the fluorines to the polarizable aromatic ring. Sensing experiments shown in FIG. 111 confirm this fact and benzylamine induces a downfield shift of 3.12 ppm (FIG. 111*b*) in 6, which is much bigger than those observed with complexes 1-5 (0.06-0.19 ppm). Interestingly, the downfield shifts were less pronounced with N-heterocycles in comparison to amines (FIG. 111*d-f* v.s. 2*g-k*). In contrast to the results obtained with 1, a broad peak was observed in response to cinchonine, which indicates that the fluorine atoms are equivalent on the NMR timescale, presumably as a result of rotational motions of the molecular sidewall (FIG. 111*k*).

Figure 96:
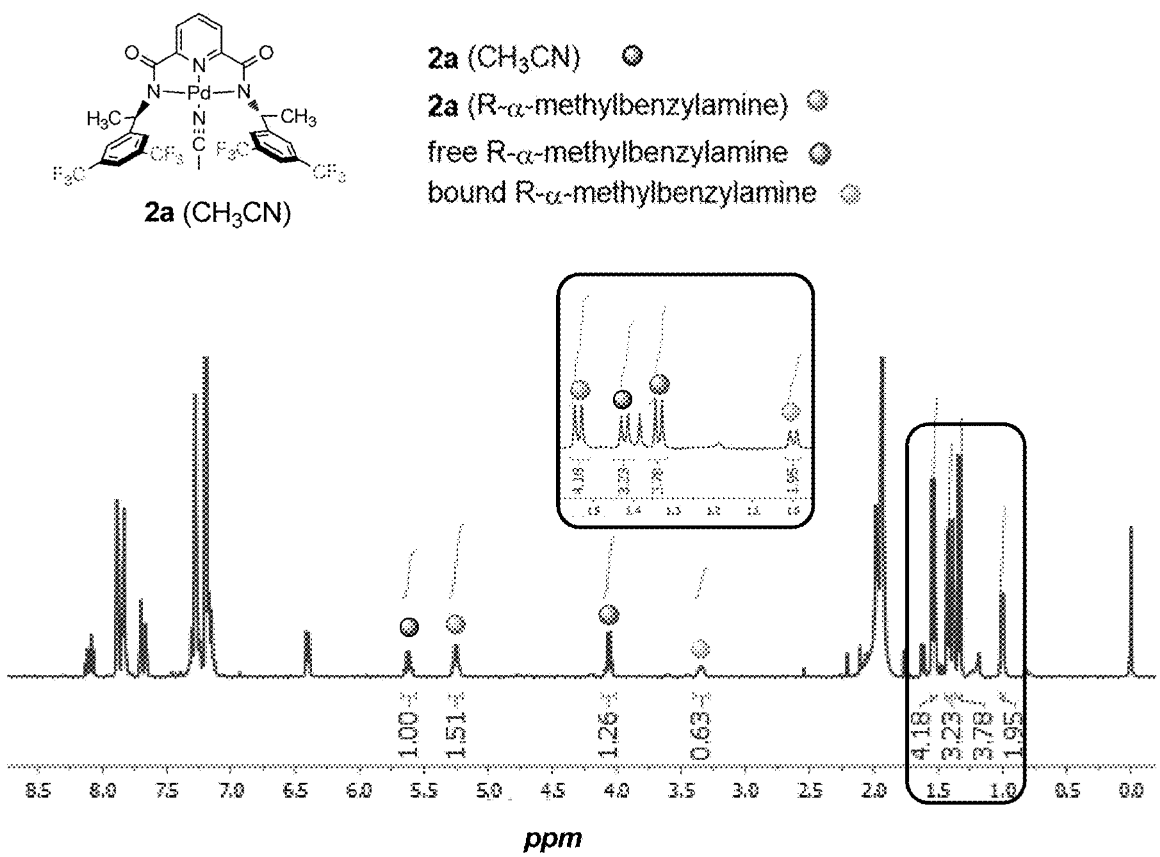
FIG. 96 shows $^{1}H$ NMR (64 scans) of a mixture of complex 2a ($CH_3CN$) (5.0 mM), $CH_3CN$ (ca. 50.0 mM) and (R)-α-methylbenzylamine (ca. 10 mM).
Figure 112:
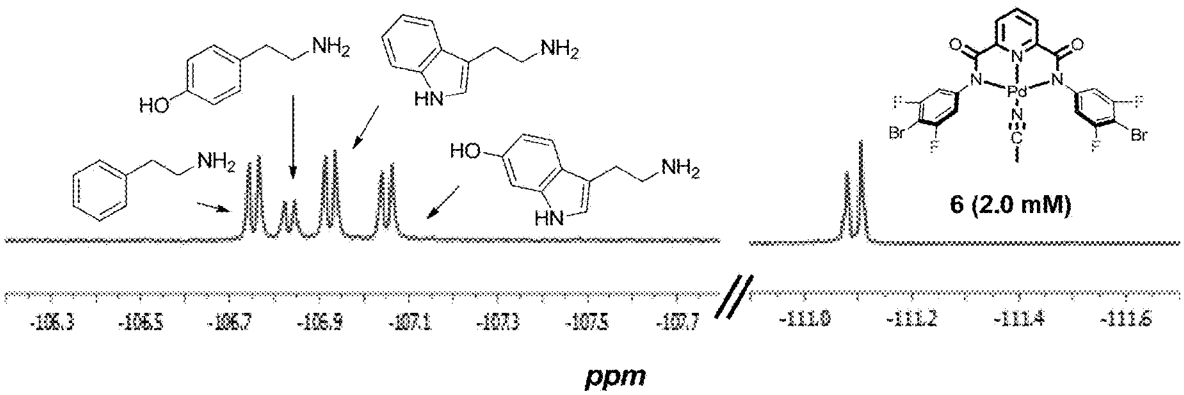
FIG. 112 shows $^{19}F$ NMR spectrum (128 scans) of a mixture of complex 6 (ca. 2.0 mM), 2-phenethylamine (ca. 1.0 mM), tyramine (ca. 0.5 mM), tryptamine (1.0 mM) and serotonin (1.0 mM) in a THF/$D_2O$/PBS buffer.

The rapid differential detection of structurally related organic compounds is crucial to biomedical research and health care and in this context biogenic amines are of particular interest as biomarkers for the disease. The precise identification of specific biogenic amines is important because of their different physiological functions. However, presently chromatographic separations are necessary when multiple biogenic amines are present in the sample under investigation. See, for example, Kumpf, J.; Freudenberg, J.; Fletcher, K.; Dreuw, A.; Bunz, U. H. F. *J. Org. Chem.* 2014, 79, 6634. Chow, C.-F.; Lam, M. H. W.; Wong, W.-Y. *Anal. Chem.* 2013, 85, 8246. Tamiaki, H.; Azuma, K.; Kinoshita, Y.; Monobe, R.; Miyatake, T.; Sasaki, S.-i. *Tetrahedron* 2013, 69, 1987. Maynor, M. S.; Nelson, T. L.; O'Sulliva, C.; Lavigne, J. J. *Org. Lett.* 2007, 9, 3217, each of which is incorporated by reference in its entirety. To demonstrate the robust discriminatory power of the method described here, it can be applied to the analysis of a mixture of biogenic amines in a buffer solution (For other applications, such as differentiation of caffeine and thoepholline; stereoisomeric quinine and quinidine, see FIG. 96 in SI). Specifically, 2-phenethylamine, tyramine, tryptamine, and serotonin were selected on the basis of their structural similarity. As shown in FIG. 112, all the analytes were successfully resolved with this method. Moreover, tryptamine and serotonin, which differ by one hydroxyl group, are unambiguously differentiated with well-separated peaks. It is notable that the precision provided with this method is difficult to achieve by other non-eluting methods.

Figure 97:
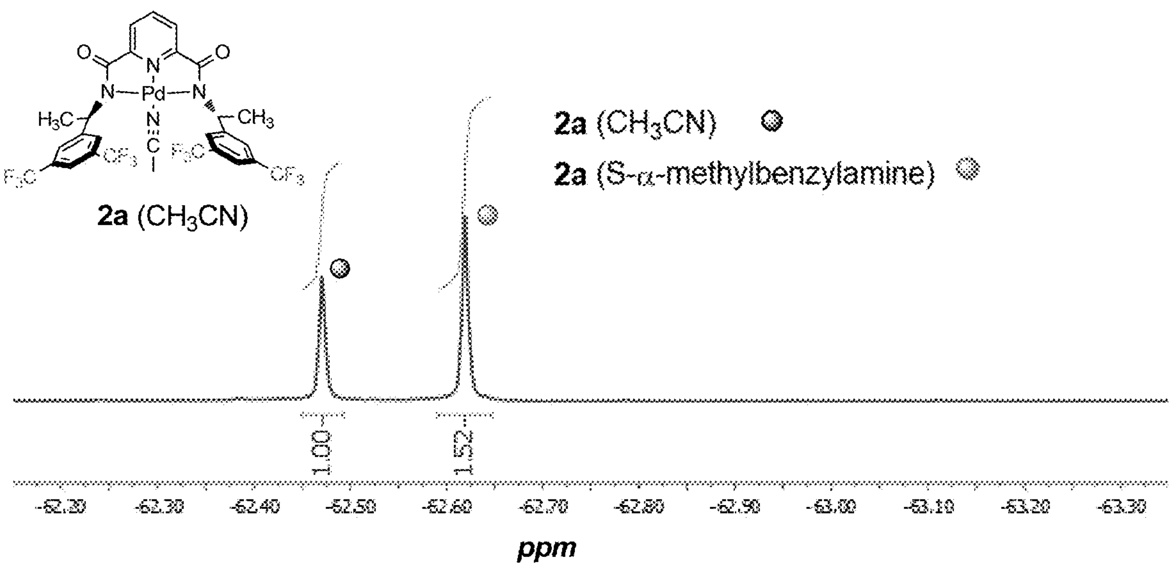
FIG. 97 shows $^{19}F$ NMR (64 scans) of a mixture of complex 2a ($CH_3CN$) (5.0 mM), $CH_3CN$ (ca. 50.0 mM) and (R)-α-methylbenzylamine (ca. 10 mM).
Figure 98:
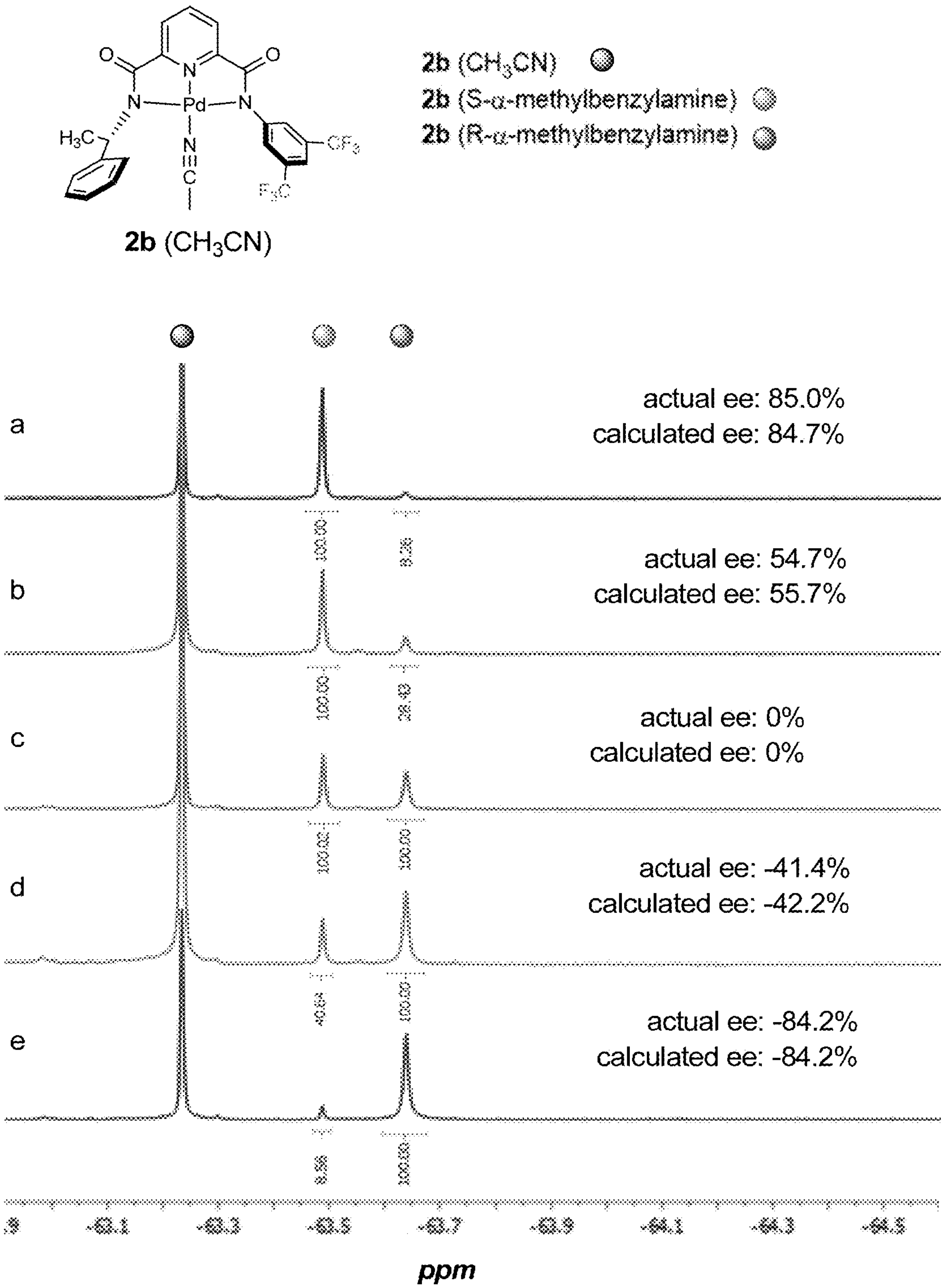
FIG. 98 shows $^{19}F$ NMR experiment (64 scans each) to determine ee using complex 2b ($CH_3CN$) (5.0 mM) and α-methylbenzylamine (ca. 2.0 mM) with variable ee in $CDCl_3$/pentane (2:3).
Figure 101:
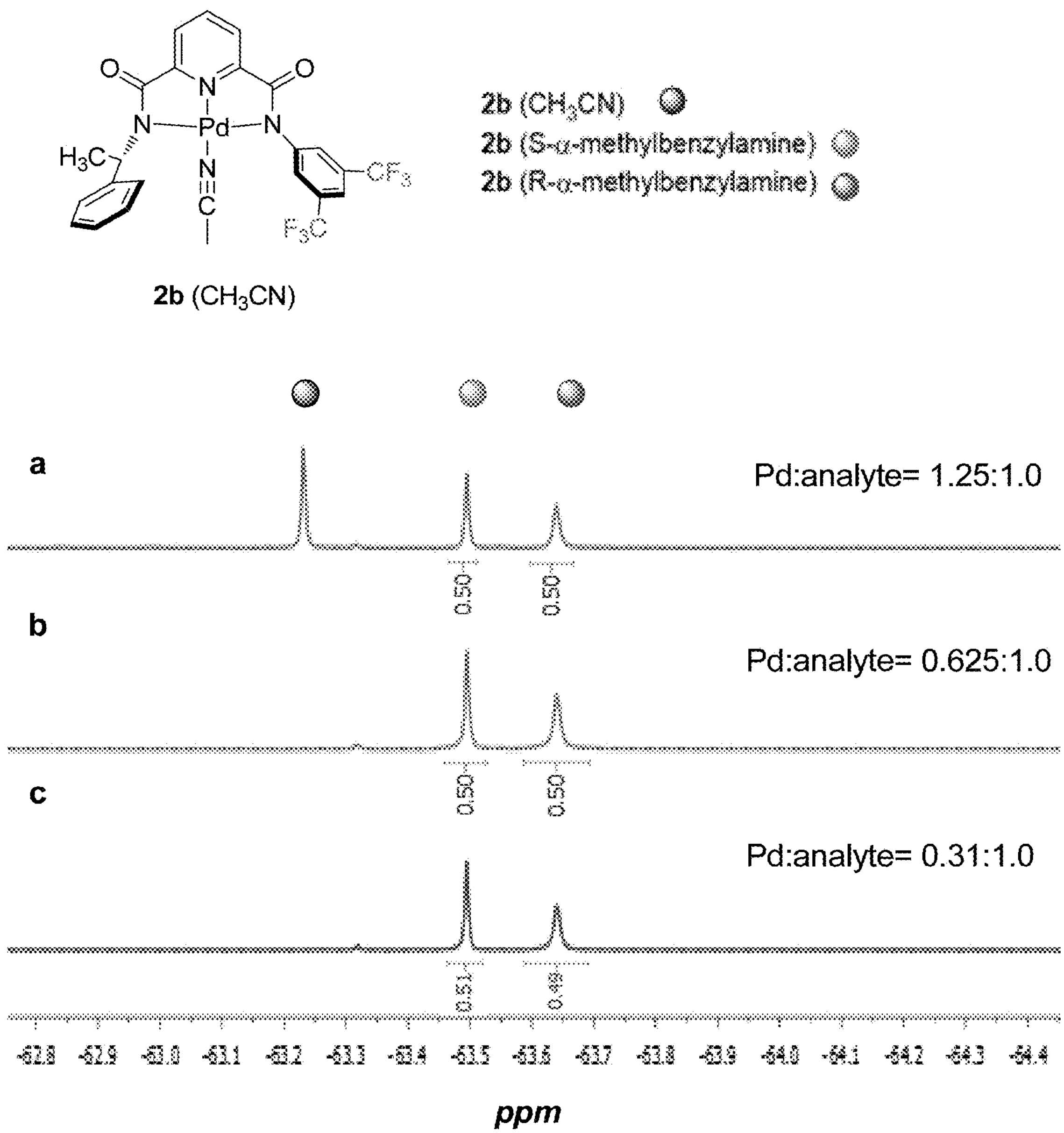
FIG. 101 shows $^{19}F$ NMR spectra (64 scans each) of a mixture of complex 2b ($CH_3CN$) (2.5 mM) in $CDCl_3$/pentane (2:3) with racemic α-methylbenzylamine at various concentrations.
Figure 113:
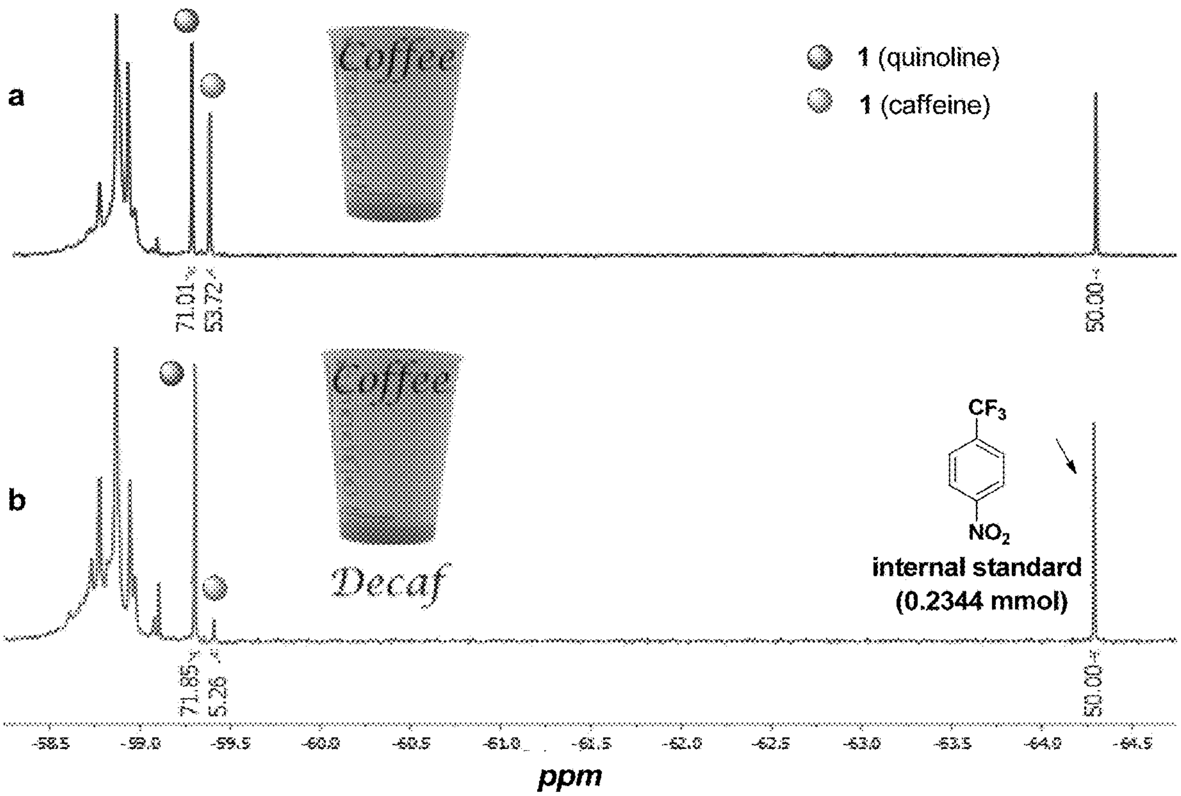
FIG. 113(*a*) shows $^{19}F$ NMR spectrum (128 scans) of a mixture of complex 1 (ca. 3.0 mM in MeOH/$D_2O$/$H_2O$), internal standards (the molar ratio of 4-nitrobenzotrifluoride:Quinoline=50:35.1) and coffee, and 40 μL of regularly brewed coffee was added.

The direct analysis of complex matrices without pretreatment is a highly desired to create rapid and robust analytical methods. Although a well-designed receptor can provide a high level of selectivity, sensing methods completely inhibiting inferences from complex matrices are still rare. Coffee represents as a complicated mixture, the primary constituents of which are water, carbohydrates, fiber, proteins, free amino acids, lipids, minerals, organic acids, chlorogenic acid, trigonelline, and caffeine. See, for example, *Coffee: Emerging Health Effects and Disease Prevention*, First Edition; Chu, Y-F. Ed.; John Wiley & Sons: New Delhi, India, 2012, which is incorporated by reference in its entirety. To illustrate the precise identification and quantification of target species can be achieved with the sensing scheme described here, the detection of caffeine in regular and decaffeinated coffee can be without pre-treatment. See, for example, For selected examples on the methods to detect caffeine, see: (a) Rochat, S.; Swager, T. M. *J. Am. Chem. Soc.* 2013, 135, 17703. (b) Kobayashi, T.; Murawaki, Y.; Reddy, P. S.; Abe, M.; Fujii, N. *Anal. Chim. Acta* 2001, 435, 141; (c) Zuo, Y.; Chen, H.; Deng, Y. *Talanta* 2002, 57, 307; (d) Xu, W.; Kim, T.-H.; Zhai, D.; Er, J. C.; Zhang, L.; Kale, A. A.; Agrawalla, B. K.; Cho, Y.-K.; Chang, Y.-T. *Sci. Rep.* 2013, 3, each of which is incorporated by reference in its entirety. In this experiment, coffee and non-volatile 4-nitrobenzotrifluoride (internal standard) was added to 1 in methanol for $^{19}$F NMR analysis. As the controlled experiment showed almost all the caffeine coordinated to receptor 1 in methanol (FIGS. 97 and 98), the concentration of caffeine can be easily determined from the integration of the corresponding $^{19}$F NMR signal. As shown in FIG. 113, although a number of unidentified species are observed, the signal produced at the distinctive chemical shift allows the unambiguous identification of caffeine in an extremely complex background. The nature of the coordination of caffeine to the $Pd^{+2}$ center was confirmed by a X-ray single-crystal of the isolated complex with 6 (FIG. 101). The concentrations of caffeine in regular and decaffeinated coffee were determined to be 3.15 and 0.15 mM, respectively. See, for example, (a) McCusker, R. R.; Goldberger, B. A.; Cone, E. J. *J. Anal. Toxicol.* 2003, 27, 520; (b) McCusker, R. R.; Fuehrlein, B.; Goldberger, B. A.; Gold, M. S.; Cone, E. J. *J. Anal. Toxicol.* 2006, 30, 611, each of which is incorporated by reference in its entirety. Notably, the precision of this method can be evaluated by concurrently adding another analyte of comparable coordinating ability and known concentration. The deviation of the concentration of the added quinoline calculated from $^{19}$F NMR is found to be less than 3%, thus suggesting the matrices of coffee have a negligible impact on the sensing result.

A new chemosensory platform can be based on $^{19}$F NMR and a binding site flanked by fluorine containing molecular sidewalls. The bound analyte restricts the free rotation of molecular sidewall and produced precise $^{19}$F NMR shifts can be used to identify various amines and N-heterocycles. The modularity and facile synthesis of the palladium pincer complexes allows for access to libraries of designer chemosensors for the direct detection and unambiguous identification of a wide range of analytes in a complex mixtures.

Amine and N-heterocycle moieties are ubiquitously found in bioactive molecules playing a wide variety of physiological functions. Biogenic amines are useful biomarkers to determine the food freshness and human disease. For instance, a higher-than-normal level of serum serotonin may indicate carcinoid syndrome. On the other hand, N-heterocycles are widely present in drugs, vitamins, and natural products. See for example, Santos, M. H. S. *Int. J. Food Microbiol.* 1996, 29, 213. Khuhawar, M. Y.; Qureshi, G. A. J. *Chromatogr. B* 2001, 764, 385, which is incorporated by reference in its entirety. As a result of the complex sample matrices, high performance liquid chromatography (HPLC) and other eluting methods are often needed to separate each species before precisely determining their identities. The sensing scheme described here uses a non-eluting chemosensing method for the identification of amines and N-heterocycles using fluorinated molecular sidewalls as a structure probe. Direct analysis of complex mixture is amenable with this method and multiple structurally similar analytes can be identified simultaneously.

Figure 114:
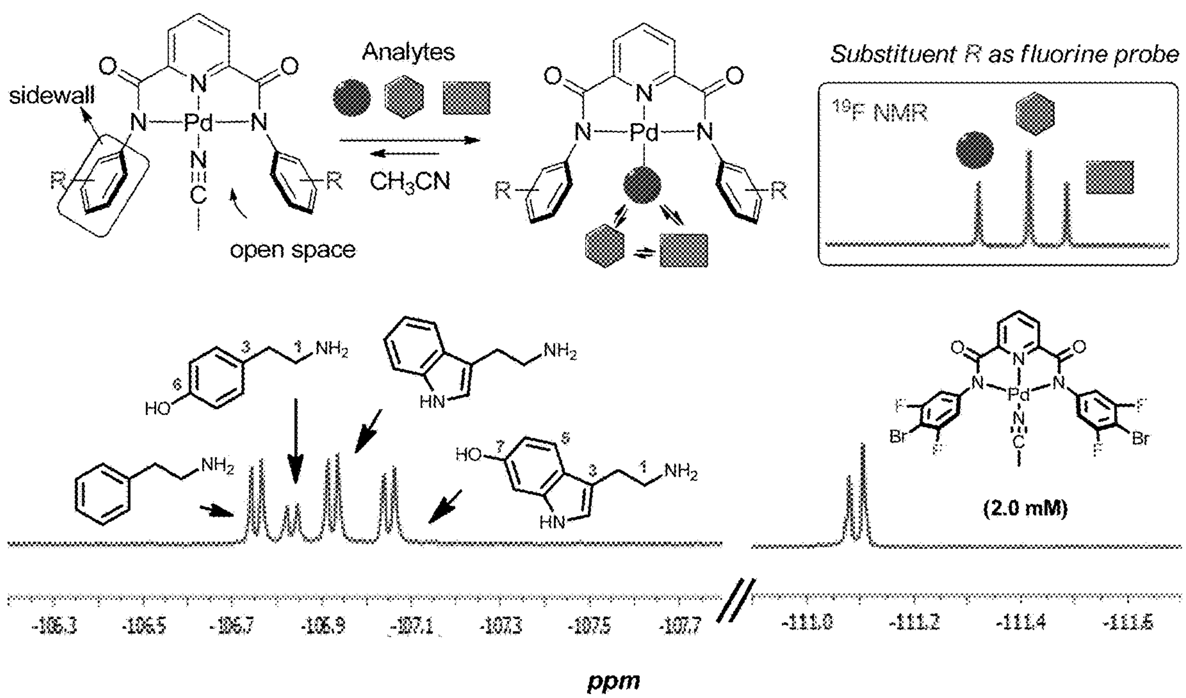
FIG. 114 shows identification of structurally similar biogenic amines with palladium pincer complex.

The amide-based tridentate chelated NNN palladium pincer complexes as a scaffold and the molecular sidewalls can be easily constructed by reacting 2,6-pyridinedicarbonyl dichloride with various anilines or benzylamines. One feature of these complexes is the ability to undergo facile ligand exchange at the fourth coordination site. The $Pd^{+2}$ center has a strong affinity for nitrogen ligands and is a good motif for recognition of biologically relevant amines, heterocycles or histidine residues in proteins. The weakly bound acetonitrile can be replaced by stronger ligands such as pyridine and other Lewis basic analytes (FIG. 114). A wide analyte scope can thus be provided by this property.

Figure 115:
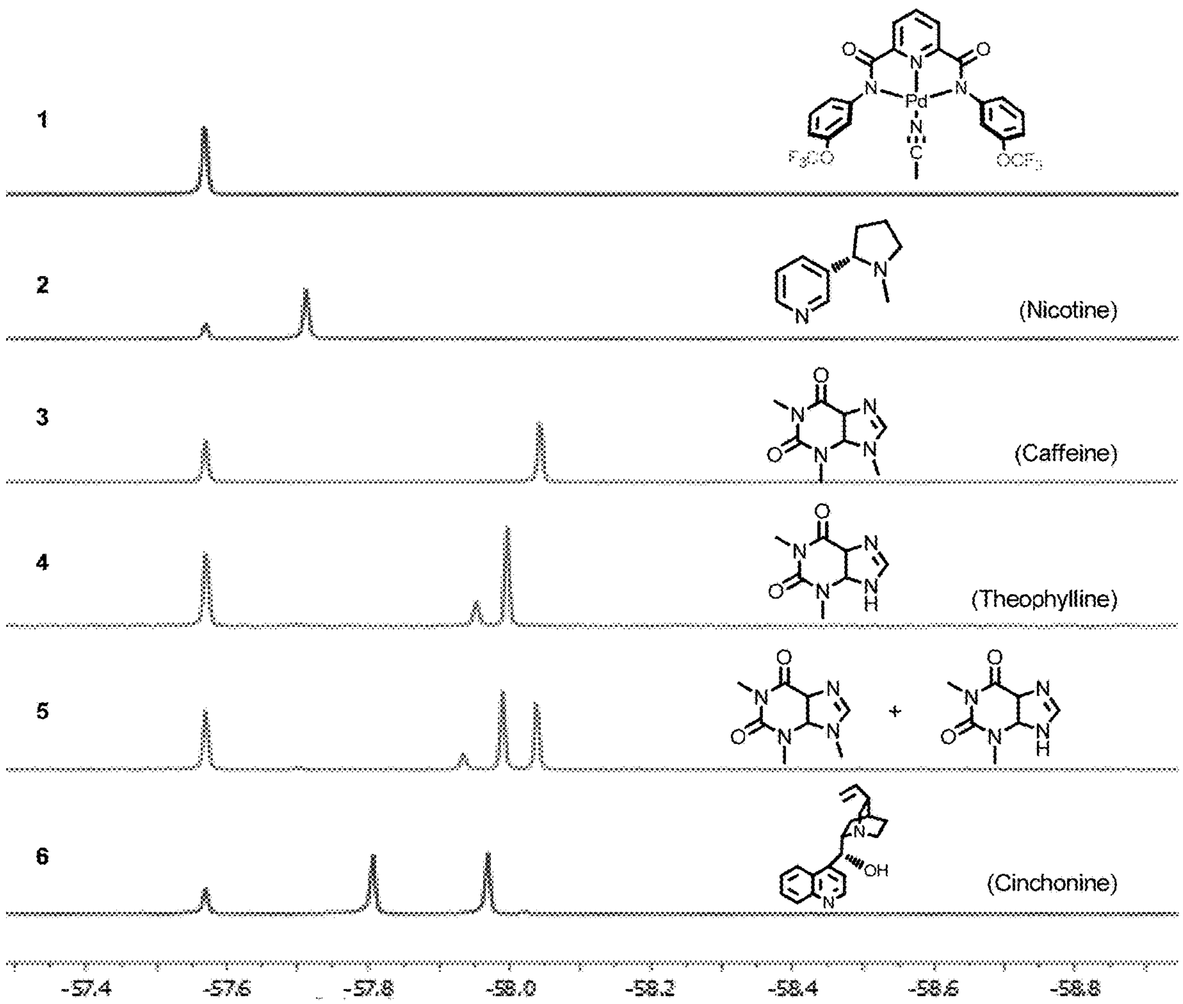
FIG. 115 shows identification of N-heterocycles with palladium pincer complex.

FIGS. 114 & 115 demonstrates the feasibility and precision of this method for the identification of various structurally similar amines and N-heterocycles. Four new and distinct peaks appear when four structurally similar biogenic amines were added to a solution of Pd pincer receptor. As shown in FIG. 115, various bioactive N-heterocycles induce different upfield shift upon binding to Pd. Notably, two new signals are produced by theophylline as a result of two possible way to bound to Pd. In addition, sterically bulky cinchonine affords two new signal of the same intensity. This observation is attributed to the asymmetricity of cinchonine, which induces the non-equivalence of the two $OCF_3$ groups.

Figure 116:
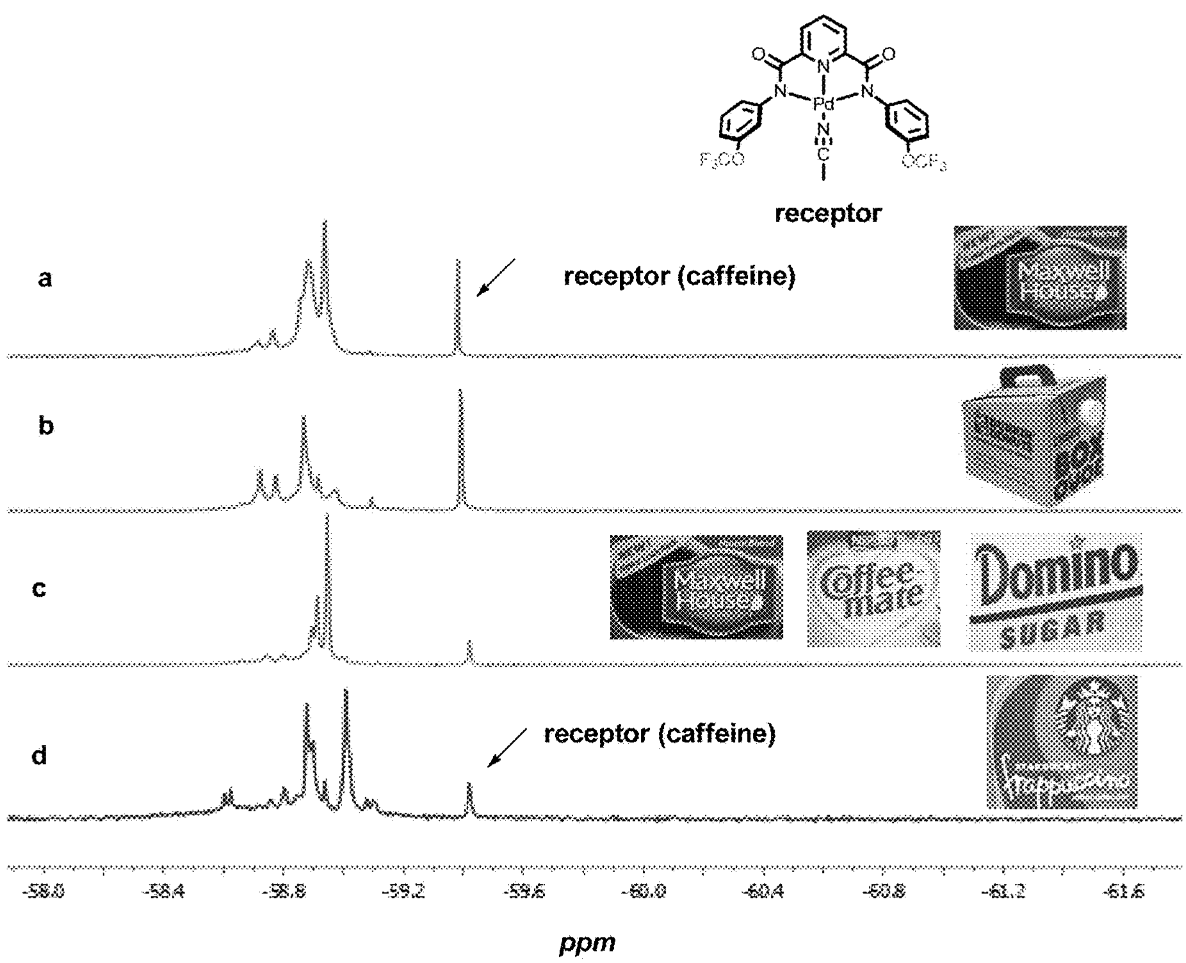
FIG. 116 shows $^{19}F$ NMR spectrum (128 scans) of a mixture of $Pd^{2+}$ receptor (ca. 1.7 mM in $MeOH/D_2O/H_2O$), and various coffee.

FIG. 116 demonstrates the robust nature of this method for the detection of caffeine in complex mixture. FIG. 116 shows $^{19}F$ NMR of a Pd pincer probe in water (a) with signals for both ACN and $H_2O$ coordination. Addition of pure caffeine generates a new signal at −59.48 ppm (b), which is also observed when the pincer is added to coffee (c) in the presence of creamer (d) or creamer and sugar (e).

Figure 117:
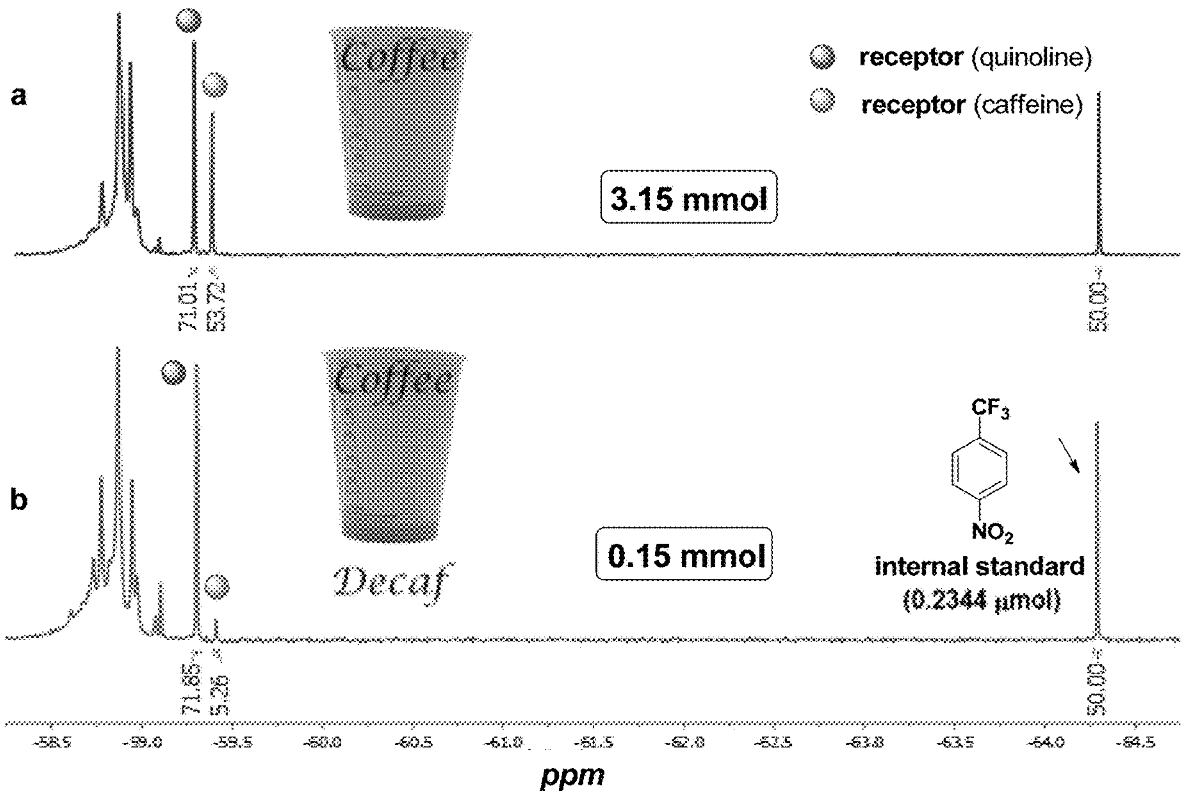
FIG. 117 (*a*) shows $^{19}F$ NMR spectrum (128 scans) of a mixture of receptor (ca. 3.0 mM in $MeOH/D_2O/H_2O$), internal standards (the molar ratio of 4-nitrobenzotrifluoride:quinoline=50:35.1) and coffee, when 40 μL of regularly brewed coffee was added.

FIG. 117 further demonstrates the precise quantitative analysis of caffeine content in coffee with any pre-treatment. In this experiment, coffee and non-volatile 4-nitrobenzotrifluoride (internal standard) was added to Pd pincer probe in methanol for $^{19}F$ NMR analysis. As the controlled experiment showed almost all the caffeine coordinated to receptor in methanol, the concentration of caffeine can be easily determined from the integration of the corresponding $^{19}F$ NMR signal. The concentrations of caffeine in regular and decaffeinated coffee were determined to be 3.15 and 0.15 mM, respectively. Notably, the precision of this method can be evaluated by concurrently adding another analyte of comparable coordinating ability and known concentration. The deviation of the concentration of the added quinoline calculated from $^{19}F$ NMR is found to be less than 3%, thus suggesting the matrices of coffee have a negligible impact on the sensing result.

Figure 118:
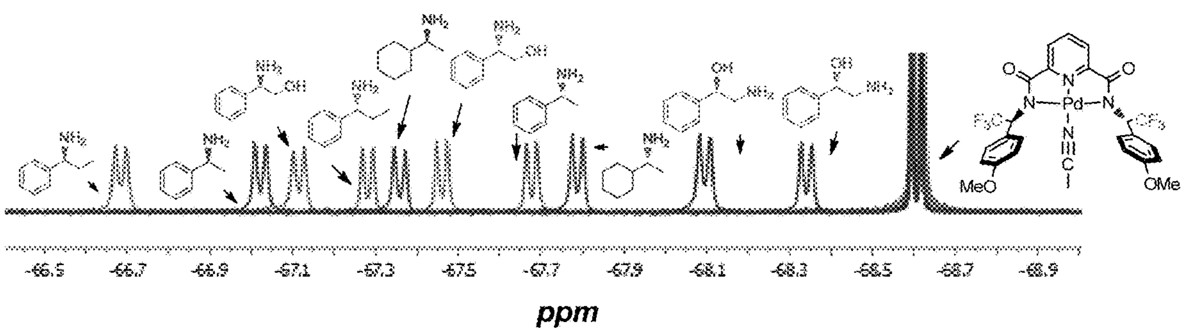
FIG. 118 shows identification of various chiral amines with palladium pincer complex.

Rapid and facile methods to detect and discriminate chiral compounds are highly desirable to accelerate advances in synthetic and biological chemistry. The challenges in analysis stem from the obvious fact that enantiomeric molecules have the same physical properties. Chemosensory systems designed for chirality determination have attracted increasing attention as a result of the low cost and simplicity as alternatives to traditionally employed X-ray crystallography and chiral chromatography. The $Pd^{+2}$ Pincer platform can employ chiral ligands for the identification of chiral organic molecules, including chiral amine, nitrile, N-heterocycle, and other molecules that is capable of coordinating to palladium to afford static complex on NMR time scale. FIG. 118 demonstrates the robust nature of this platform to simultaneously identify multiple chiral amines. As a result of the chiral pocket defined by ligand, pairs of enantiomers produce diastereoisomeric Pd complexes and distinct $^{19}F$ NMR signals.

Figure 119:
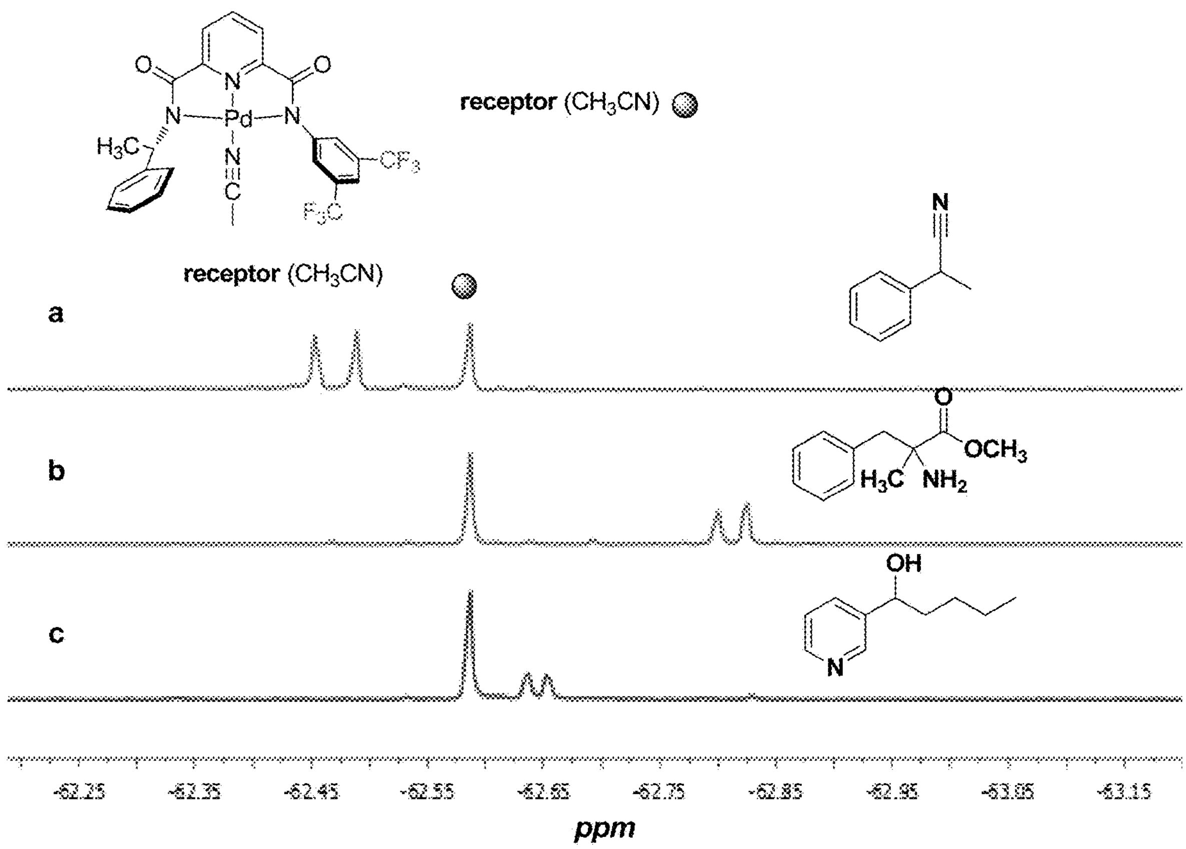
FIGS. 119(*a*)-(*c*) show differentiation of chiral nitrile, sterically hindered amino ester, and N-heterocycles with palladium pincer complex.

FIG. 119 further demonstrates the applicability of this platform to differentiate other chiral analytes. In this experiment, chiral nitriles, amino esters, and N-heterocycles are successful differentiation using $^{19}F$ NMR fingerprints, which indicates the scope of analyte can be extended to any chiral analytes that binds to Pd complex.

Figure 120:
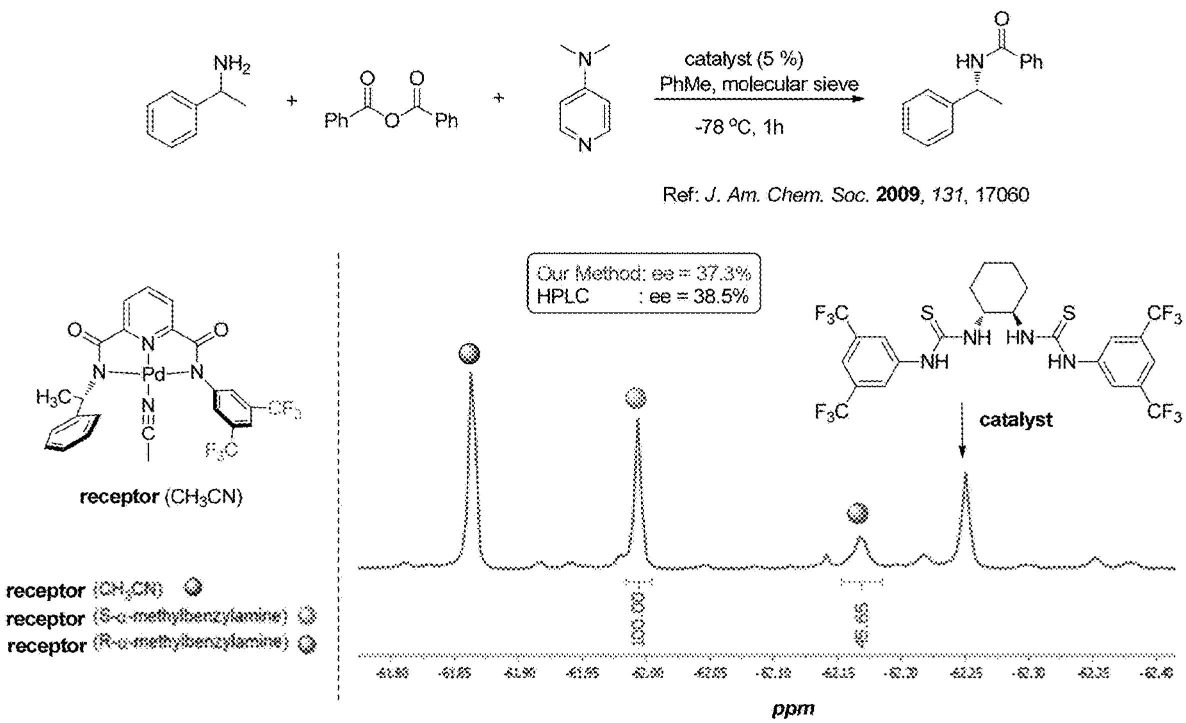
FIG. 120 shows $^{19}F$ NMR spectra (128 scans) of a mixture of receptor ($CH_3CN$) (ca. 1.5 mg), reaction mixture (0.3 mL), and $CDCl_3$ (0.2 mL).

FIG. 120 is an example of direct determination of enantiomeric excess value using complex reaction mixture. The work of Siedel and coworkers on catalytic kinetic resolution of chiral amines is selected as an example to demonstrate the ability to analyze crude reaction mixture with the method described here. C. K. De, E. G. Klauber and D. Seidel, *J. Am. Chem. Soc.,* 2009, 131, 17060-17061, which is incorporated by reference in its entirety. The reaction was carried out following the procedure reported there.

A mixture of DMAP (6.1 mg, 0.05 mmol), benzoic anhydride (23 mg, 0.125 mg) and 4 Å MS (100 mg) in toluene was stirred at room temperature for 15 min. The reaction mixture was cooled to −78° C. and a solution of catalyst (33 mg, 0.05 mmol) in 2 mL of toluene was added. After 15 min, racemic α-methylbenzylamine (30.3 mg, 0.25 mmol) was added. The reaction mixture was stirred at −78° C. for 1 h and was allowed to warm to room temperature over 2 h. 0.3 mL of this reaction mixture was mixed with 1.5 mg (ca.) of complex 2b ($CH_3CN$) in 2 mL of $CDCl_3$ and the $^{19}F$ NMR spectra was recorded. The enantiomeric excess determined by the method described here is 37.3% which is in good agreement with the result determined by chiral HPLC (38.5%).

Figure 121:
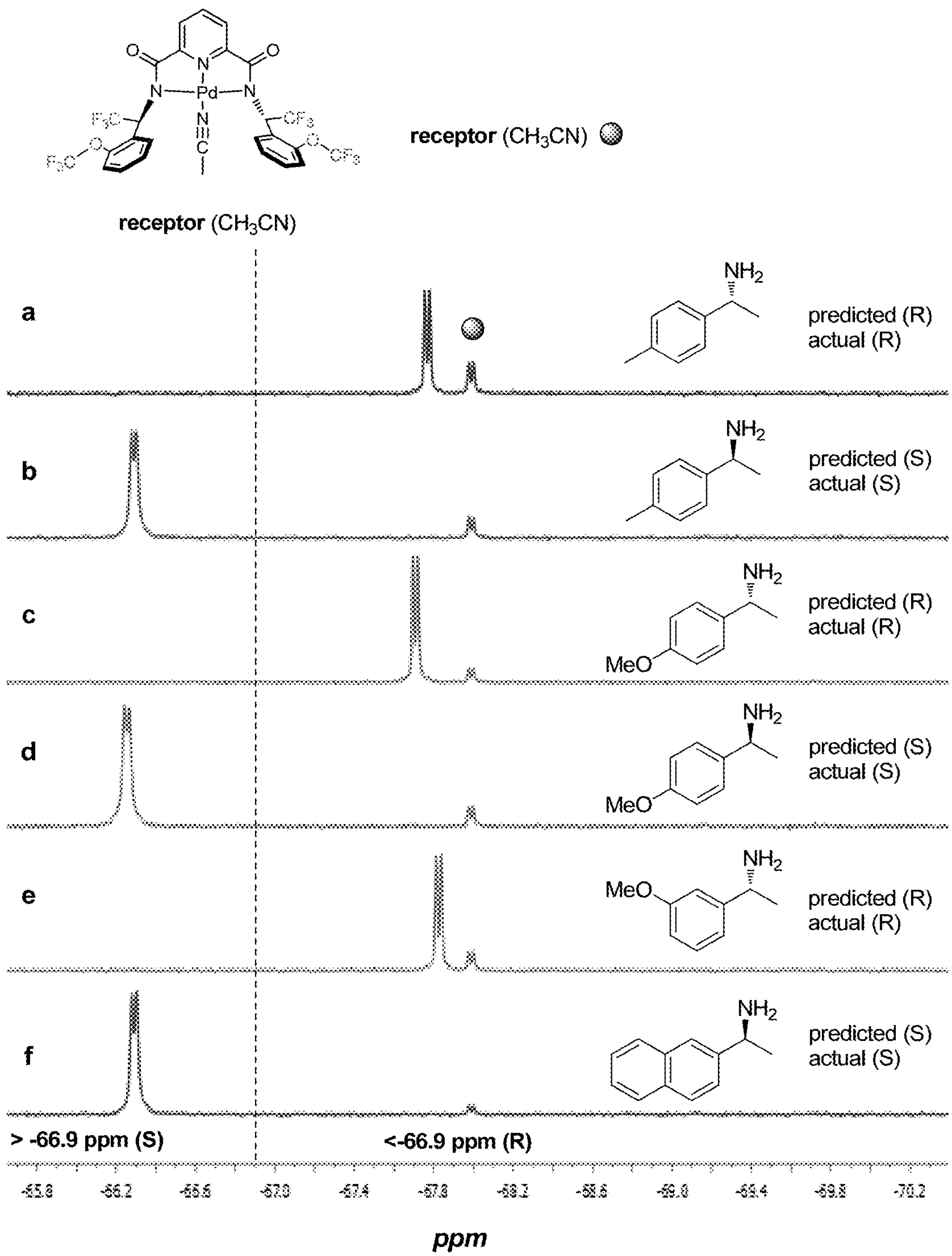
FIG. 121 shows $^{19}F$ NMR spectra (64 scans each) of a mixture of receptor ($CH_3CN$) (1.0 mM) in $CDCl_3$ with chiral amine (ca. 1.5 mM).

This $^{19}F$ NMR fingerprint approach is also capable of predicting the absolute configuration of chiral amines. The prediction is based on empirical trend found in the experiments of structurally similar analyte with known configuration. For instance, α-chiral amines of S configuration always appear at a lower field as compared to those of R configuration. Based on this trend, the configuration of amines (FIG. 121) can be made. Alternatively, α-chiral amines of S configuration generally appear at >−66.9 ppm, while R α-chiral amines has a chemical shift of <−66.9 ppm. The configuration of amines (FIGS. 121, *e* and *f*) were assigned based on the trend found in chemical shift.

Figure 122:
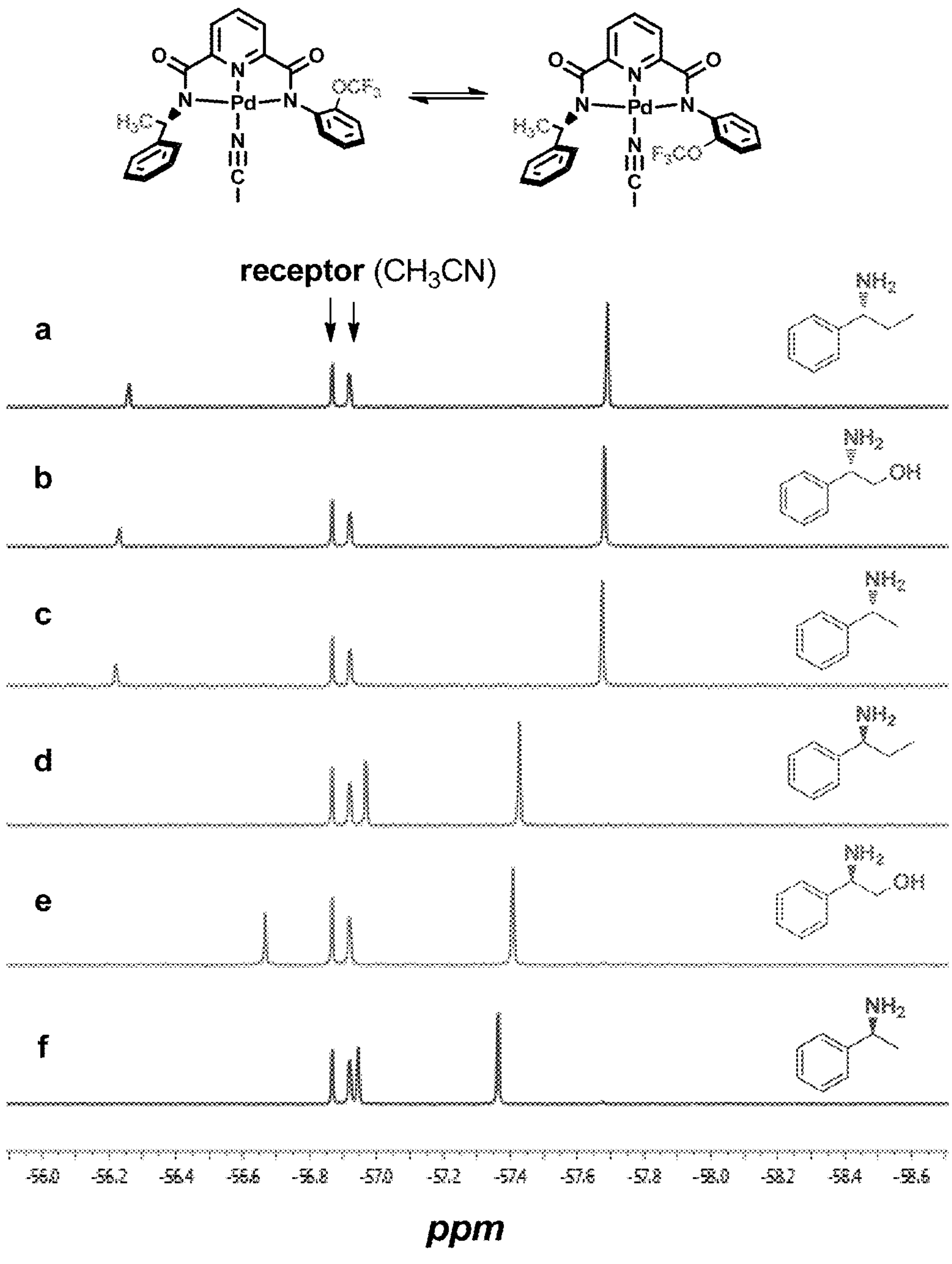
FIG. 122 shows pattern-based chirality prediction of chiral amine.

The receptor shown in FIG. 122 undergo an equilibrium between two different conformers. The interconversion is slow on NMR timescale, so two distinct $^{19}F$ NMR signals appear that correspond these two conformers and each conformer will produce a new $^{19}F$ NMR signal when bound to an analyte. As shown in FIG. 122, the analyte with —$NH_2$ group pointing into the plane give a uniform pattern, while the patterns produced by their enantiomers are distinct. The prediction of absolution configuration can thus be performed based on different patterns.

Figure 123:
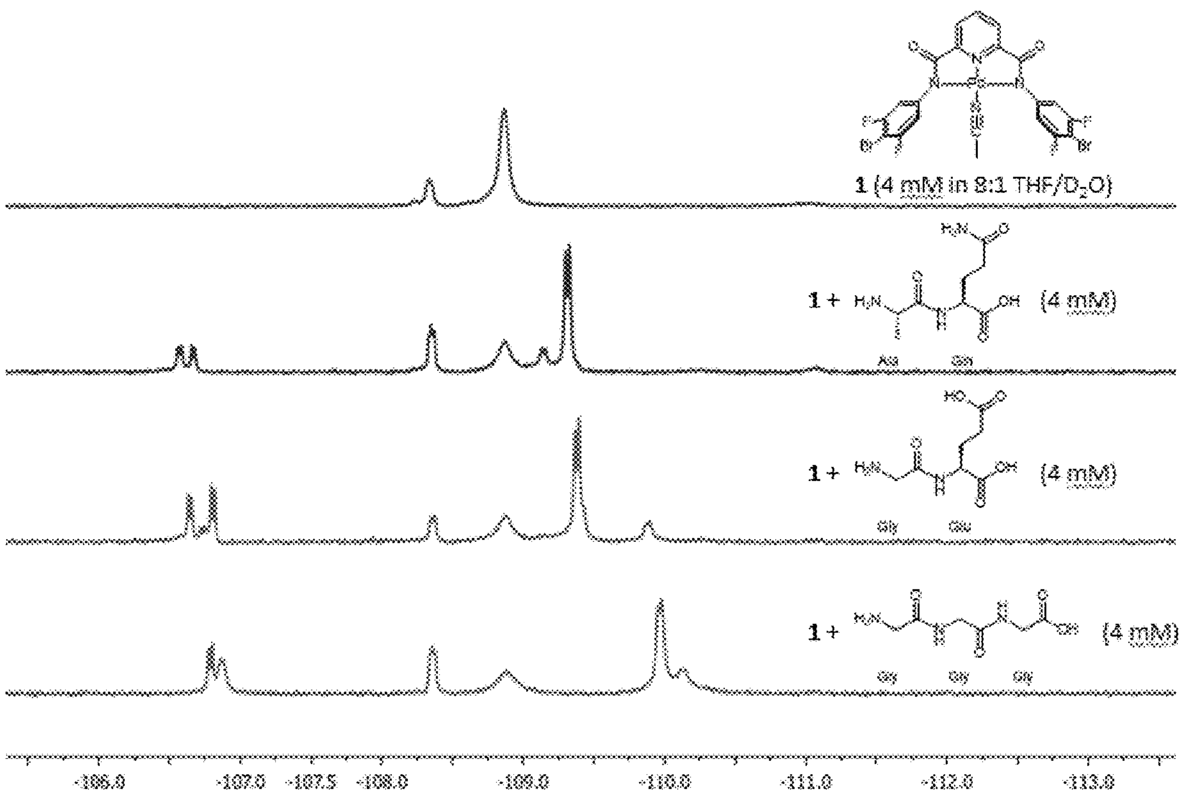
FIG. 123 shows $^{19}F$ spectra (64 scans) of 1 (4 mM in 8:1 $THF/D_2O$) and several di- and tri-peptide analytes (4 mM).

Another application of the $Pd2^+$ platform is to recognize the sequence of the peptide. In this experiment, various peptides were added to the solution of receptor 1, and the $^{19}F$ NMR spectrum was recorded. FIG. 123 demonstrates this method provide information of sufficient dimension to precisely identify peptide of various length and sequences.

Figure 124:
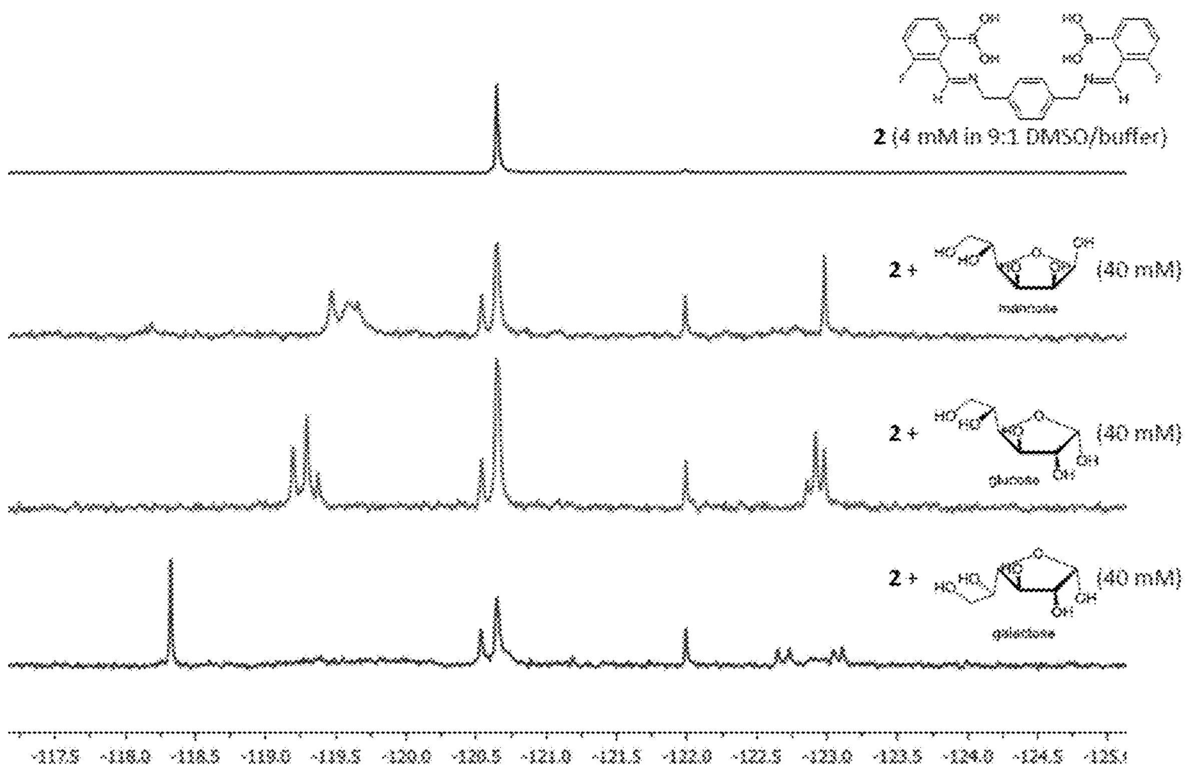
FIG. 124 shows $^1H$-decoupled $^{19}F$ spectra (64 scans) of 2 (4 mM in 9:1 DMSO/buffer; buffer is a 50 mM phosphate buffer with pH 7.2) and several carbohydrate analytes (40 mM).

To expand fingerprinting to both simple carbohydrates and carbohydrates of high complexity, $^{19}F$ NMR carbohydrate fingerprinting agents based upon boronic acids can be used to selectively detect carbohydrates. FIG. 124 demonstrates the use of this method to identify and differentiate the sugars mannose, glucose, and galactose, which differ only in the configuration of several chiral centers. Each analyte yields a unique fingerprint of $^{19}F$ signals corresponding to the various ways in which the boronic acid moiety can bind to form boronate esters with the 1,2- and 1,3-diol motifs found in the analyte, allowing structurally similar carbohydrates to be distinguished from each other.

Figure 125:
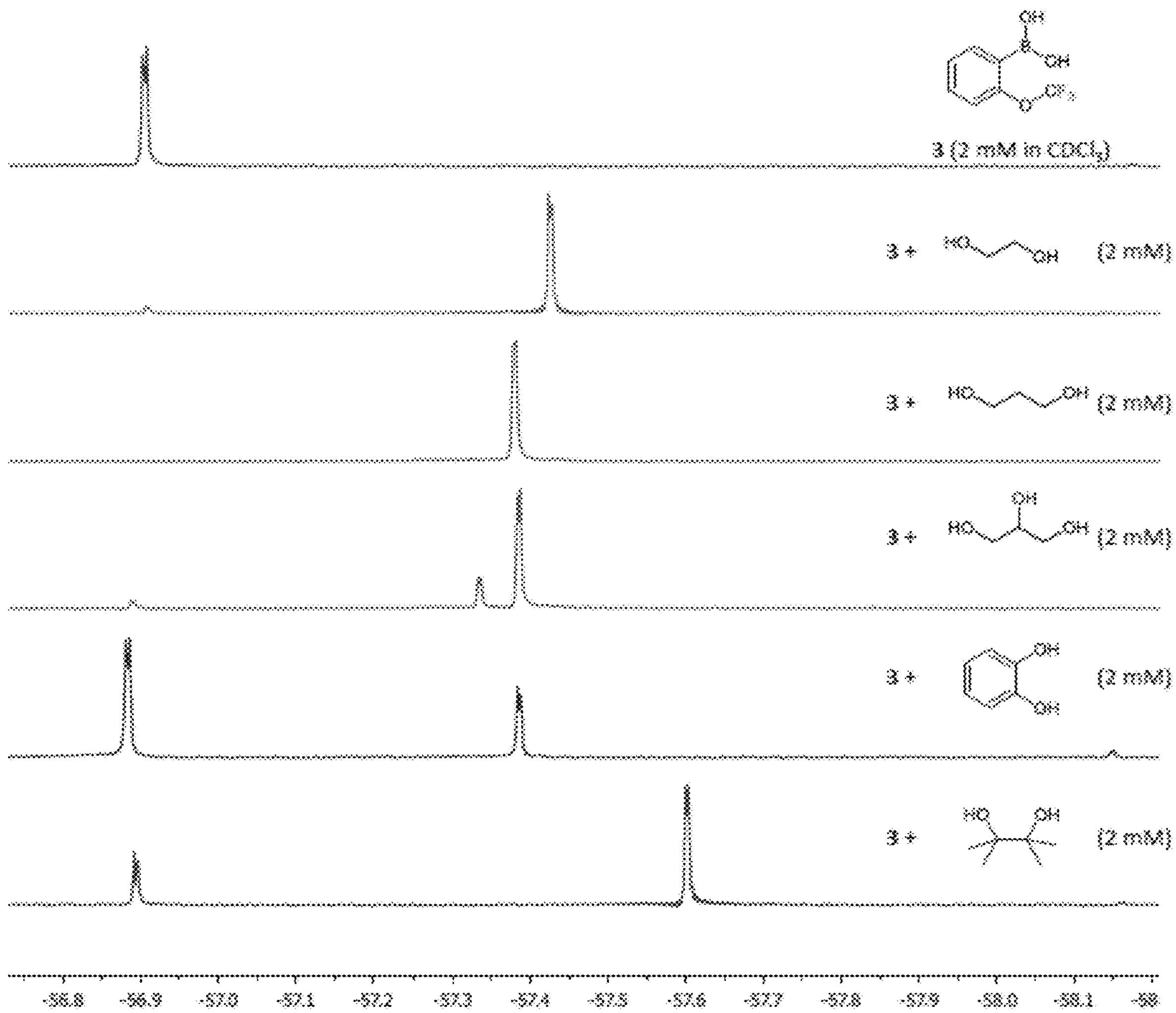
FIG. 125 shows $^{19}F$ spectra (64 scans) of a mixture of 3 (2 mM in $CDCl_3$) and each of several 1,2- and 1,3-diol analytes (2 mM).

Sensors based on boronic acids can also be used for the $^{19}F$ NMR sensing of 1,2- and 1,3-diols. FIG. 125 demonstrates the sensing of various simple 1,2- and 1,3-diols using a sensor bearing a boronic acid moiety. Glycerol gives rise to two $^{19}F$ signals, which correspond to the two ways in which it can bind with the sensor (as a 1,2-diol or a 1,3-diol).

Figure 126:
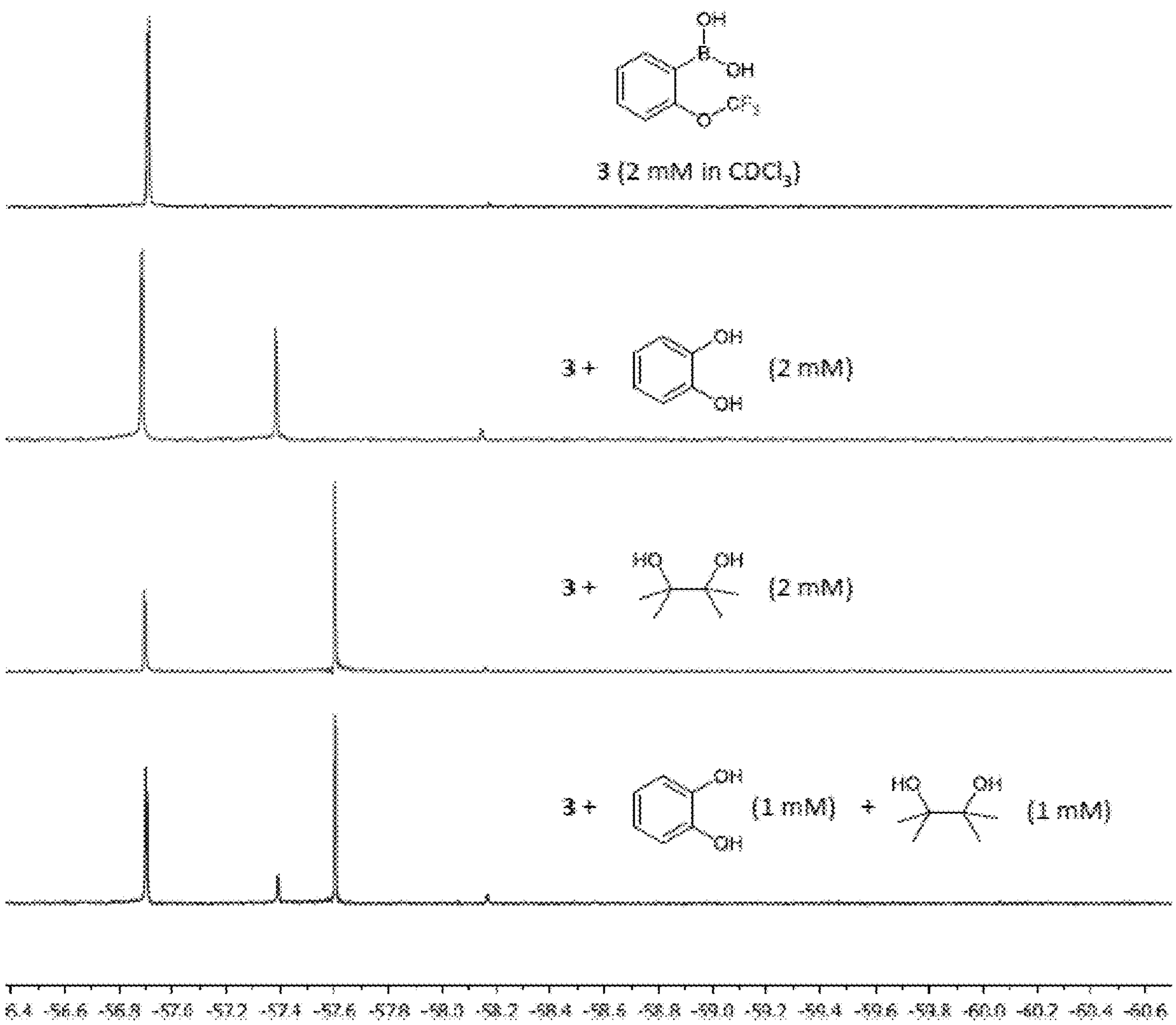
FIG. 126 shows $^{19}F$ spectra (64 scans) of a mixture of 3 (2 mM in $CDCl_3$) and catechol (2 mM), pinacol (2 mM), and a 1:1 mixture of catechol and pinacol (1 mM each), respectively.
Figure 127:
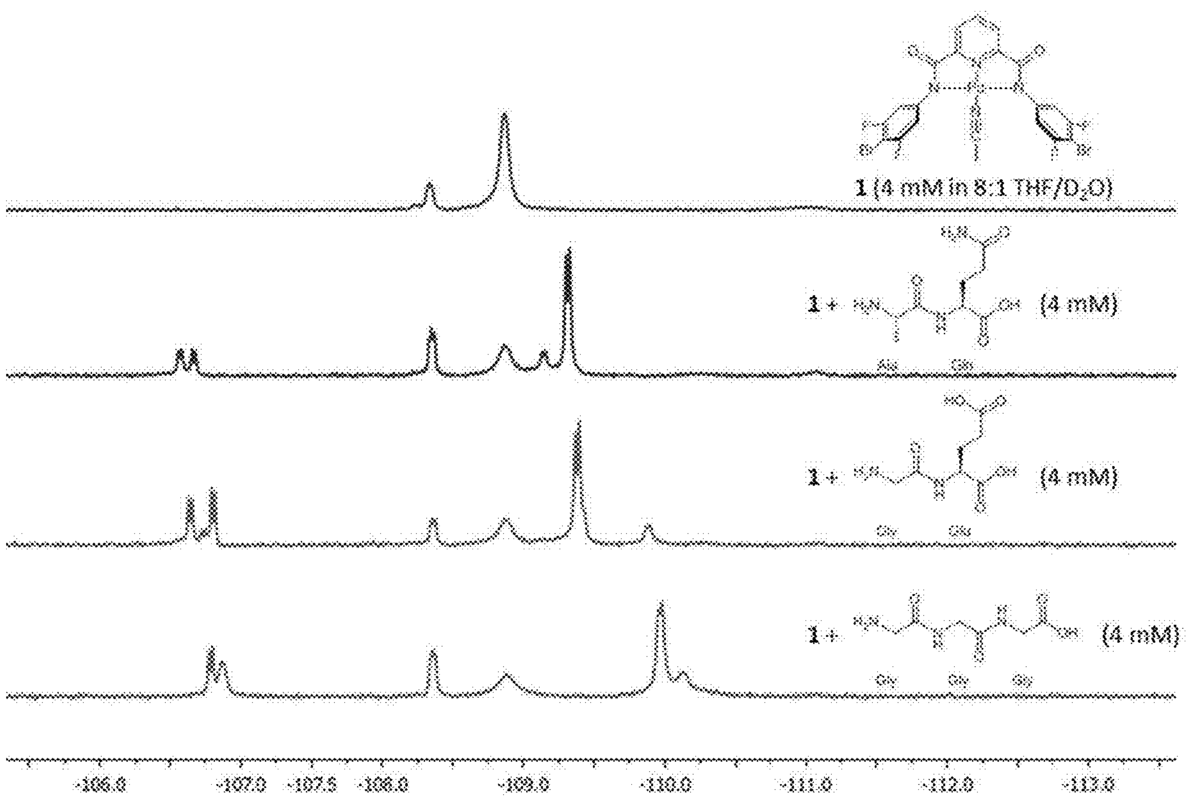
FIG. 127 shows $^{19}F$ spectra (64 scans) of 1 (4 mM in 8:1 $THF/D_2O$) and several di- and tri-peptide analytes (4 mM).
Figure 128:
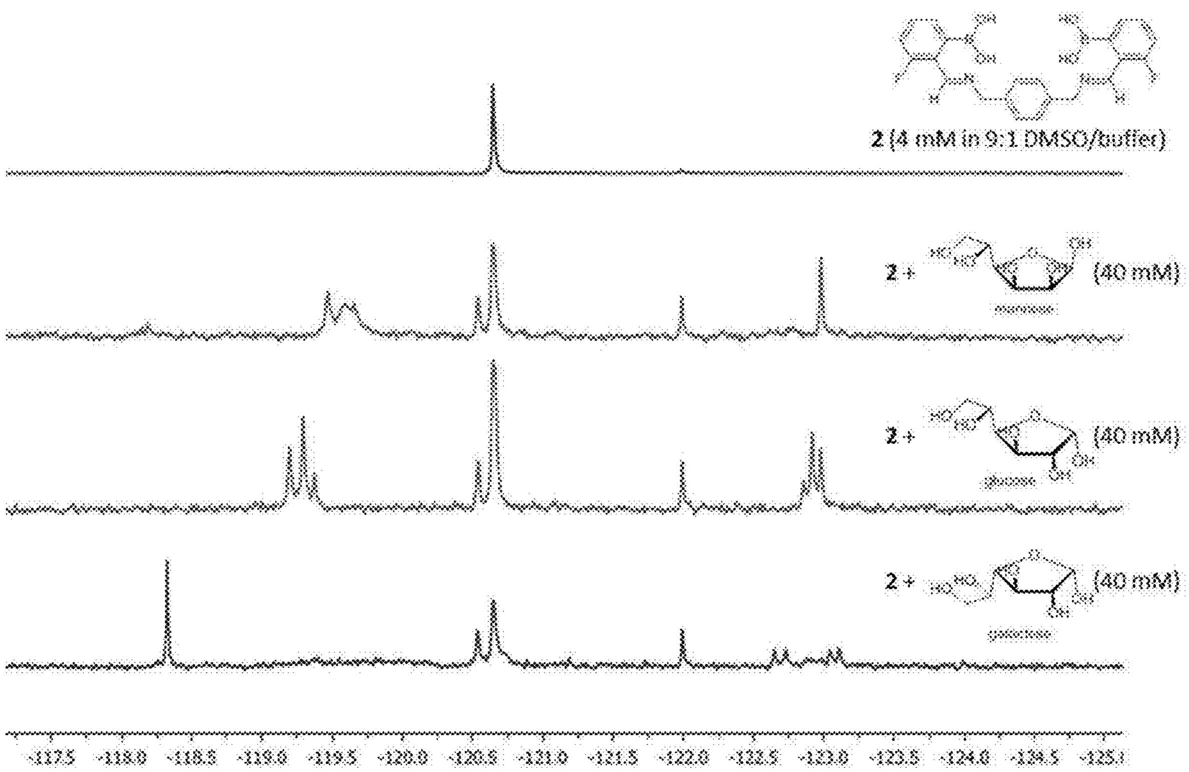
FIG. 128 shows $^1H$-decoupled $^{19}F$ spectra (64 scans) of 2 (4 mM in 9:1 DMSO/buffer; buffer is a 50 mM phosphate buffer with pH 7.2) and several carbohydrate analytes (40 mM).
Figure 129:
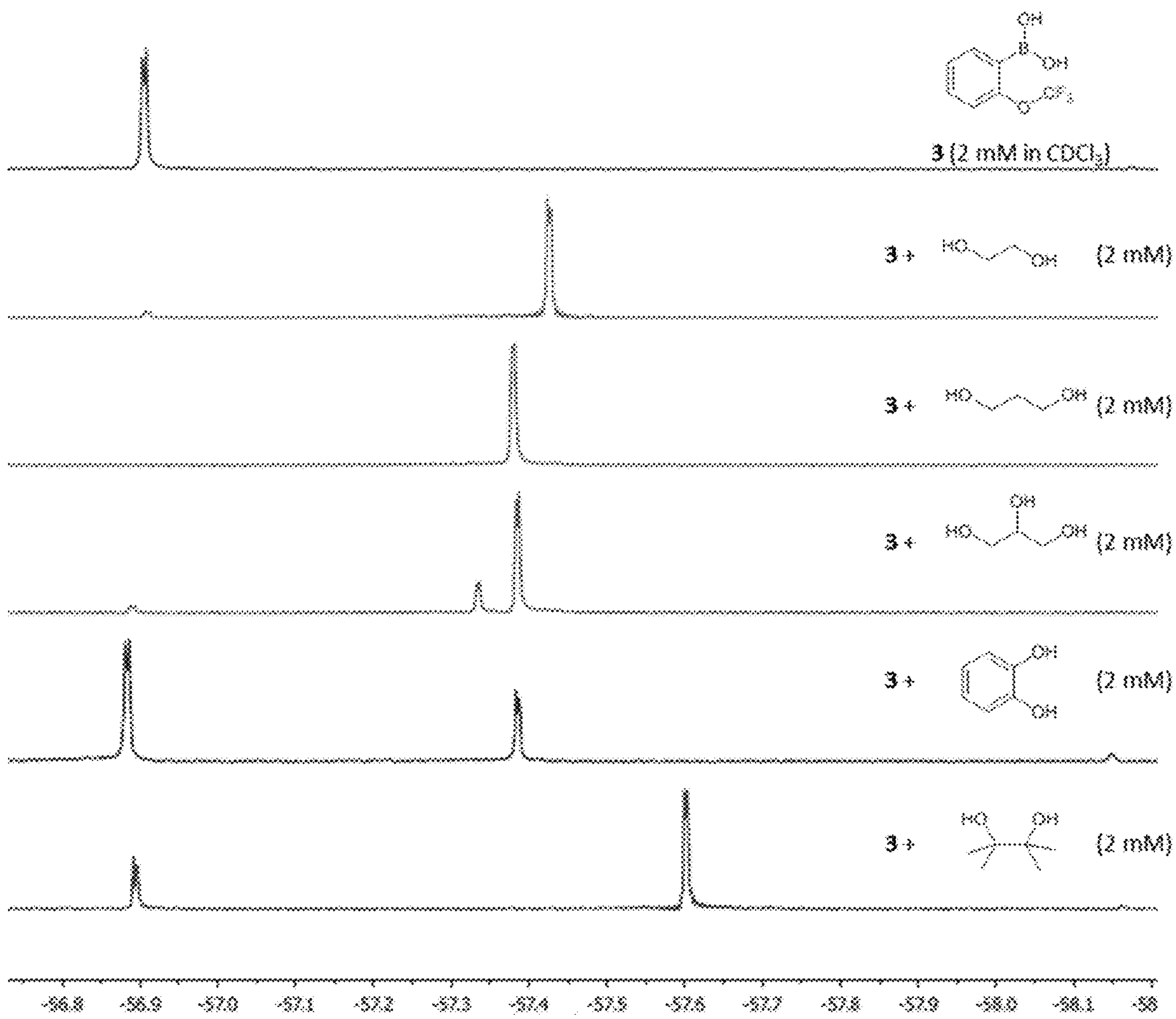
FIG. 129 shows $^{19}F$ spectra (64 scans) of a mixture of 3 (2 mM in $CDCl_3$) and each of several 1,2- and 1,3-diol analytes (2 mM).
Figure 130:
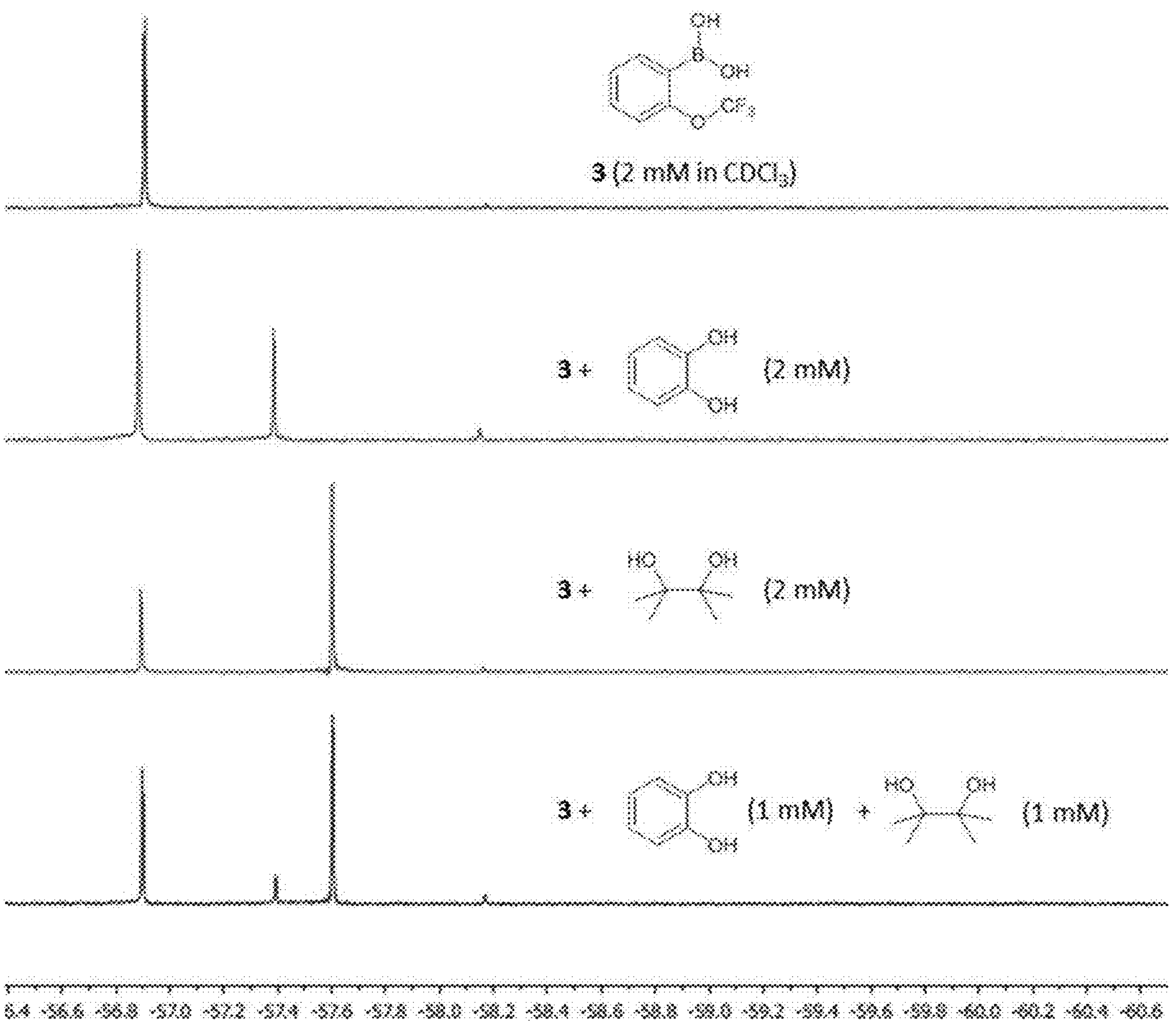
FIG. 130 shows $^{19}F$ spectra (64 scans) of a mixture of 3 (2 mM in $CDCl_3$) and catechol (2 mM), pinacol (2 mM), and a 1:1 mixture of catechol and pinacol (1 mM each), respectively.
Figure 131:
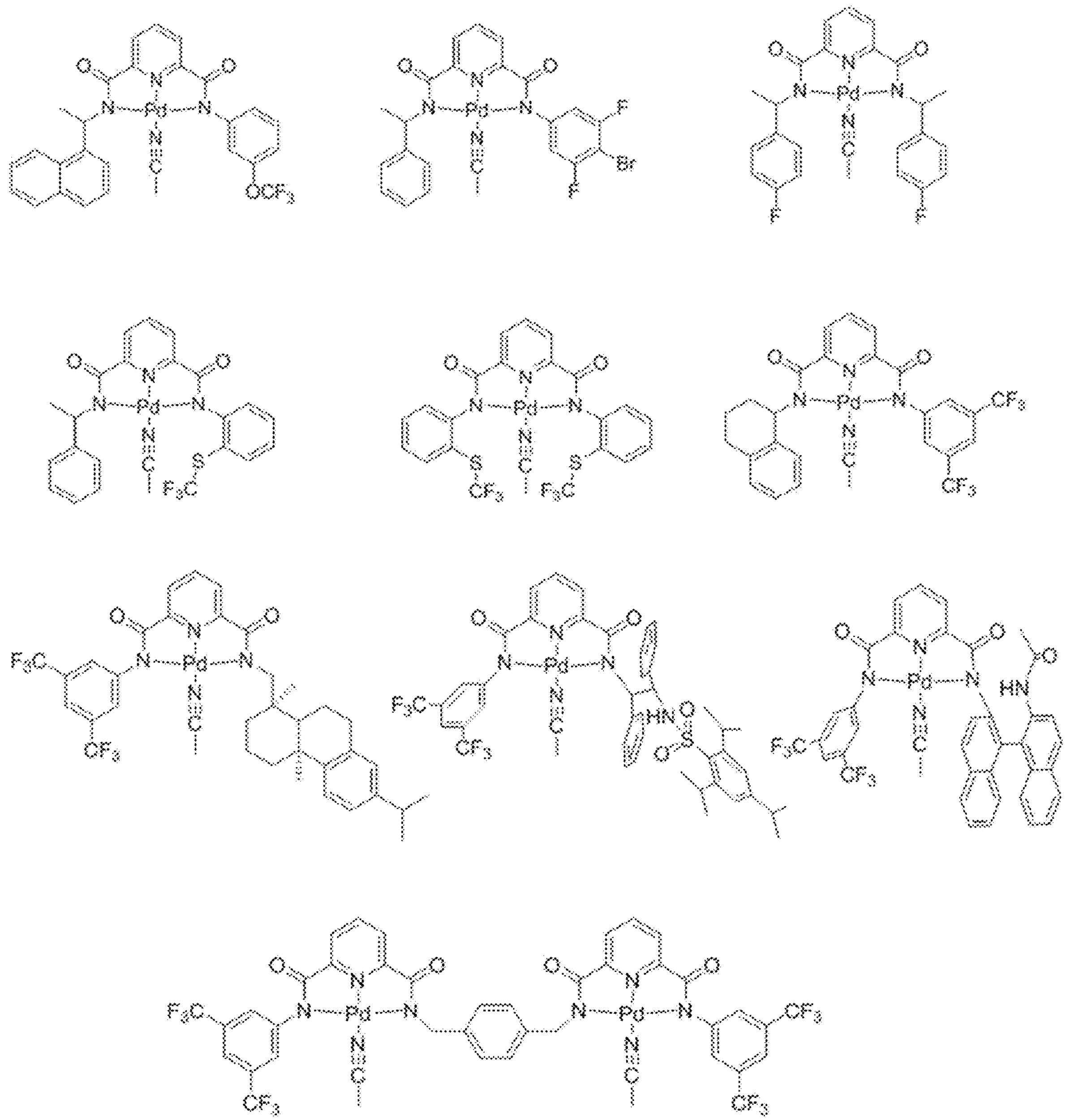
FIG. 131 shows diverse palladium sensors.

FIG. 126 shows the sensing of a mixture of two diol analytes. The mixture exhibits two $^{19}F$ signals at the same chemical shifts as those of its two components, allowing the components of the mixture to be identified.

Material:

All reactions were carried out under argon using standard Schlenk techniques unless otherwise noted. All solvents were of ACS reagent grade or better unless otherwise noted. Anhydrous acetonitrile ($CH_3CN$) was obtained from Alfa Aesar. Silica gel (40 μm) was purchased from SiliCycle Inc. All reagent grade materials were purchased from Alfa Aesar, Sigma-Aldrich, Matrix Scientific, or Strem chemicals and used without further purification.

NMR Spectroscopy:

$^{1}H$, $^{19}F$, and $^{13}C$ NMR spectra for all compounds were acquired in $CDCl_3$ on a Bruker Avance Spectrometer operating at (400 MHz 376 MHz, and 100 MHz, respectively). Chemical shifts (δ) are reported in parts per million (ppm) and referenced with TMS for $^{1}H$ NMR and $CFCl_3$ for $^{19}F$ NMR.

General Procedure for NMR Experiment:

For FIG. 110, at ambient temperature, complexes 1-5 (1.01 M in 495 μL of $CDCl_3$) was mixed with different analytes different analytes (variable concentrations in 5 μL $CDCl_3$). For FIG. 111, at ambient temperature, complex 6 (2.04 M in 490 μL of $CDCl_3$) was mixed with different analytes (variable concentrations in 10 μL $CDCl_3$). The NMR spectra were recorded on a Bruker Avance Spectrometer with TOPSPIN using autolocking and auto shimming (typically 64 scans).

The obtained NMR data were processed using MestReNova. After phase correction, the spectra were stacked (stacked angle=0).

Mass Spectrometry:

High-resolution mass spectra (HRMS) were obtained at the MIT Department of Chemistry Instrumentation Facility employing electrospray (ESI) as the ionization technique.

Figure 132:
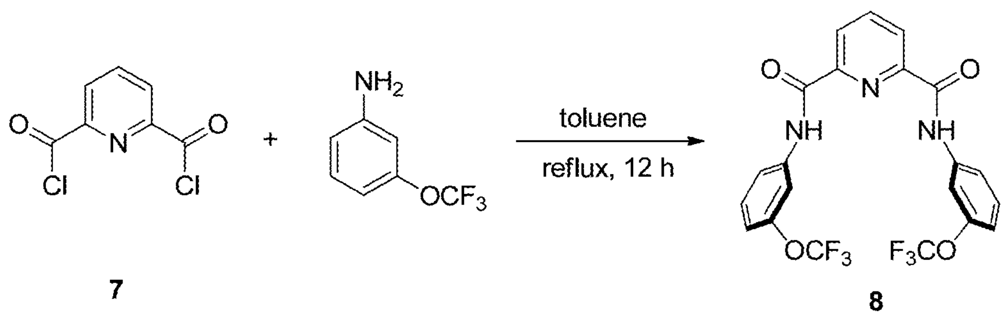
FIG. 132 shows preparation of various fluorinated pincer ligands (8-13).

General Procedure for the Preparation of Various Fluorinated Pincer Ligands (8-13), See FIG. 132.

Under Ar atmosphere, a solution of 2,6-Pyridinedicarbonyl dichloride (500 mg, 2.45 mmol, 1.0 equiv) and 3-(Trifluoromethoxy)aniline (868 mg, 4.9 mmol, 2.0 equiv) in toluene (30 mL) was refluxed for 12 h before the reaction was cooled to room temperature. The white precipitate was filtered off and washed with toluene (20 mL) and hexane (20 mL) and then dried under air to give the product 8 as a white solid (1.05 g, 2.16 mmol, Yield: 88%). M.P.: 229-231° C. IR: 3290, 1682, 1671, 1609, 1560, 1433, 1326, 1246, 1201, 1184, 1163, 1152, 1074, 1002, 857, 785, 708, 689, 673 $cm^{-1}$. $^{1}H$ NMR (400 MHz, Acetone) δ 10.74 (s, 2H), 8.56-8.48 (m, 2H), 8.38 (dd, J=8.3, 7.2 Hz, 1H), 8.17 (s, 2H), 8.02-7.93 (m, 2H), 7.57 (t, J=8.2 Hz, 2H), 7.20-7.11 (m, 2H). $^{19}F$ NMR (376 MHz, Acetone) δ −58.41 (s, 6F). $^{13}C$ NMR (101 MHz, Acetone) δ 161.69, 149.26, 148.97, 140.03, 140.00, 130.27, 125.62, 120.61 (q, J=255.5 Hz), 118.93, 116.22, 112.79. HRMS (ESI): calc for $C_{21}H_{14}F_6N_3O_4$ $[M+H]^+$ 486.0883. found 486.0862.

Figure 133:
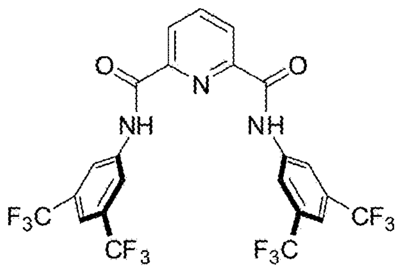
FIG. 133 shows structures of complexes.
Figure 133:
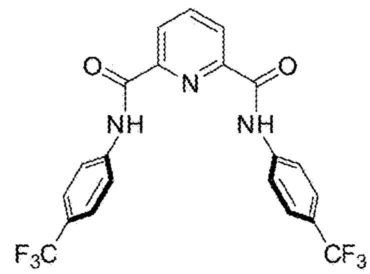
Figure 133:
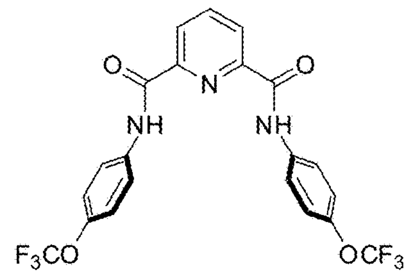
Figure 133:
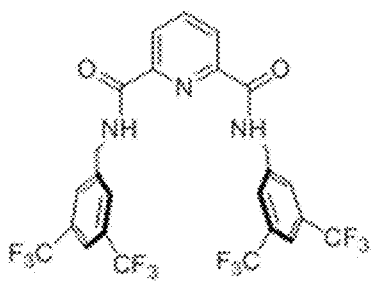
Figure 133:
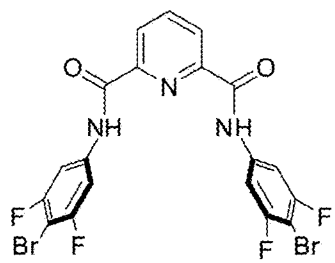

Complex 9 of FIG. 133: White solid. Yield: 92%. M.P.: 335-337° C. (decomposed). IR: 3281, 1686, 1574, 1475, 1438, 1384, 1309, 1277, 1223, 1175, 1141, 1118, 1110, 1068, 1002, 936, 888, 839, 713, 701, 691, 682 $cm^{-1}$. $^{1}H$ NMR (400 MHz, Acetone) δ 11.16 (s, 2H), 8.74 (s, 4H), 8.58 (d, J=7.8 Hz, 2H), 8.49-8.43 (m, 1H), 7.85 (s, 2H). $^{19}F$ NMR (376 MHz, Acetone) δ −63.59 (s, 12F). $^{13}C$ NMR (101 MHz, THF) δ 161.83, 148.65, 140.17, 140.06, 132.69-131.15 (m), 126.16, 123.51 (q, J=272.4 Hz), 120.30, 117.25. HRMS (ESI): calc for $C_{23}H_{15}F_{12}N_4O_2$ $[M+NH_4]^+$ 607.0998. found 607.0979.

Complex 10 of FIG. 133: White solid. Yield: 92%. M.P.: 298-300° C. IR: 3322, 1694, 1677, 1605, 1553, 1527, 1415, 1320, 1190, 1175, 1105, 1064, 1016, 840, 827, 753, 655 $cm^{-1}$. $^{1}H$ NMR (400 MHz, Acetone) δ 10.46 (s, 2H), 8.61 (d, J=7.8 Hz, 2H), 8.38 (dd, J=8.1, 7.5 Hz, 1H), 8.27 (d, J=8.5 Hz, 4H), 7.89 (d, J=8.5 Hz, 4H). $^{19}F$ NMR (376 MHz, Acetone) δ −62.43 (s, 6F). $^{13}C$ NMR (101 MHz, Acetone) δ 161.80, 148.96, 141.83, 140.01, 125.97 (q, J=3.8 Hz), 125.76, 125.22 (q, J=32.4 Hz), 124.53 (q, J=270.6 Hz), 120.28. HRMS (ESI): calc for $C_{21}H_{14}F_6N_3O_2$ $[M+H]^+$ 454.0985. found 454.0967.

Complex 11 of FIG. 133: White solid. Yield: 83%. M.P.: 236-238° C. IR: 3379, 1703, 1692, 1549, 1527, 1506, 1450, 163, 1216, 1197, 1153, 1109, 1072, 1004, 837, 743, 669, 652 $cm^{-1}$. $^{1}H$ NMR (400 MHz, $CDCl_3$) δ 9.53 (s, 2H), 8.51 (d, J=7.8 Hz, 2H), 8.17 (t, J=7.8 Hz, 1H), 7.87-7.76 (m, 4H), 7.29 (d, J=6.9 Hz, 4H). $^{19}F$ NMR (376 MHz, $CDCl_3$) δ −58.08 (s, 6F). $^{13}C$ NMR (101 MHz, Acetone) δ 161.51, 149.08, 144.99, 139.88, 137.47, 125.47, 121.79, 121.54, 120.62 (q, J=254.9 Hz). HRMS (ESI): calc for $C_{21}H_{14}F_6N_3O_4$ $[M+H]^+$ 486.0883. found 486.0866.

The compound 12 of FIG. 133 was purified by silica gel chromatography using hexane/DCM as the eluent. White solid. Yield: 65%. M.P: 65-67° C. IR: 3327, 1661, 1573, 1382, 1354, 1277, 1169, 1128, 894, 846, 706, 682 $cm^{-1}$. $^{1}H$ NMR (400 MHz, Acetone) δ 9.44 (s, 2H), 8.43-8.34 (m, 2H), 8.33-8.23 (m, 1H), 8.03 (s, 4H), 7.95 (s, 2H), 4.84 (d, J=6.4 Hz, 4H), 2.88 (s, 6H). $^{19}F$ NMR (376 MHz, Acetone) δ −63.37 (s, 12F). $^{13}C$ NMR (101 MHz, Acetone) δ 163.91, 148.84, 142.99, 139.48, 131.21 (q, J=33.1 Hz), 127.97 (d, J=3.1 Hz), 124.90, 123.53 (q, J=270.3 Hz), 121.26-120.62 (m), 42.00. HRMS (ESI): calc for $C_{25}H_{16}F_{12}N_3O_2$ $[M+H]^+$ 618.1045. found 618.1055.

Complex 13 of FIG. 133: White solid. Yield: 82%. M.P.: 272-275° C. IR: 3297, 1700, 1689, 1664, 1618, 1604, 1524, 1482, 1450, 1418, 1357, 1312, 1226, 1169, 1062, 1034, 997, 841, 753, 717, 676, 636 $cm^{-1}$. $^{1}H$ NMR (400 MHz, Acetone) δ 10.86 (s, 2H), 8.52 (d, J=8.0 Hz, 2H), 8.40 (dd, J=8.3, 7.2 Hz, 1H), 7.92 (d, J=8.9 Hz, 4H). $^{19}F$ NMR (376 MHz, Acetone) δ −106.89 (d, J=9.6 Hz, 4F). $^{13}C$ NMR (101 MHz, Pyr) δ 164.02, 161.25 (dd, J=244.4, 6.4 Hz), 150.64, 141.16-141.10, 141.06 (t, J=12.8 Hz), 127.75, 106.33 (dd, J=27.8, 2.7 Hz), 93.51 (t, J=25.0 Hz). HRMS (ESI): calc for $C_{19}H_{10}Br_2F_4N_3O_2$ $[M+H]^+$ 547.9058. found 547.9076.

Figure 134:
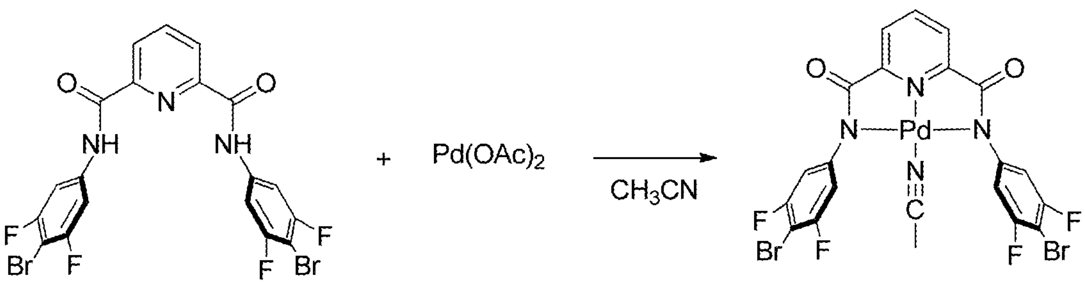
FIG. 134 shows procedure for preparing palladium pincer complexes.

General Procedure for the Preparation of Various Palladium Pincer Complexes (1-6), See FIG. 134.

Ligand 13 (200 mg, 0.44 mmol, 1.0 equiv) was suspended in a solution of $Pd(OAc)_2$ (103 mg, 0.46 mmol, 1.05 equiv) in acetonitrile (10 mL). The resulting mixture was stirred at 35° C. for 12 h, and filtered through 0.02 μM syringe filter ($CH_2Cl_2$ was added before the filtration if product is not soluble in $CH_3CN$). The filtrate was concentrated to give the crude product which was transferred to a filter funnel and washed extensively with water and hexane. The yellow powder was then dried under air to give product 6 as a yellow solid (264 mg, 0.38 mmol, Yield: 87%). IR: 1634, 1599, 1541, 1466, 1423, 1370, 1329, 1269, 1205, 1122, 1028, 1000, 840, 802, 758, 688, 675 $cm^{-1}$. $^{1}H$ NMR (400 MHz, $CD_3CN$) δ 8.29 (t, J=7.8 Hz, 1H), 7.86 (d, J=7.8 Hz, 2H), 7.15-7.06 (m, 4H). $^{19}F$ NMR (376 MHz, $CD_3CN$) δ −109.54 (d, J=9.8 Hz, 4F). $^{13}C$ NMR (101 MHz, $CDCl_3$/$CD_3CN$) δ 168.62, 159.24 (dd, J=246.5, 6.1 Hz), 151.66, 147.58 (d, J=11.3 Hz), 141.95, 126.61, 110.50 (d, J=26.9 Hz), 92.81 (t, J=24.8 Hz). HRMS (ESI): calc for $C_{21}H_{11}Br_2F_4N_4O_2Pd$ $[M+H]^+$ 692.8210. found 692.8201. For the $^{13}C$ NMR, $CD_3CN$ was added to prevent the formation of oligomer. The signals of $CH_3CN$ for $^{1}H$ NMR and $^{13}C$ NMR were omitted because the bound $CH_3CN$ was replaced by $CD_3CN$.

Figure 135:
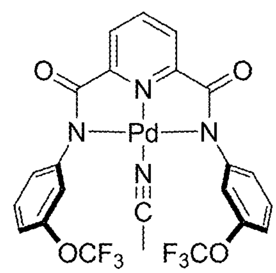
FIG. 135 shows structures of complexes.
Figure 135:
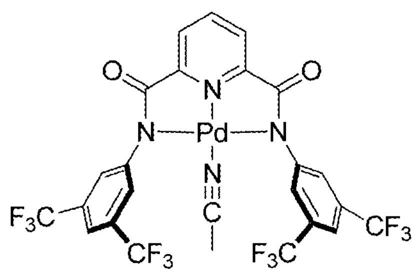
Figure 135:
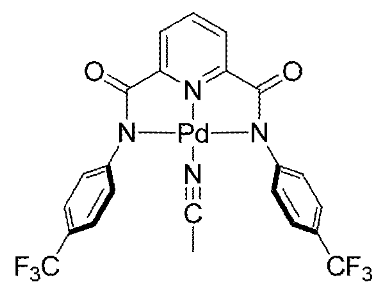
Figure 135:
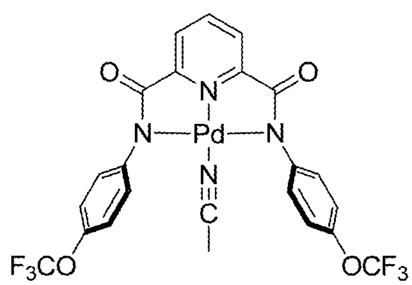
Figure 135:
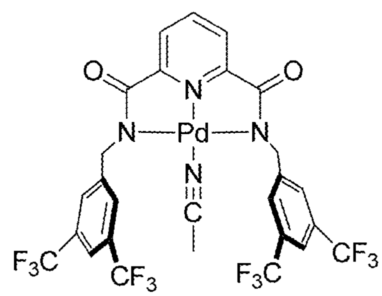
Figure 136:
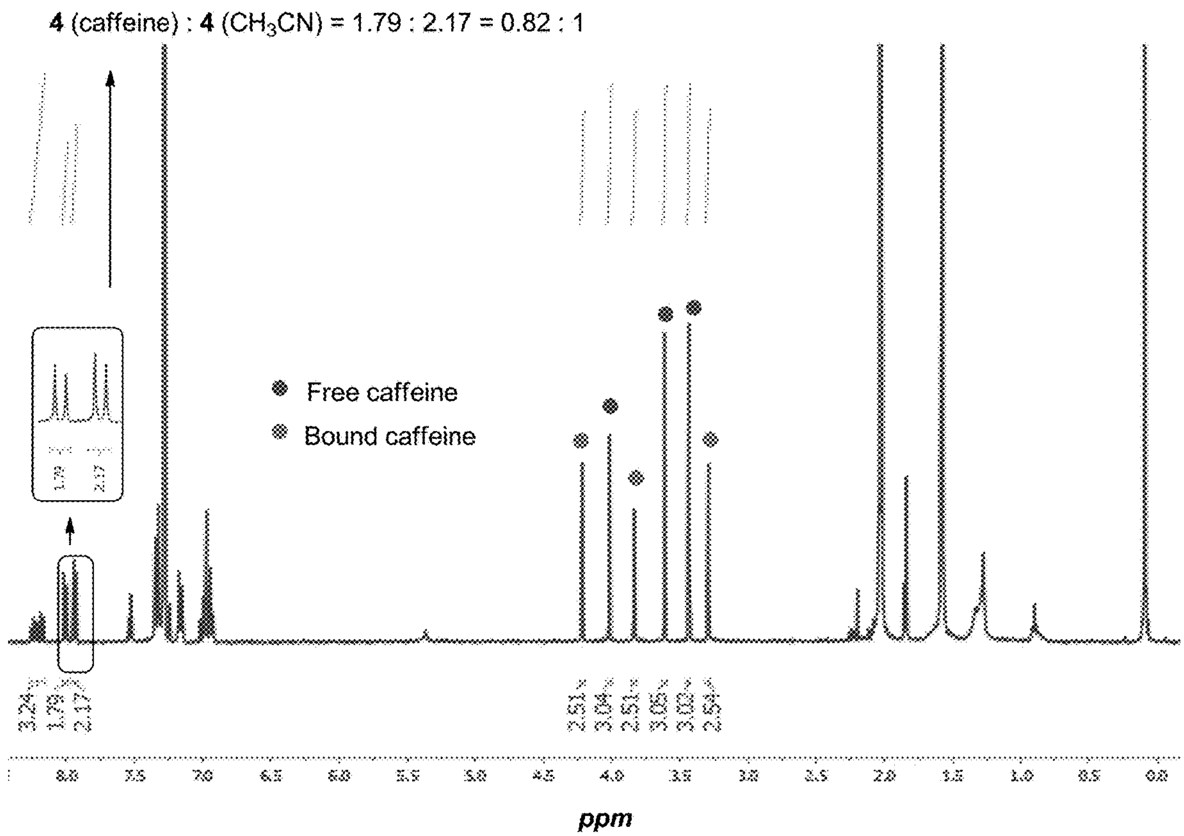
FIG. 136 shows $^1H$ NMR experiment (32 scans) with complex 4 (1.0 mM), $CH_3CN$ (15 mM), and caffeine (1.0 mM).
Figure 137:
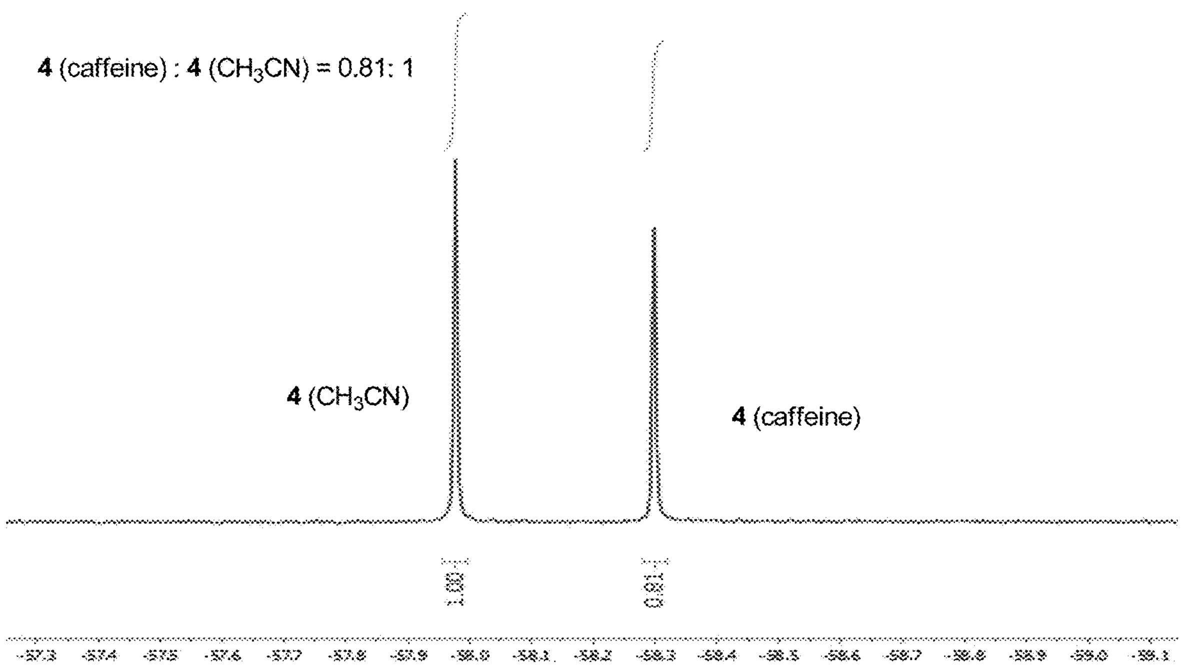
FIG. 137 shows $^{19}F$ NMR experiment (32 scans) with complex 4 (1.0 mM), $CH_3CN$ (15 mM), and caffeine (1.0 mM).
Figure 138:
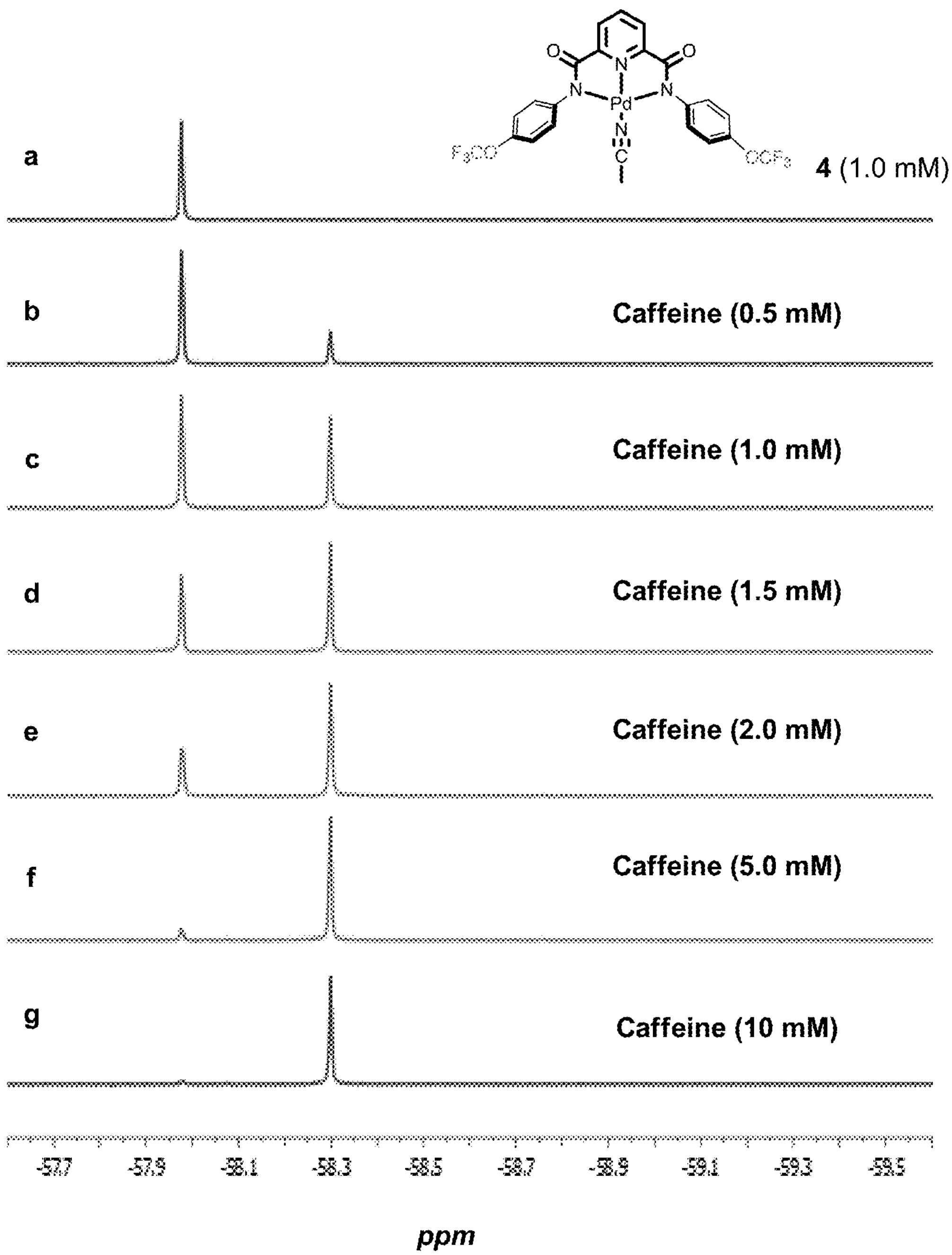
FIG. 138 shows $^{19}F$ NMR titration experiment (32 scans) with complex 4 (1.0 mM), $CH_3CN$ (15.0 mM) and caffeine at various concentrations (0.5-10 mM).
Figure 139:
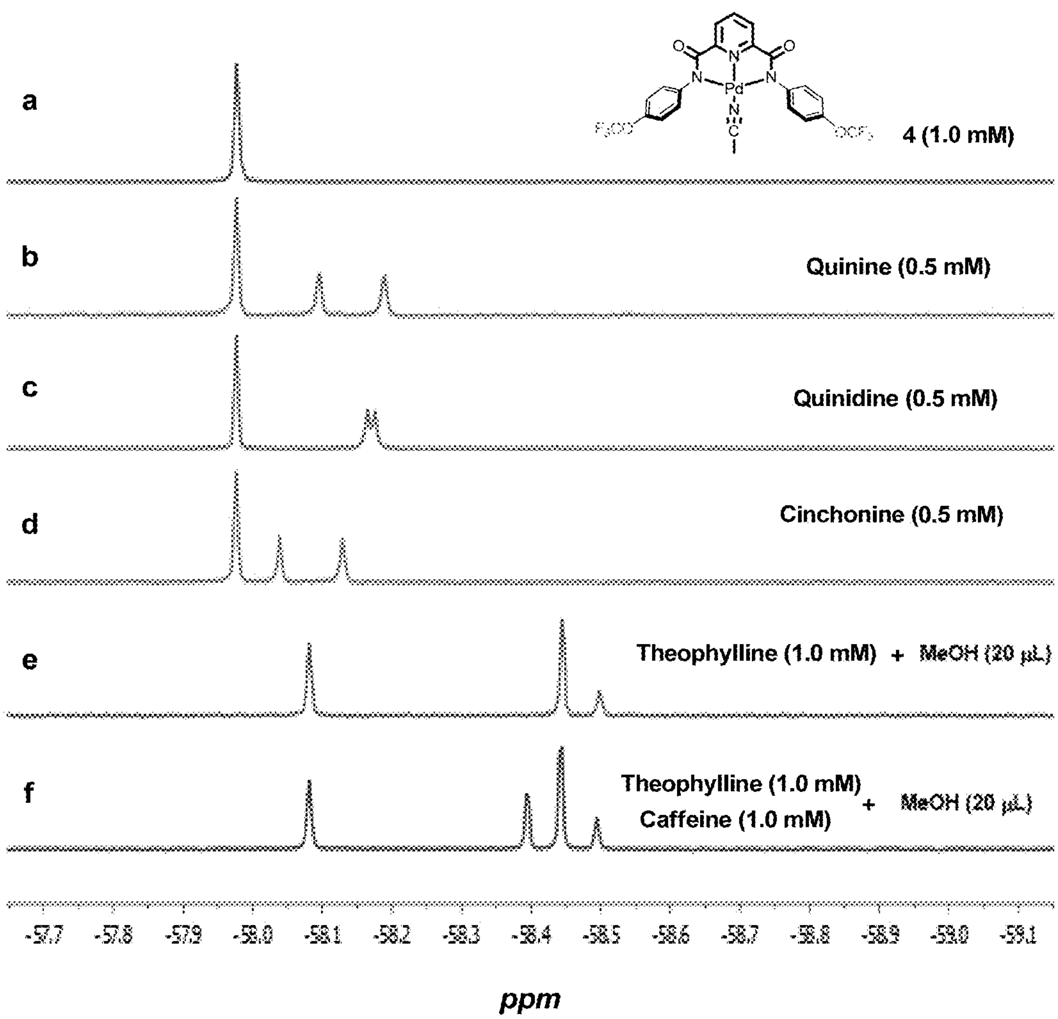
FIG. 139 shows $^{19}F$ NMR spectrum (typically 64 scans) of a mixture of complex 4 (1 mM in $CDCl_3$), $CH_3CN$ (15 mM) and different analytes (0.5-1.0 mM): (a) complex 4 alone, (b)-(f) complex 4 bound to various analytes.

Complex 1 of FIG. 135: Yellow solid. Yield: 68%. IR: 1645, 1629, 1596, 1486, 1366, 1259, 1244, 1211, 1178, 1149, 1003, 881, 787, 761 $cm^{-1}$. $^{1}H$ NMR (400 MHz, $CD_3CN$) δ 8.29 (t, J=7.8 Hz, 1H), 7.85 (d, J=7.8 Hz, 2H), 7.40 (t, J=8.1 Hz, 2H), 7.30 (d, J=8.1 Hz, 2H), 7.27 (s, 2H), 7.07 (d, J=8.0 Hz, 2H). $^{19}F$ NMR (376 MHz, $CD_3CN$) δ −58.41 (s, 6F). $^{13}C$ NMR (101 MHz, $CD_2Cl_2$/Pyridine-$d_5$) δ 169.04, 152.22, 148.94, 147.84, 141.21, 129.15, 125.71, 125.44, 120.29 (q, J=256.8 Hz), 119.07, 116.59 (unbound $CH_3CN$), 1.60 (unbound $CH_3CN$). HRMS (ESI): calc for $C_{23}H_{14}F_6N_4NaO_4Pd$ $[M+Na]^+$ 652.9860. found 652.9774. For the $^{13}C$ NMR, Pyridine-d5 was added due to the low solubility of 1. $CH_3CN$ was displaced by pyridine in this solution.

Complex 2 of FIG. 135: Yellow solid. Yield: 89%. IR: 1660, 1527, 1448, 1382, 1354, 1277, 1169, 1128, 1003, 894, 845, 706, 682 $cm^{-1}$. $^1H$ NMR (400 MHz, $CD_3CN$) δ 8.31 (t, J=7.8 Hz, 1H), 7.93 (s, 4H), 7.90 (d, J=7.8 Hz, 2H), 7.74 (s, 2H). $^{19}F$ NMR (376 MHz, $CD_3CN$) δ −63.13 (s, 12F). $^{13}C$ NMR (101 MHz, $CDCl_3/CD_3CN$) δ 168.90, 151.61, 147.73, 142.19, 131.19 (q, J=33.1 Hz), 126.91, 126.82, 123.32 (q, J=272.5 Hz), 117.75. HRMS (ESI): calc for $C_{25}H_{12}F_{12}N_4NaO_2Pd$ $[M+Na]^+$ 756.9710. found 756.9736. For the $^{13}C$ NMR, $CD_3CN$ was added to prevent the formation of oligomer. The signals of $CH_3CN$ for $^1H$ NMR and $^{13}C$ NMR were omitted because the bound $CH_3CN$ was replaced by $CD_3CN$.

Complex 3 of FIG. 135: Yellow solid. Yield: 91%. IR: 1629, 1597, 1539, 1513, 1413, 1396, 1363, 1322, 1161, 1106, 1066, 1016, 879, 832, 758 $cm^{-1}$. $^1H$ NMR (400 MHz, $CD_3CN$) δ 8.29 (t, J=7.8 Hz, 1H), 7.85 (d, J=7.8 Hz, 2H), 7.62 (d, J=8.3 Hz, 4H), 7.47 (d, J=8.2 Hz, 4H). $^{19}F$ NMR (376 MHz, $CD_3CN$) δ −62.44 (s, 6F). $^{13}C$ NMR (101 MHz, $CDCl_3$) δ 168.65, 152.15, 149.78, 141.69, 126.85, 126.31, 126.27 (q, J=32.4 Hz), 125.26 (d, J=3.6 Hz), 124.29 (q, J=271.5 Hz). HRMS (ESI): calc for $C_{23}H_{14}F_6N_4NaO_2Pd$ $[M+Na]^+$ 620.9962. found 620.9943. For the $^{13}C$ NMR, $CD_3CN$ was added to prevent the formation of oligomer. The signals of $CH_3CN$ for $^1H$ NMR and $^{13}C$ NMR were omitted because the bound $CH_3CN$ was replaced by $CD_3CN$.

Complex 4 of FIG. 135: Yellow solid. Yield: 88%. IR: 1634, 1596, 1502, 1363, 1260, 1201, 1142, 1106, 1017, 987, 919, 879, 848, 831, 807, 757, 670 $cm^{-1}$. $^1H$ NMR (400 MHz, $CD_3CN$) δ 8.26 (t, J=7.8 Hz, 1H), 7.82 (d, J=7.8 Hz, 2H), 7.40-7.34 (m, 4H), 7.26-7.20 (m, 4H). $^{19}F$ NMR (376 MHz, $CD_3CN$) δ −58.74 (s, 6F). $^{13}C$ NMR (101 MHz, $CDCl_3/CD_3CN$) δ 168.67, 152.30, 145.50, 145.28, 141.58, 127.67, 126.02, 120.88, 120.41 (q, J=256.1 Hz). HRMS (ESI): calc for $C_{23}H_{14}F_6N_4NaO_4Pd$ $[M+Na]^+$ 652.9860. found 652.9852. For the $^{13}C$ NMR, $CD_3CN$ was added to prevent the formation of oligomer. The signals of $CH_3CN$ for $^1H$ NMR and $^{13}C$ NMR were omitted because the bound $CH_3CN$ was replaced by $CD_3CN$.

Complex 5 of FIG. 135: Yellow solid, Yield: 58%. IR: 2923, 2307, 1625, 1603, 1378, 1340, 1321, 1174, 1125, 1095, 1040, 1015, 991, 908, 890, 950, 775, 707, 690 $cm^{-1}$. $^1H$ NMR (400 MHz, $CD_3CN$) δ 8.22 (t, J=7.8 Hz, 1H), 7.93 (s, 4H), 7.88 (s, 2H), 7.74 (d, J=7.8 Hz, 2H), 4.63 (s, 4H). $^{19}F$ NMR (376 MHz, $CD_3CN$) δ −63.24 (s, 12F). $^{13}C$ NMR (101 MHz, $CDCl_3/CD_3CN$) δ 170.89, 152.23, 144.28, 141.67, 131.28 (q, J=33.1 Hz), 127.47, 125.44, 123.37 (q, J=272.5 Hz), 120.40, 49.43. HRMS (ESI): calc for $C_{29}H_{17}F_9N_4O_2Pd$ $[M+H]^+$ 763.0204. found 763.0213. For the $^{13}C$ NMR, $CD_3CN$ was added to prevent the formation of oligomer. The signals of $CH_3CN$ for $^1H$ NMR and $^{13}C$ NMR were omitted because the bound $CH_3CN$ was replaced by $CD_3CN$.

The Determination of the Percentage of the Bound Quinoline and Caffeine when Using Receptor 1 in $CH_3OH/D_2O$.

A solution of various analytes and internal standard was prepared using methanol (4 mL), quinoline (0.12 mmol), caffeine (0.0953 mmol), and 4-nitrobenzotrifluoride (0.129 mmol). The molar ratio of quinoline:caffeine: 4-nitrobenzotrifluoride=46.5:36.9:50. The percentage of the bound quinoline and caffeine can be calculated based on the relative integrations of the corresponding peaks in $^{19}F$ NMR. Because there are two $OCF_3$ groups on receptor 1, if all the quinoline and caffeine are bound to receptor, the corresponding integration should be 93 and 73.8 if the internal standard 4-nitrobenzotrifluoride is set to 50. The estimated percentage of quinoline and caffeine bound to receptor 1 are both around 97%.

The Determination of Caffeine Content in Regularly Brewed and Decaffeinated Coffee.

Figure 140:
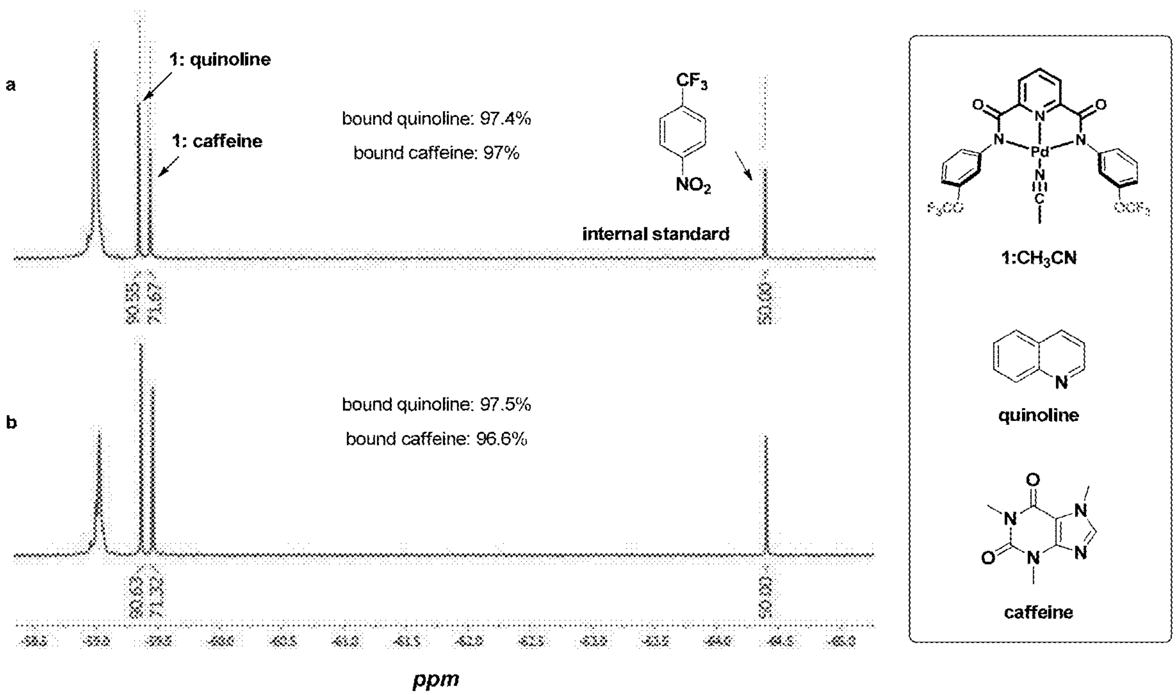
FIG. 140(*a*) shows $^{19}F$ NMR spectrum (64 scans each) of a mixture of complex 1 (ca. 2 mM in 490 μL $CH_3OH/D_2O$) and various amount of a prepared analyte solution, when 10 μL of the prepared analyte solution was added to complex 1.
Figure 141:
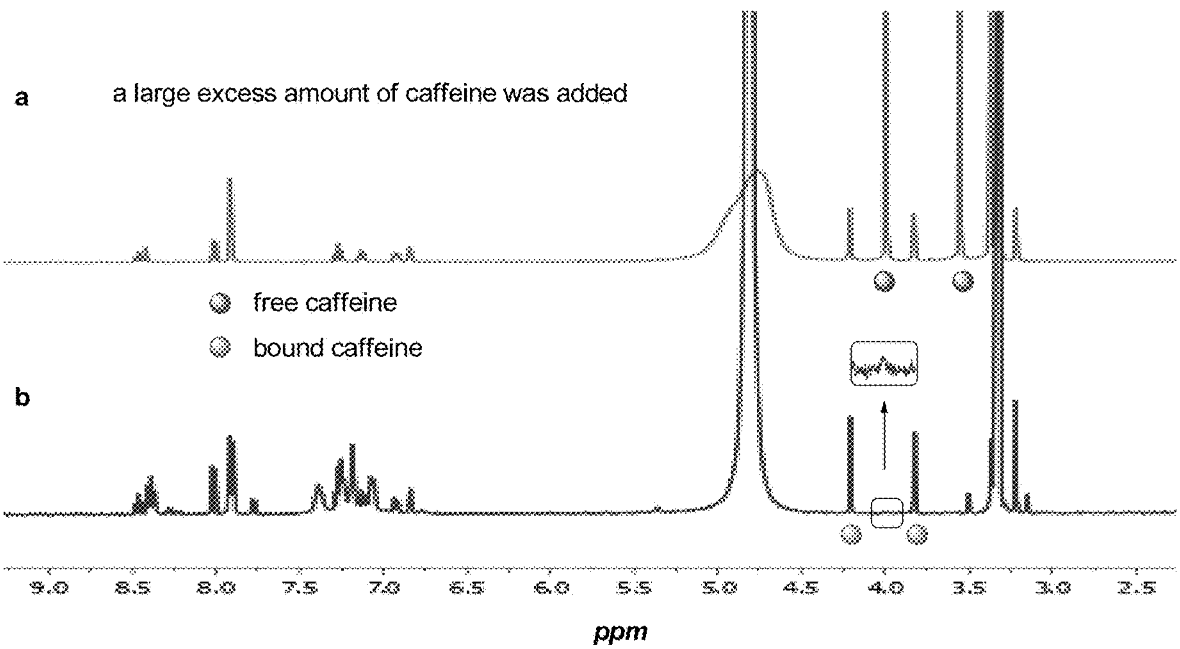
FIG. 141(*a*) shows $^1H$ NMR spectrum (64 scans each) of a mixture of complex 1 (ca. 2 mM in 490 μL $CD_3OD/D_2O$) and various amount of caffeine, when a large excess amount of caffeine was added.

The result shown in FIG. 140 and FIG. 141 demonstrates that the almost all the caffeine under the experimental conditions are bound to receptor 1, and quinoline has a similar coordinating ability to receptor 1 as caffeine.

Figure 142:
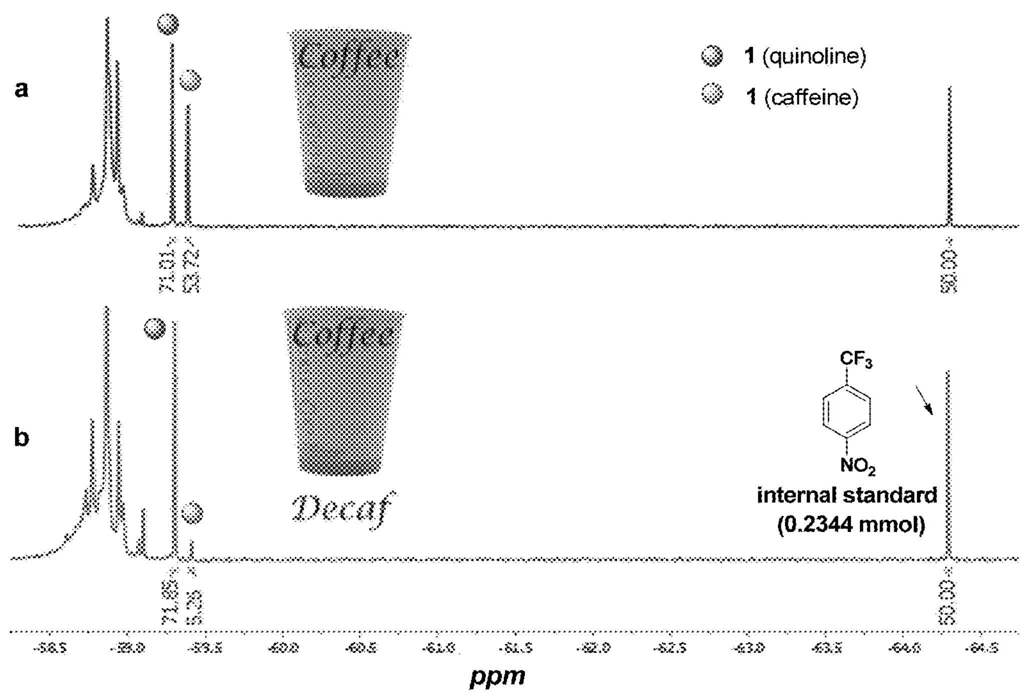
FIG. 142(*a*) shows $^{19}F$ NMR spectrum (128 scans) of a mixture of complex 1 (ca. 3.0 mM in $MeOH/D_2O/H_2O$), internal standards (the molar ratio of 4-nitrobenzotrifluoride:Quinoline=50:35.1) and coffee, when 40 μL of regularly brewed coffee was added.
Figure 143:
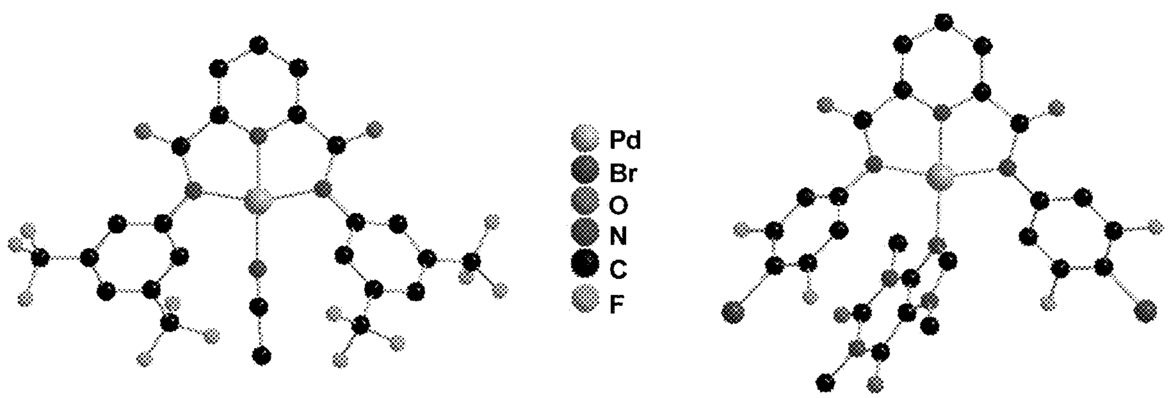
FIG. 143 shows X-ray structures of complex 2: $CH_3CN$, and 6: caffeine. The disorders of $CF_3$ group in 2: $CH_3CN$ are omitted for clarity.
Figure 144:
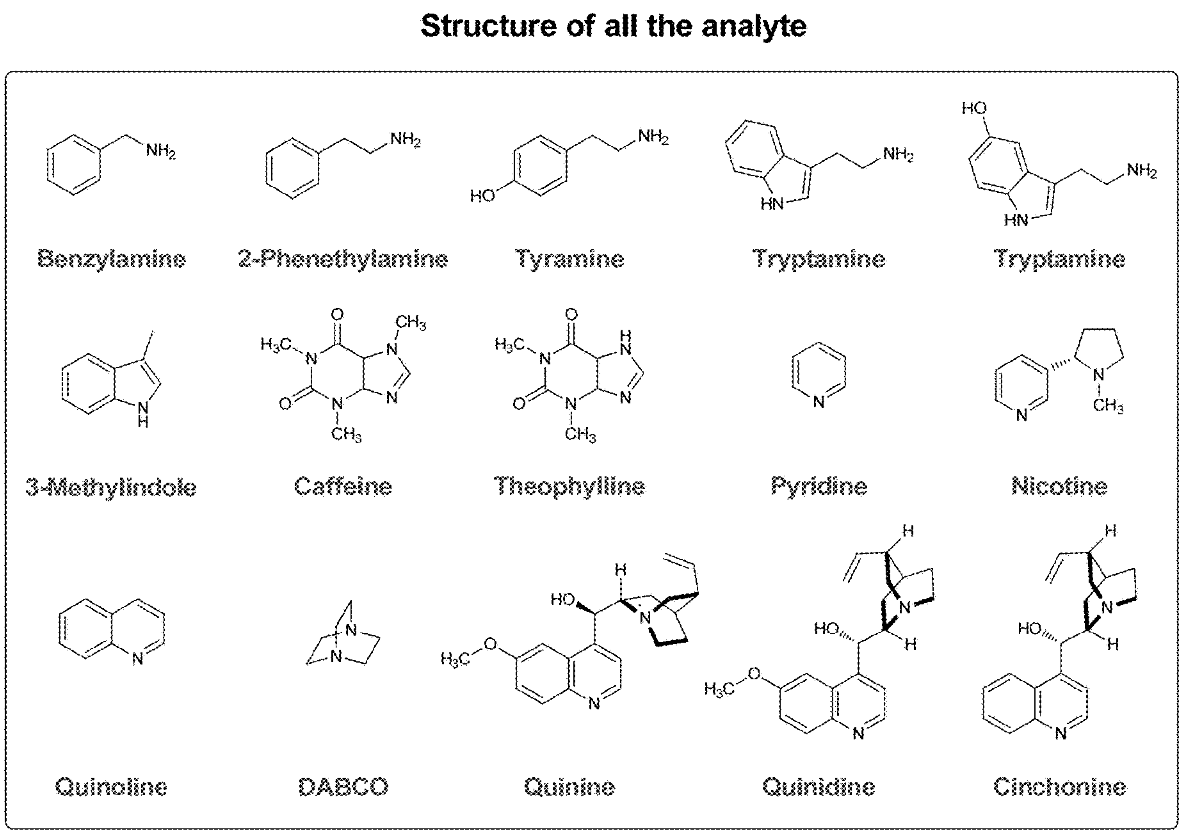
FIG. 144 shows structures of analytes.

Procedure for the caffeine determination in coffee: The coffee samples were purchased form Starbuck. A solution of quinoline (0.164 mmol/20 μL) and 4-nitrobenzotrifluoride (0.234 mmol/20 μL) in methanol was prepared and used as an internal standard. The addition of quinoline is used to estimate the influence of the matrices on the association of caffeine, because quinoline and caffeine have a similar coordinating ability to receptor 1. As FIG. 142 showed that all the quinoline was bound to receptor 1, the concentration of caffeine was calculated directly from the corresponding integration.

To determine the caffeine content in coffee, 40 μL of regularly brew coffee (or 80 μL of decaffeinated coffee), 20 μL of the internal standard and 450 μL of receptor 1 were mixed and $^{19}F$ NMR spectra was recorded. The concentrations of caffeine in regular and decaffeinated coffee were determined to be 3.15 and 0.15 mM, respectively based on the corresponding integration.

In another experiment with the same procedure, while using 60 μL of regularly brew coffee (or 100 μL of decaffeinated coffee), the concentrations of caffeine were determined to be 3.07 and 0.16 mM, respectively.

Other embodiments are within the scope of the following claims.

What is claimed is:

1. A sensor comprising a fluorinated receptor, the receptor chosen to provide a selective interaction with an analyte such that a $^{19}F$ NMR resonance of the receptor shifts when associating with an analyte, the sensor comprising multiple non-equivalent fluorine atoms in a single receptor, the sensor is capable of multi-dimensional differentiation to fingerprint the analyte, by identifying the analyte through the shift in the $^{19}F$ NMR resonance and providing a multi-dimensional spectroscopic signature without complexity from overlapping $^{19}F$ NMR signals, and an additional receptor, the sensor having an orthogonal discriminatory property that allows for higher analyte resolution signal though a combined analysis of signals from multiple receptors.

2. The sensor of claim 1, wherein the $^{19}F$ NMR resonance is capable of being detected by a NMR spectrometer.

3. The sensor of claim 1, wherein the shift of the $^{19}F$ NMR resonance is induced by spatial proximity.

4. The sensor of claim 1, wherein the shift of the $^{19}F$ NMR resonance is induced by changes in electron density.

5. The sensor of claim 1, wherein the shift of the $^{19}F$ NMR resonance is induced by spatial proximity and changes in electron density.

6. The sensor of claim 1, wherein the shift of the $^{19}F$ NMR resonance is induced by differences in a magnetic microenvironment.

7. The sensor of claim 1, wherein the sensor includes fluorine atoms at different positions relative to the analyte.

8. The sensor of claim 1, wherein the sensor includes at least two nonequivalent fluorine atoms.

9. The sensor of claim 1, wherein the sensor is capable of providing at least two $^{19}F$ NMR signals that shift when the receptor associates with the analyte.

10. The sensor of claim 1, wherein the sensor is capable of accessing structure information of the analyte by interaction with spatially arranged fluorine atoms.

11. The sensor of claim 1, wherein the sensor selectivity is capable of being optimized by the position of a fluorine atom of the receptor.

12. The sensor of claim 1, wherein the sensor is capable of discriminating different analytes.

13. The sensor of claim 1, wherein the analyte includes a carbohydrate.

14. The sensor of claim 1, wherein the analyte includes a protein.

15. The sensor of claim 1, wherein the analyte includes a biomolecule.

16. The sensor of claim 1, wherein the analyte includes a cell.

17. The sensor of claim 1, wherein the analyte includes a virus.

18. The sensor of claim 1, wherein the analyte is a toxic molecule.

19. The sensor of claim 1, wherein the receptor includes a magnetic microenvironment.

20. The sensor of claim 1, wherein the sensor is capable of three dimensional differentiation of the analyte.

21. The sensor of claim 1, wherein the sensor is capable of calculating a concentration of the analyte.

22. The sensor of claim 1, wherein the receptor includes a calixarene tungsten-imido complex.

23. The sensor of claim 1, wherein the receptor includes a palladium complex.

24. The sensor of claim 1, wherein the receptor includes a boronic acid complex.

25. The sensor of claim 22, wherein the calixarene tungsten-imido complex includes a trifluoromethyl group and a trifluoromethoxy group.

26. The sensor of claim 1, wherein the receptor includes a pentafluorophenyl group.

27. The sensor of claim 1, wherein the receptor includes a $SF_5$, $SCF_3$, $OCF_3$, trifluoromethyl ketone, difluoromethylketone, pentaflurophenyl, and/or trifluoromethyl.

28. The sensor of claim 19, wherein the analyte includes caffeine or a biologically active heterocycle.

29. The sensor of claim 19, wherein the analyte includes a cyanophos [O-(4-cyanophenyl) O,O-dimethyl phosphorothioate].

30. The sensor of claim 1, wherein the analyte includes an amine, a heterocycle, a thioether, a carbohydrate, a polyol, a nitrile, an amide, a sulfoxide or a vitamin.

* * * * *